(12) United States Patent
Sasaki et al.

(10) Patent No.: US 10,340,470 B2
(45) Date of Patent: Jul. 2, 2019

(54) LIGHT-EMITTING ELEMENT, DISPLAY DEVICE, ELECTRONIC DEVICE, AND LIGHTING APPARATUS

(71) Applicant: Semiconductor Energy Laboratory Co., Ltd., Atsugi-shi, Kanagawa-ken (JP)

(72) Inventors: Toshiki Sasaki, Kanagawa (JP); Riho Kataishi, Kanagawa (JP); Ryohei Yamaoka, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 309 days.

(21) Appl. No.: 15/436,263

(22) Filed: Feb. 17, 2017

(65) Prior Publication Data

US 2017/0244059 A1 Aug. 24, 2017

(30) Foreign Application Priority Data

Feb. 23, 2016 (JP) ................................ 2016-032007

(51) Int. Cl.
| | | |
|---|---|---|
| *H01L 51/54* | (2006.01) | |
| *H01L 51/50* | (2006.01) | |
| *H01L 27/32* | (2006.01) | |
| *H01L 51/52* | (2006.01) | |
| *H01L 27/12* | (2006.01) | |
| *H01L 29/24* | (2006.01) | |
| *H01L 29/786* | (2006.01) | |
| *H01L 51/00* | (2006.01) | |

(52) U.S. Cl.
CPC ........ *H01L 51/5008* (2013.01); *H01L 27/323* (2013.01); *H01L 27/3262* (2013.01); *H01L 51/5012* (2013.01); *H01L 51/5056* (2013.01); *H01L 51/5072* (2013.01); *H01L 51/5088* (2013.01); *H01L 51/5092* (2013.01); *H01L 51/5206* (2013.01); *H01L 51/5221* (2013.01); *H01L 51/5278* (2013.01); *H01L 27/1225* (2013.01); *H01L 29/24* (2013.01); *H01L 29/7869* (2013.01); *H01L 51/006* (2013.01); *H01L 51/0052* (2013.01); *H01L 51/0054* (2013.01); *H01L 51/0058* (2013.01); *H01L 51/0061* (2013.01); *H01L 51/0072* (2013.01); *H01L 51/0074* (2013.01); *H01L 51/0081* (2013.01); *H01L 51/0085* (2013.01); *H01L 51/0091* (2013.01); *H01L 2251/301* (2013.01); *H01L 2251/303* (2013.01); *H01L 2251/5353* (2013.01)

(58) Field of Classification Search
CPC .............. H01L 27/1225; H01L 27/323; H01L 27/3262; H01L 29/24; H01L 29/7869; H01L 51/0032; H01L 51/005; H01L 51/0052; H01L 51/0054; H01L 51/0058; H01L 51/006; H01L 51/0061; H01L 51/0072; H01L 51/0073; H01L 51/0074; H01L 51/50; H01L 51/5012; H01L 51/5016; H01L 51/5008; H01L 51/5056; H01L 51/5072; H01L 51/5206; H01L 51/5221; H01L 51/5278; H01L 2251/301; H01L 2251/303; H01L 2251/5353
USPC ....... 428/690, 691, 917, 411.4, 336; 427/58, 427/66; 313/500–512; 257/40, 88–104, 257/E51.001–E51.052; 252/301.16–301.35
See application file for complete search history.

(56) References Cited

U.S. PATENT DOCUMENTS

| | | |
|---|---|---|
| 7,387,904 B2 | 6/2008 | Saito et al. |
| 7,598,670 B2 | 10/2009 | Kumaki et al. |
| 7,956,349 B2 | 6/2011 | Tsutsui et al. |
| 7,985,974 B2 | 7/2011 | Nowatari et al. |
| 8,158,991 B2 | 4/2012 | Nowatari et al. |
| 2006/0263629 A1 | 11/2006 | Aziz et al. |
| 2011/0215307 A1 | 9/2011 | Nowatari et al. |
| 2012/0205686 A1 | 8/2012 | Seo et al. |
| 2012/0228588 A1 | 9/2012 | Mitsuya |
| 2012/0235166 A1 | 9/2012 | Nowatari et al. |
| 2015/0318335 A1 | 11/2015 | Kataishi et al. |

FOREIGN PATENT DOCUMENTS

| | | |
|---|---|---|
| JP | 2003-272867 A | 9/2003 |
| WO | WO-2015/118426 | 8/2015 |

OTHER PUBLICATIONS

Fukagawa.H et al., "Highly Efficient Inverted OLED with Air-Stable Electron Injection Layer", SID Digest '13 : SID International Symposium Digest of Technical Papers, May 21, 2013, pp. 1466-1469.

*Primary Examiner* — Andrew K Bohaty
(74) *Attorney, Agent, or Firm* — Fish & Richardson P.C.

(57) ABSTRACT

A light-emitting element includes a cathode, an anode, a light-emitting layer, a first layer, a second layer, and a third layer. The first layer is provided between the cathode and the light-emitting layer. The second layer is provided between the light-emitting layer and the third layer and includes a region in contact with the third layer. The third layer is provided between the second layer and the anode and includes a region in contact with the anode. The first layer and the third layer each include an alkali metal or an alkaline earth metal. The second layer includes a material that has a function of transporting an electron.

19 Claims, 44 Drawing Sheets

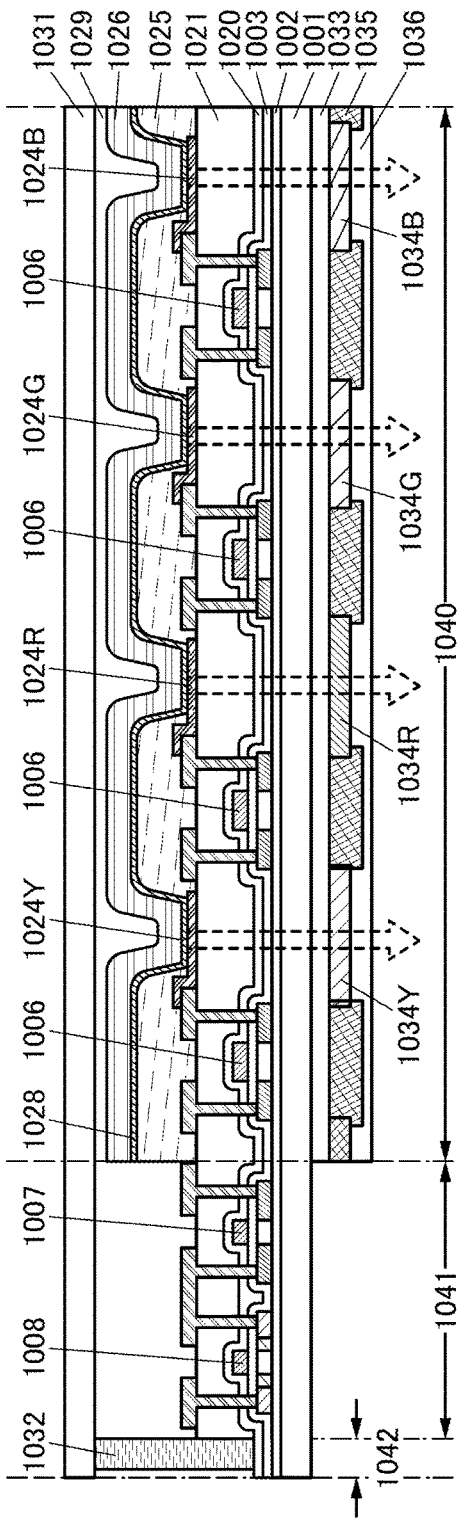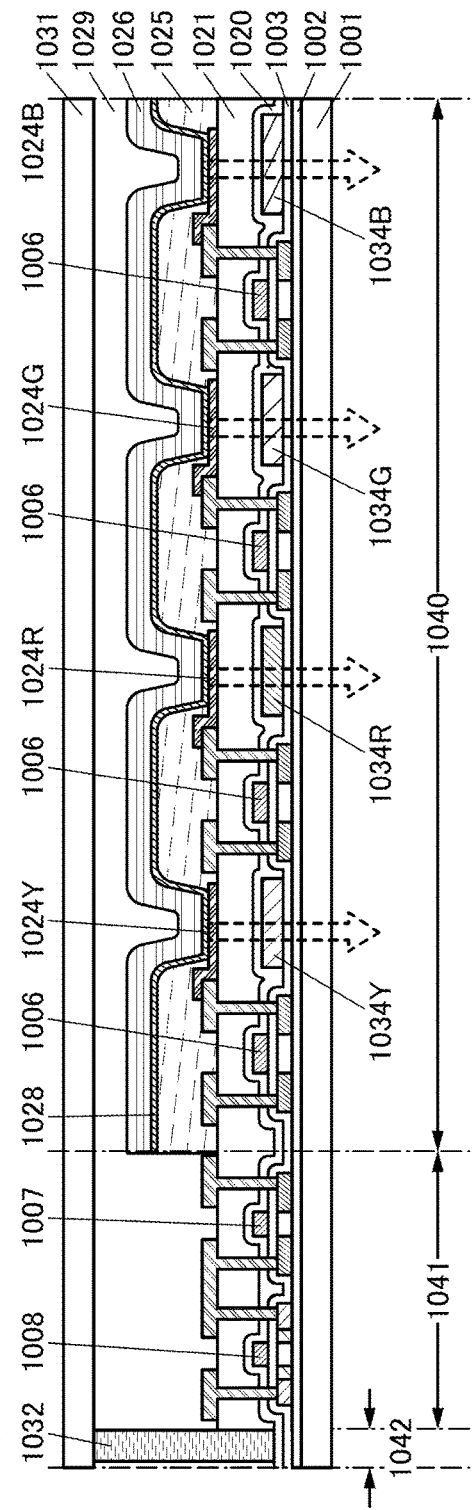

LIGHT-EMITTING ELEMENT, DISPLAY DEVICE, ELECTRONIC DEVICE, AND LIGHTING APPARATUS

BACKGROUND OF THE INVENTION

1. Field of the Invention

One embodiment of the present invention relates to a light-emitting element, a display device including the light-emitting element, an electronic device including the light-emitting element, or a lighting device including the light-emitting element.

Note that one embodiment of the present invention is not limited to the above technical field. In addition, one embodiment of the present invention relates to a process, a machine, manufacture, and a composition of matter. Specifically, examples of the technical field of one embodiment of the present invention disclosed in this specification include a semiconductor device, a display device, a liquid crystal display device, a light-emitting device, a lighting device, a power storage device, a memory device, a method for driving any of them, and a method for manufacturing any of them.

2. Description of the Related Art

In recent years, research and development have been extensively conducted on light-emitting elements utilizing electroluminescence (EL). In a basic structure of such a light-emitting element, a layer containing a light-emitting substance (an EL layer) is interposed between a pair of electrodes. By application of a voltage between the electrodes of this element, light emission from the light-emitting substance can be obtained.

Since the above light-emitting element is a self-luminous type, a display device using this light-emitting element has advantages such as high visibility, no necessity of a backlight, and low power consumption. Furthermore, such a light-emitting element also has advantages in that the element can be formed to be thin and lightweight, and that response time is high.

In the manufacturing process of a light-emitting element, an electrode serving as an anode of the light-emitting element is formed over a substrate before the other electrode serving as a cathode is formed as described above in some cases, and in other cases, an electrode serving as a cathode is formed over a substrate before the other electrode serving as an anode is formed. An element structure formed in the former cases of the manufacturing process is referred to as an "ordered stacked structure", and an element structure formed in the latter cases is referred to as an "inverted stacked structure". Not only these element structures of the light-emitting element are mutually inverted over a substrate, but also the element structures may differ from each other depending on the difference in manufacturing processes (e.g., Patent Document 1).

Furthermore, a structure in which an oxide semiconductor (OS) is used for a semiconductor layer of a field-effect transistor (FET) for controlling a light-emitting element has also been proposed. The FET including an oxide semiconductor is referred to as OS-FET. In particular, majority carriers in the OS-FET including In, Ga, and Zn as components of an oxide semiconductor are electrons, and the OS-FET is an n-channel FET. There is a report that the OS-FET is combined with a light-emitting element with an inverted stacked structure where a cathode is connected to the OS-FET, whereby the element characteristics can be improved (for example, Non-Patent Document 1).

REFERENCE

Patent Document

[Patent Document 1] Japanese Published Patent Application No. 2003-272867

Non-Patent Document

[Non-Patent Document 1]
H. Fukagawa, and six others, *SID* 2013 *DIGEST*. p. 1466, 2013

SUMMARY OF THE INVENTION

In a light-emitting element with an inverted stacked structure, an electron-injection layer, a light-emitting layer, a hole-injection layer, and an anode are stacked in this order over a cathode. As the anode, a material with a high work function and high reflectance or transmittance of light is preferably used. However, it is difficult to select such an anode material that has the above characteristics and that can be stacked without damaging the light-emitting element. Furthermore, even if a material that can be stacked without damaging the light-emitting element is used for an anode, there is a possibility of an increase of driving voltage and a reduction in emission efficiency of the light-emitting element when the material has inappropriate characteristics such as a work function for the anode.

An object of one embodiment of the present invention is to provide a light-emitting element driven with a low driving voltage. Another object of one embodiment of the present invention is to provide a light-emitting element with high emission efficiency. Another object of one embodiment of the present invention is to provide a light-emitting element with low power consumption. Another object of one embodiment of the present invention is to provide a novel light-emitting element. Another object of one embodiment of the present invention is to provide a novel display device.

Note that the description of the above object does not disturb the existence of other objects. In one embodiment of the present invention, there is no need to achieve all the objects. Other objects are apparent from and can be derived from the description of the specification and the like.

One embodiment of the present invention is a light-emitting element including a cathode, an anode, a light-emitting layer, a first layer, a second layer, and a third layer, where the first layer is provided between the cathode and the light-emitting layer, where the second layer is provided between the light-emitting layer and the third layer and includes a region in contact with the third layer, where the third layer is provided between the second layer and the anode and includes a region in contact with the anode, where the first layer includes an alkali metal or an alkaline earth metal, where the third layer includes an alkali metal or an alkaline earth metal, and where the second layer includes a material having a function of transporting an electron.

Another embodiment of the present invention is a light-emitting element including a cathode, a first layer over the cathode, a light-emitting layer over the first layer, a second layer over the light-emitting layer, a third layer including a region over and in contact with the second layer, and an anode including a region over and in contact with the third layer, where the first layer includes an alkali metal or an alkaline earth metal, where the third layer includes an alkali metal or an alkaline earth metal, and where the second layer includes a material having a function of transporting an electron.

Another embodiment of the present invention is a light-emitting element including a cathode, an anode, a light-emitting layer, a first layer, a second layer, a third layer, and a fourth layer, where the first layer is provided between the cathode and the light-emitting layer, where the second layer is provided between the light-emitting layer and the third layer and includes a region in contact with the third layer, where the third layer is provided between the second layer and the fourth layer and includes a region in contact with the fourth layer, where the fourth layer is provided between the third layer and the anode and includes a region in contact with the anode, where the first layer includes an alkali metal or an alkaline earth metal, where the third layer includes an alkali metal or an alkaline earth metal, where the second layer includes a material having a function of transporting an electron, and where the fourth layer includes a material having a function of transporting an electron.

Another embodiment of the present invention is a light-emitting element including a cathode, a first layer over the cathode, a light-emitting layer over the first layer, a second layer over the light-emitting layer, a third layer including a region over and in contact with the second layer, a fourth layer including a region over and in contact with the third layer, and an anode including a region over and in contact with the fourth layer, where the first layer includes an alkali metal or an alkaline earth metal, where the third layer includes an alkali metal or an alkaline earth metal, where the second layer includes a material having a function of transporting an electron, and where the fourth layer includes a material having a function of transporting an electron.

The above structure preferably further includes a fifth layer provided between the light-emitting layer and the second layer, and the fifth layer preferably includes a region in contact with the second layer. The fifth layer preferably includes a material having a function of transporting a hole and an electron acceptor. The material having a function of transporting a hole preferably includes at least one of a π-electron rich heteroaromatic ring skeleton and an aromatic amine skeleton, and the electron acceptor preferably includes a transition metal oxide.

The above structure preferably further includes a sixth layer between the cathode and the first layer, and the sixth layer preferably includes a region in contact with the first layer. The sixth layer preferably includes a material having a function of transporting an electron.

In the above structure, the material having a function of transporting an electron preferably includes a π-electron deficient heteroaromatic ring skeleton. Furthermore, the material transporting an electron preferably includes bathophenanthroline or tris(8-quinolinolato)aluminum.

In the above structure, each of the first layer and the third layer preferably includes a region without a π-electron deficient heteroaromatic ring skeleton.

In the above structure, the alkali metal or the alkaline earth metal is preferably lithium or calcium.

In the above structure, the anode preferably includes silver. At least one of the cathode and the anode preferably includes a metal oxide containing at least one of indium and zinc.

Another embodiment of the present invention is a display device including the light-emitting element having any of the above-described structures and a transistor that is electrically connected to the cathode.

In the above structure, the transistor is preferably an n-channel transistor. Furthermore, the transistor preferably includes a semiconductor layer including an oxide semiconductor. Furthermore, the oxide semiconductor preferably includes indium, gallium, and zinc.

Another embodiment of the present invention is an electronic device including the display device, and at least one of a housing and a touch sensor. Another embodiment of the present invention is a lighting device including the light-emitting element having any of the above-described structures, and at least one of a housing and a touch sensor. The category of one embodiment of the present invention includes not only a light-emitting device including a light-emitting element but also an electronic device including a light-emitting device. Accordingly, a light-emitting device in this specification refers to an image display device or a light source (including a lighting device). A display module in which a connector such as a flexible printed circuit (FPC) or a tape carrier package (TCP) is connected to a light-emitting element, a display module in which a printed wiring board is provided on the tip of a TCP, and a display module in which an integrated circuit (IC) is directly mounted on a light-emitting element by a chip on glass (COG) method are also embodiments of the present invention.

According to one embodiment of the present invention, a light-emitting element with a low driving voltage can be provided. Alternatively, according to one embodiment of the present invention, a light-emitting element with high emission efficiency can be provided. Alternatively, according to one embodiment of the present invention, a light-emitting element with low power consumption can be provided. Alternatively, according to one embodiment of the present invention, a novel light-emitting element can be provided. Alternatively, according to one embodiment of the present invention, a novel display device can be provided.

Note that the description of these effects does not disturb the existence of other effects. One embodiment of the present invention does not necessarily achieve all the effects listed above. Other effects will be apparent from and can be derived from the description of the specification, the drawings, the claims, and the like.

BRIEF DESCRIPTION OF THE DRAWINGS

FIGS. 14A and 14B are schematic cross-sectional views each illustrating a display device of one embodiment of the present invention.

FIGS. 30A, 30B1, and 30B2 illustrate a structure of a display device of one embodiment of the present invention.

DETAILED DESCRIPTION OF THE INVENTION

Figure 1:
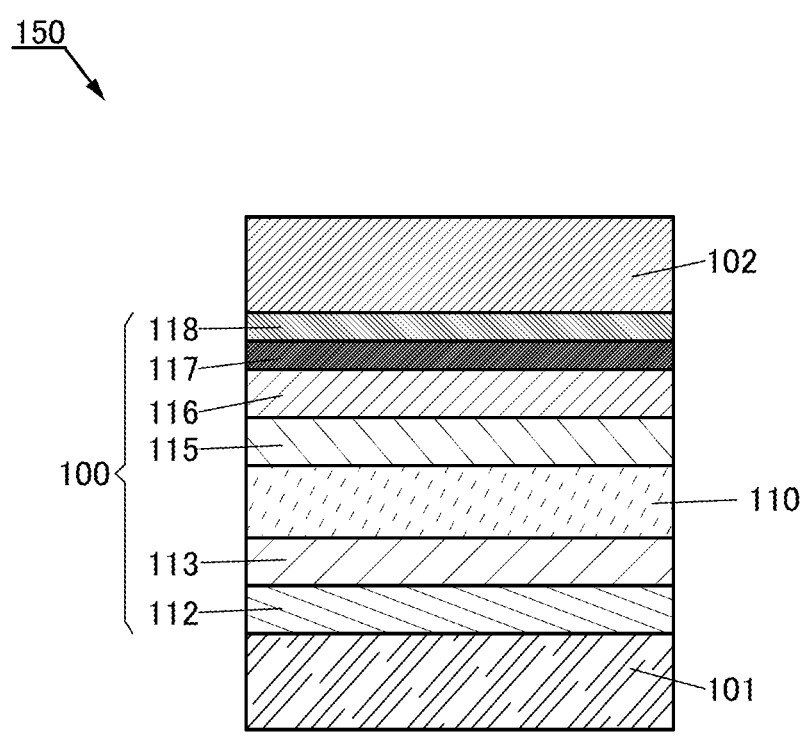
FIG. 1 is a schematic cross-sectional view of a light-emitting element of one embodiment of the present invention.

Embodiments and an example of the present invention will be described below with reference to the drawings. However, the present invention is not limited to the following description, and the mode and details can be variously changed unless departing from the scope and spirit of the present invention. Accordingly, the present invention should not be interpreted as being limited to the content of the embodiments below.

Note that the position, the size, the range, or the like of each structure illustrated in the drawings and the like are not accurately represented in some cases for easy understanding. Therefore, the disclosed invention is not necessarily limited to the position, size, range, or the like as disclosed in the drawings and the like.

Note that the ordinal numbers such as "first", "second", and the like in this specification and the like are used for convenience and do not denote the order of steps or the stacking order of layers. Therefore, for example, description can be made even when "first" is replaced with "second" or "third", as appropriate. In addition, the ordinal numbers in this specification and the like are not necessarily the same as those which specify one embodiment of the present invention.

In the description of modes of the present invention in this specification and the like with reference to the drawings, the same components in different diagrams are commonly denoted by the same reference numeral in some cases.

In this specification and the like, the terms "film" and "layer" can be interchanged with each other depending on the case or circumstances. For example, the term "conductive layer" can be changed into the term "conductive film" in some cases. Also, the term "insulating film" can be changed into the term "insulating layer" in some cases.

In this specification and the like, a singlet excited state (S*) refers to a singlet state having excitation energy. An S1 level means the lowest level of the singlet excitation energy level, that is, the excitation energy level of the lowest singlet excited state (S1 state). A triplet excited state (T*) refers to a triplet state having excitation energy. A T1 level means the lowest level of the triplet excitation energy level, that is, the excitation energy level of the lowest triplet excited state (T1 state). Note that in this specification and the like, simple expressions "singlet excited state" and "singlet excitation energy level" mean the S1 state and the S1 level, respectively, in some cases. In addition, expressions "triplet excited state" and "triplet excitation energy level" mean the T1 state and the T1 level, respectively, in some cases.

In this specification and the like, a fluorescent compound refers to a substance that emits light in the visible light region when the relaxation from the singlet excited state to the ground state occurs. A phosphorescent compound refers to a substance that emits light in the visible light region at room temperature when the relaxation from the triplet excited state to the ground state occurs. That is, a phosphorescent compound refers to a substance that can convert triplet excitation energy into visible light.

Note that in this specification and the like, "room temperature" refers to a temperature higher than or equal to 0° C. and lower than or equal to 40° C.

In this specification and the like, a wavelength range of blue refers to a wavelength range which is greater than or equal to 400 nm and less than 500 nm, and blue light has at least one peak in that wavelength range in an emission spectrum. A wavelength range of green refers to a wavelength range which is greater than or equal to 500 nm and less than 580 nm, and green light has at least one peak in that wavelength range in an emission spectrum. A wavelength range of red refers to a wavelength range which is greater than or equal to 580 nm and less than or equal to 680 nm, and red light has at least one peak in that wavelength range in an emission spectrum.

Embodiment 1

In this embodiment, a light-emitting element of one embodiment of the present invention will be described below with reference to FIG. 1, FIGS. 2A and 2B, and FIG. 3.

<Structure Example 1 of Light-Emitting Element>

First, a structure of a light-emitting element of one embodiment of the present invention is described with reference to FIG. 1.

FIG. 1 is a schematic cross-sectional view of a light-emitting element 150 of one embodiment of the present invention.

The light-emitting element 150 includes a pair of electrodes (an electrode 101 and an electrode 102) and an EL layer 100 between the pair of electrodes. The EL layer 100 includes at least a light-emitting layer 110. In this embodiment, the electrode 101 of the pair of electrodes functions as a cathode, and the electrode 102 functions as an anode.

The EL layer 100 illustrated in FIG. 1 includes functional layers such as an electron-injection layer 112, an electron-transport layer 113, a hole-transport layer 115, and a hole-injection layer 116, in addition to the light-emitting layer 110.

Note that in FIG. 1, the electrode 101 is provided under the light-emitting layer 110, and the electrode 102 is provided over the light-emitting layer 110; however, the structure of the light-emitting element 150 is not limited thereto. The layers between the electrodes may be stacked in the reverse order when the electrode 102 is provided under the light-emitting layer 110 and the electrode 101 is provided over the light-emitting layer 110. In other words, the electron-injection layer 112, the electron-transport layer 113, the light-emitting layer 110, the hole-transport layer 115, and the hole-injection layer 116 are stacked in this order from the cathode side.

Furthermore, the light-emitting element 150 may have either a structure such that the electrode 101 is provided over a substrate and the EL layer 100 is provided over the electrode 101, or a structure such that the electrode 102 is provided over the substrate and the EL layer 100 is provided over the electrode 102. In addition, the light-emitting element 150 may have any of a structure such that light is extracted from the electrode 101 side, a structure such that light is extracted from the electrode 102 side, or a structure such that light is extracted from both the electrode 101 side and the electrode 102 side.

Note that the structure of the EL layer 100 is not limited to the structure illustrated in FIG. 1, and at least one selected from the electron-injection layer 112, the electron-transport layer 113, the hole-transport layer 115, and the hole-injection layer 116 is included. Alternatively, the EL layer 100 may include a functional layer which is capable of lowering a hole- or electron-injection barrier, improving a hole- or electron-transport property, inhibiting a hole- or electron-transport property, or suppressing a quenching phenomenon by an electrode, for example. Note that the functional layers may each be a single layer or stacked layers.

The light-emitting layer 110 includes a host material and a guest material (light-emitting material).

As the host material, it is preferable to use one or both of a material having a function of transporting holes (hole-transport property) and a material having a function of transporting electrons (electron-transport property). Alternatively, it is preferable to use a material having a hole-transport property and an electron-transport property.

In the case where the host material is a combination of an electron-transport material and a hole-transport material, the carrier balance can be easily controlled with a mixture ratio. Specifically, the weight ratio of the electron-transport material to the hole-transport material is preferably within a range of 1:9 to 9:1. Since the carrier balance can be easily controlled with the structure, a carrier recombination region can also be controlled easily.

The guest material may be a light-emitting organic compound, and the light-emitting organic compound is preferably a substance capable of emitting fluorescence (hereinafter also referred to as a fluorescent compound) or a substance capable of emitting phosphorescence (hereinafter also referred to as a phosphorescent compound).

In the light-emitting element 150 of one embodiment of the present invention, voltage application between the pair of electrodes (the electrodes 101 and 102) allows electrons and holes to be injected from the cathode and the anode, respectively, into the EL layer 100 and thus current flows. By recombination of the injected electrons and holes, excitons are formed. Note that the term "exciton" refers to a pair of carriers (an electron and a hole). Since an exciton has excited energy, a material where an exciton is formed is brought into an excited state.

When the carriers recombine in the host material, excitons are formed to bring the host material into an excited state (a singlet excited state or a triplet excited state). In the case where the guest material is a fluorescent compound, excitation energy transfers from the S1 level of the host material to the S1 level of the guest material, thereby forming the singlet excited state of the guest material. In the case where the guest material is a phosphorescent compound, excitation energy transfers from the S1 level or the T1 level of the host material to the T1 level of the guest material, thereby forming the triplet excited state of the guest material. In either case, light is emitted when the guest material in an excited state is deactivated to the ground state.

The electrode 101 that functions as a cathode preferably has a low work function. Accordingly, an electron-injection property from the electrode 101 to the EL layer 100 can be improved. The electrode 102 that functions as an anode preferably has a high work function. Accordingly, a hole-injection property from the electrode 102 to the EL layer 100 can be improved.

In the case where light is extracted from the electrode 101 side, it is preferable that the electrode 101 have a function of transmitting light and the electrode 102 have a function of reflecting light. In the case where light is extracted from the electrode 102 side, it is preferable that the electrode 101 have a function of reflecting light and the electrode 102 have a function of transmitting light. In the case where light is extracted from both the electrode 101 side and the electrode 102 side, it is preferable that both the electrode 101 and the electrode 102 have a function of transmitting light.

However, it is difficult to select a stable material suitable for the electrode, which has a high hole- or electron-injection property and high light transmittance or reflectance. A reason of this is explained by taking the case of using a transparent conductive material including a metal oxide such as indium tin oxide, which has a relatively high work function, as an example. Such a transparent conductive material causes a high barrier to electron injection when being used for the cathode, whereas such a transparent conductive material enables holes to be injected relatively easily to the EL layer. Furthermore, when the transparent conductive material including the metal oxide is deposited over the EL layer 100, the EL layer 100 is damaged in some cases, which leads to a degradation in characteristics of the light-emitting element. As another example, the case of using a metal such as aluminum or a silver-magnesium alloy, which has a relatively low work function, is considered. Such a metal causes a high hole-injection barrier when being used for the anode, whereas such a metal enables electrons to be injected relatively easily to the EL layer when being used for the cathode. Moreover, surface oxidation of the metal easily occurs in air, and when the substrate provided with the metal is exposed to air, the resistance of the electrode increases. This leads to a degradation in characteristics of the light-emitting element.

Thus, it is difficult to directly employ an electrode that can be used in an ordered stacked structure (the anode and the EL layer are stacked in this order over the substrate) for an electrode used in an inverted stacked structure (the cathode and the EL layer are stacked in this order over the substrate).

Thus, it is preferable to provide a layer including a material that lowers a carrier (holes and electrons) injection barrier between the electrode 101 and the EL layer 100 and between the electrode 102 and the EL layer 100.

The light-emitting element 150 of one embodiment of the present invention includes the hole-injection layer 116. The hole-injection layer 116 injects holes to the EL layer and contains a material having a high hole-injection property. For the hole-injection layer 116, a composite material containing a hole-transport material and an electron acceptor (acceptor). When the hole-injection layer contains a hole-transport material and an electron acceptor (acceptor), electrons are extracted from the hole-transport material by the electron acceptor (acceptor) to generate holes and the holes are injected to the light-emitting layer 110 through the hole-transport layer 115. The electrons extracted by the electron acceptor (acceptor) are transported to the electrode 102.

The light-emitting element 150 of one embodiment of the present invention includes a buffer layer 117 and a buffer layer 118 between the hole-injection layer 116 and the electrode 102.

The buffer layer 118 preferably includes an alkali metal, an alkaline earth metal, or a compound thereof. When buffer layer 118 includes the metal, the barrier of electron injection from the hole-injection layer 116 to the electrode 102 can be lowered.

On the other hand, when the alkali metal or the alkaline earth metal included in the buffer layer 118 diffuses to the hole-injection layer 116, the hole-injection layer 116 comes to include a material with a strong donor property (the alkali metal or the alkaline earth metal) and a material with a strong acceptor property (electron acceptor). This structure makes the carrier (electrons and holes) transport property of the hole-injection layer 116 to be lowered in some cases, which leads to problems of high driving voltage, an increase in power consumption, and a short lifetime of the light-emitting element. Thus, the buffer layer 117 preferably has a function of preventing diffusion of the alkali metal or the alkaline earth metal in the buffer layer 118 to the hole-injection layer 116.

A material having a function of transporting an electron is preferably used for the buffer layer 117. In particular, it is preferable to use an organic compound that enables the alkali metal or the alkaline earth metal in the buffer layer 118 to serve as an electron donor (donor) when the metal is diffused and included in the buffer layer 117. A composite material in which the alkali metal or the alkaline earth metal is mixed with such an organic compound to serve as an electron donor (donor) has an excellent electron-transport property and an excellent electron-injection property because electrons are generated in the organic compound by the electron donor. Thus, even when the buffer layer 117 is provided between the hole-injection layer 116 and the buffer layer 118, a property of transporting electron to the electrode 102 can be secured. In addition, the electrons generated in the hole-injection layer 116 can be easily transported to the electrode 102.

The material of the buffer layer 117 can be the same as a material used for the electron-transport layer 113. When the materials of the buffer layer 117 and the electron-transport layer 113 are the same as each other, the manufacturing cost of the light-emitting element can be low. Alternatively, the material of the buffer layer 117 may be different from the material used for the electron-transport layer 113. When the materials of the buffer layer 117 and the electron-transport layer 113 are different from each other, the range of choices for materials is expanded, and the potentials of the electron-transport property and the electron-injection property can be enhanced.

Besides the buffer layer 117, another layer may be further provided between the hole-injection layer 116 and the buffer layer 118. The buffer layer 117 is preferably provided in a region where the alkali metal or the alkaline earth metal included in the buffer layer 118 diffuses so that the buffer layer 117 is allowed to prevent diffusion of the metal into the hole-injection layer 116. In other words, a preferable distance between the buffer layer 117 and the buffer layer 118 is smaller than a distance where the metal can diffuse, and it is further preferable to provide a region where the buffer layer 117 and the buffer layer 118 are in contact with each other. In order to prevent the diffusion of the metal into the hole-injection layer 116, a region where the buffer layer 117 and the hole-injection layer 116 are in contact with each other is preferably provided.

The buffer layer 117 may be a single layer or a stacked layer including two or more layers. In the case where the buffer layer 117 includes two or more layers, at least one of the layers includes a material having an electron-transport property, and the other layer can include a variety of materials. It is known that the light path in the light-emitting element affects the wavelength of light emitted from the light-emitting element; optical adjustment for extracting light with a desired wavelength can be performed on the light-emitting element using a material having a light-transmitting property and high conductivity for the other layer of the buffer layer 117. For example, the other layer in the buffer layer 117 can be formed by adding an electron donor (donor) to an organic compound with a high electron-transport property.

According to the structure of one embodiment of the present invention as described above, a light-emitting element with a low driving voltage can be provided. Moreover, a light-emitting element with high emission efficiency can be provided. A light-emitting element with low power consumption can be provided.

<Structure Example 2 of Light-Emitting Element>

Next, a structure example different from that of the light-emitting element 150 in FIG. 1 is described below with reference to FIG. 2A.

Figure 2A:
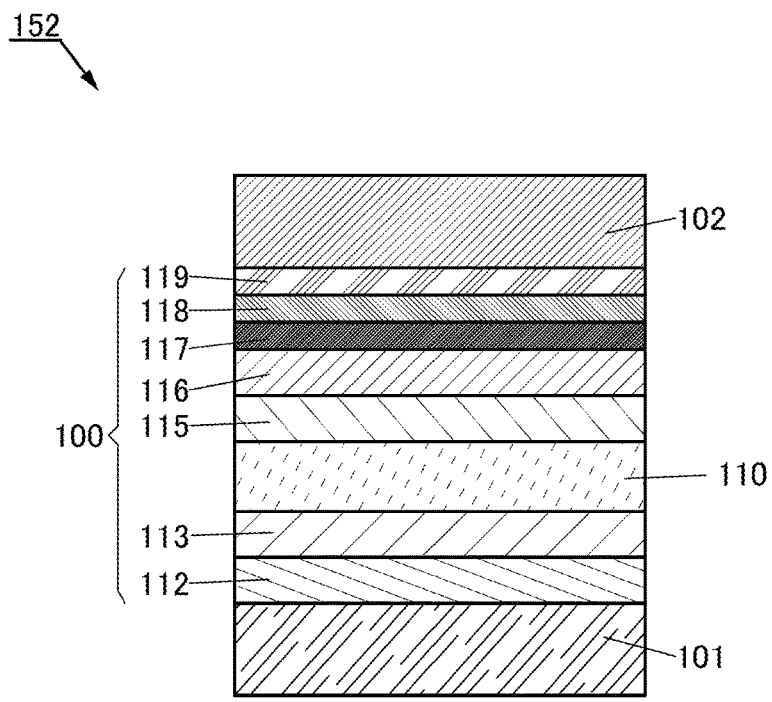
FIGS. 2A and 2B are each a schematic cross-sectional view of a light-emitting element of one embodiment of the present invention.

FIG. 2A is a schematic cross-sectional view of a light-emitting element 152 of one embodiment of the present invention. In FIG. 2A, a portion having a function similar to that in FIG. 1 is represented by the same hatch pattern as in FIG. 1 and not especially denoted by a reference numeral in some cases. In addition, common reference numerals are used for portions having similar functions, and a detailed description of the portions is omitted in some cases.

The light-emitting element 152 includes the buffer layer 117, the buffer layer 118, and a buffer layer 119 between the hole-injection layer 116 and the electrode 102.

When the alkali metal or the alkaline earth metal included in the buffer layer 118 is in contact with the electrode 102, an energy barrier is formed and electron injection to the electrode 102 is inhibited in some cases. This structure causes problems of high driving voltage, an increase in power consumption, and a short lifetime of the light-emitting element. Thus, the buffer layer 119 preferably has a function of preventing the alkali metal or the alkaline earth metal included in the buffer layer 118 from being in contact with the electrode 102.

A material having a function of transporting electrons is preferably used for the buffer layer 119. In particular, it is preferable to use an organic compound that enables the alkali metal or the alkaline earth metal in the buffer layer 118 to serve as an electron donor (donor) when the metal is diffused and included in the buffer layer 119. A composite material in which the alkali metal or the alkaline earth metal is mixed with such an organic material to serve as an electron donor (donor) has an excellent electron-transport property and an electron-injection property because electrons are generated in the organic compound by the electron donor (donor). Thus, even when the buffer layer 119 is provided between the electrode 102 and the buffer layer 118, the property of injecting electrons to the electrode 102 can be secured. Furthermore, the electrons generated in the hole-injection layer 116 can be easily injected to the electrode 102.

The material of the buffer layer 119 can be the same as the material used for the buffer layer 117. When the materials of the buffer layers 117 and 119 are the same as each other, the manufacturing cost of the light-emitting element can be low. Alternatively, the material of the buffer layer 119 may be different from the material used for the buffer layer 117. When the materials of the buffer layers 117 and 119 are different from each other, the range of choices for materials is expanded, and the potentials of the electron-transport property and the electron-injection property can be enhanced.

Besides the buffer layer 119, another layer may be further provided between the electrode 102 and the buffer layer 118. The buffer layer 119 is preferably provided in a region where the alkali metal or the alkaline earth metal included in the buffer layer 118 diffuses so that the buffer layer 119 is allowed to prevent the metal to be in contact with the electrode 102. In other words, a preferable distance between the buffer layers 119 and 118 is smaller than a distance where the metal can diffuse, and it is further preferable to provide a region where the buffer layer 119 and the buffer layer 118 are in contact with each other. In order to prevent the metal to be in contact with the electrode 102, a region where the buffer layer 119 and the electrode 102 are in contact with each other is preferably provided.

The buffer layer 119 may be a single layer or a stacked layer including two or more layers. In the case where the buffer layer 119 includes two or more layers, at least one of the layers includes a material having an electron-transport property, and the other layer can include a variety of materials. It is known that the light path in the light-emitting element affects the wavelength of light emitted from the light-emitting element; optical adjustment for extracting light with a desired wavelength can be performed on the light-emitting element using a material having a light-transmitting property and high conductivity for the other layer of the buffer layer 119. For example, the other layer in the buffer layer 119 can be formed by adding an electron donor (donor) to an organic compound with a high electron-transport property.

According to the structure of one embodiment of the present invention as described above, a light-emitting element with a low driving voltage can be provided. Moreover, a light-emitting element with high emission efficiency can be provided. A light-emitting element with low power consumption can be provided.

Note that the structure of the light-emitting element 150 may be referred to for the other part in the light-emitting element 152.

<Structure Example 3 of Light-Emitting Element>

Next, a structural example different from the light-emitting element 150 illustrated in FIG. 1 is described below with reference to FIG. 2B.

Figure 2B:
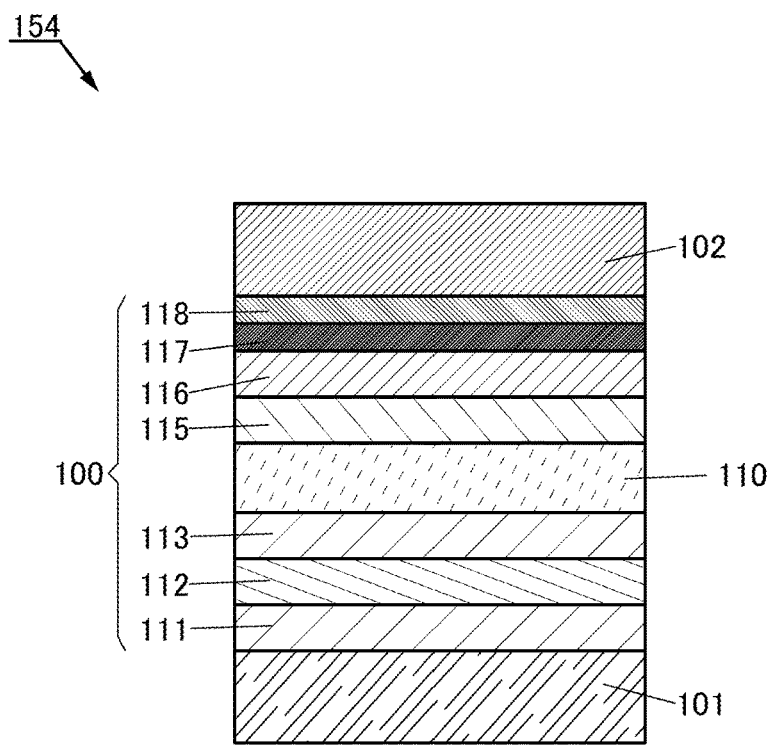

FIG. 2B is a schematic cross-sectional view of a light-emitting element 154 of one embodiment of the present invention. In FIG. 2B, a portion having a function similar to that in FIG. 1 is represented by the same hatch pattern as in FIG. 1 and not especially denoted by a reference numeral in some cases. In addition, common reference numerals are used for portions having similar functions, and a detailed description of the portions is omitted in some cases.

The light-emitting element 154 includes a buffer layer 111 between the electron-injection layer 112 and the electrode 101.

The electron-injection layer 112 is a layer for injecting electrons to the EL layer and includes a material with a high electron-injection property. For the electron-injection layer 112, an alkali metal, an alkaline earth metal, or a compound thereof can be used. When the electron-injection layer 112 includes the alkali metal or the alkaline earth metal, a barrier of electron injection from the electron-injection layer 112 to the electrode 101 can be lowered.

The material of the electron-injection layer 112 can be the same as a material used for the buffer layer 118. When the materials of the electron-injection layer 112 and the buffer layer 118 are the same as each other, the manufacturing cost of the light-emitting element can be low. Alternatively, the material of the electron-injection layer 112 may be different from the material used for the buffer layer 118. When the materials of the electron-injection layer 112 and the buffer layer 118 are different from each other, the range of choices for materials is expanded, and the potentials of the electron-transport property and the electron-injection property can be enhanced.

In the case where the electrode 101 is formed using a conductive material with relatively high work function formed of a metal oxide or the like, an energy barrier is formed when the electrode 101 is in contact with the alkali metal or the alkaline earth metal included in the electron-injection layer 112, and accordingly, electron injection from the electrode 101 to the electron-injection layer 112 is inhibited in some cases. This structure causes problems of high driving voltage, an increase in power consumption, and a short lifetime of the light-emitting element. Thus, the buffer layer 111 preferably has a function of preventing the electrode 101 from being in contact with the alkali metal or the alkaline earth metal included in the electron-injection layer 112.

A material having a function of transporting electrons is preferably used for the buffer layer 111. In particular, it is preferable to use an organic compound that enables the alkali metal or the alkaline earth metal in the electron-injection layer 112 to serve as an electron donor (donor) when the metal is diffused and includes in the buffer layer 111. A composite material in which the alkali metal or the alkaline earth metal is mixed with such an organic compound to serve as an electron donor (donor) has an excellent electron-transport property and an electron-injection property because electrons are generated in the organic compound by the electron donor (donor). Thus, even when the buffer layer 111 is provided between the electrode 101 and the electron-injection layer 112, the property of injecting electrons from the electrode 101 to the EL layer 100 can be secured. Furthermore, the electrons can be easily injected from the electron-injection layer 112 to the electrode 102.

The material of the buffer layer 111 can be the same as a material used for the electron-transport layer 113. When the materials of the buffer layer 111 and the electron-transport layer 113 are the same as each other, the manufacturing cost of the light-emitting element can be low. Alternatively, the material of the buffer layer 111 may be different from the material used for the electron-transport layer 113. When the materials of the buffer layer 111 and the electron-transport layer 113 are different from each other, the range of choices for materials is expanded, and the potentials of the electron-transport property and the electron-injection property can be enhanced.

Besides the buffer layer 111, another layer may be further provided between the electrode 101 and the electron-injection layer 112. The buffer layer 111 is preferably provided in a region where the alkali metal or the alkaline earth metal included in the electron-injection layer 112 diffuses so that the buffer layer 111 is allowed to prevent the metal to be in contact with the electrode 101. In other words, a preferable distance between the buffer layer 111 and the electron-injection layer 112 is smaller than a distance where the metal can diffuse, and it is further preferable to provide a region where the buffer layer 111 and the electron-injection layer 112 are in contact with each other. In order to prevent the metal to be in contact with the electrode 101, a region where the buffer layer 111 and the electrode 101 are in contact with each other is preferably provided.

The buffer layer 111 may be a single layer or a stacked layer including two or more layers. In the case where the buffer layer 111 includes two or more layers, at least one of the layers includes a material having an electron-transport property, and the other layer can include a variety of materials. It is known that the light path in the light-emitting element affects the wavelength of light emitted from the light-emitting element; optical adjustment for extracting light with a desired wavelength can be performed on the light-emitting element using a material having a light-transmitting property and high conductivity for the other layer of the buffer layer 111. For example, the other layer in the buffer layer 111 can be formed by adding an electron donor (donor) to a material with a high electron-transport property. Alternatively, the other layer in the buffer layer 111 may be formed by adding an electron acceptor (acceptor) to a material with a high hole-transport property.

According to the structure of one embodiment of the present invention as described above, a light-emitting element with a low driving voltage can be provided. Moreover, a light-emitting element with high emission efficiency can be provided. A light-emitting element with low power consumption can be provided.

Note that the structure of the light-emitting element 150 may be referred to for the other structure in the light-emitting element 154.

<Structure Example 4 of Light-Emitting Element>

Next, a structure example different from the light-emitting element 150 in FIG. 1 is described below with reference to FIG. 3.

Figure 3:
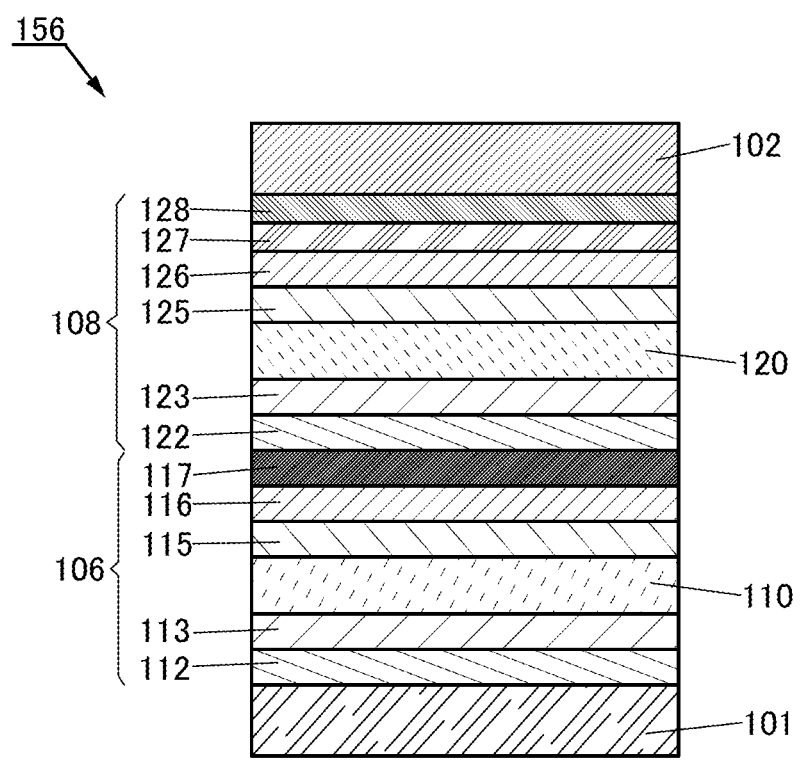
FIG. 3 is a schematic cross-sectional view of a light-emitting element of one embodiment of the present invention.

FIG. 3 is a schematic cross-sectional view of a light-emitting element 156 of one embodiment of the present invention. In FIG. 3, a portion having a function similar to that in FIG. 1 is represented by the same hatch pattern as in FIG. 1 and not especially denoted by a reference numeral in some cases. In addition, common reference numerals are used for portions having similar functions, and a detailed description of the portions is omitted in some cases.

The light-emitting element 156 includes a plurality of light-emitting units (a light-emitting unit 106 and a light-emitting unit 108 in FIG. 3) between a pair of electrodes (the electrode 101 and the electrode 102). One of the plurality of light-emitting units preferably has the same structure as the EL layer 100 illustrated in FIG. 1. In other words, the light-emitting element 150 illustrated in FIG. 1 includes one light-emitting unit, and the light-emitting element 156 illustrated in FIG. 3 includes a plurality of light-emitting units.

In the light-emitting element 156 illustrated in FIG. 3, the light-emitting unit 106 and the light-emitting unit 108 are stacked, and a charge-generation layer is provided between the light-emitting unit 106 and the light-emitting unit 108. Note that the light-emitting unit 106 and the light-emitting unit 108 may have the same structure or different structures.

The light-emitting element 156 includes the light-emitting layer 110 and a light-emitting layer 120 between the electrode 101 and the electrode 102. In other words, the light-emitting element 156 shows a structure example of a tandem light-emitting element in which a plurality of light-emitting layers are stacked with a charge-generation layer provided therebetween.

The tandem light-emitting element 156 includes the electron-injection layer 112, the electron-transport layer 113, the hole-transport layer 115, the hole-injection layer 116, the buffer layer 117, an electron-injection layer 122, an electron-transport layer 123, a hole-transport layer 125, a hole-injection layer 126, a buffer layer 127, and a buffer layer 128.

The electron-injection layer 122, the electron-transport layer 123, the hole-transport layer 125, the hole-injection layer 126, the buffer layer 127, and the buffer layer 128 can be formed using a material and structure similar to those of the electron-injection layer 112, the electron-transport layer 113, the hole-transport layer 115, the hole-injection layer 116, the buffer layer 117, and the buffer layer 118, respectively.

Each of the light-emitting layer 110 and the light-emitting layer 120 includes a light-emitting organic compound. The emission colors of the light-emitting organic compounds in the light-emitting layer 110 and the light-emitting layer 120 may be the same or different.

In the case where the organic compounds emitting light of the same color are used for the light-emitting unit 106 and the light-emitting unit 108, the light-emitting element 156 can exhibit high emission luminance at a small current value, which is preferable.

In the case where the organic compounds emitting light of different colors are used for the light-emitting unit 106 and the light-emitting unit 108, the light-emitting element 156 can exhibit multi-color light emission, which is preferable. In that case, when a plurality of light-emitting materials with different emission wavelengths are used in one or both of the light-emitting layers 120 and 110, the emission spectrum of the tandem light-emitting element 156 is formed by combining light having different emission peaks, and thus has at least two peaks.

The above structure is also suitable for obtaining white light emission. For example, the light-emitting organic compounds are selected so that the light-emitting unit 106 and the light-emitting unit 108 emit light of complementary colors, whereby white light emission can be obtained. It is particularly favorable to select the light-emitting organic compound so that white light emission with high color rendering properties or light emission of at least red, green, and blue colors can be obtained.

Either or both of the light-emitting layers 110 and 120 may have a stacked structure of two layers. Two kinds of organic compounds emitting light of different colors from each other are used for the two light-emitting layers, whereby light with a plural colors can be obtained. It is particularly preferable to select the light-emitting organic compounds of the light-emitting layers so that white light can be obtained by combining light emissions from the light-emitting layer 110 and the light-emitting layer 120.

Note that each of the light-emitting layer 110 and the light-emitting layer 120 may have a stacked structure including three or more layers and may include a layer without a light-emitting organic compound.

In the case where one of the light-emitting unit 106 and the light-emitting unit 108 includes a fluorescent compound and the other includes a phosphorescent compound, as light-emitting materials, it is preferable that light from the fluorescent compound have a peak of emission spectrum on a shorter wavelength side than that of light from the phosphorescent compound. The luminance of a light-emitting element using a material having a high triplet excited energy level tends to degrade quickly. Thus, the fluorescent compound is used in the light-emitting layer emitting light with a short wavelength, whereby a light-emitting element with less degradation of luminance can be provided.

The charge-generation layer has a function of injecting electrons to one of the light-emitting layer 110 and the light-emitting layer 120 and injecting holes to the other light-emitting layer when a voltage is applied between the pair of electrodes (the electrode 101 and the electrode 102).

For example, in the tandem light-emitting element 156, when a voltage is applied such that the potential of the electrode 102 is higher than that of the electrode 101, the charge-generation layer injects holes to the light-emitting layer 110 and injects electrons to the light-emitting layer 120.

For the charge-generation layer, a composite material including a material having a hole-transport property and an electron acceptor (acceptor) or a composite material including a material having an electron-transport property and an electron donor (donor) can be used. Alternatively, these structures may be stacked.

Note that when a surface of a light-emitting unit on the anode side is in contact with the charge-generation layer, the charge-generation layer can also serve as a hole-injection layer or a hole-transport layer of the light-emitting unit; thus, a hole-injection layer or a hole-transport layer need not be included in the light-emitting unit. When a surface of a light-emitting unit on the cathode side is in contact with the charge-generation, the charge-generation layer can also serve as an electron-injection layer or an electron-transport layer of the light-emitting unit; thus, an electron-injection layer or an electron-transport layer need not be included in the light-emitting unit.

In the light-emitting element 156 of one embodiment of the present invention, the hole-injection layer 116 can be used as the charge-generation layer.

For the electron-injection layer 122, a material and structure of the electron-injection layer 112 or the buffer layer 128 can be used. In other words, for the electron-injection layer 122, an alkali metal, an alkaline earth metal, or a compound thereof can be used. When the electron-injection layer 122 includes the alkali metal or the alkaline earth metal, a barrier of electron injection from the hole-injection layer 116 to the electron-transport layer 123 can be lowered.

The buffer layer 117 preferably has a function of preventing diffusion of the alkali metal or the alkaline earth metal included in the electron-injection layer 122 to the hole-injection layer 116. Furthermore, a material that can transport electrons is preferably used for the buffer layer 117. In particular, it is preferable to use an organic compound that enables the alkali metal or the alkaline earth metal in the electron-injection layer 122 to serve as an electron donor (donor) when the metal is diffused and included in the buffer layer 117. Thus, even when the buffer layer 117 is provided between the hole-injection layer 116 and the electron-injection layer 122, the property of injecting electrons to the electron-transport layer 123 can be secured. Furthermore, the electrons generated in the hole-injection layer 116 can be easily transported to the electron-transport layer 123.

Note that as the charge-generation layer, another layer may be formed besides the hole-injection layer 116.

Moreover, besides the buffer layer 117, another layer may be further provided between the hole-injection layer 116 and the electron-injection layer 122. Even in that case, the buffer layer 117 is preferably provided in a region where the alkali metal or the alkaline earth metal included in the electron-injection layer 122 diffuses so that the buffer layer 117 is allowed to prevent diffusion of the metal into the hole-injection layer 116. In other words, a preferable distance between the buffer layer 117 and the electron-injection layer 122 is smaller than a distance where the metal can diffuse, and it is further preferable to provide a region where the buffer layer 117 and the electron-injection layer 122 are in contact with each other.

Note that in FIG. 3, the light-emitting element having two light-emitting units is described; however, one embodiment of the present invention can be similarly applied to a light-emitting element in which three or more light-emitting units are stacked. With a plurality of light-emitting units partitioned by the charge-generation layer between a pair of electrodes as in the light-emitting element 156, it is possible to provide a light-emitting element which can emit light with high luminance with the current density kept low and has a long lifetime. Furthermore, a light-emitting element with low power consumption can be provided.

When the charge-generation layer is formed in the above structure, an increase in the driving voltage of the light-emitting element where light-emitting layers are stacked can be suppressed.

Note that the structure of the light-emitting element 150 may be referred to for the other structure in the light-emitting element 156.

The structures of the light-emitting elements described in this embodiment can be freely combined with each other.

<Components of Light-Emitting Element>

Next, components of a light-emitting element of one embodiment of the present invention are described in detail below.

<<Pair of Electrodes>>

The electrodes 101 and 102 function as a cathode and an anode of each light-emitting element. The electrodes 101 and 102 can be formed using a metal, an alloy, or a conductive compound, or a mixture or a stack thereof, for example.

One of the electrode 101 and the electrode 102 is preferably formed using a conductive material having a function of reflecting light. Examples of the conductive material include aluminum (Al), an alloy containing Al, and the like. Examples of the alloy containing Al include an alloy containing Al and L (L represents one or more of titanium (Ti), neodymium (Nd), nickel (Ni), and lanthanum (La)), such as an alloy containing Al and Ti and an alloy containing Al, Ni, and La. Aluminum has low resistance and high light reflectivity. Aluminum is included in earth's crust in large amount and is inexpensive; therefore, it is possible to reduce costs for manufacturing a light-emitting element with aluminum. Alternatively, Ag, an alloy of silver (Ag) and N (N represents one or more of yttrium (Y), Nd, magnesium (Mg), ytterbium (Yb), Al, Ti, gallium (Ga), zinc (Zn), indium (In), tungsten (W), manganese (Mn), tin (Sn), iron (Fe), Ni, copper (Cu), palladium (Pd), iridium (Ir), or gold (Au)), or the like can be used. Examples of the alloy containing silver include an alloy containing silver, palladium, and copper, an alloy containing silver and copper, an alloy containing silver and magnesium, an alloy containing silver and nickel, an alloy containing silver and gold, an alloy containing silver and ytterbium, and the like. Besides, a transition metal such as tungsten, chromium (Cr), molybdenum (Mo), copper, or titanium can be used.

Light emitted from the light-emitting layer is extracted through the electrode 101 and/or the electrode 102. Thus, at least one of the electrode 101 and the electrode 102 is preferably formed using a conductive material having a function of transmitting light. As the conductive material, a conductive material having a visible light transmittance higher than or equal to 40% and lower than or equal to 100%, preferably higher than or equal to 60% and lower than or equal to 100%, and a resistivity lower than or equal to $1 \times 10^{-2}$ Ω·cm can be used.

The electrodes 101 and 102 may each be formed using a conductive material having functions of transmitting light and reflecting light. As the conductive material, a conductive material having a visible light reflectivity higher than or equal to 20% and lower than or equal to 80%, preferably higher than or equal to 40% and lower than or equal to 70%, and a resistivity lower than or equal to $1 \times 10^{-2}$ Ω·cm can be used. For example, one or more kinds of conductive metals and alloys, conductive compounds, and the like can be used. Specifically, a metal oxide such as indium tin oxide (hereinafter, referred to as ITO), indium tin oxide containing silicon or silicon oxide (ITSO), indium oxide-zinc oxide (indium zinc oxide), indium oxide-tin oxide containing titanium, indium titanium oxide, or indium oxide containing tungsten oxide and zinc oxide can be used. A metal thin film having a thickness that allows transmission of light (preferably, a thickness greater than or equal to 1 nm and less than or equal to 30 nm) can also be used. As the metal, Ag, an alloy of Ag and Al, an alloy of Ag and Mg, an alloy of Ag and Au, an alloy of Ag and ytterbium (Yb), or the like can be used.

In this specification and the like, as the material transmitting light, a material that transmits visible light and has conductivity is used. Examples of the material include, in addition to the above-described oxide conductor typified by an ITO, an oxide semiconductor and an organic conductor containing an organic substance. Examples of the organic conductor containing an organic substance include a composite material in which an organic compound and an electron donor (donor material) are mixed and a composite material in which an organic compound and an electron acceptor (acceptor material) are mixed. Alternatively, an inorganic carbon-based material such as graphene may be used. The resistivity of the material is preferably lower than or equal to $1 \times 10^5$ Ω·cm, further preferably lower than or equal to $1 \times 10^4$ Ω·cm.

Alternatively, the electrode 101 and/or the electrode 102 may be formed by stacking two or more of these materials.

In order to improve the light extraction efficiency, a material whose refractive index is higher than that of an electrode having a function of transmitting light may be formed in contact with the electrode. The material may be electrically conductive or non-conductive as long as it has a function of transmitting visible light. In addition to the oxide conductors described above, an oxide semiconductor and an organic substance are given as the examples of the material. Examples of the organic substance include the materials for the light-emitting layer, the hole-injection layer, the hole-transport layer, the electron-transport layer, and the electron-injection layer. Alternatively, an inorganic carbon-based material or a metal film thin enough to transmit light can be used. Further alternatively, stacked layers with a thickness of several nanometers to several tens of nanometers may be used.

In the case where the electrode 101 functions as the cathode, the electrode preferably contains a material having a low work function (lower than or equal to 3.8 eV). The examples include an element belonging to Group 1 or 2 of the periodic table (e.g., an alkali metal such as lithium, sodium, or cesium, an alkaline earth metal such as calcium or strontium, or magnesium), an alloy containing any of these elements (e.g., Ag—Mg or Al—Li), a rare earth metal such as europium (Eu) or Yb, an alloy containing any of these rare earth metals, an alloy containing aluminum and silver, and the like.

When the electrode 102 is used as an anode, a material with a high work function (4.0 eV or higher) is preferably used.

The electrode 101 and the electrode 102 may be a stacked layer of a conductive material having a function of reflecting light and a conductive material having a function of transmitting light. In that case, the electrode 101 and the electrode 102 can have a function of adjusting the optical path length so that light of a desired wavelength emitted from each light-emitting layer resonates and is intensified, which is preferable.

As the method for forming the electrode 101 and the electrode 102, a sputtering method, an evaporation method, a printing method, a coating method, a molecular beam epitaxy (MBE) method, a CVD method, a pulsed laser deposition method, an atomic layer deposition (ALD) method, or the like can be used as appropriate.

<<Hole-Injection Layer>>

The hole-injection layer 116 is formed using a transition metal oxide, a phthalocyanine derivative, or an aromatic amine, for example. As the transition metal oxide, molybdenum oxide, vanadium oxide, ruthenium oxide, tungsten oxide, manganese oxide, or the like can be given. As the phthalocyanine derivative, phthalocyanine (abbreviation: $H_2Pc$), metal phthalocyanine such as copper phthalocyanine (abbreviation: CuPc), or the like can be given, for example. As the aromatic amine, a benzidine derivative, a phenylenediamine derivative, or the like can be given. It is also possible to use a high molecular compound such as polythiophene or polyaniline; a typical example thereof is poly (ethylenedioxythiophene)/poly(styrenesulfonic acid), which is self-doped polythiophene. In addition, polyvinylcarbazole and a derivative thereof, polyarylene including an aromatic amine skeleton or a π-electron rich heteroaromatic skeleton in a side chain or a main chain and a derivative thereof, and the like are given as examples.

As the hole-injection layer 116, a layer containing a composite material of a hole-transport material and a material having a property of accepting electrons (acceptor) from the hole-transport material can also be used. Alternatively, a stack of a layer containing a material having an electron accepting property and a layer containing a hole-transport material may also be used. In a steady state or in the presence of an electric field, electric charge can be transferred between these materials. As examples of the material having an electron accepting property, organic acceptors such as a quinodimethane derivative, a chloranil derivative, and a hexaazatriphenylene derivative can be given. A specific example is a compound having an electron-withdrawing group (a halogen group or a cyano group), such as 7,7,8,8-tetracyano-2,3,5,6-tetrafluoroquinodimethane (abbreviation: $F_4$-TCNQ), chloranil, or 2,3,6,7,10,11-hexacyano-1,4,5,8,9,12-hexaazatriphenylene (abbreviation: HAT-CN). Alternatively, a transition metal oxide such as an oxide of a metal from Group 4 to Group 8 can also be used. Specifically, vanadium oxide, niobium oxide, tantalum oxide, chromium oxide, molybdenum oxide, tungsten oxide, manganese oxide, rhenium oxide, or the like can be used. In particular, molybdenum oxide is preferable because it is stable in the air, has a low hygroscopic property, and is easily handled.

A material having a property of transporting more holes than electrons can be used as the hole-transport material, and a material having a hole mobility of $1 \times 10^{-6}$ cm$^2$/Vs or higher is preferable. Specifically, an aromatic amine, a carbazole derivative, an aromatic hydrocarbon, a stilbene derivative, or the like can be used, for example. Furthermore, the hole-transport material may be a high molecular compound.

Examples of the material having a high hole-transport property are aromatic amine compounds such as N,N'-di(p-tolyl)-N,N'-diphenyl-p-phenylenediamine (abbreviation: DTDPPA), 4,4'-bis[N-(4-diphenylaminophenyl)-N-phenylamino]biphenyl (abbreviation: DPAB), N,N'-bis {4-[bis (3-methylphenyl)amino]phenyl}-N,N'-diphenyl-(1,1'-biphenyl)-4,4'-diamine (abbreviation: DNTPD), 1,3,5-tris[N-(4-diphenylaminophenyl)-N-phenylamino]benzene (abbreviation: DPA3B), and the like.

Specific examples of the carbazole derivative are 3-[N-(4-diphenylaminophenyl)-N-phenylamino]-9-phenylcarbazole (abbreviation: PCzDPA1), 3,6-bis[N-(4-diphenylaminophenyl)-N-phenylamino]-9-phenylcarbazole (abbreviation: PCzDPA2), 3,6-bis[N-(4-diphenylaminophenyl)-N-(1-naphthyl)amino]-9-phenylcarbazole (abbreviation: PCzTPN2), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), and the like.

Other examples of the carbazole derivative are 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthryl)phenyl]-9H-carbazole (abbreviation: CzPA), 1,4-bis[4-(N-carbazolyl)phenyl]-2,3,5,6-tetraphenylbenzene, and the like.

Examples of the aromatic hydrocarbon are 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 2-tert-butyl-9,10-bis[2-(1-naphthyl)phenyl]anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, and the like. Other examples are pentacene, coronene, and the like. The aromatic hydrocarbon having a hole mobility of $1 \times 10^{-6}$ cm$^2$/Vs or higher and having 14 to 42 carbon atoms is particularly preferable.

The aromatic hydrocarbon may have a vinyl skeleton. As the aromatic hydrocarbon having a vinyl group, the following are given for example: 4,4'-bis(2,2-diphenylvinyl)biphenyl (abbreviation: DPVBi); 9,10-bis[4-(2,2-diphenylvinyl) phenyl]anthracene (abbreviation: DPVPA); and the like.

Other examples are high molecular compounds such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl) methacrylamide] (abbreviation: PTPDMA), and poly[N,N'-bis(4-butylphenyl)-N,N'-bis(phenyl)benzidine] (abbreviation: poly-TPD).

Examples of the material having a high hole-transport property are aromatic amine compounds such as 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), 4,4',4''-tris(carbazol-9-yl)triphenylamine (abbreviation: TCTA), 4,4',4''-tris[N-(1-naphthyl)-N-phenylamino]triphenylamine (abbreviation: 1'-TNATA), 4,4',4''-tris(N,N-diphenylamino) triphenylamine (abbreviation: TDATA), 4,4',4''-tris[N-(3-methylphenyl)-N-phenylamino]triphenylamine (abbreviation: MTDATA), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), N-(9,9-dimethyl-9H-fluoren-2-yl)-N-{9,9-dimethyl-2-[N-phenyl-N-(9,9-dimethyl-9H-fluoren-2-yl)amino]-9H-fluoren-7-yl}phenylamine (abbreviation: DFLADFL), N-(9,9-dimethyl-2-diphenylamino-9H-fluoren-7-yl)diphenylamine (abbreviation: DPNF), 2-[N-(4-diphenylaminophenyl)-N-phenylamino] spiro-9,9'-bifluorene (abbreviation: DPASF), 4-phenyl-4'-(9-phenyl-9H-carbazol-3-yl)triphenylamine (abbreviation: PCBA1BP), 4,4'-diphenyl-4''-(9-phenyl-9H-carbazol-3-yl) triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4''-(9-phenyl-9H-carbazol-3-yl)triphenylamine (abbreviation: PCBNBB), 4-phenyldiphenyl-(9-phenyl-9H-carbazol-3-yl)amine (abbreviation: PCA1BP), N,N'-bis(9-phenylcarbazol-3-yl)-N,N'-diphenylbenzene-1,3-diamine (abbreviation: PCA2B), N,N',N''-triphenyl-N,N',N''-tris(9-phenylcarbazol-3-yl)benzene-1,3,5-triamine (abbreviation: PCA3B), N-(4-biphenyl)-N-(9,9-dimethyl-9H-fluoren-2-yl)-9-phenyl-9H-carbazol-3-amine (abbreviation: PCBiF), N-(1,1'-biphenyl-4-yl)-N-[4-(9-phenyl-9H-carbazol-3-yl)phenyl]-9,9-dimethyl-9H-fluor en-2-amine (abbreviation: PCBBiF), 9,9-dimethyl-N-phenyl-N-[4-(9-phenyl-9H-carbazol-3-yl)phenyl] fluoren-2-amine (abbreviation: PCBAF), N-phenyl-N-[4-(9-phenyl-9H-carbazol-3-yl)phenyl]spiro-9,9'-bifluoren-2-amine (abbreviation: PCBASF), 2-[N-(9-phenylcarbazol-3-yl)-N-phenylamino]spiro-9,9'-bifluorene (abbreviation: PCASF), 2,7-bis[N-(4-diphenylaminophenyl)-N-phenylamino]-spiro-9,9'-bifluorene (abbreviation: DPA2SF), N-[4-(9H-carbazol-9-yl)phenyl]-N-(4-phenyl)phenylaniline (abbreviation: YGA1BP), and N,N'-bis[4-(carbazol-9-yl) phenyl]-N,N'-diphenyl-9,9-dimethylfluorene-2,7-diamine (abbreviation: YGA2F). Other examples are amine compounds, carbazole compounds, thiophene compounds, furan compounds, fluorene compounds; triphenylene compounds; phenanthrene compounds, and the like such as 3-[4-(1-naphthyl)-phenyl]-9-phenyl-9H-carbazole (abbreviation: PCPN), 3-[4-(9-phenanthryl)-phenyl]-9-phenyl-9H-carbazole (abbreviation: PCPPn), 3,3'-bis(9-phenyl-9H-carbazole) (abbreviation: PCCP), 1,3-bis(N-carbazolyl)benzene (abbreviation: mCP), 3,6-bis(3,5-diphenylphenyl)-9-phenylcarbazole (abbreviation: CzTP), 4-{3-[3-(9-phenyl-9H-fluoren-9-yl)phenyl]phenyl}dibenzofuran (abbreviation: mmDBFFLBi-II), 4,4',4''-(benzene-1,3,5-triyl)tri(dibenzofuran) (abbreviation: DBF3P-II), 1,3,5-tri(dibenzothiophen-4-yl)-benzene (abbreviated as DBT3P-II), 2,8-diphenyl-4-[4-(9-phenyl-9H-fluoren-9-yl)phenyl]dibenzothiophene (abbreviation: DBTFLP-III), 4-[4-(9-phenyl-9H-fluoren-9-yl)phenyl]-6-phenyldibenzothiophene (abbreviation: DBTFLP-IV), and 4-[3-(triphenylen-2-yl)phenyl]dibenzothiophene (abbreviation: mDBTPTp-II). The substances listed here are mainly ones that have a hole mobility of $1\times10^{-6}$ $cm^2/Vs$ or higher. Note that other than these substances, any substance that has a property of transporting more holes than electrons may be used.

<<Hole-Transport Layer>>

The hole-transport layer 115 contains a hole-transport material and can be formed using any of the hole-transport materials given as examples of the materials of the hole-injection layer 116. In order that the hole-transport layer 115 can have a function of transporting holes injected into the hole-injection layer 116 to the light-emitting layer 110, the highest occupied molecular orbital (HOMO) level of the hole-transport layer 115 is preferably equal or close to the HOMO level of the hole-injection layer 116.

As the hole-transport material, a substance having a hole mobility of $1\times10^{-6}$ $cm^2/Vs$ or higher is preferably used. Note that other than these substances, any substance that has a property of transporting more holes than electrons may be used. The layer including a substance having a high hole-transport property is not limited to a single layer, and two or more layers containing the aforementioned substances may be stacked.

<<Electron-Injection Layer>>

The electron-injection layer 112 has a function of reducing a barrier for electron injection from the electrode 101 to promote electron injection and can be formed using a Group 1 metal or a Group 2 metal, or an oxide, a halide, or a carbonate of any of the metals, for example. Alternatively, a composite material containing an electron-transport material (described above) and a material having a property of donating electrons to the electron-transport material can also be used. As the material having an electron donating property, a Group 1 metal, a Group 2 metal, an oxide of the metal, or the like can be given. Specifically, an alkali metal, an alkaline earth metal, or a compound thereof, such as lithium fluoride (LiF), sodium fluoride (NaF), cesium fluoride (CsF), calcium fluoride ($CaF_2$), or lithium oxide ($LiO_x$), can be used. A rare earth metal compound like erbium fluoride ($ErF_3$) can also be used. Electride may also be used for the electron-injection layer 112. Examples of the electride include a substance in which electrons are added at high concentration to calcium oxide-aluminum oxide.

Among the above-described materials, an alkali metal, an alkaline earth metal, or a compound thereof can be used for the buffer layer 118.

A composite material in which an electron-transport material and an electron donor (donor) are mixed may also be used for the electron-injection layer 112. The composite material has a superior electron-injection property and a superior electron-transport property, since electrons are generated in the electron-transport material by the electron donor. The electron-transport material here is preferably a material excellent in transporting the generated electrons; specifically, for example, an electron-transport material such as a metal complex or a heteroaromatic compound can be used. As the electron donor, a substance showing an electron-donating property with respect to the organic compound may be used. Specifically, an alkali metal, an alkaline earth metal, and a rare earth metal are preferable, and lithium, sodium, cesium, magnesium, calcium, erbium, and ytterbium are given. Furthermore, an alkali metal oxide and an alkaline earth metal oxide are preferable, and a lithium oxide, a calcium oxide, a barium oxide, and the like can be given. Alternatively, Lewis base such as magnesium oxide can be used. Further alternatively, an organic compound such as tetrathiafulvalene (abbreviation: TTF) can be used.

As the electron-transport material, a material having a property of transporting more electrons than holes can be used, and a material having an electron mobility of $1\times10^{-6}$ cm$^2$/Vs or higher is preferable. A π-electron deficient heteroaromatic compound such as a nitrogen-containing heteroaromatic compound, a metal complex, or the like can be used. Specific examples include a metal complex having a quinoline ligand, a benzoquinoline ligand, an oxazole ligand, and a thiazole ligand. Other examples include an oxadiazole derivative, a triazole derivative, a phenanthroline derivative, a pyridine derivative, a bipyridine derivative, a pyrimidine derivative, and the like.

Specific examples include metal complexes having a quinoline or benzoquinoline skeleton, such as tris(8-quinolinolato)aluminum(III) (abbreviation: Alq), tris(4-methyl-8-quinolinolato)aluminum(III) (abbreviation: Almq$_3$), bis(10-hydroxybenzo[h]quinolinato)beryllium(II) (abbreviation: BeBq$_2$), bis(2-methyl-8-quinolinolato) (4-phenylphenolato) aluminum(III) (abbreviation: BAlq) and bis(8-quinolinolato)zinc(II) (abbreviation: Znq), and the like. Alternatively, a metal complex having an oxazole-based or thiazole-based ligand, such as bis[2-(2-benzoxazolyl)phenolato]zinc(II) (abbreviation: ZnPBO) or bis[2-(2-benzothiazolyl)phenolato]zinc(II) (abbreviation: ZnBTZ) can be used. Other than such metal complexes, any of the following can be used: heterocyclic compounds such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl) phenyl]-9H-carbazole (abbreviation: CO11), 3-(4-biphenylyl)-4-phenyl-5-(4-tert-butylphenyl)-1,2,4-triazole (abbreviation: TAZ), 2,2',2''-(1,3,5-benzenetriyl)tris(1-phenyl-1H-benzimidazole) (abbreviation: TPBI), 2-[3-(dibenzothiophen-4-yl)phenyl]-1-phenyl-1H-benzimidazole (abbreviation: mDBTBIm-II), bathophenanthroline (abbreviation: BPhen), and bathocuproine (abbreviation: BCP); heterocyclic compounds having a diazine skeleton such as 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[3'-(9H-carbazol-9-yl) biphenyl-3-yl]dibenzo[f,h]quinoxaline (abbreviation: 2mCzBPDBq), 2-[4-(3,6-diphenyl-9H-carbazol-9-yl)phenyl]dibenzo[f,h]quinoxaline (abbreviation: 2CzPDBq-III), 7-[3-(dibenzothiophen-4-yl)phenyl]dibenzo[f,h]quinoxaline (abbreviation: 7mDBTPDBq-II), 6-[3-(dibenzothiophen-4-yl)phenyl]dibenzo[f,h]quinoxaline (abbreviation: 6mDBTPDBq-II), 4,6-bis[3-(phenanthren-9-yl)phenyl]pyrimidine (abbreviation: 4,6mPnP2Pm), 4,6-bis[3-(4-dibenzothienyl) phenyl]pyrimidine (abbreviation: 4,6mDBTP2Pm-II), and 4,6-bis[3-(9H-carbazol-9-yl)phenyl]pyrimidine (abbreviation: 4,6mCzP2Pm); heterocyclic compounds having a triazine skeleton such as 2-{4-[3-(N-phenyl-9H-carbazol-3-yl)-9H-carbazol-9-yl]phenyl}-4,6-diphenyl-1,3,5-triazine (abbreviation: PCCzPTzn); heterocyclic compounds having a pyridine skeleton such as 3,5-bis[3-(9H-carbazol-9-yl) phenyl]pyridine (abbreviation: 35DCzPPy) and 1,3,5-tris[3-(3-pyridyl)-phenyl]benzene (abbreviation: TmPyPB); and heteroaromatic compounds such as 4,4'-bis(5-methylbenzoxazol-2-yl)stilbene (abbreviation: BzOs). Further alternatively, a high molecular compound such as poly(2,5-pyridinediyl) (abbreviation: PPy), poly[(9,9-dihexylfluorene-2,7-diyl)-co-(pyridine-3,5-diyl)](abbreviation: PF-Py) or poly [(9,9-dioctylfluorene-2,7-diyl)-co-(2,2'-bipyridine-6,6'-diyl)] (abbreviation: PF-BPy) can be used. The substances listed here are mainly ones that have an electron mobility of $1\times10^{-6}$ cm$^2$/Vs or higher. However, any substance other than the above-described substances may be used as long as it is a substance whose electron-transport property is higher than the hole-transport property.

<<Electron-Transport Layer>>

The electron-transport layer 113 has a function of transporting, to the light-emitting layer 110, electrons injected from the electrode 101 through the electron-injection layer 112. A material having a property of transporting more electrons than holes can be used as an electron-transport material, and a material having an electron mobility of $1\times10^{-6}$ cm$^2$/Vs or higher is preferable. As the electron-transport material, a π-electron deficient heteroaromatic compound such as a nitrogen-containing heteroaromatic compound, a metal complex, or the like can be used, for example. Specifically, the pyridine derivative, the bipyridine derivative, the pyrimidine derivative, the triazine derivative, the quinoxaline derivative, the dibenzoquinoxaline derivative, the phenanthroline derivative, the triazole derivative, the benzimidazole derivative, the oxadiazole derivative, and the like given as the electron-transport materials that can be used in the electron-injection layer 112 can be given. A substance having an electron mobility of $1\times10^{-6}$ cm$^2$/Vs or higher is preferable. Note that a substance other than the above substances may be used as long as it has a higher electron-transport property than a hole-transport property. The electron-transport layer 113 is not limited to a single layer, and may include stacked two or more layers containing the aforementioned substances.

Any of the above-described electron-transport materials can be used for the buffer layer 117, the buffer layer 119, and the buffer layer 111.

Between the electron-transport layer 113 and the light-emitting layer 110, a layer that controls transport of electron carriers may be provided. This is a layer formed by addition of a small amount of a substance having a high electron-trapping property to a material having a high electron-transport property as described above, and the layer is capable of adjusting carrier balance by suppressing transport of electron carriers. Such a structure is very effective in preventing a problem (such as a reduction in element lifetime) caused when electrons pass through the light-emitting layer.

An n-type compound semiconductor may also be used, and an oxide such as titanium oxide, zinc oxide, silicon oxide, tin oxide, tungsten oxide, tantalum oxide, barium titanate, barium zirconate, zirconium oxide, hafnium oxide, aluminum oxide, yttrium oxide, or zirconium silicate; a nitride such as silicon nitride; cadmium sulfide; zinc selenide; or zinc sulfide can be used, for example.

<<Charge-Generation Layer>>

The charge-generation layer may have either a structure in which an acceptor substance that is an electron acceptor is added to a hole-transport material or a structure in which a donor substance that is an electron donor is added to an electron-transport material. Alternatively, both of these structures may be stacked.

In the case where the charge-generation layer contains a composite material of an organic compound and an acceptor substance, the composite material that can be used for the hole-injection layer may be used for the composite material. As the organic compound, a variety of compounds such as an aromatic amine compound, a carbazole compound, an aromatic hydrocarbon, and a high molecular compound (such as an oligomer, a dendrimer, or a polymer) can be used. An organic compound having a hole mobility of $1×10^{-6}$ cm²/Vs or higher is preferably used as the organic compound. Note that any other material may be used as long as it has a property of transporting more holes than electrons. Since the composite material of an organic compound and an acceptor substance has excellent carrier-injection and carrier-transport properties, low-voltage driving or low-current driving can be realized.

The charge-generation layer may have a stacked-layer structure of a layer containing the composite material of an organic compound and an acceptor substance and a layer containing another material. For example, the charge-generation layer may be formed using a combination of a layer containing the composite material of an organic compound and an acceptor substance with a layer containing one compound selected from among donor materials and a compound having a high electron-transport property. Furthermore, the charge-generation layer may be formed using a combination of a layer containing the composite material of an organic compound and an acceptor substance with a layer containing a transparent conductive material.

Note that in terms of light extraction efficiency, the charge-generation layer preferably has a visible light transmittance (specifically, a visible light transmittance higher than or equal to 40%). The charge-generation layer functions even if it has lower conductivity than the pair of electrodes.

Note that forming the charge-generation layer by using any of the above materials can suppress an increase in driving voltage caused by the stack of the light-emitting layers.

In addition, an electron-relay layer may be formed to be in contact with the charge-generation layer. The electron-relay layer is formed with a material having high electron-transport property. Use of a material having a high electron-transport property enables electrons to be rapidly transported from the charge-generation layer into the buffer layer.

As the substance having a high electron-transport property contained in the electron-relay layer, a phthalocyanine-based material or a metal complex having a metal-oxygen bond and an aromatic ligand is preferably used.

As the metal complex having a metal-oxygen bond and an aromatic ligand, which is contained in the electron-relay layer, a metal complex having a metal-oxygen double bond is preferably used. The metal-oxygen double bond has an acceptor property (a property of easily accepting electrons); thus, electrons can be transferred (donated and accepted) more easily. Further, the metal complex having a metal-oxygen double bond is considered stable. Thus, the use of the metal complex having the metal-oxygen double bond makes it possible to drive the light-emitting element at low voltage more stably.

As a metal complex having a metal-oxygen bond and an aromatic ligand, a phthalocyanine-based material is preferable. In particular, it is preferable to use a material in which a metal-oxygen double bond is likely to act on another molecule in terms of a molecular structure and which has a high acceptor property.

Note that as the phthalocyanine-based materials described above, a phthalocyanine-based material having a phenoxy group is preferable. Specifically, a phthalocyanine derivative having a phenoxy group, such as PhO-VOPc, is preferable. A phthalocyanine derivative having a phenoxy group is soluble in a solvent. For that reason, such a phthalocyanine derivative has an advantage of being easily handled during formation of a light-emitting element. In addition, the phthalocyanine derivative having a phenoxy group, which is soluble in a solvent, also has a merit of easy maintenance of an apparatus for forming its film.

<<Light-Emitting Layer>>

Each of the light-emitting layers (the light-emitting layer 110 and the light-emitting layer 120) includes a light-emitting material having a peak of an emission spectrum in a wavelength range of at least one color selected from violet, blue, blue green, green, yellow green, yellow, yellow orange, orange, and red. Each light-emitting layer includes a host material in addition to the light-emitting material (guest material). The host material preferably includes one or both of an electron-transport material and a hole-transport material.

As the light-emitting material used in the light-emitting layer, a light-emitting material having a function of converting the singlet excitation energy into light emission or a light-emitting material having a function of converting the triplet excitation energy into light emission can be used. Examples of the light-emitting materials are given below.

Examples of the light-emitting material having a function of converting singlet excitation energy into light emission include substances that emit fluorescence (fluorescent compound). Although there is no particular limitation on the fluorescent compound, an anthracene derivative, a tetracene derivative, a chrysene derivative, a phenanthrene derivative, a pyrene derivative, a perylene derivative, a stilbene derivative, an acridone derivative, a coumarin derivative, a phenoxazine derivative, a phenothiazine derivative, or the like is preferably used, and for example, any of the following substances can be used.

Specifically, examples of such materials include 5,6-bis[4-(10-phenyl-9-anthryl)phenyl]-2,2'-bipyridine (abbreviation: PAP2BPy), 5,6-bis[4'-(10-phenyl-9-anthryl)biphenyl-4-yl]-2,2'-bipyridine (abbreviation: PAPP2BPy), N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), 4-(10-phenyl-9-anthryl)-4'-(9-phenyl-9H-carbazol-3-yl)triphenylamine (abbreviation: PCBAPA), 4-[4-(10-phenyl-9-anthryl)phenyl]-4'-(9-phenyl-9H-carbazol-3-yl)triphenylamine (abbreviation: PCBAPBA), perylene, 2,5,8,11-tetra(tert-butyl)perylene (abbreviation: TBP), N,N'-diphenyl-N,N'-bis[4-(9-phenyl-9H-fluoren-9-yl)phenyl]pyrene-1,6-diamine (abbreviation: 1,6FLPAPm), N,N'-bis(3-methylphenyl)-N,N'-bis[3-(9-phenyl-9H-fluoren-9-yl)phenyl]-pyrene-1,6-diamine (abbreviation 1,6mMemFLPAPm), N,N'-bis(dibenzofuran-2-yl)-N,N'-diphenylpyrene-1,6-diamine (abbreviation: 1,6FrAPm), N,N'-bis(dibenzothiophen-2-yl)-N,N'-diphenylpyrene-1,6-diamine (abbreviation: 1,6ThAPm), N,N'-(2-tert-butylanthracene-9,10-diyldi-4,1-phenylene)bis[N,N',N'-triphenyl-1,4-phenylenediamine] (abbreviation: DPABPA), N,9-diphenyl-N-[4-(9,10-diphenyl-2-anthryl)phenyl]-9H-carbazol-3-amine (abbreviation: 2PCAPPA), N-[4-(9,10-diphenyl-2-anthryl)phenyl]-N,N',N'-triphenyl-1,4-phenylenediamine (abbreviation: 2DPAPPA), N,N,N',N',N'',N'',N''',N'''-octaphenyl dibenzo[g,p]chrysene-2,7,10,15-tetraamine (abbreviation: DBC1), coumarin 30, N-(9,10-diphenyl-2-anthryl)-N,9-diphenyl-9H-carbazol-3-amine (abbreviation: 2PCAPA), N-(9,10-diphenyl-2-anthryl)-N,N',N'-triphenyl-1,4-phenylenediamine (abbreviation: 2DPAPA), N,N,9-triphenylanthracen-9-amine (abbreviation: DPhAPhA), coumarin 6, coumarin 545T, N,N'-diphenylquinacridone (abbreviation: DPQd), rubrene, 5,12-bis(1,1'-biphenyl-4-yl)-6,11-diphenyltetracene (abbreviation: BPT), 2-(2-{2-[4-(dimethylamino)phenyl]ethenyl}-6-methyl-4H-pyran-4-ylidene)propanedinitrile (abbreviation: DCM1), 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2), N,N,N',N'-tetrakis(4-methylphenyl)tetracene-5,11-diamine (abbreviation: p-mPhTD), 7,14-diphenyl-N,N,N',N'-tetrakis(4-methylphenyl)acenaphtho[1,2-a]fluoranthene-3,10-diamine (abbreviation: p-mPhAFD), 2-{2-isopropyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB), 2-(2,6-bis{2-[4-(dimethylamino)phenyl]ethenyl}-4H-pyran-4-ylidene)propanedinitrile (abbreviation: BisDCM), 2-{2,6-bis[2-(8-methoxy-1,1,7,7-tetramethyl-2,3,6,7-tetrahydro-1H,5H-benzo[ij]quinolizin-9-yl)ethenyl]-4H-pyran-4-ylidene}propanedinitrile (abbreviation: BisDCJTM), and 5,10,15,20-tetraphenylbisbenzo[5,6]indeno[1,2,3-cd: 1',2',3'-lm]perylene.

As the light-emitting material having a function of converting triplet excitation energy into light emission (phosphorescent compound), an iridium-, rhodium-, or platinum-based organometallic complex or metal complex can be used; in particular, an organoiridium complex such as an iridium-based ortho-metalated complex is preferable. As an ortho-metalated ligand, a 4H-triazole ligand, a 1H-triazole ligand, an imidazole ligand, a pyridine ligand, a pyrimidine ligand, a pyrazine ligand, an isoquinoline ligand, or the like can be given. As the metal complex, a platinum complex having a porphyrin ligand or the like can be given.

Examples of the substance that has an emission peak in the blue or green wavelength range include organometallic iridium complexes having a 4H-triazole skeleton, such as tris {2-[5-(2-methylphenyl)-4-(2,6-dimethylphenyl)-4H-1,2,4-triazol-3-yl-κN2]phenyl-κC}iridium(III) (abbreviation: Ir(mpptz-dmp)$_3$), tris(5-methyl-3,4-diphenyl-4H-1,2,4-triazolato)iridium(III) (abbreviation: Ir(Mptz)$_3$), tris[4-(3-biphenyl)-5-isopropyl-3-phenyl-4H-1,2,4-triazolato]iridium (III) (abbreviation: Ir(iPrptz-3b)$_3$), and tris[3-(5-biphenyl)-5-isopropyl-4-phenyl-4H-1,2,4-triazolato]iridium(III) (abbreviation: Ir(iPr5btz)$_3$); organometallic iridium complexes having a 1H-triazole skeleton, such as tris[3-methyl-1-(2-methylphenyl)-5-phenyl-1H-1,2,4-triazolato]iridium (III) (abbreviation: Ir(Mptz 1-mp)$_3$) and tris(1-methyl-5-phenyl-3-propyl-1H-1,2,4-triazolato)iridium(III) (abbreviation: Ir(Prptz1-Me)$_3$); organometallic iridium complexes having an imidazole skeleton, such as fac-tris[1-(2,6-diisopropylphenyl)-2-phenyl-1H-imidazole]iridium(III) (abbreviation: Ir(iPrpmi)$_3$) and tris[3-(2,6-dimethylphenyl)-7-methylimidazo[1,2-]phenanthridinato]iridium(III) (abbreviation: Ir(dmpimpt-Me)$_3$); and organometallic iridium complexes in which a phenylpyridine derivative having an electron-withdrawing group is a ligand, such as bis[2-(4',6'-difluorophenyl)pyridinato-N,C$^{2'}$]iridium(III) tetrakis(1-pyrazolyl)borate (abbreviation: FIr6), bis[2-(4',6'-difluorophenyl)pyridinato-N,C$^{2'}$]iridium(III) picolinate (abbreviation: FIrpic), bis {2-[3',5'-bis(trifluoromethyl)phenyl]pyridinato-N,C$^{2'}$}iridium(III)picolinate (abbreviation: Ir(CF$_3$ppy)$_2$(pic)), and bis[2-(4',6'-difluorophenyl)pyridinato-N,C$^{2'}$]iridium(III) acetylacetonate (abbreviation: FIr(acac)). Among the materials given above, the organometallic iridium complexes having a 4H-triazole skeleton have high reliability and high emission efficiency and are thus especially preferable.

Examples of the substance that has an emission peak in the green or yellow wavelength range include organometallic iridium complexes having a pyrimidine skeleton, such as tris(4-methyl-6-phenylpyrimidinato)iridium(III) (abbreviation: Ir(mppm)$_3$), tris(4-t-butyl-6-phenylpyrimidinato) iridium(III) (abbreviation: Ir(tBuppm)$_3$), (acetylacetonato) bis(6-methyl-4-phenylpyrimidinato)iridium(III) (abbreviation: Ir(mppm)$_2$(acac)), (acetylacetonato)bis(6-tert-butyl-4-phenylpyrimidinato)iridium(III) (abbreviation: Ir(tBuppm)$_2$(acac)), (acetylacetonato)bis[4-(2-norbornyl)-6-phenylpyrimidinato]iridium(III) (abbreviation: Ir(nbppm)$_2$ (acac)), (acetylacetonato)bis[5-methyl-6-(2-methylphenyl)-4-phenylpyrimidinato]iridium(III) (abbreviation: Ir(mpmppm)$_2$(acac)), (acetylacetonato)bis {4,6-dimethyl-2-[6-(2,6-dimethylphenyl)-4-pyrimidinyl-κN3]phenyl-κC}iridium(III) (abbreviation: Ir(dmppm-dmp)$_2$(acac)), (acetylacetonato)bis(4,6-diphenylpyrimidinato)iridium(III) (abbreviation: Ir(dppm)$_2$(acac)); organometallic iridium complexes having a pyrazine skeleton, such as (acetylacetonato)bis(3,5-dimethyl-2-phenylpyrazinato)iridium(III) (abbreviation: Ir(mppr-Me)$_2$(acac)) and (acetylacetonato)bis (5-isopropyl-3-methyl-2-phenylpyrazinato)iridium(III) (abbreviation: Ir(mppr-iPr)$_2$(acac)); organometallic iridium complexes having a pyridine skeleton, such as tris(2-phenylpyridinato-N,C$^{2'}$)iridium(III) (abbreviation: Ir(ppy)$_3$), bis(2-phenylpyridinato-N,C$^{2'}$)iridium(III) acetylacetonate (abbreviation: Ir(ppy)$_2$(acac)), bis(benzo[h]quinolinato) iridium(III) acetylacetonate (abbreviation: Ir(bzq)$_2$(acac)), tris(benzo[h]quinolinato)iridium(III) (abbreviation: Ir(bzq)$_3$), tris(2-phenylquinolinato-N,C$^{2'}$)iridium(III) (abbreviation: Ir(pq)$_3$), and bis(2-phenylquinolinato-N,C$^{2'}$) iridium(III) acetylacetonate (abbreviation: Ir(pq)$_2$(acac)); organometallic iridium complexes such as bis(2,4-diphenyl-1,3-oxazolato-N,C$^{2'}$)iridium(III) acetylacetonate (abbreviation: Ir(dpo)$_2$(acac)), bis {2-[4'-(perfluorophenyl)phenyl] pyridinato-N,C$^{2'}$ }iridium(III) acetylacetonate (abbreviation: Ir(p-PF-ph)$_2$(acac)), and bis(2-phenylbenzothiazolato-N,C$^{2'}$)iridium(III) acetylacetonate (abbreviation: Ir(bt)$_2$(acac)); and a rare earth metal complex such as tris(acetylacetonato)(monophenanthroline)terbium(III) (abbreviation: Tb(acac)$_3$(Phen)). Among the materials given above, the organometallic iridium complexes having a pyrimidine skeleton have distinctively high reliability and emission efficiency and are thus particularly preferable.

Examples of the substance that has an emission peak in the yellow or red wavelength range include organometallic iridium complexes having a pyrimidine skeleton, such as (diisobutyrylmethanato)bis[4,6-bis(3-methylphenyl)pyrimidinato]iridium(III) (abbreviation: Ir(5mdppm)$_2$(dibm)), bis [4,6-bis(3-methylphenyl)pyrimidinato](dipivaloylmethanato)iridium(III) (abbreviation: Ir(5mdppm)$_2$(dpm)), and (dipivaloylmethanato)bis[4,6-di(naphthalen-1-yl)pyrimidinato]iridium(III) (abbreviation: Ir(d1npm)$_2$(dpm)); organometallic iridium complexes having a pyrazine skeleton, such as (acetylacetonato)bis(2,3,5-triphenylpyrazinato)iridium (III) (abbreviation: Ir(tppr)$_2$(acac)), bis(2,3,5-triphenylpyrazinato)(dipivaloylmethanato)iridium(III) (abbreviation: Ir(tppr)$_2$(dpm)), and (acetylacetonato)bis[2,3-bis(4-fluorophenyl)quinoxalinato]iridium(III) (abbreviation: Ir(Fdpq)$_2$(acac)); organometallic iridium complexes having a pyridine skeleton, such as tris(1-phenylisoquinolinato-N, C$^{2'}$)iridium(III) (abbreviation: Ir(piq)$_3$) and bis(1-phenylisoquinolinato-N,C$^{2'}$)iridium(III) acetylacetonate (abbreviation: Ir(piq)$_2$(acac)); a platinum complex such as 2,3,7,8,12, 13,17,18-octaethyl-21H,23H-porphyrin platinum(II) (abbreviation: PtOEP); and rare earth metal complexes such as tris(1,3-diphenyl-1,3-propanedionato)(monophenanthroline)europium(III) (abbreviation: Eu(DBM)$_3$(Phen)) and tris[1-(2-thenoyl)-3,3,3-trifluoroacetonato](monophenanthroline)europium(III) (abbreviation: Eu(TTA)$_3$(Phen)). Among the materials given above, the organometallic iridium complexes having a pyrimidine skeleton have distinctively high reliability and emission efficiency and are thus particularly preferable. Furthermore, the organometallic iridium complexes having a pyrazine skeleton can provide red light emission with favorable chromaticity.

Although there is no particular limitation on a material that can be used as a host material of the light-emitting layer, for example, any of the following substances can be used for the host material: metal complexes such as tris(8-quinolinolato)aluminum(III) (abbreviation: Alq), tris(4-methyl-8-quinolinolato)aluminum(III) (abbreviation: Almq$_3$), bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), and bis[2-(2-benzothiazolyl)phenolato]zinc(II) (abbreviation: ZnBTZ); heterocyclic compounds such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), 2,2',2"-(1,3,5-benzenetriyl)tris(1-phenyl-1H-benzimidazole) (abbreviation: TPBI), bathophenanthroline (abbreviation: Bphen), bathocuproine (abbreviation: BCP), and 9-[4-(5-phenyl-1,3,4-oxadiazol-2-yl)phenyl]-9H-carbazole (abbreviation: CO11); and aromatic amine compounds such as 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), and 4,4'-bis[N-(spiro-9,9'-bifluoren-2-yl)-N-phenylamino]biphenyl (abbreviation: BSPB). In addition, condensed polycyclic aromatic compounds such as anthracene derivatives, phenanthrene derivatives, pyrene derivatives, chrysene derivatives, and dibenzo[g,p]chrysene derivatives can be used. Specific examples of the condensed polycyclic aromatic compound include 9,10-diphenylanthracene (abbreviation: DPAnth), N,N-diphenyl-9-[4-(10-phenyl-9-anthryl)phenyl]-9H-carbazol-3-amine (abbreviation: CzA1PA), 4-(10-phenyl-9-anthryl)triphenylamine (abbreviation: DPhPA), YGAPA, PCAPA, N,9-diphenyl-N-{4-[4-(10-phenyl-9-anthryl)phenyl]phenyl}-9H-carbazol-3-amine (abbreviation: PCAPBA), 2PCAPA, 6,12-dimethoxy-5,11-diphenylchrysene, DBC1, 9-[4-(10-phenyl-9-anthracenyl)phenyl]-9H-carbazole (abbreviation: CzPA), 3,6-diphenyl-9-[4-(10-phenyl-9-anthryl)phenyl]-9H-carbazole (abbreviation: DPCzPA), 9-phenyl-3-[4-(10-phenyl-9-anthryl)phenyl]-9H-carbazole (abbreviation: PCzPA), 7-[4-(10-phenyl-9-anthryl)phenyl]-7H-dibenzo[c,g]carbazole (abbreviation: cgDBCzPA), 6-[3-(9,10-diphenyl-2-anthryl)phenyl]-benzo[b]naphtho[1,2-d]furan (abbreviation: 2mBnfPPA), 9-phenyl-10-{4-(9-phenyl-9H-fluoren-9-yl)biphenyl-4'-yl}anthracene (abbreviation: FLPPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), 1,3,5-tri(1-pyrenyl)benzene (abbreviation: TPB3), 5,12-diphenyltetracene, 5,12-bis(biphenyl-2-yl)tetracene, and the like. One or more substances having a wider energy gap than the above-described light-emitting material is preferably selected from these substances and a variety of substances. Moreover, in the case where the light-emitting material emits phosphorescence, a substance having triplet excitation energy (energy difference between a ground state and a triplet excited state) which is higher than that of the light-emitting material is preferably selected as the host material.

In the case where a plurality of materials are used as the host material of the light-emitting layer, it is preferable to use a combination of two kinds of compounds which form an exciplex. In this case, a variety of carrier-transport materials can be used as appropriate. In order to form an exciplex efficiently, it is particularly preferable to combine an electron-transport material and a hole-transport material.

This is because in the case where the combination of an electron-transport material and a hole-transport material which form an exciplex is used as a host material, the carrier balance between holes and electrons in the light-emitting layer can be easily optimized by adjustment of the mixture ratio of the electron-transport material and the hole-transport material. The optimization of the carrier balance between holes and electrons in the light-emitting layer can prevent a region in which electrons and holes are recombined from existing on one side in the light-emitting layer. By preventing the region in which electrons and holes are recombined from existing on one side, the reliability of the light-emitting element can be improved.

As the electron-transport material, a π-electron deficient heteroaromatic compound such as a nitrogen-containing heteroaromatic compound, a metal complex, or the like can be used. Specifically, an electron-transport material that can be used for an electron-injection layer or an electron-transport layer can be used. Among such materials, heterocyclic compounds having a pyridine skeleton, a diazine skeleton, or a triazine skeleton have high reliability and are thus preferable. Heterocyclic compounds having a diazine (pyrimidine or pyrazine) skeleton or a triazine skeleton have a high electron-transport property and contribute to a reduction in driving voltage.

As the hole-transport material, a π-electron rich heteroaromatic compound (e.g., a carbazole derivative or an indole derivative), an aromatic amine compound, or the like can be favorably used. Specifically, the hole-transport material that can be used for the hole-injection layer or the hole-transport layer can be used. Among such materials, a compound having an aromatic amine skeleton and a compound having a carbazole skeleton are preferable because these compounds are highly reliable and have high hole-transport properties to contribute to a reduction in driving voltage.

Note that the combination of the materials which form an exciplex and is used as a host material is not limited to the above-described compounds, as long as they can transport carriers, the combination can form an exciplex, and light emission of the exciplex overlaps with an absorption band on the longest wavelength side in an absorption spectrum of a light-emitting substance (an absorption corresponding to the transition of the light-emitting substance from the singlet ground state to the singlet excited state), and other materials may be used.

In order that the above-described hole-transport material and the electron-transport material efficiently form an exciplex, it is preferable that the HOMO level of the hole-transport material be higher than that of the electron-transport material and the lowest unoccupied molecular orbital (LUMO) level of the hole-transport material be higher than the LUMO level of the electron-transport material. Specifically, the difference between the HOMO level of the hole-transport material and the HOMO level of the electron-transport material is preferably 0.05 eV or more, further preferably 0.1 eV or more, and still further preferably 0.2 eV or more. In addition, the difference between the LUMO level of the hole-transport material and the LUMO level of the electron-transport material is preferably 0.05 eV or more, further preferably 0.1 eV or more, and still further preferably 0.2 eV or more.

As the light-emitting material or host material of the light-emitting layer, a thermally activated delayed fluorescent (TADF) substance may be used. The thermally activated delayed fluorescent substance is a material having a small difference between the level of the triplet excitation energy and the level of the singlet excitation energy and a function of converting triplet excitation energy into singlet excitation energy by reverse intersystem crossing. Conditions for efficiently obtaining thermally activated delayed fluorescence are as follows: the energy difference between the S1 level and the T1 level is preferably greater than 0 eV and less than or equal to 0.3 eV, further preferably greater than 0 eV and less than or equal to 0.2 eV, still further preferably greater than 0 eV and less than or equal to 0.1 eV.

The thermally activated delayed fluorescent substance may be composed of one kind of material or a plurality of materials. For example, in the case where the thermally activated delayed fluorescent substance is composed of one kind of material, any of the following materials can be used, for example.

First, a fullerene, a derivative thereof, an acridine derivative such as proflavine, eosin, and the like can be given. Furthermore, a metal-containing porphyrin, such as a porphyrin containing magnesium (Mg), zinc (Zn), cadmium (Cd), tin (Sn), platinum (Pt), indium (In), or palladium (Pd), can be given. Examples of the metal-containing porphyrin include a protoporphyrin-tin fluoride complex ($SnF_2$(Proto IX)), a mesoporphyrin-tin fluoride complex ($SnF_2$(Meso IX)), a hematoporphyrin-tin fluoride complex ($SnF_2$(Hemato IX)), a coproporphyrin tetramethyl ester-tin fluoride complex ($SnF_2$(Copro III-4Me)), an octaethylporphyrin-tin fluoride complex ($SnF_2$(OEP)), an etioporphyrin-tin fluoride complex ($SnF_2$(Etio I)), and an octaethylporphyrin-platinum chloride complex ($PtCl_2$OEP).

Alternatively, a heterocyclic compound having a π-electron rich heteroaromatic ring and a π-electron deficient heteroaromatic ring, such as 2-(biphenyl-4-yl)-4,6-bis(12-phenylindolo[2,3-a]carbazol-11-yl)-1,3,5-triazine (abbreviation: PIC-TRZ), 2-{4-[3-(N-phenyl-9H-carbazol-3-yl)-9H-carbazol-9-yl]phenyl}-4,6-diphenyl-1,3,5-triazine (abbreviation: PCCzPTzn), 2-[4-(10H-phenoxazin-10-yl)phenyl]-4,6-diphenyl-1,3,5-triazine (abbreviation: PXZ-TRZ), 3-[4-(5-phenyl-5,10-dihydrophenazin-10-yl)phenyl]-4,5-diphenyl-1,2,4-triazole (abbreviation: PPZ-3TPT), 3-(9,9-dimethyl-9H-acridin-10-yl)-9H-xanthen-9-one (abbreviation: ACRXTN), bis[4-(9,9-dimethyl-9,10-dihydroacridine)phenyl]sulfone (abbreviation: DMAC-DPS), or 10-phenyl-10H,10'H-spiro[acridin-9,9'-anthracen]-10'-one (abbreviation: ACRSA), can be used for example as the thermally activated delayed fluorescent substance composed of one kind of material. The heterocyclic compound is preferably used because of the π-electron rich heteroaromatic ring and the π-electron deficient heteroaromatic ring, for which the electron-transport property and the hole-transport property are high. Note that a substance in which the π-electron rich heteroaromatic ring is directly bonded to the π-electron deficient heteroaromatic ring is particularly preferably used because the donor property of the π-electron rich heteroaromatic ring and the acceptor property of the π-electron deficient heteroaromatic ring are both increased and the difference between the level of the singlet excitation energy and the level of the triplet excitation energy becomes small.

In the case where the thermally activated delayed fluorescent substance is used as the host material, it is preferable to use a combination of two kinds of materials which form an exciplex. In this case, it is particularly preferable to use the above-described combination of an electron-transport material and a hole-transport material, which forms an exciplex.

In the light-emitting layer, a material other than the host material and the light-emitting material may be contained.

The light-emitting layer can have a structure in which two or more layers are stacked. For example, in the case where the light-emitting layer is formed by stacking a first light-emitting layer and a second light-emitting layer in this order from the hole-transport layer side, the first light-emitting layer is formed using a material having a hole-transport property as the host material and the second light-emitting layer is formed using a material having an electron-transport property as the host material. A light-emitting material included in the first light-emitting layer may be the same as or different from a light-emitting material included in the second light-emitting layer. In addition, the materials may have functions of emitting light of the same color or light of different colors. Two kinds of light-emitting materials having functions of emitting light of different colors are used for the two light-emitting layers, so that light of a plurality of emission colors can be obtained at the same time. It is particularly preferable to select light-emitting materials of the light-emitting layers so that white light can be obtained by combining light emission from the two light-emitting layers.

Note that the light-emitting layer, the hole-injection layer, the hole-transport layer, the electron-transport layer, the electron-injection layer, and the charge-generation layer described above can each be formed by an evaporation method (including a vacuum evaporation method), an ink-jet method, a coating method, a nozzle-printing method, a gravure printing method, or the like. Besides the above-mentioned materials, an inorganic compound such as a quantum dot or a high molecular compound (e.g., an oligomer, a dendrimer, or a polymer) may be used for the above-described light-emitting layer, hole-injection layer, hole-transport layer, electron-transport layer, electron-injection layer, and charge-generation layer.

As a light-emitting material, a quantum dot can be used. A quantum dot is a semiconductor nanocrystal with a size of several nanometers and contains approximately $1 \times 10^3$ to $1 \times 10^6$ atoms. Since energy shift of quantum dots depend on their size, quantum dots made of the same substance emit light with different wavelengths depending on their size. Thus, emission wavelengths can be easily adjusted by changing the size of quantum dots.

Since a quantum dot has an emission spectrum with a narrow peak, emission with high color purity can be obtained. In addition, a quantum dot is said to have a theoretical internal quantum efficiency of 100%, which far exceeds that of a fluorescent organic compound, i.e., 25%, and is comparable to that of a phosphorescent organic compound. Therefore, a quantum dot can be used as a light-emitting material to obtain a light-emitting element having high luminous efficiency. Furthermore, since a quantum dot which is an inorganic material has high inherent stability, a light-emitting element which is favorable also in terms of lifetime can be obtained.

Examples of a material of a quantum dot include a Group 14 element in the periodic table, a Group 15 element in the periodic table, a Group 16 element in the periodic table, a compound of a plurality of Group 14 elements in the periodic table, a compound of an element belonging to any of Groups 4 to 14 in the periodic table and a Group 16 element in the periodic table, a compound of a Group 2 element in the periodic table and a Group 16 element in the periodic table, a compound of a Group 13 element in the periodic table and a Group 15 element in the periodic table, a compound of a Group 13 element in the periodic table and a Group 17 element in the periodic table, a compound of a Group 14 element in the periodic table and a Group 15 element in the periodic table, a compound of a Group 11 element in the periodic table and a Group 17 element in the periodic table, iron oxides, titanium oxides, spinel chalcogenides, and semiconductor clusters.

Specific examples include, but are not limited to, cadmium selenide (CdSe); cadmium sulfide (CdS); cadmium telluride (CdTe); zinc selenide (ZnSe); zinc oxide (ZnO); zinc sulfide (ZnS); zinc telluride (ZnTe); mercury sulfide (HgS); mercury selenide (HgSe); mercury telluride (HgTe); indium arsenide (InAs); indium phosphide (InP); gallium arsenide (GaAs); gallium phosphide (GaP); indium nitride (InN); gallium nitride (GaN); indium antimonide (InSb); gallium antimonide (GaSb); aluminum phosphide (AlP); aluminum arsenide (AlAs); aluminum antimonide (AlSb); lead(II) selenide (PbSe); lead(II) telluride (PbTe); lead(II) sulfide (PbS); indium selenide ($In_2Se_3$); indium telluride ($In_2Te_3$); indium sulfide ($In_2S_3$); gallium selenide ($Ga_2Se_3$); arsenic(III) sulfide ($As_2S_3$); arsenic(III) selenide ($As_2Se_3$); arsenic(III) telluride ($As_2Te_3$); antimony(III) sulfide ($Sb_2S3$); antimony(III) selenide ($Sb_2Se_3$); antimony(III) telluride ($Sb_2Te_3$); bismuth(III) sulfide ($Bi_2S3$); bismuth(III) selenide ($Bi_2Se_3$); bismuth(III) telluride ($Bi_2Te_3$); silicon (Si); silicon carbide (SiC); germanium (Ge); tin (Sn); selenium (Se); tellurium (Te); boron (B); carbon (C); phosphorus (P); boron nitride (BN); boron phosphide (BP); boron arsenide (BAs); aluminum nitride (AlN); aluminum sulfide ($Al_2S_3$); barium sulfide (BaS); barium selenide (BaSe); barium telluride (BaTe); calcium sulfide (CaS); calcium selenide (CaSe); calcium telluride (CaTe); beryllium sulfide (BeS); beryllium selenide (BeSe); beryllium telluride (BeTe); magnesium sulfide (MgS); magnesium selenide (MgSe); germanium sulfide (GeS); germanium selenide (GeSe); germanium telluride (GeTe); tin(IV) sulfide ($SnS_2$); tin(II) sulfide (SnS); tin(II) selenide (SnSe); tin(II) telluride (SnTe); lead(II) oxide (PbO); copper(I) fluoride (CuF); copper(I) chloride (CuCl); copper(I) bromide (CuBr); copper(I) iodide (CuI); copper(I) oxide ($Cu_2O$); copper(I) selenide ($Cu_2Se$); nickel(II) oxide (NiO); cobalt(II) oxide (CoO); cobalt(II) sulfide (CoS); triiron tetraoxide ($Fe_3O_4$); iron(II) sulfide (FeS); manganese(II) oxide (MnO); molybdenum(IV) sulfide ($MoS_2$); vanadium(II) oxide (VO); vanadium(IV) oxide ($VO_2$); tungsten(IV) oxide ($WO_2$); tantalum (V) oxide ($Ta_2O_5$); titanium oxide (e.g., $TiO_2$, $Ti_2O_5$, $Ti_2O_3$, or $Ti_5O_9$); zirconium oxide ($ZrO_2$); silicon nitride ($Si_3N_4$); germanium nitride ($Ge_3N_4$); aluminum oxide ($Al_2O_3$); barium titanate ($BaTiO_3$); a compound of selenium, zinc, and cadmium (CdZnSe); a compound of indium, arsenic, and phosphorus (InAsP); a compound of cadmium, selenium, and sulfur (CdSeS); a compound of cadmium, selenium, and tellurium (CdSeTe); a compound of indium, gallium, and arsenic (InGaAs); a compound of indium, gallium, and selenium (InGaSe); a compound of indium, selenium, and sulfur (InSeS); a compound of copper, indium, and sulfur (e.g., $CuInS_2$); and combinations thereof. What is called an alloyed quantum dot, whose composition is represented by a given ratio, may be used. For example, an alloyed quantum dot represented by $CdS_xSe_{1-x}$ (where x is any number between 0 and 1 inclusive) is a means effective in obtaining blue light because the emission wavelength can be changed by changing x.

As the quantum dot, any of a core-type quantum dot, a core-shell quantum dot, a core-multishell quantum dot, and the like can be used. Note that when a core is covered with a shell formed of another inorganic material having a wider band gap, the influence of defects and dangling bonds existing at the surface of a nanocrystal can be reduced. Since such a structure can significantly improve the quantum efficiency of light emission, it is preferable to use a core-shell or core-multishell quantum dot. Examples of the material of a shell include zinc sulfide (ZnS) and zinc oxide (ZnO).

Quantum dots have a high proportion of surface atoms and thus have high reactivity and easily cohere together. For this reason, it is preferable that a protective agent be attached to, or a protective group be provided at the surfaces of quantum dots. The attachment of the protective agent or the provision of the protective group can prevent cohesion and increase solubility in a solvent. It can also reduce reactivity and improve electrical stability. Examples of the protective agent (or the protective group) include polyoxyethylene alkyl ethers such as polyoxyethylene lauryl ether, polyoxyethylene stearyl ether, and polyoxyethylene oleyl ether; trialkylphosphines such as tripropylphosphine, tributylphosphine, trihexylphosphine, and trioctylphoshine; polyoxyethylene alkylphenyl ethers such as polyoxyethylene n-octylphenyl ether and polyoxyethylene n-nonylphenyl ether; tertiary amines such as tri(n-hexyl)amine, tri(n-octyl)amine, and tri(n-decyl)amine; organophosphorus compounds such as tripropylphosphine oxide, tributylphosphine oxide, trihexylphosphine oxide, trioctylphosphine oxide, and tridecylphosphine oxide; polyethylene glycol diesters such as polyethylene glycol dilaurate and polyethylene glycol distearate; organic nitrogen compounds such as nitrogen-containing aromatic compounds, e.g., pyridines, lutidines, collidines, and quinolines; aminoalkanes such as hexylamine, octylamine, decylamine, dodecylamine, tetradecylamine, hexadecylamine, and octadecylamine; dialkylsulfides such as dibutylsulfide; dialkylsulfoxides such as dimethylsulfoxide and dibutylsulfoxide; organic sulfur compounds such as sulfur-containing aromatic compounds, e.g., thiophene; higher fatty acids such as a palmitin acid, a stearic acid, and an oleic acid; alcohols; sorbitan fatty acid esters; fatty acid modified polyesters; tertiary amine modified polyurethanes; and polyethyleneimines.

The quantum dots may be quantum rods, which are rod-like shape quantum dots. A quantum rod emits directional light polarized in the c-axis direction; thus, quantum rods can be used as a light-emitting material to obtain a light-emitting element with higher external quantum efficiency.

In the case of using quantum dots as the light-emitting material in the light-emitting layer, the thickness of the light-emitting layer is set to 3 nm to 100 nm, preferably 10 nm to 100 nm, and the light-emitting layer is made to contain 1 volume % to 100 volume % of the quantum dots. Note that it is preferable that the light-emitting layer be composed of the quantum dots. To form a light-emitting layer in which the quantum dots are dispersed as light-emitting materials in host materials, the quantum dots may be dispersed in the host materials, or the host materials and the quantum dots may be dissolved or dispersed in an appropriate liquid medium, and then a wet process (e.g., a spin coating method, a casting method, a die coating method, a blade coating method, a roll coating method, an ink-jet method, a printing method, a spray coating method, a curtain coating method, or a Langmuir-Blodgett method) may be employed.

An example of the liquid medium used for the wet process is an organic solvent of ketones such as methyl ethyl ketone and cyclohexanone; fatty acid esters such as ethyl acetate; halogenated hydrocarbons such as dichlorobenzene; aromatic hydrocarbons such as toluene, xylene, mesitylene, and cyclohexylbenzene; aliphatic hydrocarbons such as cyclohexane, decalin, and dodecane; dimethylformamide (DMF); dimethyl sulfoxide (DMSO); or the like.

Examples of the high molecular compound that can be used for the light-emitting layer include a phenylenevinylene (PPV) derivative such as poly[2-methoxy-5-(2-ethylhexyloxy)-1,4-phenylenevinylene] (abbreviation: MEH-PPV) or poly(2,5-dioctyl-1,4-phenylenevinylene); a polyfluorene derivative such as poly(9,9-di-n-octylfluorenyl-2,7-diyl) (abbreviation: PF8), poly[(9,9-di-n-octylfluorenyl-2,7-diyl)-alt-(benzo[2,1,3]thiadiazole-4, 8-diyl)](abbreviation: F8BT), poly(9,9-di-n-octylfluorenyl-2,7-diyl)-alt-(2,2'-bithiophene-5,5'-diyl)] (abbreviation: F8T2), poly[(9,9-dioctyl-2,7-divinylenefluorenylene)-alt-(9,10-anthracene)], or poly[(9,9-dihexylfluorene-2,7-diyl)-alt-(2,5-dimethyl-1,4-phenylene)]; a polyalkylthiophene (PAT) derivative such as poly(3-hexylthiophen-2,5-diyl) (abbreviation: P3HT); and a polyphenylene derivative. These high molecular compounds, poly(9-vinylcarbazole) (abbreviation: PVK), poly(2-vinylnaphthalene), poly[bis(4-phenyl) (2,4,6-trimethylphenyl)amine] (abbreviation: PTAA), or the like may be doped with a light-emitting low molecular compound and used for the light-emitting layer. As the light-emitting low molecular compound, any of the above-described light-emitting materials can be used.

<<Substrate>>

A light-emitting element in one embodiment of the present invention may be formed over a substrate of glass, plastic, or the like. As the way of stacking layers over the substrate, layers may be sequentially stacked from the electrode 101 side or sequentially stacked from the electrode 102 side.

For the substrate over which the light-emitting element of one embodiment of the present invention can be formed, glass, quartz, plastic, or the like can be used, for example. Alternatively, a flexible substrate can be used. The flexible substrate means a substrate that can be bent, such as a plastic substrate made of polycarbonate or polyarylate, for example. A film, an inorganic film, or the like can also be used. Another material may be used as long as the substrate functions as a support in a manufacturing process of the light-emitting elements or the optical element. Another material having a function of protecting the light-emitting elements or the optical elements may be used.

In this specification and the like, a light-emitting element can be formed using any of a variety of substrates, for example. The type of a substrate is not limited particularly. Examples of the substrate include a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, cellulose nanofiber (CNF) and paper which include a fibrous material, a base material film, and the like. As an example of a glass substrate, a barium borosilicate glass substrate, an aluminoborosilicate glass substrate, a soda lime glass substrate, or the like can be given. Examples of the flexible substrate, the attachment film, the base material film, and the like are substrates of plastics typified by polyethylene terephthalate (PET), polyethylene naphthalate (PEN), polyether sulfone (PES), and polytetrafluoroethylene (PTFE). Another example is a resin such as acrylic. Alternatively, polypropylene, polyester, polyvinyl fluoride, polyvinyl chloride, or the like can be used. Alternatively, polyamide, polyimide, aramid, epoxy, an inorganic vapor deposition film, paper, or the like can be used. Specifically, the use of semiconductor substrates, single crystal substrates, SOI substrates, or the like enables the manufacture of small-sized transistors with a small variation in characteristics, size, shape, or the like and with high current capability. A circuit using such transistors achieves lower power consumption of the circuit or higher integration of the circuit.

Alternatively, a flexible substrate may be used as the substrate, and the light-emitting element may be provided directly on the flexible substrate. Alternatively, a separation layer may be provided between the substrate and the light-emitting element. The separation layer can be used when part or the whole of the light-emitting element formed over the separation layer is completed, separated from the substrate, and transferred to another substrate. In such a case, the light-emitting element can be transferred to a substrate having low heat resistance or a flexible substrate as well. For the above separation layer, a stack including inorganic films, which are a tungsten film and a silicon oxide film, or a structure in which a resin film of polyimide or the like is formed over a substrate can be used, for example.

In other words, after the light-emitting element is formed using a substrate, the light-emitting element may be transferred to another substrate. Examples of a substrate to which the light-emitting element is transferred include, in addition to the above-described substrates, a cellophane substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester, or the like), a leather substrate, and a rubber substrate. By using such a substrate, a light-emitting element with high durability, a light-emitting element with high heat resistance, a lightweight light-emitting element, or a thin light-emitting element can be obtained.

The light-emitting element 150 may be formed over an electrode electrically connected to a field-effect transistor (FET), for example, which is formed over any of the above-described substrates. Accordingly, an active matrix display device in which the FET controls the driving of the light-emitting element 150 can be manufactured.

In Embodiment 1, one embodiment of the present invention has been described. Other embodiments of the present invention are described in Embodiments 2 to 9. Note that one embodiment of the present invention is not limited to the above examples. In other words, various embodiments of the invention are described in this embodiment and the other embodiments, and one embodiment of the present invention is not limited to a particular embodiment. The example in which one embodiment of the present invention is used in a light-emitting element is described; however, one embodiment of the present invention is not limited thereto. For example, depending on circumstances or conditions, one embodiment of the present invention is not necessarily used in a light-emitting element. For example, this embodiment describes an example in which a buffer layer including an alkali metal or an alkaline earth metal and a buffer layer having functions of preventing a diffusion of the metals and transporting electrons are provided between a hole-injection layer and an electrode that functions as an anode; however, one embodiment of the present invention is not limited thereto. Depending on circumstances or conditions, the buffer layer including the metal is not necessarily provided in one embodiment of the present invention. Alternatively, the buffer layer having a function of preventing a diffusion of the metal is not necessarily provided. Alternatively, the buffer layer having a function of transporting electrons is not necessarily provided.

The structure described above in this embodiment can be combined with any of the structures described in the other embodiments as appropriate.

Embodiment 2

In this embodiment, light emission mechanisms of a light-emitting element that can be used for the light-emitting element described in Embodiment 1 will be described below with reference to FIGS. 4A to 4D and FIGS. 5A and 5B.

<Structure Example 1 of Light-Emitting Layer>

Figure 4A:
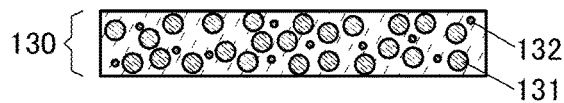
FIGS. 4A and 4C are schematic cross-sectional views illustrating a light-emitting layer of one embodiment of the present invention.

FIG. 4A is a schematic cross-sectional view of a light-emitting layer 130 that can be suitably used for a light-emitting material of one embodiment of the present invention.

The light-emitting layer 130 includes a host material 131 and a guest material 132 as illustrated in FIG. 4A. Note that the guest material 132 is described below as a fluorescent compound.

<<Light Emission Mechanism of Light-Emitting Layer 130>>

Next, the light emission mechanism of the light-emitting layer 130 is described below.

By recombination of the electrons and holes injected from the pair of electrodes (the electrode 101 and the electrode 102) or the charge-generation layer in the light-emitting layer 130, excitons are formed. Because the amount of the host material 131 is larger than that of the guest material 132, the host material 131 is brought into an excited state by the exciton generation.

Note that the term "exciton" refers to a carrier (electron and hole) pair. Since excitons have energy, a material where excitons are generated is brought into an excited state.

In the case where the formed excited state of the host material 131 is a singlet excited state, singlet excitation energy transfers from the S1 level of the host material 131 to the S1 level of the guest material 132, thereby forming the singlet excited state of the guest material 132.

Since the guest material 132 is a fluorescent compound, when a singlet excited state is formed in the guest material 132, the guest material 132 immediately emits light. To obtain high emission efficiency in this case, the fluorescence quantum yield of the guest material 132 is preferably high. The same can apply to a case where a singlet excited state is formed by recombination of carriers in the guest material 132.

Figure 4B:
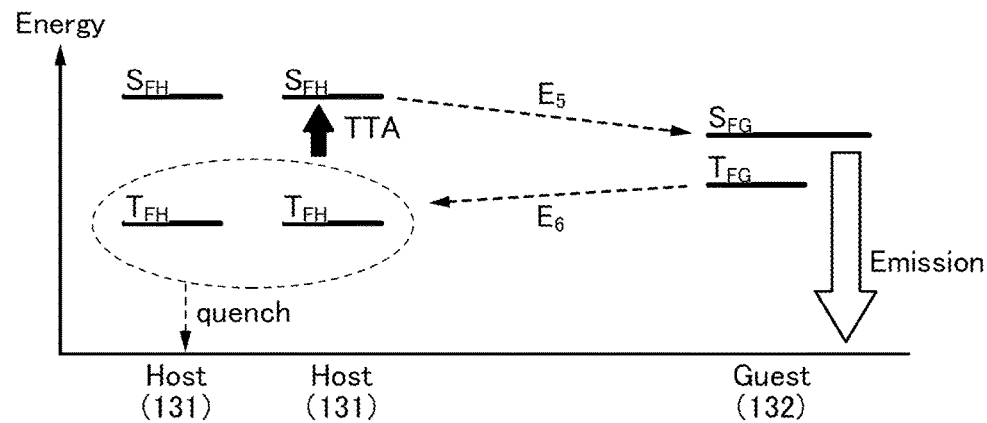
FIGS. 4B and 4D are each a schematic diagram showing a correlation of energy levels in a light-emitting layer.

Next, a case where recombination of carriers forms a triplet excited state of the host material 131 is described. The correlation of energy levels of the host material 131 and the guest material 132 in this case is illustrated in FIG. 4B. The following explains what terms and signs in FIG. 4B represent. Note that because it is preferable that the T1 level of the host material 131 be lower than the T1 level of the guest material 132, FIG. 4B shows this preferable case. However, the T1 level of the host material 131 may be higher than the T1 level of the guest material 132.

- Host (131): the host material 131;
- Guest (132): the guest material 132 (the fluorescent compound);
- $S_{FH}$: the S1 level of the host material 131
- $T_{FH}$: the T1 level of the host material 131
- $S_{FG}$: the S1 level of the guest material 132 (fluorescent compound); and
- $T_{FG}$: the T1 level of the guest material 132 (the fluorescent compound).

As illustrated in FIG. 4B, triplet excitons formed by carrier recombination interact with each other, and excitation energy is transferred and spin angular momenta are exchanged; as a result, a reaction in which one of the triplet excitons are converted into singlet exciton having energy of the S1 level of the host material 131 ($S_{FH}$), that is, triplet-triplet annihilation (TTA) occurs (see TTA in FIG. 4B). The singlet excitation energy of the host material 131 is transferred from $S_{FH}$ to the S1 level of the guest material 132 ($S_{FG}$) having a lower energy than $S_{FH}$ (see Route $E_5$ in FIG. 4B), and a singlet excited state of the guest material 132 is formed, whereby the guest material 132 emits light.

In the case where the density of the triplet excitons in the light-emitting layer 130 is sufficiently high (e.g., $1 \times 10^{12}$ cm$^3$ or more), only the reaction of two triplet excitons approaching each other can be considered whereas quenching of a single triplet exciton is ignored.

In the case where a triplet excited state of the guest material 132 is formed by carrier recombination, the triplet excited state of the guest material 132 is thermally deactivated and is difficult to use for light emission. However, in the case where the T1 level of the host material 131 ($T_{FH}$) is lower than the T1 level of the guest material 132 ($T_{FG}$), the triplet excitation energy of the guest material 132 can be transferred from the T1 level of the guest material 132 ($T_{FG}$) to the T1 level of the host material 131 ($T_{FH}$) (see Route $E_6$ in FIG. 4B) and then is utilized for TTA.

In other words, the host material 131 preferably has a function of converting triplet excitation energy into singlet excitation energy by causing TTA, so that the triplet excitation energy generated in the light-emitting layer 130 can be partly converted into singlet excitation energy by TTA in the host material 131. The singlet excitation energy generated by TTA can be transferred to the guest material 132 and extracted as fluorescence. In order to achieve this, the S1 level of the host material 131 ($S_{FH}$) is preferably higher than the S1 level of the guest material 132 ($S_{FG}$). In addition, the Ti level of the host material 131 ($T_{FH}$) is preferably lower than the T1 level of the guest material 132 ($T_{FG}$).

In the case where the T1 level ($T_{FG}$) of the guest material 132 is lower than the T1 level ($T_{FH}$) of the host material 131, the weight ratio of the guest material 132 to the host material 131 is preferably low. Specifically, the weight ratio of the guest material 132 to the host material 131 is preferably greater than 0 and less than or equal to 0.05, in which case the probability of carrier recombination in the guest material 132 can be reduced. In addition, the probability of energy transfer from the T1 level ($T_{FH}$) of the host material 131 to the T1 level ($T_{FG}$) of the guest material 132 can be reduced.

Note that the host material 131 may be composed of a single compound or a plurality of compounds.

<Structure Example 2 of Light-Emitting Layer>

Next, a structure example that is different from that of the light-emitting layer 130 illustrated in FIGS. 4A and 4B are described below with reference to FIGS. 4C and 4D.

Figure 4C:
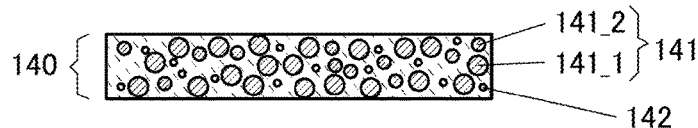

FIG. 4C is a schematic cross-sectional view of the light-emitting layer 140.

The light-emitting layer 140 includes a host material 141 and a guest material 142 as illustrated in FIG. 4C. The host material 141 includes an organic compound 141_1 and an organic compound 141_2. In the following description, the guest material 142 included in the light-emitting layer 140 is a phosphorescent compound.

<<Light Emission Mechanism of Light-Emitting Layer 140>>

Next, the light emission mechanism of the light-emitting layer 140 is described below.

The organic compound 141_1 and the organic compound 141_2 which are included in the light-emitting layer 140 preferably form an exciplex.

Although it is acceptable as long as the combination of the organic compound 141_1 and the organic compound 141_2 can form an exciplex, it is preferable that one of them be a compound having a hole-transport property and the other be a compound having an electron-transport property.

Figure 4D:
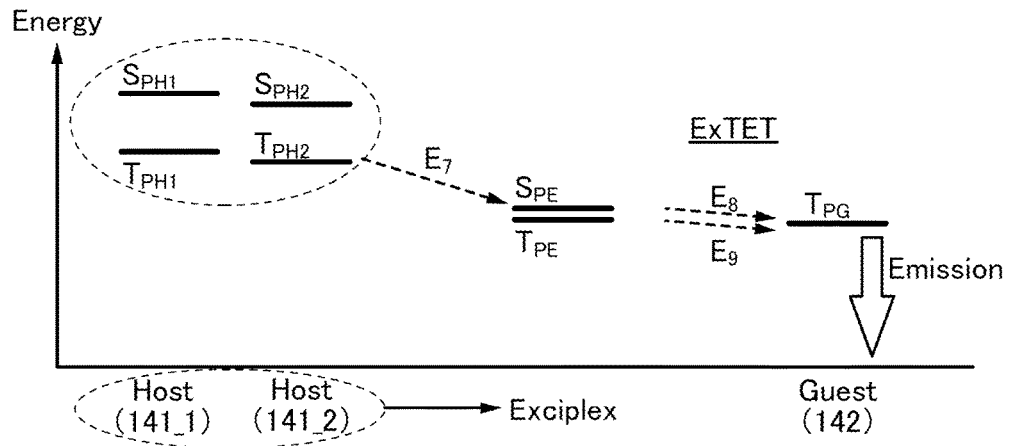

FIG. 4D shows a correlation between the energy levels of the organic compound 141_1, the organic compound 141_2, and the guest material 142 in the light-emitting layer 140. The following explains what terms and signs in FIG. 4D represent:

Host (141_1): the organic compound 141_1 (host material);

Host (141_2): the organic compound 141_2 (host material);

Guest (142): the guest material 142 (the phosphorescent compound);

$S_{PH1}$: the S1 level of the organic compound 141_1 (host material);

$T_{PH1}$: the T1 level of the organic compound 141_1 (host material);

$S_{PH2}$: the S1 level of the organic compound 141_2 (host material);

$T_{PH2}$: the T1 level of the organic compound 141_2 (host material);

$T_{PG}$: the T1 level of the guest material 142 (the phosphorescent compound);

$S_{PE}$: the S1 level of the exciplex; and $T_{PE}$: the T1 level of the exciplex.

The organic compound 141_1 and the organic compound 141_2 form an exciplex, and the S1 level ($S_{PE}$) and the T1 level ($T_{PE}$) of the exciplex are energy levels close to each other (see Route $E_7$ in FIG. 4D).

One of the organic compound 141_1 and the organic compound 141_2 receives a hole and the other receives an electron to readily form an exciplex. Alternatively, one of the organic compounds brought into an excited state immediately interacts with the other organic compound to form an exciplex. Therefore, most excitons in the light-emitting layer 140 exist as excited complexes. Because the excitation energy levels ($S_{PE}$ and $T_{PE}$) of the exciplex are lower than the S1 levels ($S_{PH1}$ and $S_{PH2}$) of the host material (the organic compounds 141_1 and 141_2) which form the exciplex, the excited state of the host material 141 can be formed with lower excitation energy. This can reduce the driving voltage of the light-emitting element.

Both energies of $S_{PE}$ and $T_{PE}$ of the exciplex are then transferred to the T1 level of the guest material 142 (the phosphorescent compound); thus, light emission is obtained (see Routes $E_8$ and $E_9$ in FIG. 4D).

Furthermore, the T1 level ($T_{PE}$) of the exciplex is preferably higher than the Ti level ($T_{PG}$) of the guest material 142. In this way, the singlet excitation energy and the triplet excitation energy of the formed exciplex can be transferred from the S1 level ($S_{PE}$) and the T1 level ($T_{PE}$) of the exciplex to the T1 level ($T_{PG}$) of the guest material 142.

Note that in order to efficiently transfer excitation energy from the exciplex to the guest material 142, the T1 level ($T_{PE}$) of the exciplex is preferably lower than or equal to the T1 levels ($T_{PH1}$ and $T_{PH2}$) of the organic compounds (the organic compound 141_1 and the organic compound 141_2) which form the exciplex. Thus, quenching of the triplet excitation energy of the exciplex due to the organic compounds (the organic compounds 141_1 and 141_2) is less likely to occur, resulting in efficient energy transfer from the exciplex to the guest material 142.

In order that the organic compound 141_1 and the organic compound 141_2 efficiently form an exciplex, it is preferable to satisfy the following: the HOMO level of one of the organic compound 141_1 and the organic compound 141_2 is higher than that of the other and the LUMO level of the one of the organic compound 141_1 and the organic compound 141_2 is higher than that of the other. For example, when the organic compound 141_1 has a hole-transport property and the organic compound 141_2 has an electron-transport property, it is preferable that the HOMO level of the organic compound 141_1 be higher than the HOMO level of the organic compound 141_2 and the LUMO level of the organic compound 141_1 be higher than the LUMO level of the organic compound 141_2. Alternatively, when the organic compound 141_2 has a hole-transport property and the organic compound 141_1 has an electron-transport property, it is preferable that the HOMO level of the organic compound 141_2 be higher than the HOMO level of the organic compound 141_1 and the LUMO level of the organic compound 141_2 be higher than the LUMO level of the organic compound 141_1. Specifically, the energy difference between the HOMO level of the organic compound 141_1 and the HOMO level of the organic compound 141_2 is preferably greater than or equal to 0.05 eV, further preferably greater than or equal to 0.1 eV, and still further preferably greater than or equal to 0.2 eV. Alternatively, the energy difference between the LUMO level of the organic compound 141_1 and the LUMO level of the organic compound 141_2 is preferably greater than or equal to 0.05 eV, further preferably greater than or equal to 0.1 eV, and still further preferably greater than or equal to 0.2 eV.

In the case where the combination of the organic compounds 141_1 and 141_2 is a combination of a compound having a hole-transport property and a compound having an electron-transport property, the carrier balance can be easily controlled depending on the mixture ratio. Specifically, the weight ratio of the compound having a hole-transport property to the compound having an electron-transport property is preferably within a range of 1:9 to 9:1. Since the carrier balance can be easily controlled with the structure, a carrier recombination region can also be controlled easily.

<Energy Transfer Mechanism>

Next, factors controlling the processes of intermolecular energy transfer between the host material 141 and the guest material 142 will be described. As mechanisms of the intermolecular energy transfer, two mechanisms, i.e., Förster mechanism (dipole-dipole interaction) and Dexter mechanism (electron exchange interaction), have been proposed. Although the intermolecular energy transfer process between the host material 141 and the guest material 142 is described here, the same can apply to a case where the host material 141 is an exciplex.

<<Förster Mechanism>>

In Förster mechanism, energy transfer does not require direct contact between molecules and energy is transferred through a resonant phenomenon of dipolar oscillation between the host material 141 and the guest material 142. By the resonant phenomenon of dipolar oscillation, the host material 141 provides energy to the guest material 142, and thus, the host material 141 in an excited state is brought to a ground state and the guest material 142 in a ground state is brought to an excited state. Note that the rate constant $k_{h^* \to g}$ of Förster mechanism is expressed by Formula 1.

[Formula 1]

$$k_{h^* \to g} = \frac{9000 c^4 K^2 \phi \ln 10}{128 \pi^5 n^4 N \tau R^6} \int \frac{f'_h(\nu) \varepsilon_g(\nu)}{\nu^4} d\nu \quad (1)$$

In Formula (1), $\nu$ denotes a frequency, $f'_h(\nu)$ denotes a normalized emission spectrum of the host material 141 (a fluorescent spectrum in energy transfer from a singlet excited state, and a phosphorescent spectrum in energy transfer from a triplet excited state), $\varepsilon_g(\nu)$ denotes a molar absorption coefficient of the guest material 142, N denotes Avogadro's number, n denotes a refractive index of a medium, R denotes an intermolecular distance between the host material 141 and the guest material 142, $\tau$ denotes a measured lifetime of an excited state (fluorescence lifetime or phosphorescence lifetime), c denotes the speed of light, $\phi$ denotes a luminescence quantum yield (a fluorescence quantum yield in energy transfer from a singlet excited state, and a phosphorescence quantum yield in energy transfer from a triplet excited state), and $K^2$ denotes a coefficient (0 to 4) of orientation of a transition dipole moment between the host material 141 and the guest material 142. Note that $K^2=2/3$ in random orientation.

<<Dexter Mechanism>>

In Dexter mechanism, the host material 141 and the guest material 142 are close to a contact effective range where their orbitals overlap, and the host material 141 in an excited state and the guest material 142 in a ground state exchange their electrons, which leads to energy transfer. Note that the rate constant $k_{h^* \to g}$ of Dexter mechanism is expressed by Formula 2.

[Formula 2]

$$k_{h^* \to g} = \left(\frac{2\pi}{h}\right) K^2 \exp\left(-\frac{2R}{L}\right) \int f'_h(\nu) \varepsilon'_g(\nu) d\nu \quad (2)$$

In Formula (2), h denotes a Planck constant, K denotes a constant having an energy dimension, $\nu$ denotes a frequency, $f'_h(\nu)$ denotes a normalized emission spectrum of the host material 141 (a fluorescent spectrum in energy transfer from a singlet excited state, and a phosphorescent spectrum in energy transfer from a triplet excited state), $\varepsilon'_g(\nu)$ denotes a normalized absorption spectrum of the guest material 142, L denotes an effective molecular radius, and R denotes an intermolecular distance between the host material 141 and the guest material 142.

Here, the efficiency of energy transfer from the host material 141 to the guest material 142 (energy transfer efficiency $\phi ET$) is expressed by Formula (3). In the formula, $k_r$ denotes a rate constant of a light-emission process (fluorescence in energy transfer from a singlet excited state, and phosphorescence in energy transfer from a triplet excited state) of the host material 141, $k_n$ denotes a rate constant of a non-light-emission process (thermal deactivation or intersystem crossing) of the host material 141, and $\tau$ denotes a measured lifetime of an excited state of the host material 141.

[Formula 3]

$$\phi_{ET} = \frac{k_{h^* \to g}}{k_r + k_n + k_{h^* \to g}} = \frac{k_{h^* \to g}}{\left(\frac{1}{\tau}\right) + k_{h^* \to g}} \quad (3)$$

According to Formula 3, it is found that the energy transfer efficiency $\phi ET$ can be increased by increasing the rate constant $k_{h^* \to g}$ of energy transfer so that another competing rate constant $k_r + k_n$ ($=1/\tau$) becomes relatively small.

<<Concept for Promoting Energy Transfer>>

In energy transfer by Förster mechanism, high energy transfer efficiency $\phi ET$ is obtained when quantum yield $\phi$ (a fluorescence quantum yield in the case where energy transfer from a singlet excited state is discussed, and a phosphorescence quantum yield in the case where energy transfer from a triplet excited state is discussed) is high. Furthermore, it is preferable that the emission spectrum (the fluorescence spectrum in the case where energy transfer from the singlet excited state is discussed) of the host material 141 largely overlap with the absorption spectrum (absorption corresponding to the transition from the singlet ground state to the triplet excited state) of the guest material 142. It is preferable that the molar absorption coefficient of the guest material 142 be also high. This means that the emission spectrum of the host material 141 overlaps with the absorption band of the guest material 142 which is on the longest wavelength side.

In energy transfer by Dexter mechanism, in order to make the rate constant $k_{h^* \to g}$ large, it is preferable that the emission spectrum (a fluorescence spectrum in the case where energy transfer from a singlet excited state is discussed, and a phosphorescence spectrum in the case where energy transfer from a triplet excited state is discussed) of the host material 141 largely overlap with the absorption spectrum (absorption corresponding to transition from a singlet ground state to a triplet excited state) of the guest material 142. Therefore, the energy transfer efficiency can be optimized by making the emission spectrum of the host material 141 overlap with the absorption band of the guest material 142 which is on the longest wavelength side.

In a manner similar to that of the energy transfer from the host material 141 to the guest material 142, the energy transfer by both Förster mechanism and Dexter mechanism also occurs in the energy transfer process from the exciplex to the guest material 142.

That is, the host material 141 includes the organic compounds 141_1 and 141_2 which are a combination for forming an exciplex functioning as an energy donor capable of efficiently transferring energy to the guest material 142. The excitation energy for forming the exciplex by the organic compound 141_1 and the organic compound 141_2 can be lower than the excitation energy of the organic compound 141_1 in the excited state and lower than the excitation energy of the organic compound 141_2 in the excited state. Therefore, driving voltage of the light-emitting element can be reduced.

Furthermore, in order to facilitate the energy transfer from the S1 level of the exciplex to the T1 level of the guest material 142 serving as an energy acceptor, it is preferable that the emission spectrum of the exciplex overlap with the absorption band of the guest material 142 which is on the longest wavelength side (lowest energy side). Thus, the efficiency of generating the triplet excited state of the guest material 142 can be increased.

The exciplex generated in the light-emitting layer 140 has a feature in that the singlet excitation energy level is close to the triplet excitation energy level. Therefore, by overlapping the emission spectrum of the exciplex and the absorption band of the guest material 142 which is on the longest wavelength side (lowest energy side), energy transfer from the triplet excitation energy level of the exciplex to the triplet excitation energy level of the guest material 142 can be facilitated.

When the light-emitting layer 140 has the above-described structure, light emission from the guest material 142 (the phosphorescent compound) of the light-emitting layer 140 can be obtained efficiently.

Note that the above-described processes through Routes $E_7$, $E_8$, and $E_9$ may be referred to as exciplex-triplet energy transfer (ExTET) in this specification and the like. In other words, in the light-emitting layer 140, excitation energy is given from the exciplex to the guest material 142. In this case, the efficiency of reverse intersystem crossing from $T_{PE}$ to $S_{PE}$ and the emission quantum yield from $S_{PE}$ are not necessarily high; thus, materials can be selected from a wide range of options.

<Structure Example 3 of Light-Emitting Layer>

A structure example different from the light-emitting layer illustrated in FIGS. 4A to 4D is described below with reference to FIGS. 5A and 5B.

Figure 5A:
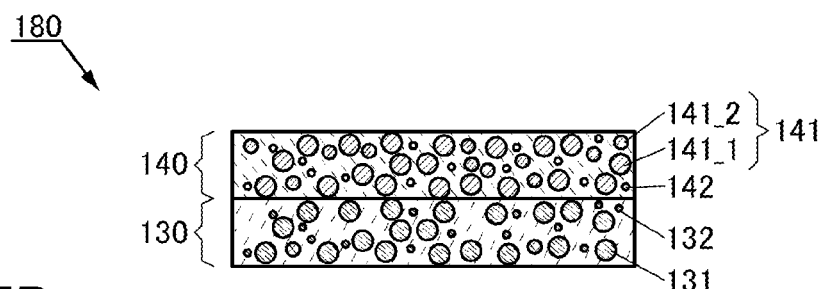
FIG. 5A is a schematic cross-sectional view of a light-emitting layer of one embodiment of the present invention.

FIG. 5A is a schematic cross-sectional view of a light-emitting layer 180.

The light-emitting layer 180 includes the light-emitting layer 130 and the light-emitting layer 140. The light-emitting layer 130 includes the host material 131 and the guest material 132. The light-emitting layer 140 includes the host material 141 and the guest material 142. The host material 141 includes an organic compound 141_1 and an organic compound 141_2. Note that in the description below, the guest material 132 is a fluorescent compound and the guest material 142 is a phosphorescent compound.

<<Light Emission Mechanism of Light-Emitting Layer 180>>

The light emission mechanism of the light-emitting layer 130 is similar to that of the light-emitting layer 130 illustrated in FIGS. 4A and 4B. The light emission mechanism of the light-emitting layer 140 is similar to that of the light-emitting layer 140 illustrated in FIGS. 4C and 4D.

In the case where the light-emitting layers 130 and 140 are in contact with each other as illustrated in FIG. 5A, even when energy (in particular, triplet excitation level energy) is transferred from the exciplex of the light-emitting layer 140 to the host material 131 of the light-emitting layer 130 at an interface between the light-emitting layer 130 and the light-emitting layer 140, triplet excitation energy can be converted into light emission in the light-emitting layer 130.

Note that the T1 level of the host material 131 of the light-emitting layer 130 is preferably lower than the T1 levels of the organic compounds 141_1 and 141_2 of the light-emitting layer 140. In the light-emitting layer 130, the S1 level of the host material 131 is preferably higher than the S1 level of the guest material 132 (fluorescent compound) while the T1 level of the host material 131 is preferably lower than the Ti level of the guest material 132 (fluorescent compound).

Figure 5B:
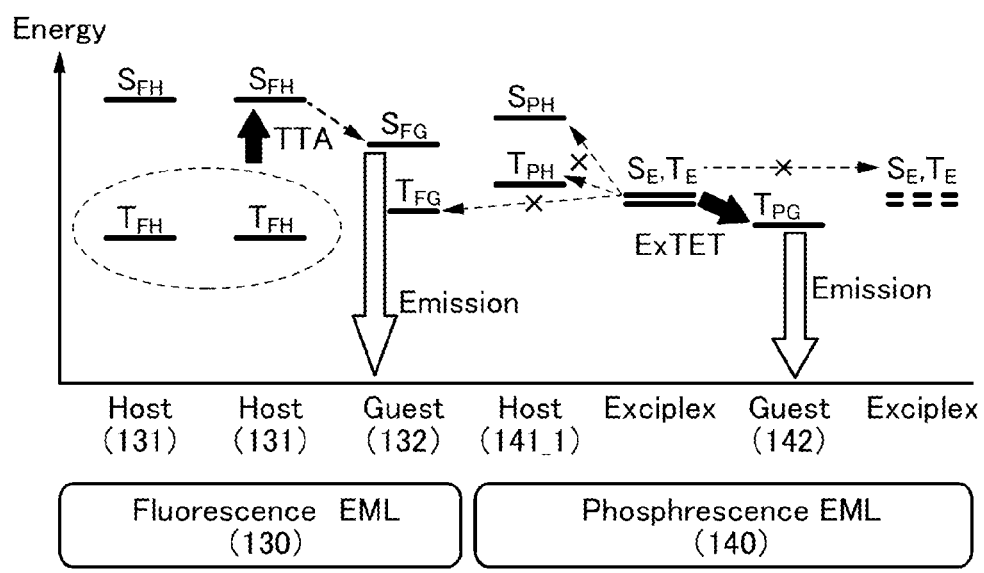
FIG. 5B is a schematic diagram showing a correlation of energy levels in a light-emitting layer.

FIG. 5B shows a correlation of energy levels in the case where TTA is utilized in the light-emitting layer 130 and ExTET is utilized in the light-emitting layer 140. The following explains what terms and signs in FIG. 5B represent:

Fluorescence EML (130): the light-emitting layer 130 (the fluorescent light-emitting layer);

Phosphorescence EML (140): the light-emitting layer 140 (phosphorescent light-emitting layer);

Host (131): the host material 131;

Guest (132): the guest material 132 (the fluorescent compound);

Host (141_1): host material (the organic compound 141_1);

Guest (142): the guest material 142 (the phosphorescent compound);

Exciplex: the exciplex (the organic compounds 141_1 and 141_2);

$S_{FH}$: the S1 level of the host material 131

$T_{FH}$: the T1 level of the host material 131

$S_{FG}$: the S1 level of the guest material 132 (fluorescent compound);

$T_{FG}$: the T1 level of the guest material 132 (the fluorescent compound);

$S_{PH}$: the S1 level of the host material (the organic compound 141_1);

$T_{PH}$: the T1 level of the host material (the organic compound 141_1);

$T_{PG}$: the T1 level of the guest material 142 (the phosphorescent compound);

$S_E$: the S1 level of the exciplex; and $T_E$: the T1 level of the exciplex.

As shown in FIG. 5B, the exciplex exists only in an excited state; thus, exciton diffusion between the exciplexes is less likely to occur. In addition, because the excitation energy levels ($S_E$ and $T_E$) of the exciplex are lower than the excitation energy levels ($S_{PH}$ and $T_{PH}$) of the organic compound 141_1 (i.e., the host material of the phosphorescent compound) of the light-emitting layer 140, energy diffusion from the exciplex to the organic compound 141_1 does not occur. That is, the efficiency of the phosphorescent light-emitting layer (the light-emitting layer 140) can be maintained because an exciton diffusion distance of the exciplex is short in the phosphorescent light-emitting layer (the light-emitting layer 140). In addition, even when part of the triplet excitation energy of the exciplex of the phosphorescent light-emitting layer (the light-emitting layer 140) diffuses into the fluorescent light-emitting layer (the light-emitting layer 130) through the interface between the fluorescent light-emitting layer (the light-emitting layer 130) and the phosphorescent light-emitting layer (the light-emitting layer 140), energy loss can be reduced because the triplet excitation energy in the fluorescent light-emitting layer (the light-emitting layer 130) caused by the diffusion is converted into light emission through TTA.

As described above, ExTET is utilized in the light-emitting layer 140 and TTA is utilized in the light-emitting layer 130; thus, the light-emitting layer 180 can have a reduced energy loss and high emission efficiency. Furthermore, in the case where the light-emitting layer 130 and the light-emitting layer 140 are in contact with each other as in the light-emitting layer 180, the number of the light-emitting layers as well as the energy loss can be reduced. Therefore, a light-emitting element with low manufacturing cost can be obtained.

Note that the light-emitting layer 130 and the light-emitting layer 140 are not necessarily in contact with each other. In that case, it is possible to prevent energy transfer by the Dexter mechanism (in particular, triplet energy transfer) from the organic compound 141_1 in an excited state, the organic compound 141_2 in an excited state, or the guest material 142 (phosphorescent compound) in an excited state which is generated in the light-emitting layer 140 to the host material 131 or the guest material 132 (fluorescent compound) in the light-emitting layer 130. Therefore, the thickness of a layer provided between the light-emitting layer 130 and the light-emitting layer 140 may be several nanometers. Specifically, the thickness is preferably greater than or equal to 1 nm and less than or equal to 5 nm, in which case an increase in driving voltage can be inhibited.

The layer provided between the light-emitting layer 130 and the light-emitting layer 140 may contain a single material or both a hole-transport material and an electron-transport material. In the case of a single material, a bipolar material may be used. The bipolar material here refers to a material in which the ratio between the electron mobility and the hole mobility is 100 or less. Alternatively, the hole-transport material, the electron-transport material, or the like may be used. At least one of materials contained in the layer may be the same as the host material (the organic compound 141_1 or 141_2) of the light-emitting layer 140. This facilitates the manufacture of the light-emitting element and reduces the driving voltage. Furthermore, the hole-transport material and the electron-transport material may form an exciplex, which effectively prevents exciton diffusion. Specifically, it is possible to prevent energy transfer from the host material (the organic compound 141_1 or 141_2) in an excited state or the guest material 142 (phosphorescent compound) in an excited state of the light-emitting layer 140 to the host material 131 or the guest material 132 (fluorescent compound) in the light-emitting layer 130.

The light-emitting layer 130 may be provided on the hole-transport layer side and the light-emitting layer 140 may be provided on the electron-transport layer side. Alternatively, the light-emitting layer 130 may be provided on the electron-transport layer side, and the light-emitting layer 140 may be provided on the hole-transport layer side.

Note that in the light-emitting layer 180, a carrier recombination region is preferably distributed to some extent. Therefore, it is preferable that the light-emitting layer 130 or 140 have an appropriate degree of carrier-trapping property. It is particularly preferable that the guest material 142 (phosphorescent compound) in the light-emitting layer 140 have an electron-trapping property. Alternatively, the guest material 132 (fluorescent compound) in the light-emitting layer 130 preferably has a hole-trapping property.

Note that light emitted from the light-emitting layer 130 preferably has a peak on the shorter wavelength side than light emitted from the light-emitting layer 140. The luminance of a light-emitting element using a phosphorescent compound emitting light with a short wavelength tends to degrade quickly. In view of the above, fluorescence is used for light emission with a short wavelength, so that a light-emitting element with less degradation of luminance can be provided.

Furthermore, the light-emitting layer 130 and the light-emitting layer 140 may be made to emit light with different emission wavelengths, so that the light-emitting element can be a multicolor light-emitting element. In that case, the emission spectrum is formed by combining light having different emission peaks, and thus has at least two peaks.

The above structure is also suitable for obtaining white light emission. When the light-emitting layer 130 and the light-emitting layer 140 emit light of complementary colors, white light emission can be obtained.

In addition, white light emission with a high color rendering property that is formed of three primary colors or four or more colors can be obtained by using a plurality of light-emitting materials emitting light with different wavelengths for one of the light-emitting layers 130 and 140 or both. In that case, the light-emitting layer may be divided into layers and each of the divided layers may contain a different light-emitting material from the others.

<Material that can be Used in Light-Emitting Layer>

Next, materials that can be used in the light-emitting layers 130 and 140 are described.

<<Material that can be Used in Light-Emitting Layer 130>>

In the light-emitting layer 130, the host material 131 is present in the largest proportion by weight, and the guest material 132 (the fluorescent compound) is dispersed in the host material 131. The S1 level of the host material 131 is preferably higher than the S1 level of the guest material 132 (the fluorescent compound) while the T1 level of the host material 131 is preferably lower than the T1 level of the guest material 132 (the fluorescent compound).

In the light-emitting layer 130, the guest material 132 is preferably, but not particularly limited to, an anthracene derivative, a tetracene derivative, a chrysene derivative, a phenanthrene derivative, a pyrene derivative, a perylene derivative, a stilbene derivative, an acridone derivative, a coumarin derivative, a phenoxazine derivative, a phenothiazine derivative, or the like. Specifically, the fluorescent compound described in Embodiment 1 can be used, for example.

In the light-emitting layer 130, although a material that can be used as the host material 131 is not particularly limited, for example, any of the materials which are described as examples of the host material in Embodiment 1 can be used. One or more substances having a wider energy gap than the guest material 132 is preferably selected from these substances and known substances.

The light-emitting layer 130 can have a structure in which two or more layers are stacked. For example, in the case where the light-emitting layer 130 is formed by stacking a first light-emitting layer and a second light-emitting layer in this order from the hole-transport layer side, the first light-emitting layer is formed using a substance having a hole-transport property as the host material and the second light-emitting layer is formed using a substance having an electron-transport property as the host material.

In the light-emitting layer 130, the host material 131 may be composed of one kind of compound or a plurality of compounds. The light-emitting layer 130 may include a material other than the host material 131 and the guest material 132.

<<Material that can be Used in Light-Emitting Layer 140>>

In the light-emitting layer 140, the host material 141 is present in the largest proportion by weight, and the guest material 142 (the phosphorescent compound) is dispersed in the host material 141. The T1 levels of the host materials 141 (organic compounds 141_1 and 141_2) of the light-emitting layer 140 are preferably higher than the T1 level of the guest material 142 of the light-emitting layer 140.

Examples of the organic compound 141_1 include a zinc- or aluminum-based metal complex, an oxadiazole derivative, a triazole derivative, a benzimidazole derivative, a quinoxaline derivative, a dibenzoquinoxaline derivative, a dibenzothiophene derivative, a dibenzofuran derivative, a pyrimidine derivative, a triazine derivative, a pyridine derivative, a bipyridine derivative, a phenanthroline derivative, and the like. Other examples are an aromatic amine and a carbazole derivative. Specifically, the electron-transport material and the hole-transport material described in Embodiment 1 can be used.

As the organic compound 141_2, a substance which can form an exciplex together with the organic compound 141_1 is preferably used. Specifically, the electron-transport material and the hole-transport material described in Embodiment 1 can be used, for example. In that case, it is preferable that the organic compound 141_1, the organic compound 141_2, and the guest material 142 (phosphorescent compound) be selected such that the emission peak of the exciplex formed by the organic compounds 141_1 and 141_2 overlaps with an absorption band, specifically an absorption band on the longest wavelength side, of a triplet metal to ligand charge transfer (MLCT) transition of the guest material 142 (phosphorescent compound). This makes it possible to provide a light-emitting element with drastically improved emission efficiency. Note that in the case where a thermally activated delayed fluorescence compound is used instead of the phosphorescent compound, it is preferable that the absorption band on the longest wavelength side be a singlet absorption band.

As the guest material 142 (phosphorescent compound), an iridium-, rhodium-, or platinum-based organometallic complex or metal complex can be used; in particular, an organoiridium complex such as an iridium-based ortho-metalated complex is preferable. As an ortho-metalated ligand, a 4H-triazole ligand, a 1H-triazole ligand, an imidazole ligand, a pyridine ligand, a pyrimidine ligand, a pyrazine ligand, an isoquinoline ligand, or the like can be given. As the metal complex, a platinum complex having a porphyrin ligand or the like can be given. Specifically, the phosphorescent compound described in Embodiment 1 as an example can be used, for example.

As the light-emitting material included in the light-emitting layer 140, any material can be used as long as the material can convert the triplet excitation energy into light emission. As an example of the material that can convert triplet excitation energy into light emission, a thermally activated delayed fluorescence compound can be given in addition to the phosphorescent compound. Therefore, the term "phosphorescent compound" in the description can be rephrased as the term "thermally activated delayed fluorescence compound".

The material that exhibits thermally activated delayed fluorescence may be a material that can form a singlet excited state from a triplet excited state by reverse intersystem crossing or may be a combination of a plurality of materials which form an exciplex.

In the case where the thermally activated delayed fluorescence compound is formed of one kind of material, any of the thermally activated delayed fluorescence compounds described in Embodiment 1 can be specifically used.

In the case where the thermally activated delayed fluorescence compound is used as the host material, it is preferable to use a combination of two kinds of compounds which form an exciplex. In this case, it is particularly preferable to use the above-described combination of a compound which easily accepts electrons and a compound which easily accepts holes, which forms an exciplex.

Note that the light-emitting layers 130, 140, and 180 can be formed by an evaporation method (including a vacuum evaporation method), an ink-jet method, a coating method, gravure printing, or the like.

The structure described in this embodiment can be used in combination with any of the structures described in the other embodiments as appropriate.

Embodiment 3

In this embodiment, examples of light-emitting elements having structures different from those described in Embodiment 1 are described below with reference to FIGS. 6A and 6B, FIGS. 7A and 7B, FIGS. 8A to 8C, and FIGS. 9A to 9C.

<Structure Example 1 of Light-Emitting Element>

Figure 6A:
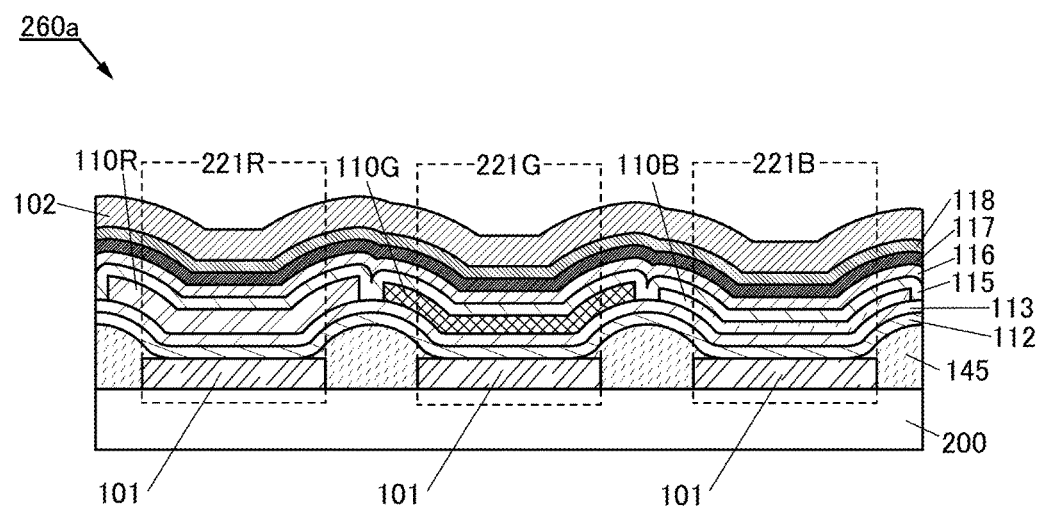
FIGS. 6A and 6B are each a schematic cross-sectional view of a light-emitting element of one embodiment of the present invention.
Figure 6B:
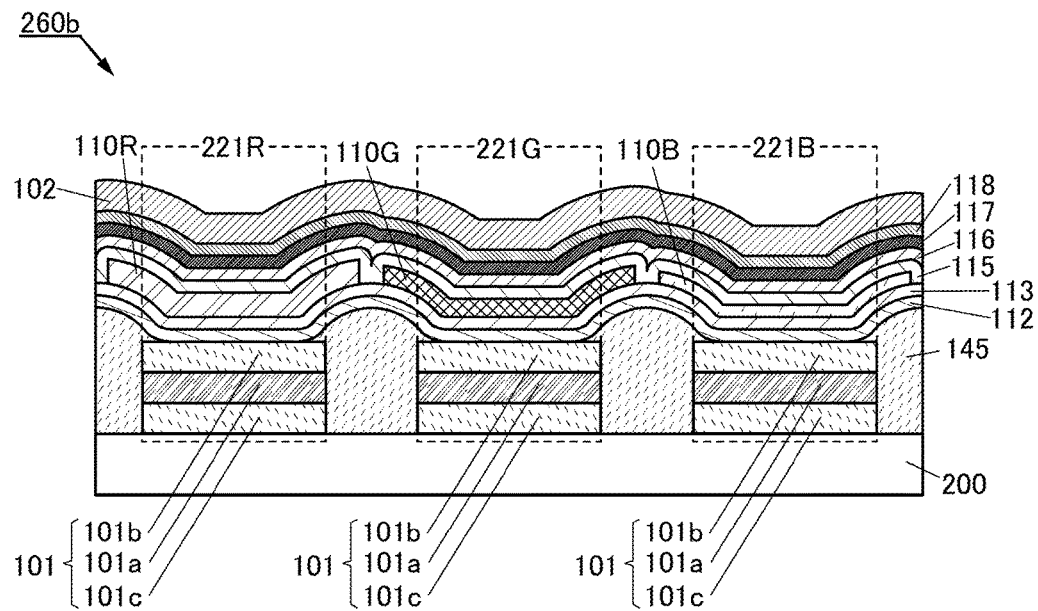

FIGS. 6A and 6B are cross-sectional views of a light-emitting element of one embodiment of the present invention. In FIGS. 6A and 6B, a portion having a function similar to that in FIG. 1 is represented by the same hatch pattern as in FIG. 1 and not especially denoted by a reference numeral in some cases. In addition, common reference numerals are used for portions having similar functions, and a detailed description of the portions is omitted in some cases.

Light-emitting elements 260a and 260b in FIGS. 6A and 6B may have a bottom-emission structure in which light is extracted through the substrate 200 or may have a top-emission structure in which light emitted from the light-emitting element is extracted in the direction opposite to the substrate 200. However, one embodiment of the present invention is not limited to this structure, and a light-emitting element having a dual-emission structure in which light emitted from the light-emitting element is extracted in both top and bottom directions of the substrate 200 may be used.

In the case where the light-emitting elements 260a and 260b each have a bottom emission structure, the electrode 101 preferably has a function of transmitting light and the electrode 102 preferably has a function of reflecting light. Alternatively, in the case where the light-emitting elements 260a and 260b each have a top emission structure, the electrode 101 preferably has a function of reflecting light and the electrode 102 preferably has a function of transmitting light.

The light-emitting elements 260a and 260b each include the electrode 101 and the electrode 102 over the substrate 200. Between the electrodes 101 and 102, a light-emitting layer 11B, a light-emitting layer 11G, and a light-emitting layer 110R are provided. In addition, each of the light-emitting elements includes the electron-injection layer 112, the electron-transport layer 113, the hole-transport layer 115, the hole-injection layer 116, the buffer layer 117, and the buffer layer 118.

The light-emitting element 260b includes, as part of the electrode 101, a conductive layer 101a, a conductive layer 101b over the conductive layer 101a, and a conductive layer 101c under the conductive layer 101a. In other words, the light-emitting element 260b includes the electrode 101 having a structure in which the conductive layer 101a is sandwiched between the conductive layer 101b and the conductive layer 101c.

In the light-emitting element 260b, the conductive layer 101b and the conductive layer 101c may be formed of different materials or the same material. The conductive layers 101b and 101c are preferably formed of the same conductive material, in which case patterning by etching in the process for forming the electrode 101 can be performed easily.

Note that the light-emitting element 260b may include either the conductive layer 101b or the conductive layer 101c.

For each of the conductive layers 101a, 101b, and 101c, which are included in the electrode 101, the structure and materials of the electrode 101 or 102 described in Embodiment 1 can be used.

In FIGS. 6A and 6B, a partition wall 145 is provided between a region 221B, a region 221G, and a region 221R, which are sandwiched between the electrode 101 and the electrode 102. The partition wall 145 has an insulating property. The partition wall 145 covers end portions of the electrode 101 and has openings overlapping with the electrode. With the partition wall 145, the electrode 101 provided over the substrate 200 in the regions can be divided into island shapes.

Note that the light-emitting layer 110B and the light-emitting layer 110G may overlap with each other in a region where they overlap with the partition wall 145. The light-emitting layer 110G and the light-emitting layer 110R may overlap with each other in a region where they overlap with the partition wall 145. The light-emitting layer 110R and the light-emitting layer 110B may overlap with each other in a region where they overlap with the partition wall 145.

The partition wall 145 has an insulating property and is formed using an inorganic or organic material. Examples of the inorganic material include silicon oxide, silicon oxynitride, silicon nitride oxide, silicon nitride, aluminum oxide, and aluminum nitride. Examples of the organic material include photosensitive resin materials such as an acrylic resin and a polyimide resin.

Note that a silicon oxynitride film refers to a film in which the proportion of oxygen is higher than that of nitrogen. The silicon oxynitride film preferably contains oxygen, nitrogen, silicon, and hydrogen in the ranges of 55 atomic % to 65 atomic %, 1 atomic % to 20 atomic %, 25 atomic % to 35 atomic %, and 0.1 atomic % to 10 atomic %, respectively. A silicon nitride oxide film refers to a film in which the proportion of nitrogen is higher than that of oxygen. The silicon nitride oxide film preferably contains nitrogen, oxygen, silicon, and hydrogen in the ranges of 55 atomic % to 65 atomic %, 1 atomic % to 20 atomic %, 25 atomic % to 35 atomic %, and 0.1 atomic % to 10 atomic %, respectively.

The light-emitting layers 11R, 110G, and 110B preferably contain light-emitting materials having functions of emitting light of different colors. For example, when the light-emitting layer 110R contains a light-emitting material having a function of emitting red, the region 221R emits red light. When the light-emitting layer 110G contains a light-emitting material having a function of emitting green, the region 221G emits green light. When the light-emitting layer 110B contains a light-emitting material having a function of emitting blue, the region 221B emits blue light. The light-emitting element 260a or 260b having such a structure is used in a pixel of a display device, whereby a full-color display device can be fabricated. The thicknesses of the light-emitting layers may be the same or different.

For the buffer layer 117 and the buffer layer 118, the structures of the buffer layer 117 and the buffer layer 118 are preferably used. In that case, a light-emitting element with high emission efficiency and a light-emitting element with high reliability can be provided.

One or more of the light-emitting layers 110B, 110G, and 110R may include two or more stacked layers.

When the light-emitting element 260a or 260b including the buffer layer with the structure described in Embodiment 1 is used in pixels in a display device, a display device with high emission efficiency and a display device with high reliability can be provided. The display device including the light-emitting element 260a or 260b can thus have reduced power consumption.

By providing an optical element (e.g., a color filter, a polarizing plate, and an anti-reflection film) on the light extraction side of the electrode through which light is extracted, the color purity of each of the light-emitting elements 260a and 260b can be improved. Therefore, the color purity of a display device including the light-emitting element 260a or 260b can be improved. Alternatively, the reflection of external light by each of the light-emitting elements 260a and 260b can be reduced. Therefore, the contrast ratio of a display device including the light-emitting element 260a or 260b can be improved.

For the other components of the light-emitting elements 260a and 260b, the components of the light-emitting elements in Embodiments 1 and 2 may be referred to.

<Structure Example 2 of Light-Emitting Element>

Next, structure examples different from the light-emitting elements illustrated in FIGS. 6A and 6B will be described below with reference to FIGS. 7A and 7B.

Figure 7A:
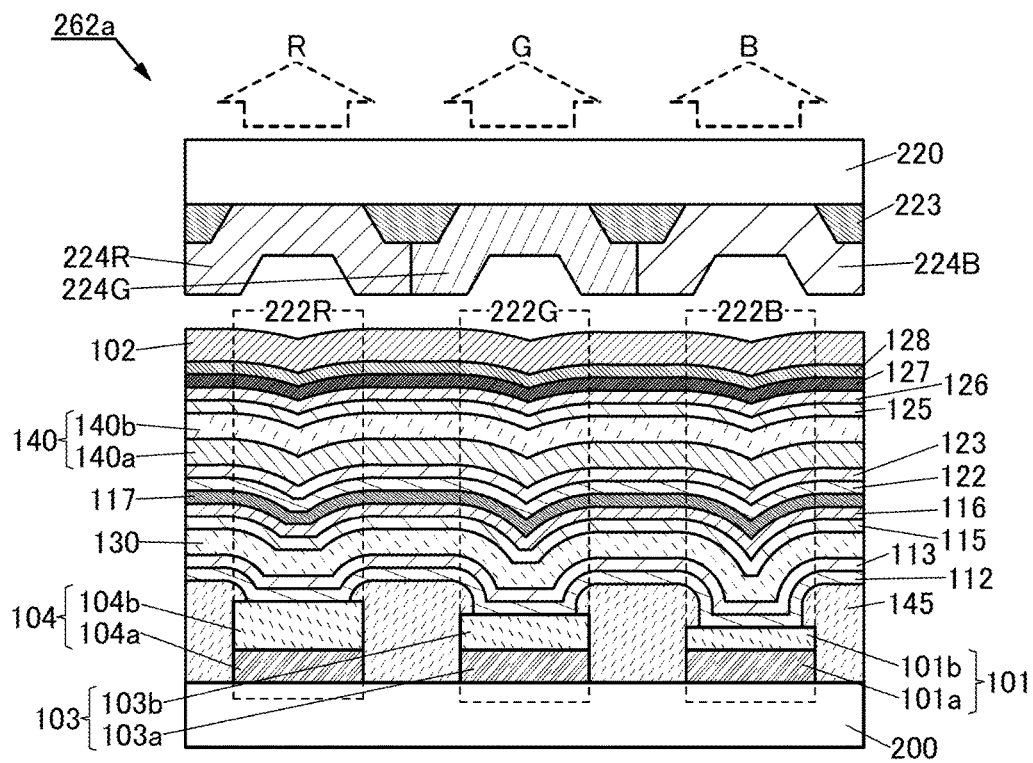
FIGS. 7A and 7B are each a schematic cross-sectional view of a light-emitting element of one embodiment of the present invention.
Figure 7B:
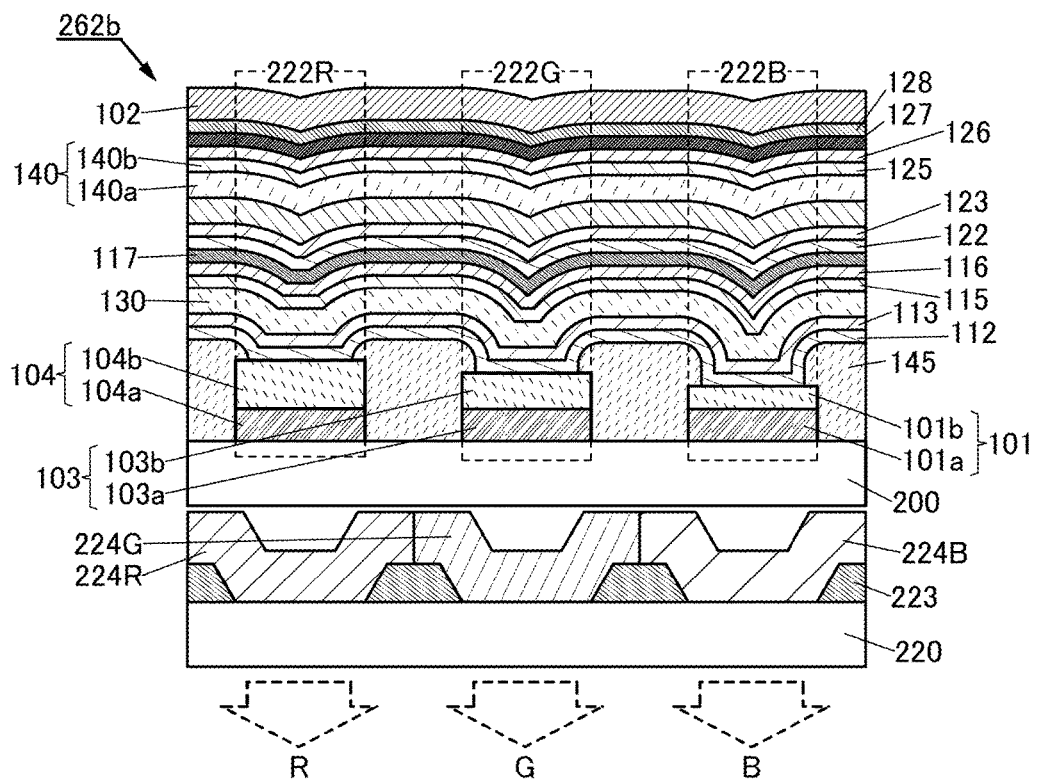

FIGS. 7A and 7B are cross-sectional views each illustrating a light-emitting element of one embodiment of the present invention. In FIGS. 7A and 7B, a portion having a function similar to that in FIGS. 6A and 6B is represented by the same hatch pattern as in FIGS. 6A and 6B and not especially denoted by a reference numeral in some cases. In addition, common reference numerals are used for portions having similar functions, and a detailed description of the portions is omitted in some cases.

FIGS. 7A and 7B illustrate structure examples of a light-emitting element including the light-emitting layer between a pair of electrodes. A light-emitting element 262a illustrated in FIG. 7A has a top-emission structure in which light is extracted in a direction opposite to the substrate 200, and a light-emitting element 262b illustrated in FIG. 7B has a bottom-emission structure in which light is extracted to the substrate 200 side. However, one embodiment of the present invention is not limited to these structures and may have a dual-emission structure in which light emitted from the light-emitting element is extracted in both top and bottom directions with respect to the substrate 200 over which the light-emitting element is formed.

The light-emitting elements 262a and 262b each include the electrode 101, the electrode 102, an electrode 103, and an electrode 104 over the substrate 200. At least the light-emitting layers 130 and 140 and the charge-generation layer are provided between the electrode 101 and the electrode 102, between the electrode 102 and the electrode 103, and between the electrode 102 and the electrode 104. In addition, each of the light-emitting elements includes the electron-injection layer 112, the electron-transport layer 113, the hole-transport layer 115, the hole-injection layer 116, the buffer layer 117, the electron-injection layer 122, the electron-transport layer 123, the hole-transport layer 115, the hole-injection layer 116, the buffer layer 127, and the buffer layer 128.

The electrode 101 includes a conductive layer 101a and a conductive layer 101b over and in contact with the conductive layer 101a. The electrode 103 includes a conductive layer 103a and a conductive layer 103b over and in contact with the conductive layer 103a. The electrode 104 includes a conductive layer 104a and a conductive layer 104b over and in contact with the conductive layer 104a.

The light-emitting element 262a illustrated in FIG. 7A and the light-emitting element 262b illustrated in FIG. 7B each include a partition wall 145 between a region 222B sandwiched between the electrode 101 and the electrode 102, a region 222G sandwiched between the electrode 102 and the electrode 103, and a region 222R sandwiched between the electrode 102 and the electrode 104. The partition wall 145 has an insulating property. The partition wall 145 covers end portions of the electrodes 101, 103, and 104 and has openings overlapping with the electrodes. With the partition wall 145, the electrodes provided over the substrate 200 in the regions can be separated into island shapes.

The charge-generation layer can be formed with a material obtained by adding an electron acceptor (acceptor) to a hole-transport material or a material obtained by adding an electron donor (donor) to an electron-transport material. In this embodiment, the hole-injection layer 116 can serve as a charge-generation layer. Note that when the conductivity of the charge-generation layer is as high as that of the pair of electrodes, carriers generated in the charge-generation layer might transfer to an adjacent pixel and light emission might occur in the pixel. In order to prevent such false light emission from an adjacent pixel, the charge-generation layer is preferably formed with a material whose conductivity is lower than that of the pair of electrodes.

The light-emitting elements 262a and 262b each include a substrate 220 provided with an optical element 224B, an optical element 224G, and an optical element 224R in the direction in which light emitted from the region 222B, light emitted from the region 222G, and light emitted from the region 222R are extracted. The light emitted from each region is emitted outside the light-emitting element through each optical element. In other words, the light from the region 222B, the light from the region 222G, and the light from the region 222R are emitted through the optical element 224B, the optical element 224G, and the optical element 224R, respectively.

The optical elements 224B, 224G, and 224R each have a function of selectively transmitting light of a particular color out of incident light. For example, the light emitted from the region 222B through the optical element 224B is blue light, the light emitted from the region 222G through the optical element 224G is green light, and the light emitted from the region 222R through the optical element 224R is red light.

For example, a coloring layer (also referred to as color filter), a band pass filter, a multilayer filter, or the like can be used for the optical elements 224R, 224G, and 224B. Alternatively, color conversion elements can be used as the optical elements. A color conversion element is an optical element that converts incident light into light having a longer wavelength than the incident light. As the color conversion elements, quantum-dot elements can be favorably used. The usage of the quantum dot can increase color reproducibility of the display device.

One or more optical elements may be stacked over each of the optical elements 224R, 224G, and 224B. As another optical element, a circularly polarizing plate, an anti-reflective film, or the like can be provided, for example. A circularly polarizing plate provided on the side where light emitted from the light-emitting element of the display device is extracted can prevent a phenomenon in which light entering from the outside of the display device is reflected inside the display device and returned to the outside. An anti-reflective film can weaken external light reflected by a surface of the display device. This leads to clear observation of light emitted from the display device.

Note that in FIGS. 7A and 7B, blue light (B), green light (G), and red light (R) emitted from the regions through the optical elements are schematically illustrated by arrows of dashed lines.

A light-blocking layer 223 is provided between the optical elements. The light-blocking layer 223 has a function of blocking light emitted from the adjacent regions. Note that a structure without the light-blocking layer 223 may also be employed.

The light-blocking layer 223 has a function of reducing the reflection of external light. The light-blocking layer 223 has a function of preventing mixture of light emitted from an adjacent light-emitting element. As the light-blocking layer 223, a metal, a resin containing black pigment, carbon black, a metal oxide, a composite oxide containing a solid solution of a plurality of metal oxides, or the like can be used.

Note that the optical element 224B and the optical element 224G may overlap with each other in a region where they overlap with the light-blocking layer 223. In addition, the optical element 224G and the optical element 224R may overlap with each other in a region where they overlap with the light-blocking layer 223. In addition, the optical element 224R and the optical element 224B may overlap with each other in a region where they overlap with the light-blocking layer 223.

As for the structures of the substrate 200 and the substrate 220 provided with the optical elements, Embodiment 1 can be referred to.

Furthermore, the light-emitting elements 262a and 262b have a microcavity structure.

<<Microcavity Structure>>

Light emitted from the light-emitting layer 130 and the light-emitting layer 140 resonates between a pair of electrodes (e.g., the electrode 101 and the electrode 102). The light-emitting layer 130 and the light-emitting layer 140 are formed at such a position as to intensify the light of a desired wavelength among light to be emitted. For example, by adjusting the optical length from a reflective region of the electrode 101 to the light-emitting region of the light-emitting layer 130 and the optical length from a reflective region of the electrode 102 to the light-emitting region of the light-emitting layer 130, the light of a desired wavelength among light emitted from the light-emitting layer 130 can be intensified. By adjusting the optical length from the reflective region of the electrode 101 to the light-emitting region of the light-emitting layer 140 and the optical length from the reflective region of the electrode 102 to the light-emitting region of the light-emitting layer 140, the light of a desired wavelength among light emitted from the light-emitting layer 140 can be intensified. In the case of a light-emitting element in which a plurality of light-emitting layers (here, the light-emitting layers 130 and 140) are stacked, the optical lengths of the light-emitting layers 130 and 140 are preferably optimized.

In each of the light-emitting elements 262a and 262b, by adjusting the thicknesses of the conductive layers (the conductive layer 101b, the conductive layer 103b, and the conductive layer 104b) in each region, the light of a desired wavelength among light emitted from the light-emitting layers 130 and 140 can be increased. Note that the thickness of at least one of the hole-injection layer 116 and the hole-transport layer 115, or the thickness of at least one of the electron-injection layer 112 and the electron-transport layer 113 may differ between the regions to increase the light emitted from the light-emitting layers 130 and 140.

For example, in the case where the refractive index of the conductive material having a function of reflecting light in the electrodes 101 to 104 is lower than the refractive index of the light-emitting layer 130 to 140, the thickness of the conductive layer 101b of the electrode 101 is adjusted so that the optical length between the electrode 101 and the electrode 102 is $m_B\lambda_B/2$ ($m_B$ is a natural number and $\lambda_B$ is the wavelength of light intensified in the region 222B). Similarly, the thickness of the conductive layer 103b of the electrode 103 is adjusted so that the optical length between the electrode 103 and the electrode 102 is $m_G\lambda_G/2$ ($m_G$ is a natural number and $\lambda_G$ is the wavelength of light intensified in the region 222G). Furthermore, the thickness of the conductive layer 104b of the electrode 104 is adjusted so that the optical length between the electrode 104 and the electrode 102 is $m_R\lambda_R/2$ ($m_R$ is a natural number and $\lambda_R$ is the wavelength of light intensified in the region 222R).

In the case where it is difficult to precisely determine the reflective regions of the electrodes 101 to 104, the optical length for intensifying light emitted from the light-emitting layer 130 or the light-emitting layer 140 may be derived on the assumption that certain regions of the electrodes 101 to 104 are the reflective regions. In the case where it is difficult to precisely determine the light-emitting region of the light-emitting layer 130 or 140, the optical length for intensifying light emitted from the light-emitting layer 130 or 140 may be derived on the assumption that certain region of the light-emitting layer 130 or 140 is the light-emitting region.

In the above manner, with the microcavity structure, in which the optical length between the pair of electrodes in the respective regions is adjusted, scattering and absorption of light in the vicinity of the electrodes can be suppressed, resulting in high light extraction efficiency.

In the above structure, the conductive layers 101b, 103b, and 104b preferably have a function of transmitting light. The materials of the conductive layers 101b, 103b, and 104b may be the same or different. It is preferable to use the same material for the conductive layer 101b, the conductive layer 103b, and the conductive layer 104b because patterning by etching in the formation process of the electrode 101, the electrode 103, and the electrode 104 can be performed easily. Each of the conductive layers 101b, 103b, and 104b may have a stacked structure of two or more layers.

Since the light-emitting element 262a illustrated in FIG. 7A has a top-emission structure, it is preferable that the conductive layer 101a, the conductive layer 103a, and the conductive layer 104a have a function of reflecting light. In addition, it is preferable that the electrode 102 have functions of transmitting light and reflecting light.

Since the light-emitting element 262b illustrated in FIG. 7B has a bottom-emission structure, it is preferable that the conductive layer 101a, the conductive layer 103a, and the conductive layer 104a have functions of transmitting light and reflecting light. In addition, it is preferable that the electrode 102 have a function of reflecting light.

In each of the light-emitting elements 262a and 262b, the conductive layers 101a, 103a, and 104a may be formed of different materials or the same material. When the conductive layers 101a, 103a, and 104a are formed of the same material, manufacturing cost of the light-emitting elements 262a and 262b can be reduced. Note that each of the conductive layers 101a, 103a, and 104a may have a stacked structure including two or more layers.

For the buffer layer 117, the buffer layer 127, and the buffer layer 128 in the light-emitting elements 262a and 262b, the structures of the buffer layer 117, the buffer layer 127, and the buffer layer 128 are preferably used. In this way, a light-emitting element with high emission efficiency and a light-emitting element with high reliability can be provided.

Either or both of the light-emitting layers 130 and 140 may have a stacked structure of two layers like light-emitting layers 140a and 140b, for example. The two light-emitting layers each including two kinds of light-emitting materials for emitting light of different colors enable emission of light of a plurality of colors. It is particularly preferable to select the light-emitting materials of the light-emitting layers so that white light can be obtained by combining light emissions from the light-emitting layers 130 and 140.

Either or both of the light-emitting layers 130 and 140 may have a stacked structure of three or more layers, in which a layer not including a light-emitting material may be included.

In the above-described manner, by using the light-emitting element 262a or 262b including the buffer layer with the structure described in Embodiment 1 in pixels in a display device, a display device with high emission efficiency and a display device with high reliability can be provided. Accordingly, the display device including the light-emitting element 262a or 262b can have low power consumption.

For the other components of the light-emitting elements 262a and 262b, the components of the light-emitting element 260a or 260b or the light-emitting element in Embodiment 1 may be referred to.

<Method for Manufacturing Light-Emitting Element>

Next, a method for fabricating a light-emitting element of one embodiment of the present invention is described below with reference to FIGS. 8A to 8C and FIGS. 9A to 9C. Here, a method for fabricating the light-emitting element 262a illustrated in FIG. 7A is described.

FIGS. 8A to 8C and FIGS. 9A to 9C are cross-sectional views illustrating a method for fabricating the light-emitting element of one embodiment of the present invention.

The method for fabricating the light-emitting element 262a described below includes first to seventh steps.

<<First Step>>

Figure 8A:
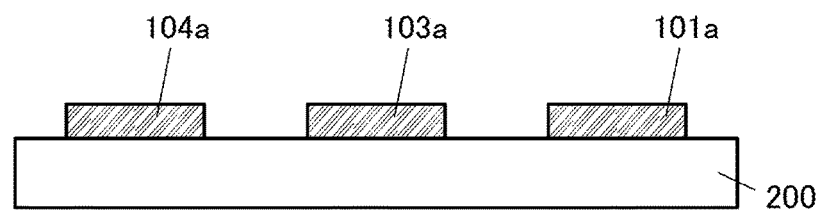
FIGS. 8A to 8C are schematic cross-sectional views illustrating a method for fabricating a light-emitting element of one embodiment of the present invention.

In the first step, the electrodes (specifically the conductive layer 101a of the electrode 101, the conductive layer 103a of the electrode 103, and the conductive layer 104a of the electrode 104) of the light-emitting elements are formed over the substrate 200 (see FIG. 8A).

In this embodiment, a conductive layer having a function of reflecting light is formed over the substrate 200 and processed into a desired shape; whereby the conductive layers 101a, 103a, and 104a are formed. As the conductive layer having a function of reflecting light, an alloy film of silver, palladium, and copper (also referred to as an Ag—Pd—Cu film or APC) is used. The conductive layers 101a, 103a, and 104a are preferably formed through a step of processing the same conductive layer, because the manufacturing cost can be reduced.

Note that a plurality of transistors may be formed over the substrate 200 before the first step. The plurality of transistors may be electrically connected to the conductive layers 101a, 103a, and 104a.

<<Second Step>>

Figure 8B:
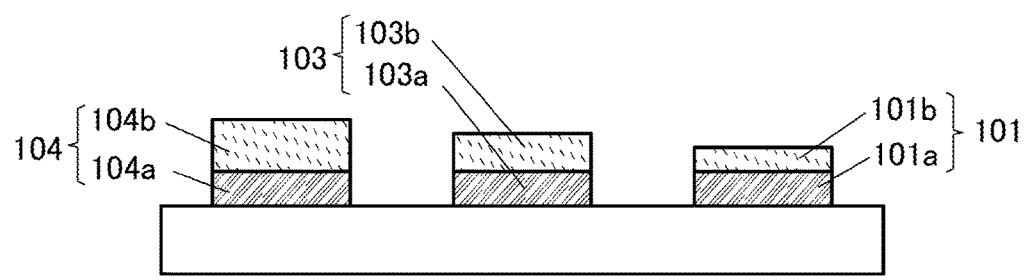

In the second step, the conductive layer 101b having a function of transmitting light is formed over the conductive layer 101a of the electrode 101, the conductive layer 103b having a function of transmitting light is formed over the conductive layer 103a of the electrode 103, and the conductive layer 104b having a function of transmitting light is formed over the conductive layer 104a of the electrode 104 (see FIG. 8B).

In this embodiment, the conductive layers 101b, 103b, and 104b each having a function of transmitting light are formed over the conductive layers 101a, 103a, and 104a each having a function of reflecting light, respectively, whereby the electrode 101, the electrode 103, and the electrode 104 are formed. As the conductive layers 101b, 103b, and 104b, ITSO films are used.

The conductive layers 101b, 103b, and 104b having a function of transmitting light may be formed in a plurality of steps. When the conductive layers 101b, 103b, and 104b having a function of transmitting light are formed in a plurality of steps, they can be formed to have thicknesses which enable microcavity structures appropriate in the respective regions.

<<Third Step>>

Figure 8C:
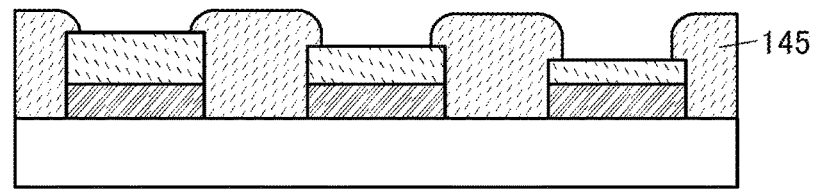

In the third step, the partition wall 145 that covers end portions of the electrodes of the light-emitting element is formed (see FIG. 8C).

The partition wall 145 includes an opening overlapping with the electrode. The conductive film exposed by the opening functions as the cathode of the light-emitting element. As the partition wall 145, a polyimide-based resin is used in this embodiment.

In the first to third steps, since there is no possibility of damaging the EL layer (a layer containing an organic compound), a variety of film formation methods and micromachining technologies can be employed. In this embodiment, a reflective conductive layer is formed by a sputtering method, a pattern is formed over the conductive layer by a lithography method, and then the conductive layer is processed into an island shape by a dry etching method or a wet etching method to form the conductive layer 101a of the electrode 101, the conductive layer 103a of the electrode 103, and the conductive layer 104a of the electrode 104. Then, a transparent conductive film is formed by a sputtering method, a pattern is formed over the transparent conductive film by a lithography method, and then the transparent conductive film is processed into island shapes by a wet etching method to form the electrodes 101, 103, and 104.

<<Fourth Step>>

Figure 9A:
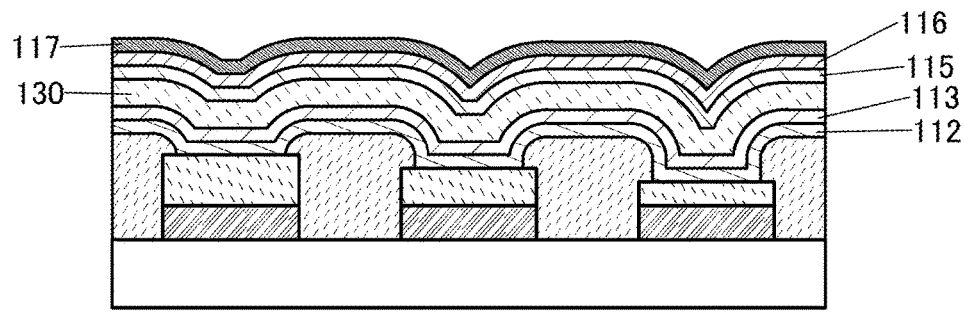
FIGS. 9A to 9C are schematic cross-sectional views illustrating a method for manufacturing a light-emitting element of one embodiment of the present invention.

In the fourth step, the electron-injection layer 112, the electron-transport layer 113, the light-emitting layer 130, the hole-transport layer 115, the hole-injection layer 116, and the buffer layer 117 are formed (see FIG. 9A).

The electron-injection layer 112 can be formed by evaporating a substance having a high electron-injection property. The electron-transport layer 113 can be formed by evaporating a substance having a high electron-transport property.

The light-emitting layer 130 can be formed by evaporating a guest material that emits light of at least one color selected from violet, blue, blue green, green, yellow green, yellow, orange, and red. As the guest material, a fluorescent or phosphorescent organic compound can be used. The light-emitting layer 130 may have a two-layered structure. In such a case, the two light-emitting layers each preferably contain a light-emitting organic compound that emits light of a different color.

The hole-transport layer 115 can be formed by evaporating a hole-transport material. The hole-injection layer 116 serving as the charge-generation layer can be formed by co-evaporating a hole-transport material and a material containing an acceptor substance. Note that co-evaporation is an evaporation method in which a plurality of different substances is concurrently vaporized from different evaporation sources.

The buffer layer 117 can be formed by evaporating a substance having a high electron-transport property. Note that the structure of the buffer layer 117 described in Embodiment 1 is preferably used.

<<Fifth Step>>

Figure 9B:
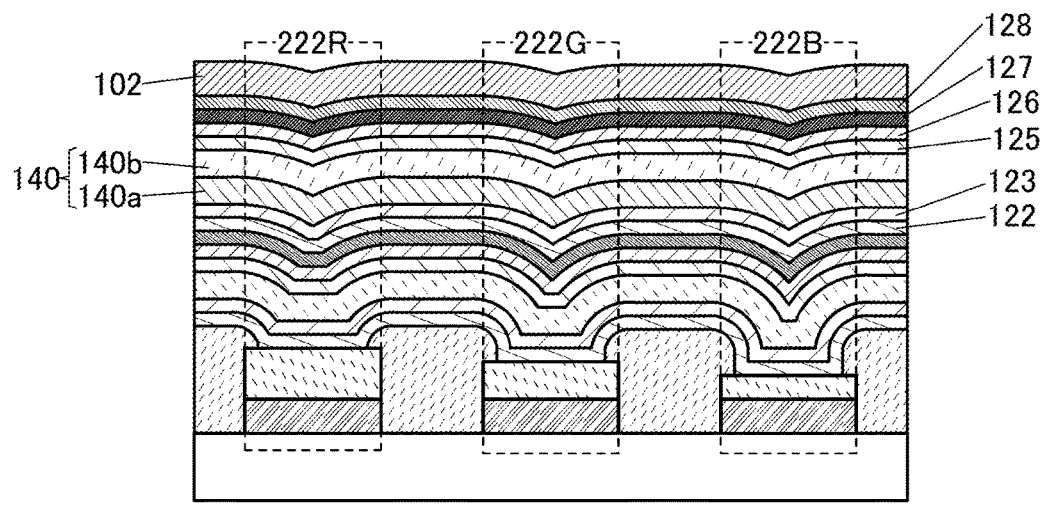

In the fifth step, the electron-injection layer 122, the electron-transport layer 123, the light-emitting layer 140, the hole-transport layer 125, the hole-injection layer 126, the buffer layer 127, the buffer layer 128, and the electrode 102 are formed (see FIG. 9B).

The electron-injection layer 122 can be formed by using a material and a method which are similar to those of the electron-injection layer 112. The electron-transport layer 123 can be formed by using a material and a method which are similar to those of the electron-transport layer 113.

The light-emitting layer 140 can be formed by evaporating a guest material that emits light of at least one color selected from violet, blue, blue green, green, yellow green, yellow, orange, and red. As the guest material, a fluorescent or phosphorescent organic compound can be used. The light-emitting layer 130 and the light-emitting layer 140 preferably include light-emitting organic compounds exhibiting light of different colors.

The hole-transport layer 125 can be formed by using a material and a method which are similar to those of the hole-transport layer 115. The hole-injection layer 126 can be formed by using a material and a method which are similar to those of the hole-injection layer 116.

The buffer layer 127 can be formed by using a material and a method which are similar to those of the buffer layer 117. The buffer layer 128 can be formed by evaporating an alkali metal, an alkaline earth metal, a compound thereof. Note that the structure of the buffer layer 118 described in Embodiment 1 is preferably used.

The electrode 102 can be formed by stacking a reflective conductive film and a light-transmitting conductive film. The electrode 102 may have a single-layer structure or a stacked-layer structure.

Through the above-described steps, the light-emitting element including the region 222B, the region 222G, and the region 222R over the electrode 101, the electrode 103, and the electrode 104, respectively, are formed over the substrate 200.

<<Sixth Step>>

Figure 9C:
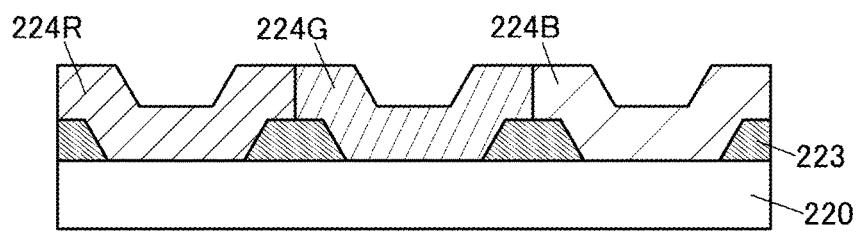

In the sixth step, the light-blocking layer 223, the optical element 224B, the optical element 224G, and the optical element 224R are formed over the substrate 220 (see FIG. 9C).

As the light-blocking layer 223, a resin film containing black pigment is formed in a desired region. Then, the optical element 224B, the optical element 224G, and the optical element 224R are formed over the substrate 220 and the light-blocking layer 223. As the optical element 224B, a resin film containing blue pigment is formed in a desired region. As the optical element 224G, a resin film containing green pigment is formed in a desired region. As the optical element 224R, a resin film containing red pigment is formed in a desired region.

<<Seventh Step>>

In the seventh step, the light-emitting element formed over the substrate 200 is attached to the light-blocking layer 223, the optical element 224B, the optical element 224G, and the optical element 224R formed over the substrate 220, and sealed with a sealant (not illustrated).

Through the above-described steps, the light-emitting element 262a illustrated in FIG. 7A can be formed.

Note that a structure described in this embodiment can be used in appropriate combination with any of the structures described in the other embodiments.

Embodiment 4

In this embodiment, a display device including a light-emitting element of one embodiment of the present invention will be described with reference to FIGS. 10A to 20.
<Structure Example 1 of Display Device>

Figure 10A:
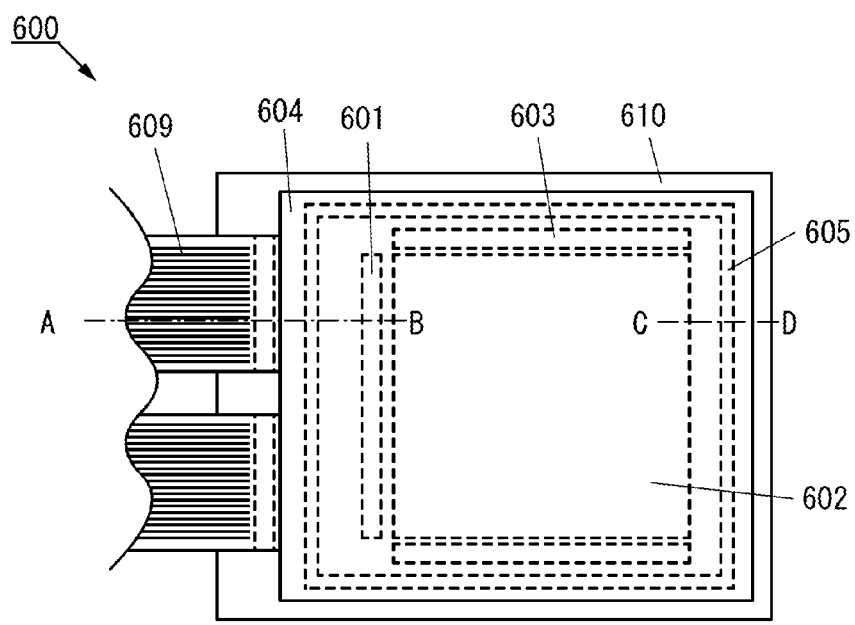
FIGS. 10A and 10B are a top view and a schematic cross-sectional view illustrating a display device of one embodiment of the present invention.
Figure 10B:
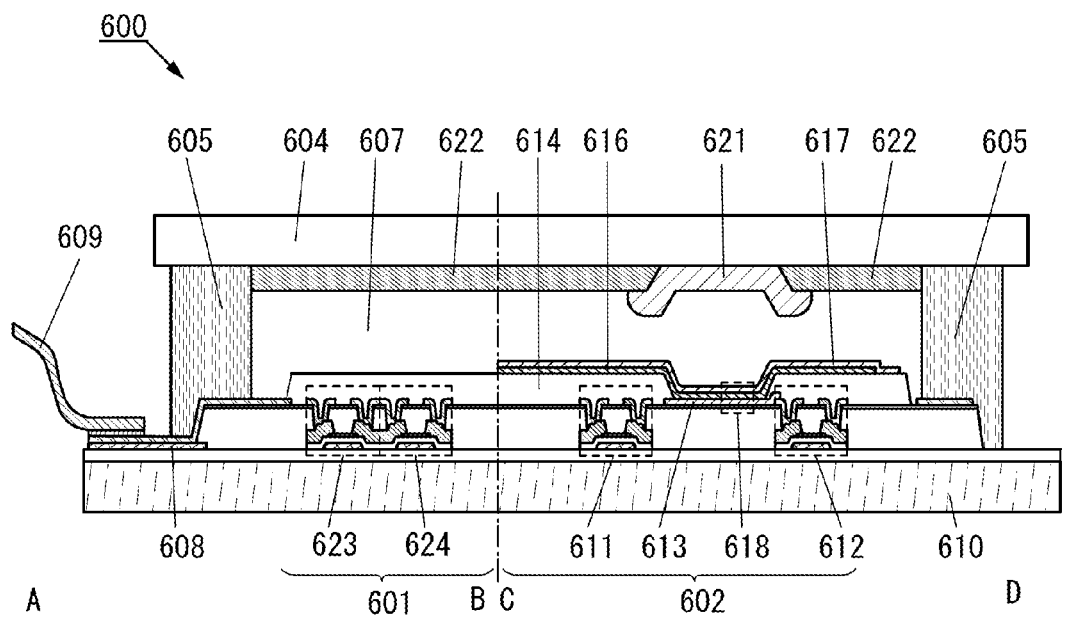

FIG. 10A is a top view illustrating a display device 600 and FIG. 10B is a cross-sectional view taken along the dashed-dotted line A-B and the dashed-dotted line C-D in FIG. 10A. The display device 600 includes driver circuit portions (a signal line driver circuit portion 601 and a scan line driver circuit portion 603) and a pixel portion 602. Note that the signal line driver circuit portion 601, the scan line driver circuit portion 603, and the pixel portion 602 have a function of controlling light emission from a light-emitting element.

The display device 600 also includes an element substrate 610, a sealing substrate 604, a sealant 605, a region 607 surrounded by the sealant 605, a lead wiring 608, and an FPC 609.

Note that the lead wiring 608 is a wiring for transmitting signals to be input to the signal line driver circuit portion 601 and the scan line driver circuit portion 603 and for receiving a video signal, a clock signal, a start signal, a reset signal, and the like from the FPC 609 serving as an external input terminal. Although only the FPC 609 is illustrated here, the FPC 609 may be provided with a printed wiring board (PWB).

As the signal line driver circuit portion 601, a CMOS circuit in which an n-channel transistor 623 and a p-channel transistor 624 are combined is formed. As the signal line driver circuit portion 601 or the scan line driver circuit portion 603, various types of circuits such as a CMOS circuit, a PMOS circuit, or an NMOS circuit can be used. Although a driver in which a driver circuit portion is formed and a pixel are formed over the same surface of a substrate in the display device of this embodiment, the driver circuit portion is not necessarily formed over the substrate and can be formed outside the substrate.

The pixel portion 602 includes a switching transistor 611, a current control transistor 612, and a lower electrode 613 electrically connected to a drain of the current control transistor 612. Note that a partition wall 614 is formed to cover end portions of the lower electrode 613. As the partition wall 614, for example, a positive type photosensitive acrylic resin film can be used.

In order to obtain favorable coverage, the partition wall 614 is formed to have a curved surface with curvature at its upper or lower end portion. For example, in the case of using a positive photosensitive acrylic as a material of the partition wall 614, it is preferable that only the upper end portion of the partition wall 614 have a curved surface with curvature (the radius of the curvature being 0.2 μm to 3 μm). As the partition wall 614, either a negative photosensitive resin or a positive photosensitive resin can be used.

Note that there is no particular limitation on a structure of each of the transistors (the transistors 611, 612, 623, and 624). For example, a staggered transistor can be used. In addition, there is no particular limitation on the polarity of these transistors. For these transistors, n-channel and p-channel transistors may be used, or either n-channel transistors or p-channel transistors may be used, for example. Furthermore, there is no particular limitation on the crystallinity of a semiconductor film used for the transistors. For example, an amorphous semiconductor film or a crystalline semiconductor film may be used. Examples of a semiconductor material include Group 14 semiconductors (e.g., a semiconductor including silicon), compound semiconductors (including oxide semiconductors), organic semiconductors, and the like. For example, it is preferable to use an oxide semiconductor that has an energy gap of 2 eV or more, preferably 2.5 eV or more and further preferably 3 eV or more, for the transistors, so that the off-state current of the transistors can be reduced. Examples of the oxide semiconductor include an In—Ga oxide and an In-M-Zn oxide (M is aluminum (Al), gallium (Ga), yttrium (Y), zirconium (Zr), lanthanum (La), cerium (Ce), tin (Sn), hafnium (Hf), or neodymium (Nd)).

An EL layer 616 and an upper electrode 617 are formed over the lower electrode 613. Here, the lower electrode 613 functions as a cathode and the upper electrode 617 functions as an anode.

In addition, the EL layer 616 is formed by any of various methods including an evaporation method (including a vacuum evaporation method) with an evaporation mask, a droplet discharge method (also referred to as an ink-jet method), a coating method such as a spin coating method, and a gravure printing method. As another material included in the EL layer 616, a low molecular compound or a high molecular compound (including an oligomer or a dendrimer) may be used.

Note that a light-emitting element 618 is formed with the lower electrode 613, the EL layer 616, and the upper electrode 617. The light-emitting element 618 preferably has any of the structures described in Embodiments 1 to 3. In the case where the pixel portion includes a plurality of light-emitting elements, the pixel portion may include both any of the light-emitting elements described in Embodiments 1 to 3 and a light-emitting element having a different structure.

When the sealing substrate 604 and the element substrate 610 are attached to each other with the sealant 605, the light-emitting element 618 is provided in the region 607 surrounded by the element substrate 610, the sealing substrate 604, and the sealant 605. The region 607 is filled with a filler. In some cases, the region 607 is filled with an inert gas (nitrogen, argon, or the like) or filled with an ultraviolet curable resin or a thermosetting resin which can be used for the sealant 605. For example, a polyvinyl chloride (PVC)-based resin, an acrylic-based resin, a polyimide-based resin, an epoxy-based resin, a silicone-based resin, a polyvinyl butyral (PVB)-based resin, or an ethylene vinyl acetate (EVA)-based resin can be used. It is preferable that the sealing substrate be provided with a recessed portion and a desiccant be provided in the recessed portion, in which case deterioration due to influence of moisture can be inhibited.

An optical element 621 is provided below the sealing substrate 604 to overlap with the light-emitting element 618. A light-blocking layer 622 is provided below the sealing substrate 604. The structures of the optical element 621 and the light-blocking layer 622 can be the same as those of the optical element and the light-blocking layer in Embodiment 3, respectively.

An epoxy-based resin or glass frit is preferably used for the sealant 605. It is preferable that such a material do not transmit moisture or oxygen as much as possible. As the sealing substrate 604, a glass substrate, a quartz substrate, or a plastic substrate formed of fiber reinforced plastics (FRP), poly(vinyl fluoride) (PVF), polyester, acrylic, or the like can be used.

<<Formation Method of Light-Emitting Element by Droplet Discharge Method>>

Here, a method for forming the EL layer 616 by a droplet discharge method is described with reference to FIGS. 19A to 19D. FIGS. 19A to 19D are cross-sectional views illustrating the method for forming the EL layer 616.

Figure 19A:
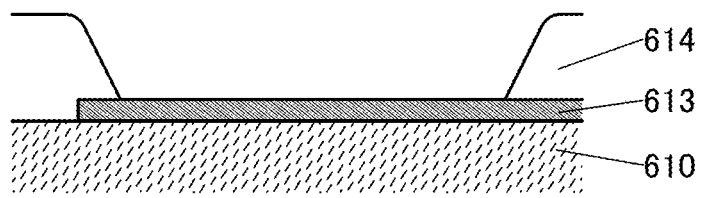
FIGS. 19A to 19D are schematic cross-sectional views illustrating a method for forming an EL layer.
Figure 19B:
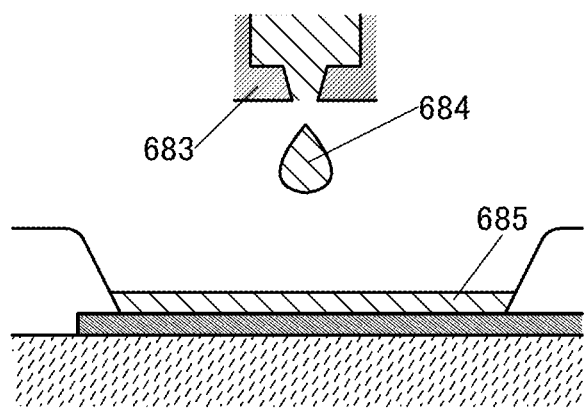

First, the element substrate 610 over which the lower electrode 613 and the partition wall 614 are formed is illustrated in FIG. 19A. However, as in FIG. 10B, the lower electrode 613 and the partition wall 614 may be formed over an insulating film over a substrate.

Next, in a portion where the lower electrode 613 is exposed, which is an opening portion of the partition wall 614, a droplet 684 is discharged from a droplet discharge apparatus 683 to form a layer 685 containing a composition. The droplet 684 is a composition containing a solvent and is attached to the lower electrode 613 (see FIG. 19B).

Note that the method for discharging the droplet 684 may be performed under reduced pressure.

Figure 19C:
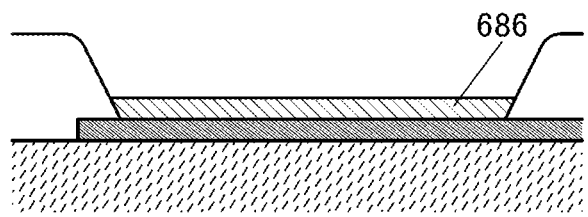

Then, the solvent is removed from the layer 685 containing the composition, and the resulting layer is solidified to form the EL layer 616 (see FIG. 19C).

The solvent may be removed by drying or heating.

Figure 19D:
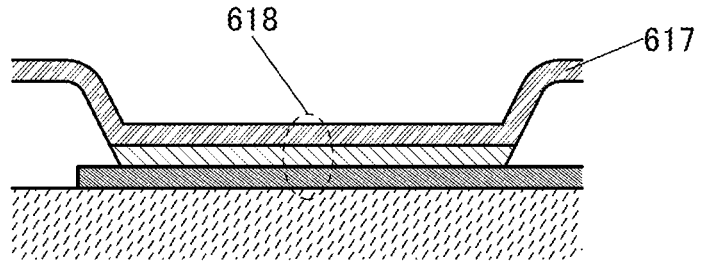

Next, the upper electrode 617 is formed over the EL layer 616, and the light-emitting element 618 is formed (see FIG. 19D).

When the EL layer 616 is formed by a droplet discharge method as described above, the composition can be selectively discharged, and accordingly, loss of materials can be reduced. Furthermore, a lithography process or the like for shaping is not needed, and thus, the process can be simplified and cost reduction can be achieved.

Note that FIGS. 19A to 19D illustrate a process for forming the EL layer 616 as a single layer. When the EL layer 616 includes functional layers in addition to the light-emitting layer, the layers are formed sequentially from the lower electrode 613 side. In that case, the electron-injection layer, the electron-transport layer, the light-emitting layer, the hole-transport layer, and the hole-injection layer may be formed by a droplet discharge method. Alternatively, the electron-injection layer, the electron-transport layer, and the light-emitting layer may be formed by a droplet discharge method, whereas the hole-transport layer and the hole-injection layer may be formed by an evaporation method or the like. The light-emitting layer may be formed by a combination of a droplet discharge method and an evaporation method or the like.

The light-emitting layer can be formed using a high molecular compound or a low molecular compound that emits at least one of violet light, blue light, blue green light, green light, yellow green light, yellow light, orange light, and red light. As the high molecular compound and the low molecular compound, a fluorescent or phosphorescent organic compound can be used. With use of a solvent in which the high molecular compound and the low molecular compound are dissolved, the light-emitting layer can be formed by a coating method, such as a droplet discharge method or a spin coating method. After the formation of the light-emitting layer, heat treatment may be performed under an air atmosphere or an inert gas atmosphere such as a nitrogen atmosphere. With use of the fluorescent or phosphorescent organic compound as a guest material, the guest material may be dispersed into a high molecular compound or a low molecular compound that has higher excitation energy than the guest material. The light-emitting organic compound may be deposited alone or the light-emitting organic compound mixed with another material may be deposited. The light-emitting layer may have a two-layered structure. In such a case, the two light-emitting layers each preferably contain a light-emitting organic compound that emits light of a different color. When the light-emitting layer is formed using a low molecular compound, an evaporation method can be used.

The droplet discharge method described above is a general term for a means including a nozzle equipped with a composition discharge opening or a means to discharge droplets such as a head having one or a plurality of nozzles.

<<Droplet Discharge Apparatus>>

Figure 20:
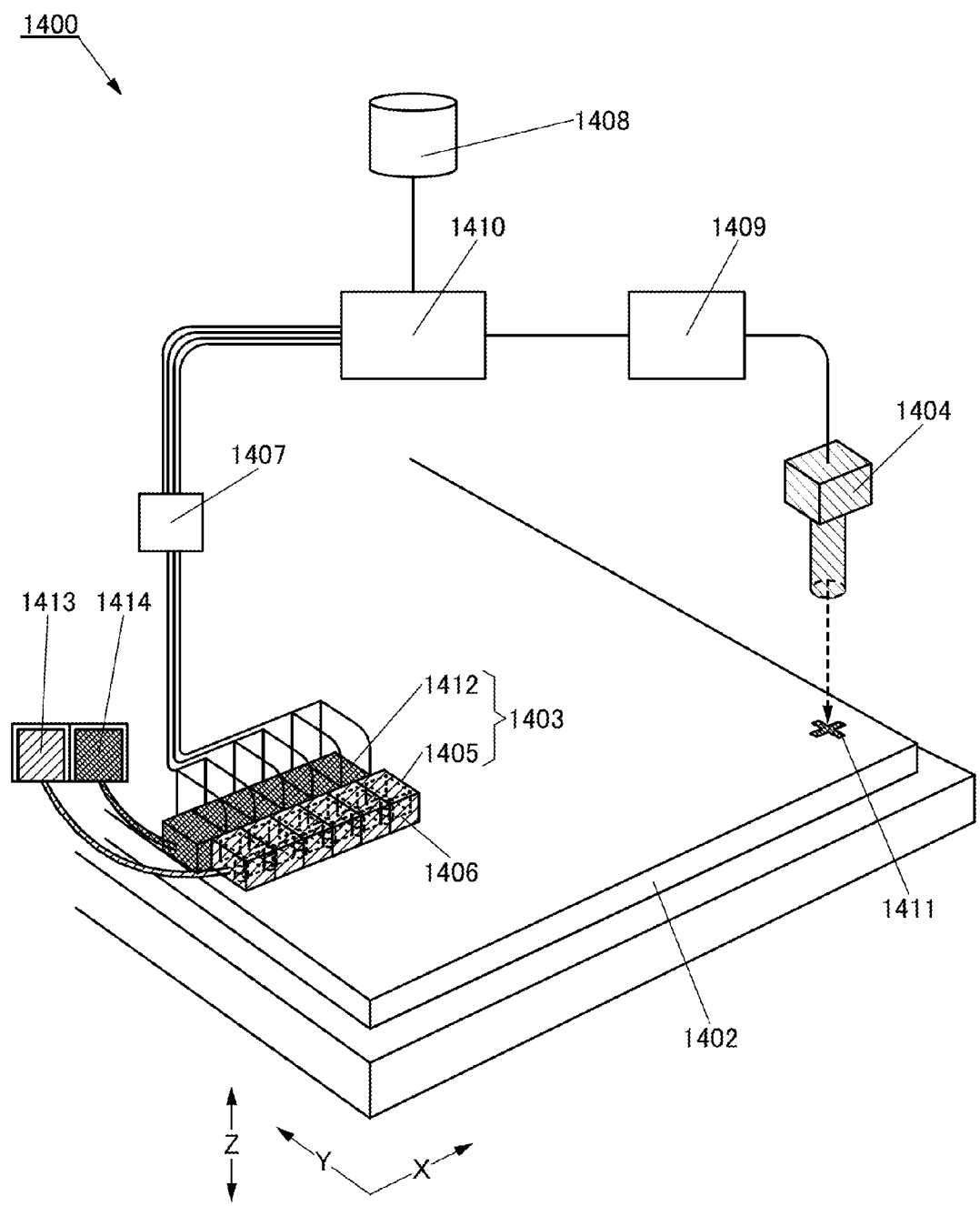
FIG. 20 is a conceptual diagram illustrating a droplet discharge apparatus.

Next, a droplet discharge apparatus used for the droplet discharge method is described with reference to FIG. 20. FIG. 20 is a conceptual diagram illustrating a droplet discharge apparatus 1400.

The droplet discharge apparatus 1400 includes a droplet discharge means 1403. In addition, the droplet discharge means 1403 is equipped with a head 1405 and a head 1412.

The heads 1405 and 1412 are connected to a control means 1407, and this control means 1407 is controlled by a computer 1410; thus, a preprogrammed pattern can be drawn.

The drawing may be conducted at a timing, for example, based on a marker 1411 formed over a substrate 1402. Alternatively, the reference point may be determined on the basis of an outer edge of the substrate 1402. Here, the marker 1411 is detected by an imaging means 1404 and converted into a digital signal by an image processing means 1409. Then, the digital signal is recognized by the computer 1410, and then, a control signal is generated and transmitted to the control means 1407.

An image sensor or the like using a charge coupled device (CCD) or a complementary metal oxide semiconductor (CMOS) can be used as the imaging means 1404. Note that information on a pattern to be formed over the substrate 1402 is stored in a storage medium 1408, and the control signal is transmitted to the control means 1407 on the basis of the information, whereby the head 1405 and the head 1412 of the droplet discharge means 1403 can be separately controlled. The heads 1405 and 1412 are supplied with a material to be discharged from material supply sources 1413 and 1414 through pipes, respectively.

Inside the head 1405, a space 1406 filled with a liquid material as indicated by a dotted line and a nozzle serving as a discharge opening are provided. Although it is not shown, an inside structure of the head 1412 is similar to that of the head 1405. When the nozzle sizes of the heads 1405 and 1412 are different from each other, different materials with different widths can be discharged simultaneously. Each head can discharge and draw a plurality of light emitting materials. In the case of drawing over a large area, the same material can be simultaneously discharged to be drawn from a plurality of nozzles in order to improve throughput. When a large substrate is used, the heads 1405 and 1412 can freely scan the substrate in directions indicated by arrows X, Y, and Z in FIG. 20, and a region in which a pattern is drawn can be freely set. Thus, a plurality of the same patterns can be drawn over one substrate.

Furthermore, a step of discharging the composition may be performed under reduced pressure. Also, a substrate may be heated when the composition is discharged. After discharging the composition, either drying or baking or the both is performed. Both the drying and baking are heat treatments but different in purpose, temperature, and time period. The steps of drying and baking are performed under normal pressure or under reduced pressure by laser irradiation, rapid thermal annealing, heating using a heating furnace, or the like. Note that the timing of the heat treatment and the number of times of the heat treatment are not particularly limited. The temperature for performing each of the steps of drying and baking in a favorable manner depends on the materials of the substrate and the properties of the composition.

As described above, the EL layer 616 can be formed with use of a droplet discharge apparatus.

In the above-described manner, the display device including any of the light-emitting elements and the optical elements which are described in Embodiments 1 to 3 can be obtained.

<Structure Example 2 of Display Device>

Next, another example of the display device is described with reference to FIGS. 11A and 11B and FIG. 12. Note that FIGS. 11A and 11B and FIG. 12 are each a cross-sectional view of a display device of one embodiment of the present invention.

Figure 11A:
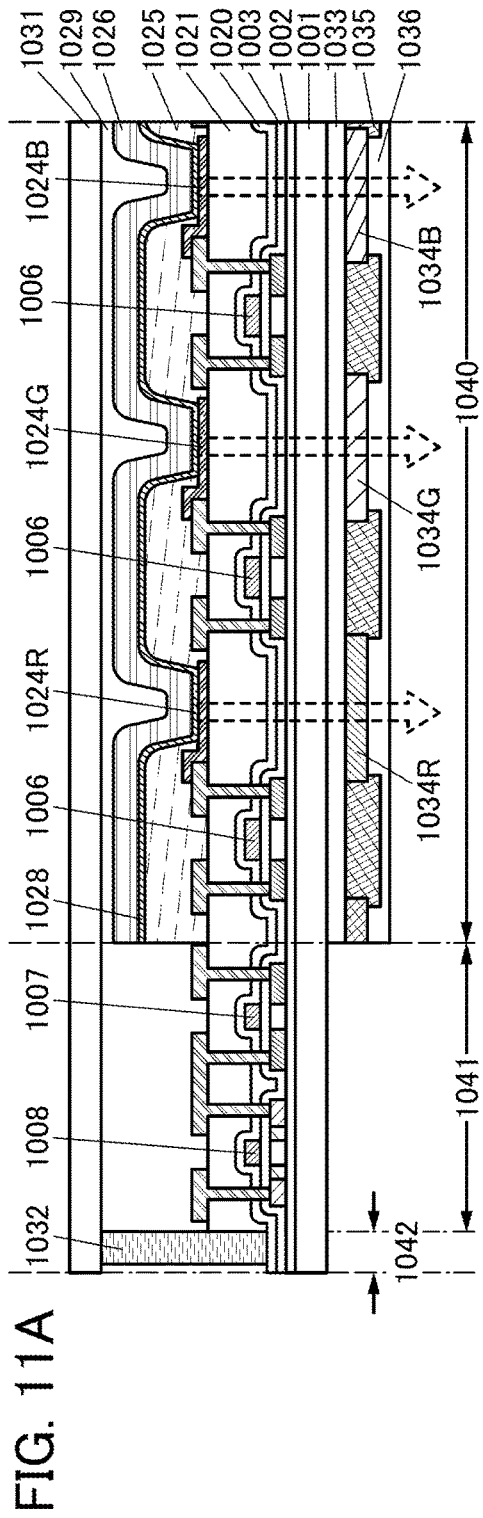
FIGS. 11A and 11B are schematic cross-sectional views each illustrating a display device of one embodiment of the present invention.
Figure 12:
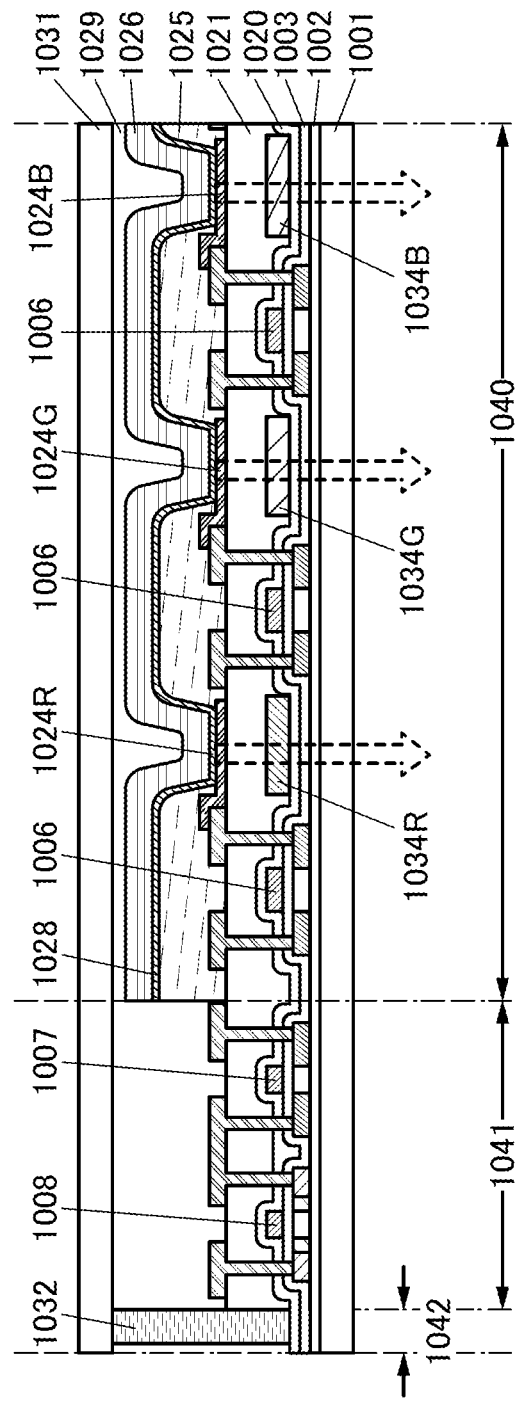
FIG. 12 is a schematic cross-sectional view illustrating a display device of one embodiment of the present invention.

In FIG. 11A, a substrate 1001, a base insulating film 1002, a gate insulating film 1003, gate electrodes 1006, 1007, and 1008, a first interlayer insulating film 1020, a second interlayer insulating film 1021, a peripheral portion 1042, a pixel portion 1040, a driver circuit portion 1041, lower electrodes 1024R, 1024G, and 1024B of light-emitting elements, a partition wall 1025, an EL layer 1028, an upper electrode 1026 of the light-emitting elements, a sealing layer 1029, a sealing substrate 1031, a sealant 1032, and the like are illustrated.

In FIG. 11A, examples of the optical elements, coloring layers (a red coloring layer 1034R, a green coloring layer 1034G, and a blue coloring layer 1034B) are provided on a transparent base material 1033. Furthermore, a light-blocking layer 1035 may be provided. The transparent base material 1033 provided with the coloring layers and the light-blocking layer is positioned and fixed to the substrate 1001. Note that the coloring layers and the light-blocking layer are covered with an overcoat layer 1036. In the structure in FIG. 11A, red light, green light, and blue light transmit the coloring layers, and thus an image can be displayed with the use of pixels of three colors.

Figure 11B:
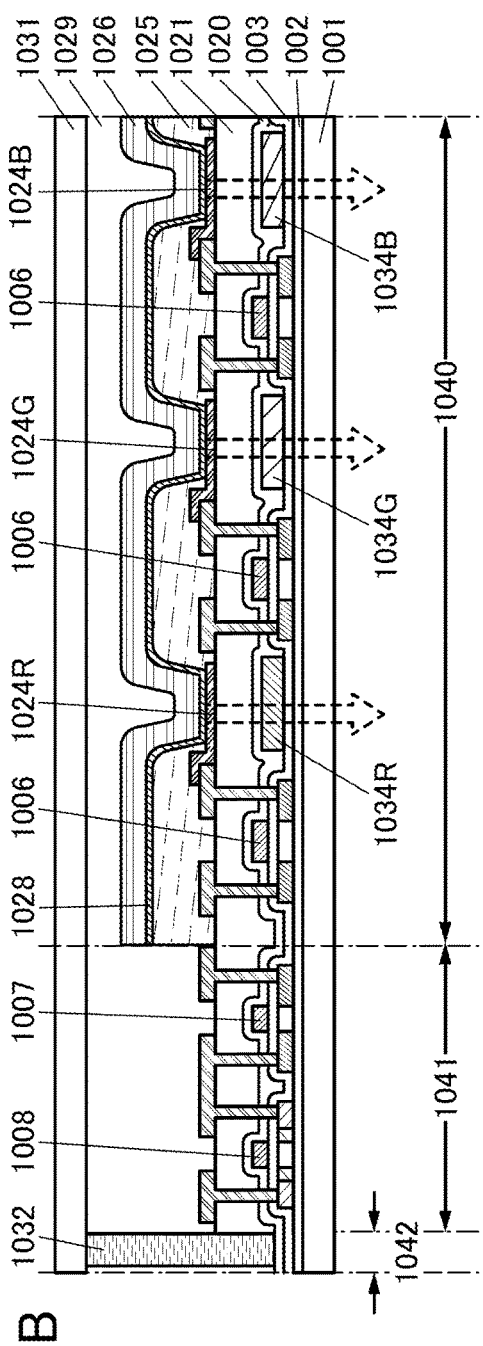

FIG. 11B illustrates an example in which, as examples of the optical elements, the coloring layers (the red coloring layer 1034R, the green coloring layer 1034G, and the blue coloring layer 1034B) are provided between the gate insulating film 1003 and the first interlayer insulating film 1020. As in this structure, the coloring layers may be provided between the substrate 1001 and the sealing substrate 1031.

FIG. 12 illustrates an example in which, as examples of the optical elements, the coloring layers (the red coloring layer 1034R, the green coloring layer 1034G, and the blue coloring layer 1034B) are provided between the first interlayer insulating film 1020 and the second interlayer insulating film 1021. As in this structure, the coloring layers may be provided between the substrate 1001 and the sealing substrate 1031.

The above-described display device has a structure in which light is extracted from the substrate 1001 side where the transistors are formed (a bottom-emission structure), but may have a structure in which light is extracted from the sealing substrate 1031 side (a top-emission structure).

<Structure Example 3 of Display Device>

Figure 13A:
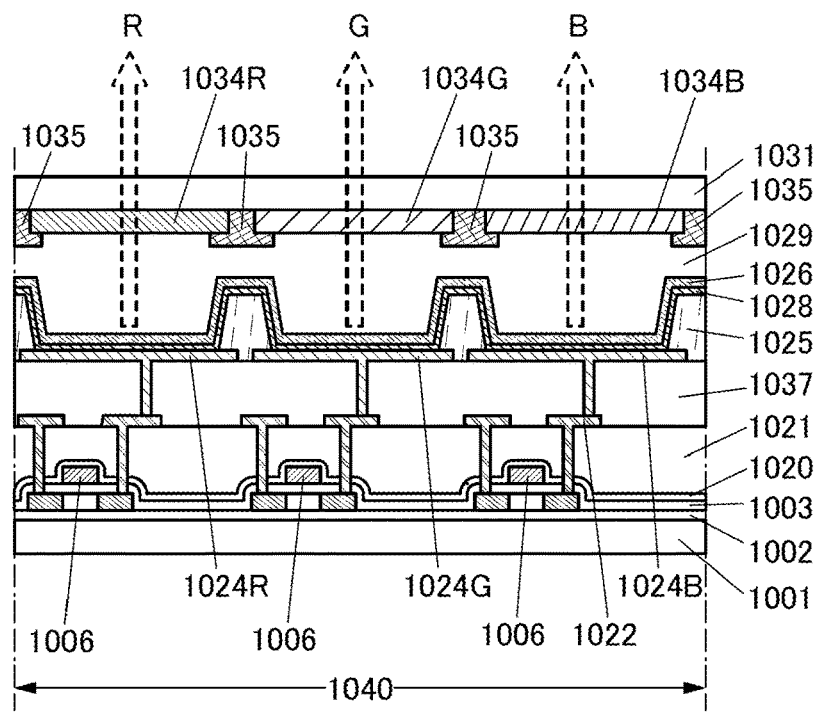
FIGS. 13A and 13B are schematic cross-sectional views each illustrating a display device of one embodiment of the present invention.
Figure 13B:
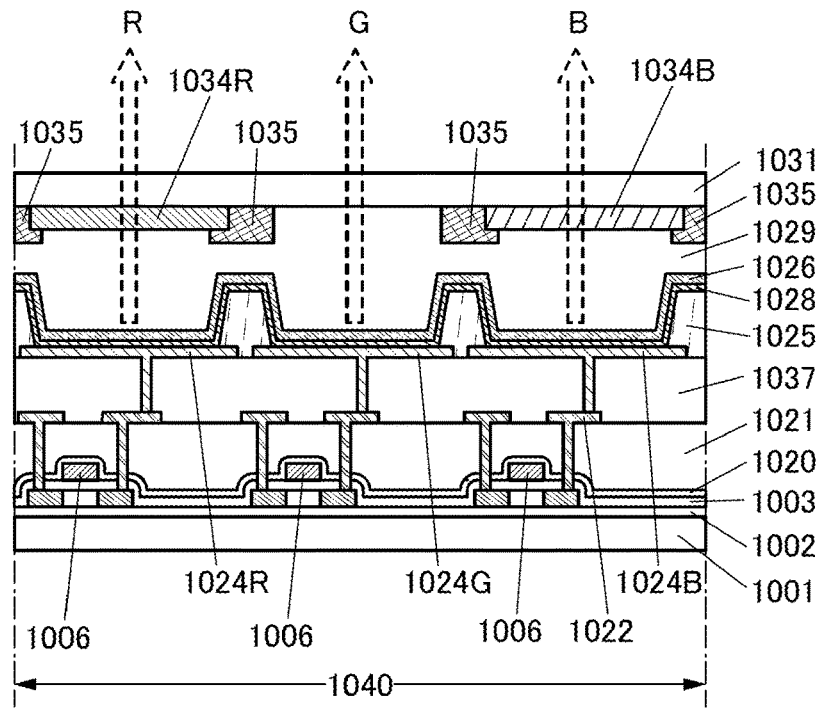

FIGS. 13A and 13B are each an example of a cross-sectional view of a display device having a top emission structure. Note that FIGS. 13A and 13B are each a cross-sectional view illustrating the display device of one embodiment of the present invention, and the driver circuit portion 1041, the peripheral portion 1042, and the like, which are illustrated in FIGS. 11A and 11B and FIG. 12, are not illustrated therein.

In this case, a substrate which does not transmit light can be used as the substrate 1001. The process up to the step of forming a connection electrode which connects the transistor and the cathode of the light-emitting element is performed in a manner similar to that of the display device having a bottom-emission structure. Then, a third interlayer insulating film 1037 is formed to cover an electrode 1022. This insulating film may have a planarization function. The third interlayer insulating film 1037 can be formed using a material similar to that of the second interlayer insulating film, or can be formed using any other various materials.

The lower electrodes 1024R, 1024G, and 1024B of the light-emitting elements each function as a cathode here, but may function as an anode. Further, in the case of a display device having a top-emission structure as illustrated in FIGS. 13A and 13B, the lower electrodes 1024R, 1024G, and 1024B preferably have a function of reflecting light. The upper electrode 1026 is provided over the EL layer 1028. It is preferable that the upper electrode 1026 have a function of reflecting light and a function of transmitting light and that a microcavity structure be used between the upper electrode 1026 and the lower electrodes 1024R, 1024G, and 1024B, in which case the intensity of light having a specific wavelength is increased.

In the case of a top-emission structure as illustrated in FIG. 13A, sealing can be performed with the sealing substrate 1031 on which the coloring layers (the red coloring layer 1034R, the green coloring layer 1034G, and the blue coloring layer 1034B) are provided. The sealing substrate 1031 may be provided with the light-blocking layer 1035 which is positioned between pixels. Note that a light-transmitting substrate is favorably used as the sealing substrate 1031.

FIG. 13A illustrates the structure provided with the light-emitting elements and the coloring layers for the light-emitting elements as an example; however, the structure is not limited thereto. For example, as shown in FIG. 13B, a structure including the red coloring layer 1034R and the blue coloring layer 1034B but not including a green coloring layer may be employed to achieve full color display with the three colors of red, green, and blue. The structure as illustrated in FIG. 13A where the light-emitting elements are provided with the coloring layers is effective to suppress reflection of external light. In contrast, the structure as illustrated in FIG. 13B where the light-emitting elements are provided with the red coloring layer and the blue coloring layer and without the green coloring layer is effective to reduce power consumption because of small energy loss of light emitted from the green light-emitting element.

<Structure Example 4 of Display Device>

Figure 15:
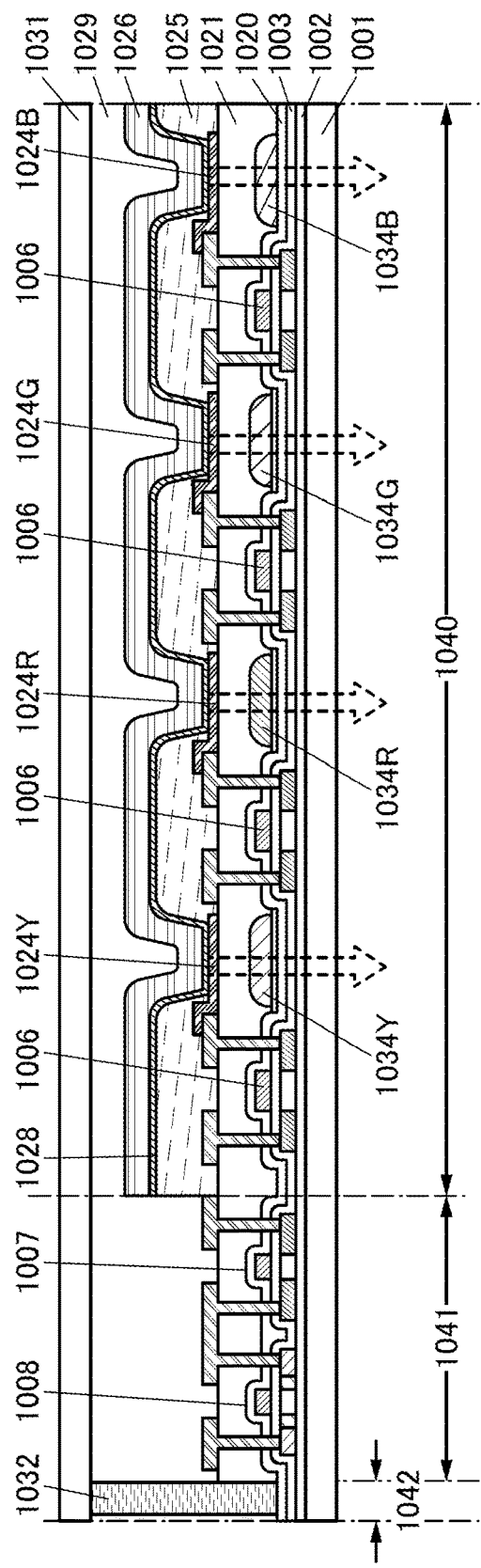
FIG. 15 is a schematic cross-sectional view illustrating a display device of one embodiment of the present invention.

Although a display device including sub-pixels of three colors (red, green, and blue) is described above, the number of colors of sub-pixels may be four (red, green, blue, and yellow, or red, green, blue, and white). FIGS. 14A and 14B, FIG. 15, and FIGS. 16A and 16B illustrate structures of display devices each including the lower electrodes 1024R, 1024G, 1024B, and 1024Y. FIGS. 14A and 14B and FIG. 15 each illustrate a display device having a structure in which light is extracted from the substrate 1001 side on which transistors are formed (bottom-emission structure), and FIGS. 16A and 16B each illustrate a display device having a structure in which light is extracted from the sealing substrate 1031 side (top-emission structure).

FIG. 14A illustrates an example of a display device in which optical elements (the coloring layer 1034R, the coloring layer 1034G, the coloring layer 1034B, and a coloring layer 1034Y) are provided on the transparent base material 1033. FIG. 14B illustrates an example of a display device in which optical elements (the coloring layer 1034R, the coloring layer 1034G, the coloring layer 1034B, and the coloring layer 1034Y) are provided between the gate insulating film 1003 and the first interlayer insulating film 1020. FIG. 15 illustrates an example of a display device in which optical elements (the coloring layer 1034R, the coloring layer 1034G, the coloring layer 1034B, and the coloring layer 1034Y) are provided between the first interlayer insulating film 1020 and the second interlayer insulating film 1021.

The coloring layer 1034R transmits red light, the coloring layer 1034G transmits green light, and the coloring layer 1034B transmits blue light. The coloring layer 1034Y transmits yellow light or transmits light of a plurality of colors selected from blue, green, yellow, and red. When the coloring layer 1034Y can transmit light of a plurality of colors selected from blue, green, yellow, and red, light released from the coloring layer 1034Y may be white light. Since the light-emitting element which transmits yellow or white light has high emission efficiency, the display device including the coloring layer 1034Y can have lower power consumption.

Figure 16A:
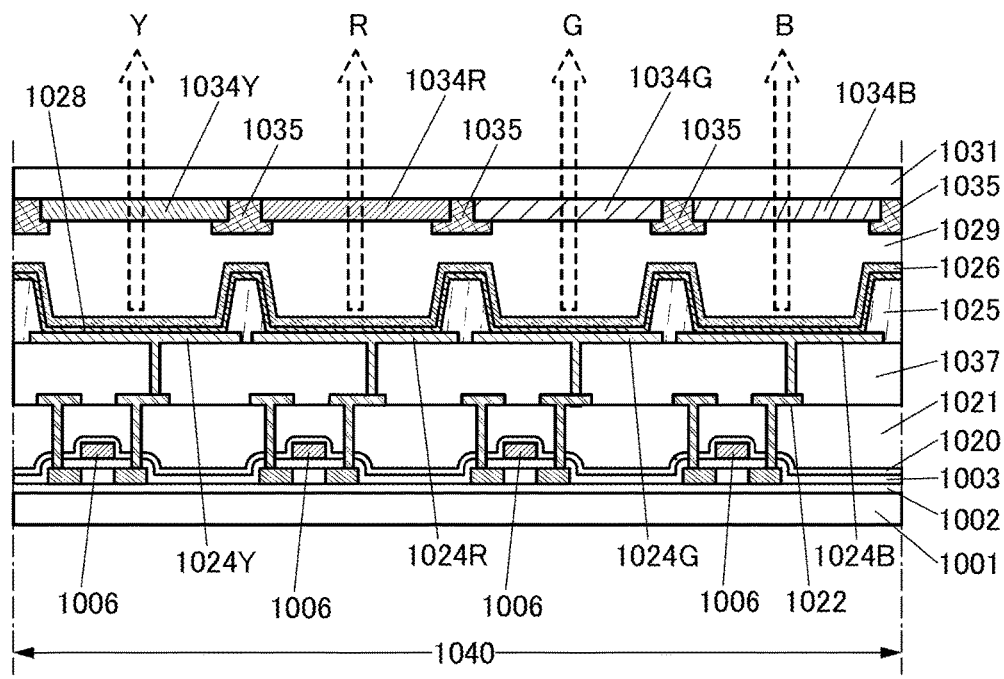
FIGS. 16A and 16B are schematic cross-sectional views each illustrating a display device of one embodiment of the present invention.
Figure 16B:
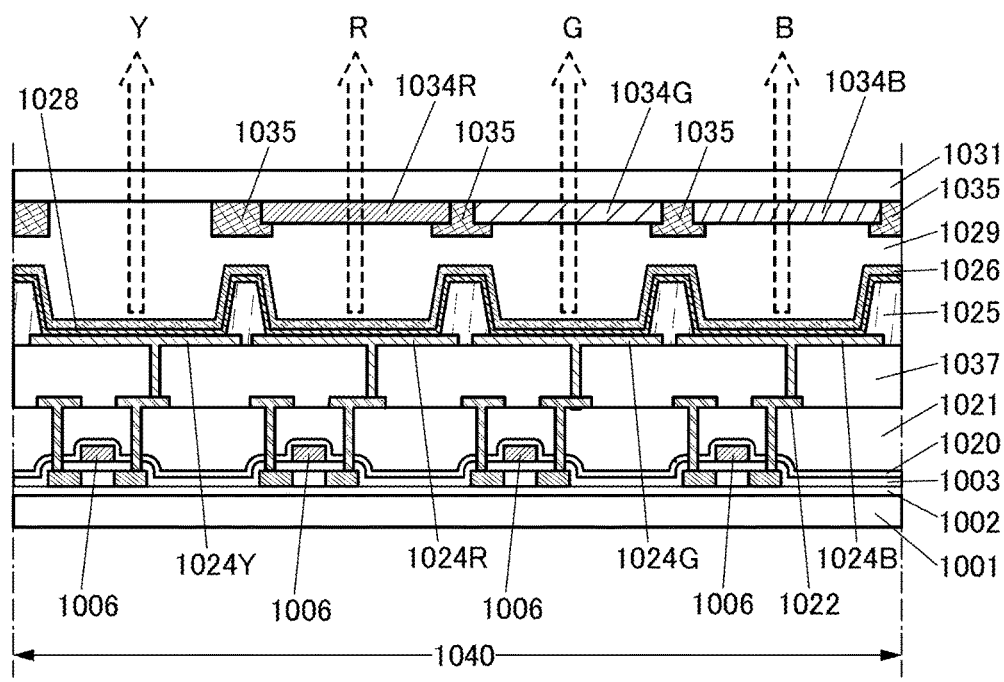

In the top-emission display devices illustrated in FIGS. 16A and 16B, a light-emitting element including the lower electrode 1024Y preferably has a microcavity structure between the lower electrode 1024Y and the upper electrode 1026 as in the display device illustrated in FIG. 13A. In the display device illustrated in FIG. 16A, sealing can be performed with the sealing substrate 1031 on which the coloring layers (the red coloring layer 1034R, the green coloring layer 1034G, the blue coloring layer 1034B, and the yellow coloring layer 1034Y) are provided.

Light emitted through the microcavity and the yellow coloring layer 1034Y has an emission spectrum in a yellow region. Since yellow is a color with a high luminosity factor, a light-emitting element emitting yellow light has high emission efficiency. Therefore, the display device of FIG. 16A can reduce power consumption.

FIG. 16A illustrates the structure provided with the light-emitting elements and the coloring layers for the light-emitting elements as an example; however, the structure is not limited thereto. For example, as shown in FIG. 16B, a structure including the red coloring layer 1034R, the green coloring layer 1034G, and the blue coloring layer 1034B but not including a yellow coloring layer may be employed to achieve full color display with the four colors of red, green, blue, and yellow or of red, green, blue, and white. The structure as illustrated in FIG. 16A where the light-emitting elements are provided with the coloring layers is effective to suppress reflection of external light. In contrast, the structure as illustrated in FIG. 16B where the light-emitting elements are provided with the red coloring layer, the green coloring layer, and the blue coloring layer and without the yellow coloring layer is effective to reduce power consumption because of small energy loss of light emitted from the yellow or white light-emitting element.

<Structure Example 5 of Display Device>

Figure 17:
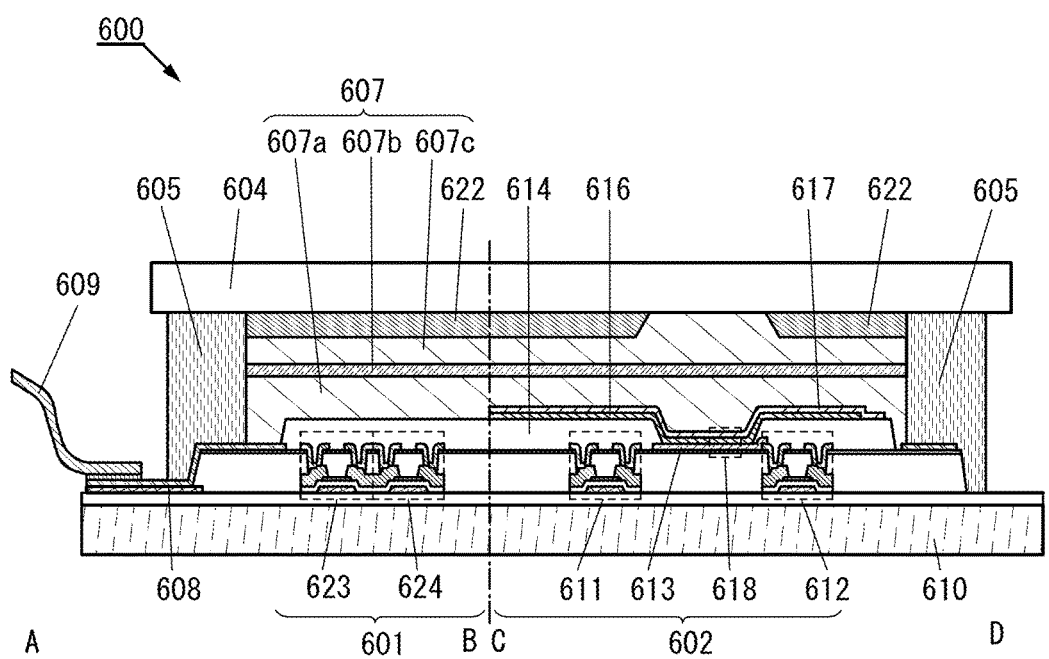
FIG. 17 is a schematic cross-sectional view illustrating a display device of one embodiment of the present invention.

Next, a display device of another embodiment of the present invention is described with reference to FIG. 17. FIG. 17 is a cross-sectional view taken along the dashed-dotted line A-B and the dashed-dotted line C-D in FIG. 10A. Note that in FIG. 17, portions having functions similar to those of portions in FIG. 10B are given the same reference numerals as in FIG. 10B, and a detailed description of the portions is omitted.

The display device 600 in FIG. 17 includes a sealing layer 607*a*, a sealing layer 607*b*, and a sealing layer 607*c* in a region 607 surrounded by the element substrate 610, the sealing substrate 604, and the sealant 605. For one or more of the sealing layer 607*a*, the sealing layer 607*b*, and the sealing layer 607*c*, a resin such as a polyvinyl chloride (PVC) based resin, an acrylic-based resin, a polyimide-based resin, an epoxy-based resin, a silicone-based resin, a polyvinyl butyral (PVB) based resin, or an ethylene vinyl acetate (EVA) based resin can be used. Alternatively, an inorganic material such as silicon oxide, silicon oxynitride, silicon nitride oxide, silicon nitride, aluminum oxide, or aluminum nitride can be used. The formation of the sealing layers 607*a*, 607*b*, and 607*c* can prevent deterioration of the light-emitting element 618 due to impurities such as water, which is preferable. In the case where the sealing layers 607*a*, 607*b*, and 607*c* are formed, the sealant 605 is not necessarily provided.

Alternatively, any one or two of the sealing layers 607*a*, 607*b*, and 607*c* may be provided or four or more sealing layers may be formed. When the sealing layer has a multilayer structure, the impurities such as water can be effectively prevented from entering the light-emitting element 618 which is inside the display device from the outside of the display device 600. In the case where the sealing layer has a multilayer structure, a resin and an inorganic material are preferably stacked.

<Structure Example 6 of Display Device>

Although the display devices in the structure examples 1 to 4 in this embodiment each have a structure including optical elements, one embodiment of the present invention does not necessarily include an optical element.

Figure 18A:
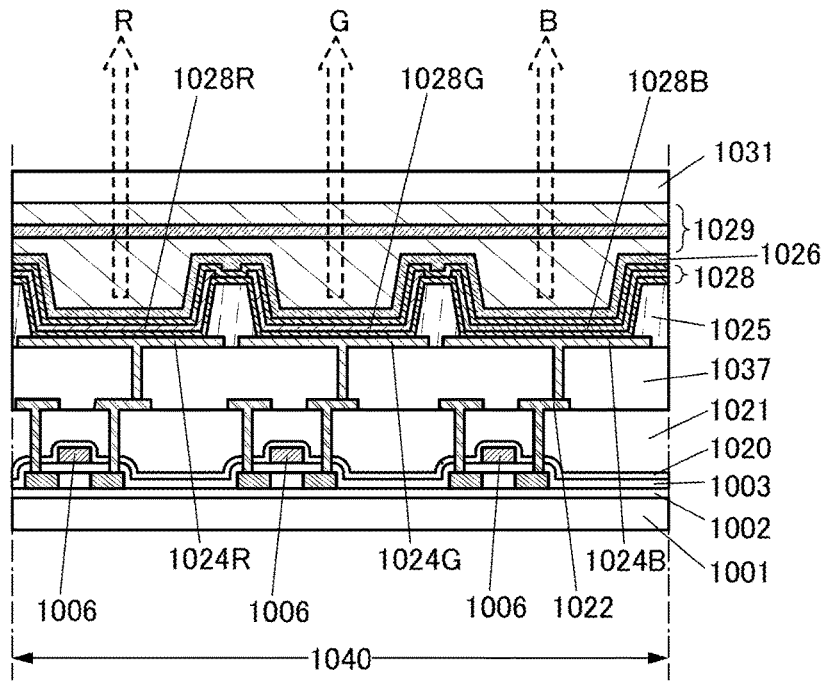
FIGS. 18A and 18B are schematic cross-sectional views each illustrating a display device of one embodiment of the present invention.
Figure 18B:
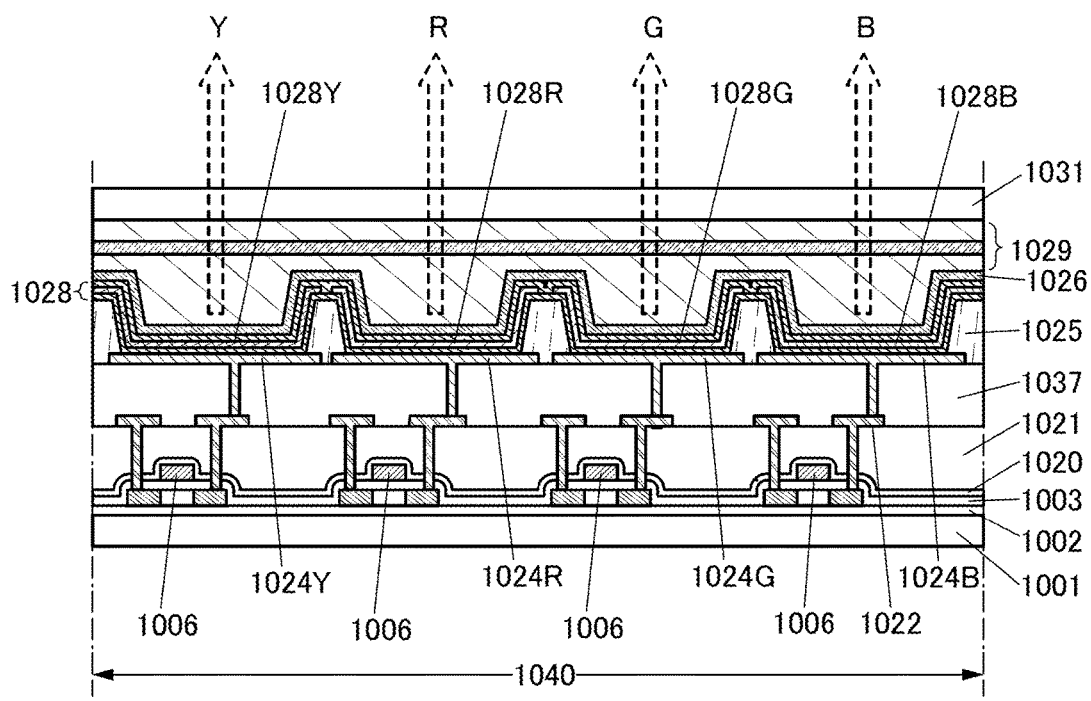

FIGS. 18A and 18B each illustrate a display device having a structure in which light is extracted from the sealing substrate 1031 side (a top-emission display device). FIG. 18A illustrates an example of a display device including a light-emitting layer 1028R, a light-emitting layer 1028G, and a light-emitting layer 1028B. FIG. 18B illustrates an example of a display device including a light-emitting layer 1028R, a light-emitting layer 1028G, a light-emitting layer 1028B, and a light-emitting layer 1028Y.

The light-emitting layer 1028R has a function of exhibiting red light, the light-emitting layer 1028G has a function of exhibiting green light, and the light-emitting layer 1028B has a function of exhibiting blue light. The light-emitting layer 1028Y has a function of exhibiting yellow light or a function of exhibiting light of a plurality of colors selected from blue, green, and red. The light-emitting layer 1028Y may exhibit white light. Since the light-emitting element which exhibits yellow or white light has high light emission efficiency, the display device including the light-emitting layer 1028Y can have lower power consumption.

Each of the display devices in FIGS. 18A and 18B does not necessarily include coloring layers serving as optical elements because EL layers exhibiting light of different colors are included in sub-pixels.

For the sealing layer 1029, a resin such as a polyvinyl chloride (PVC) based resin, an acrylic-based resin, a polyimide-based resin, an epoxy-based resin, a silicone-based resin, a polyvinyl butyral (PVB) based resin, or an ethylene vinyl acetate (EVA) based resin can be used. Alternatively, an inorganic material such as silicon oxide, silicon oxynitride, silicon nitride oxide, silicon nitride, aluminum oxide, or aluminum nitride can be used. The formation of the sealing layer 1029 can prevent deterioration of the light-emitting element due to impurities such as water, which is preferable.

Alternatively, the sealing layer 1029 may have a single-layer or two-layer structure, or four or more sealing layers may be formed as the sealing layer 1029. When the sealing layer has a multilayer structure, the impurities such as water can be effectively prevented from entering the inside of the display device from the outside of the display device. In the case where the sealing layer has a multilayer structure, a resin and an inorganic material are preferably stacked.

Note that the sealing substrate 1031 has a function of protecting the light-emitting element. Thus, for the sealing substrate 1031, a flexible substrate or a film can be used.

The structures described in this embodiment can be combined as appropriate with any of the other structures in this embodiment and the other embodiments.

Embodiment 5

In this embodiment, a display device including a light-emitting device of one embodiment of the present invention is described with reference to FIGS. 21A and 21B.

Figure 21A:
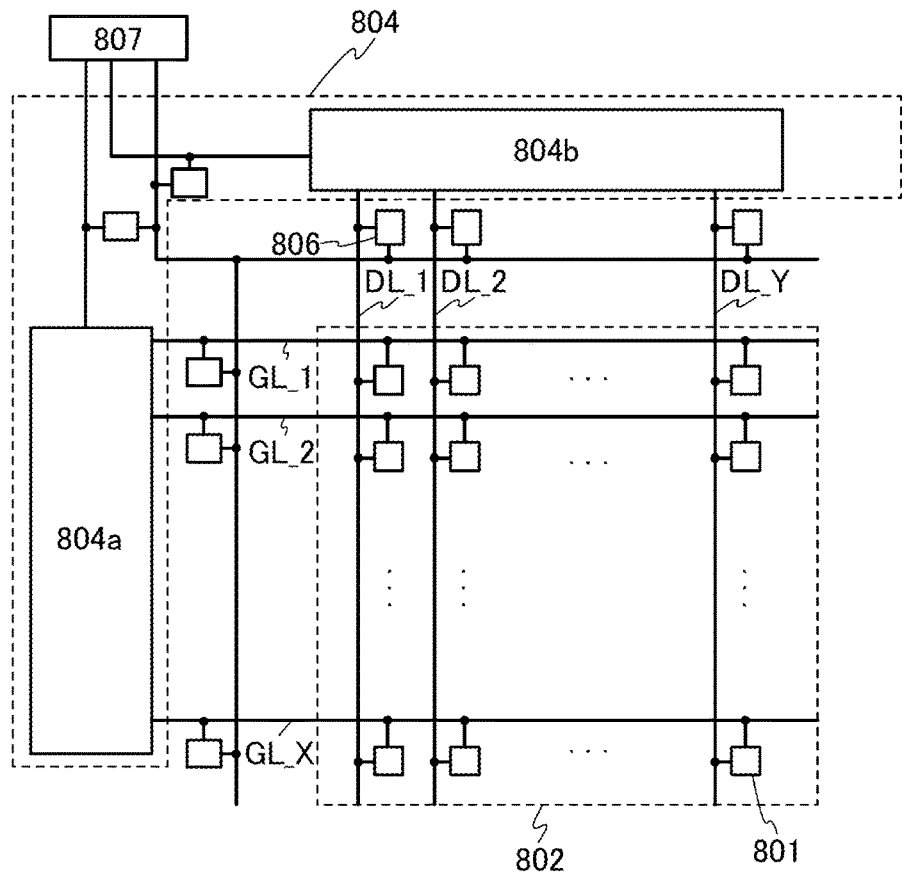
FIGS. 21A and 21B are a block diagram and a circuit diagram illustrating a display device of one embodiment of the present invention.
Figure 21B:
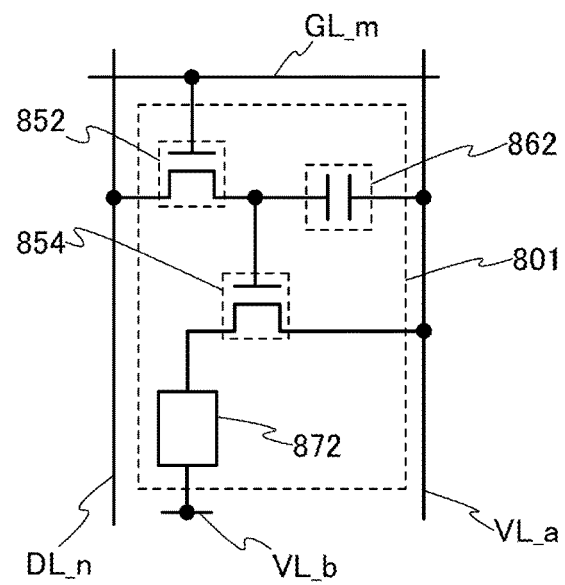

FIG. 21A is a block diagram illustrating the display device of one embodiment of the present invention, and FIG. 21B is a circuit diagram illustrating a pixel circuit of the display device of one embodiment of the present invention.
<Description of Display Device>

The display device illustrated in FIG. 21A includes a region including pixels of display elements (the region is hereinafter referred to as a pixel portion 802), a circuit portion provided outside the pixel portion 802 and including circuits for driving the pixels (the portion is hereinafter referred to as a driver circuit portion 804), circuits having a function of protecting elements (the circuits are hereinafter referred to as protection circuits 806), and a terminal portion 807. Note that the protection circuits 806 are not necessarily provided.

A part or the whole of the driver circuit portion 804 is preferably formed over a substrate over which the pixel portion 802 is formed. Thus, the number of components and the number of terminals can be reduced. When a part or the whole of the driver circuit portion 804 is not formed over the substrate over which the pixel portion 802 is formed, the part or the whole of the driver circuit portion 804 can be mounted by COG or tape automated bonding (TAB).

The pixel portion 802 includes a plurality of circuits for driving display elements arranged in X rows (X is a natural number of 2 or more) and Y columns (Y is a natural number of 2 or more) (such circuits are hereinafter referred to as pixel circuits 801). The driver circuit portion 804 includes driver circuits such as a circuit for supplying a signal (scan signal) to select a pixel (the circuit is hereinafter referred to as a scan line driver circuit 804*a*) and a circuit for supplying a signal (data signal) to drive a display element in a pixel (the circuit is hereinafter referred to as a signal line driver circuit 804*b*).

The scan line driver circuit 804*a* includes a shift register or the like. Through the terminal portion 807, the scan line driver circuit 804*a* receives a signal for driving the shift register and outputs a signal. For example, the scan line driver circuit 804*a* receives a start pulse signal, a clock signal, or the like and outputs a pulse signal. The scan line driver circuit 804*a* has a function of controlling the potentials of wirings supplied with scan signals (such wirings are hereinafter referred to as scan lines GL_1 to GL_X). Note that a plurality of scan line driver circuits 804*a* may be provided to control the scan lines GL_1 to GL_X separately. Alternatively, the scan line driver circuit 804*a* has a function of supplying an initialization signal. Without being limited thereto, the scan line driver circuit 804*a* can supply another signal.

The signal line driver circuit 804*b* includes a shift register or the like. The signal line driver circuit 804*b* receives a signal (image signal) from which a data signal is derived, as well as a signal for driving the shift register, through the terminal portion 807. The signal line driver circuit 804*b* has a function of generating a data signal to be written to the pixel circuit 801 which is based on the image signal. In addition, the signal line driver circuit 804*b* has a function of controlling output of a data signal in response to a pulse signal produced by input of a start pulse signal, a clock signal, or the like. Furthermore, the signal line driver circuit 804*b* has a function of controlling the potentials of wirings supplied with data signals (such wirings are hereinafter referred to as data lines DL_1 to DL_Y). Alternatively, the signal line driver circuit 804*b* has a function of supplying an initialization signal. Without being limited thereto, the signal line driver circuit 804*b* can supply another signal.

The signal line driver circuit 804*b* includes a plurality of analog switches or the like, for example. The signal line driver circuit 804*b* can output, as the data signals, signals obtained by time-dividing the image signal by sequentially turning on the plurality of analog switches. The signal line driver circuit 804*b* may include a shift register or the like.

A pulse signal and a data signal are input to each of the plurality of pixel circuits 801 through one of the plurality of scan lines GL supplied with scan signals and one of the plurality of data lines DL supplied with data signals, respectively. Writing and holding of the data signal to and in each of the plurality of pixel circuits 801 are controlled by the scan line driver circuit 804*a*. For example, to the pixel circuit 801 in the m-th row and the n-th column (m is a natural number less than or equal to X, and n is a natural number of less than or equal to Y), a pulse signal is input from the scan line driver circuit 804*a* through the scan line GL_m, and a data signal is input from the signal line driver circuit 804*b* through the data line DL_n in accordance with the potential of the scan line GL_m.

The protection circuit 806 shown in FIG. 21A is connected to, for example, the scan line GL between the scan line driver circuit 804*a* and the pixel circuit 801. Alternatively, the protection circuit 806 is connected to the data line DL between the signal line driver circuit 804*b* and the pixel circuit 801. Alternatively, the protection circuit 806 can be connected to a wiring between the scan line driver circuit 804*a* and the terminal portion 807. Alternatively, the protection circuit 806 can be connected to a wiring between the signal line driver circuit 804*b* and the terminal portion 807. Note that the terminal portion 807 means a portion having terminals for inputting power, control signals, and image signals to the display device from external circuits.

The protection circuit 806 is a circuit that electrically connects a wiring connected to the protection circuit to another wiring when a potential out of a certain range is applied to the wiring connected to the protection circuit.

As illustrated in FIG. 21A, the protection circuits 806 are connected to the pixel portion 802 and the driver circuit portion 804, so that the resistance of the display device to overcurrent generated by electrostatic discharge (ESD) or the like can be improved. Note that the configuration of the protection circuits 806 is not limited to that, and for example, a configuration in which the protection circuits 806 are connected to the scan line driver circuit 804a or a configuration in which the protection circuits 806 are connected to the signal line driver circuit 804b may be employed. Alternatively, the protection circuits 806 may be configured to be connected to the terminal portion 807.

In FIG. 21A, an example in which the driver circuit portion 804 includes the scan line driver circuit 804a and the signal line driver circuit 804b is shown; however, the structure is not limited thereto. For example, only the scan line driver circuit 804a may be formed and a separately prepared substrate where a signal line driver circuit is formed (e.g., a driver circuit substrate formed with a single crystal semiconductor film or a polycrystalline semiconductor film) may be mounted.

<Structural Example of Pixel Circuit>

Each of the plurality of pixel circuits 801 in FIG. 21A can have a structure illustrated in FIG. 21B, for example.

The pixel circuit 801 illustrated in FIG. 21B includes a transistor 852, a transistor 854, a capacitor 862, and a light-emitting element 872.

One of a source electrode and a drain electrode of the transistor 852 is electrically connected to a wiring to which a data signal is supplied (a data line DL_n). A gate electrode of the transistor 852 is electrically connected to a wiring to which a gate signal is supplied (a scan line GL_m).

The transistor 852 has a function of controlling whether to write a data signal.

One of a pair of electrodes of the capacitor 862 is electrically connected to a wiring to which a potential is supplied (hereinafter referred to as a potential supply line VL_a), and the other is electrically connected to the other of the source electrode and the drain electrode of the transistor 852.

The capacitor 862 functions as a storage capacitor for storing written data.

One of a source electrode and a drain electrode of the transistor 854 is electrically connected to the potential supply line VL_a. Furthermore, a gate electrode of the transistor 854 is electrically connected to the other of the source electrode and the drain electrode of the transistor 852.

One of an anode and a cathode of the light-emitting element 872 is electrically connected to a potential supply line VL_b, and the other is electrically connected to the other of the source electrode and the drain electrode of the transistor 854.

As the light-emitting element 872, any of the light-emitting elements described in Embodiments 1 to 3 can be used.

Note that a high power supply potential VDD is supplied to one of the potential supply line VL_a and the potential supply line VL_b, and a low power supply potential VSS is supplied to the other.

In the display device including the pixel circuits 801 in FIG. 21B, the pixel circuits 801 are sequentially selected row by row by the scan line driver circuit 804a in FIG. 21A, for example, whereby the transistors 852 are turned on and a data signal is written.

When the transistors 852 are turned off, the pixel circuits 801 in which the data has been written are brought into a holding state. Furthermore, the amount of current flowing between the source electrode and the drain electrode of the transistor 854 is controlled in accordance with the potential of the written data signal. The light-emitting element 872 emits light with a luminance corresponding to the amount of flowing current. This operation is sequentially performed row by row; thus, an image is displayed.

Alternatively, the pixel circuit can have a function of compensating variation in threshold voltages or the like of a transistor.

A light-emitting element of one embodiment of the present invention can be used for an active matrix method in which an active element is included in a pixel of a display device or a passive matrix method in which an active element is not included in a pixel of a display device.

In an active matrix method, as an active element (a non-linear element), not only a transistor but also various active elements (non-linear elements) can be used. For example, a metal insulator metal (MIM), a thin film diode (TFD), or the like can also be used. Since such an element has few numbers of manufacturing steps, manufacturing cost can be reduced or yield can be improved. Alternatively, since the size of the element is small, the aperture ratio can be improved, so that power consumption can be reduced or higher luminance can be achieved.

As a method other than the active matrix method, the passive matrix method in which an active element (a non-linear element) is not used can also be used. Since an active element (a non-linear element) is not used, the number of manufacturing steps is small, so that manufacturing cost can be reduced or yield can be improved. Alternatively, since an active element (a non-linear element) is not used, the aperture ratio can be improved, so that power consumption can be reduced or higher luminance can be achieved, for example.

The structure described in this embodiment can be used in appropriate combination with the structure described in any of the other embodiments.

Embodiment 6

In this embodiment, a display device including a light-emitting element of one embodiment of the present invention and an electronic device in which the display device is provided with an input device will be described with reference to FIGS. 22A and 22B, FIGS. 23A to 23C, FIGS. 24A and 24B, FIGS. 25A and 25B, and FIG. 26.

<Description 1 of Touch Panel>

In this embodiment, a touch panel 2000 including a display device and an input device will be described as an example of an electronic device. In addition, an example in which a touch sensor is included as an input device will be described.

Figure 22A:
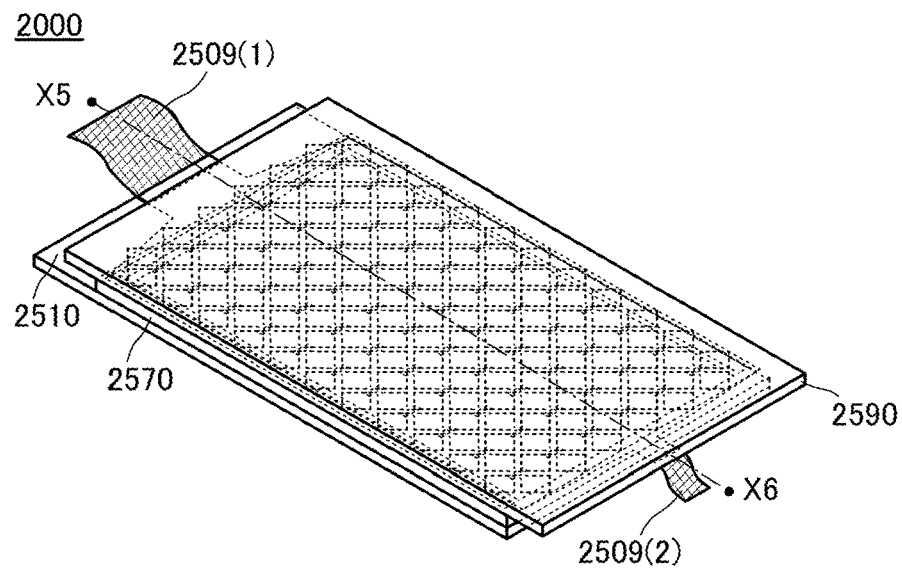
FIGS. 22A and 22B are perspective views of an example of a touch panel of one embodiment of the present invention.
Figure 22B:
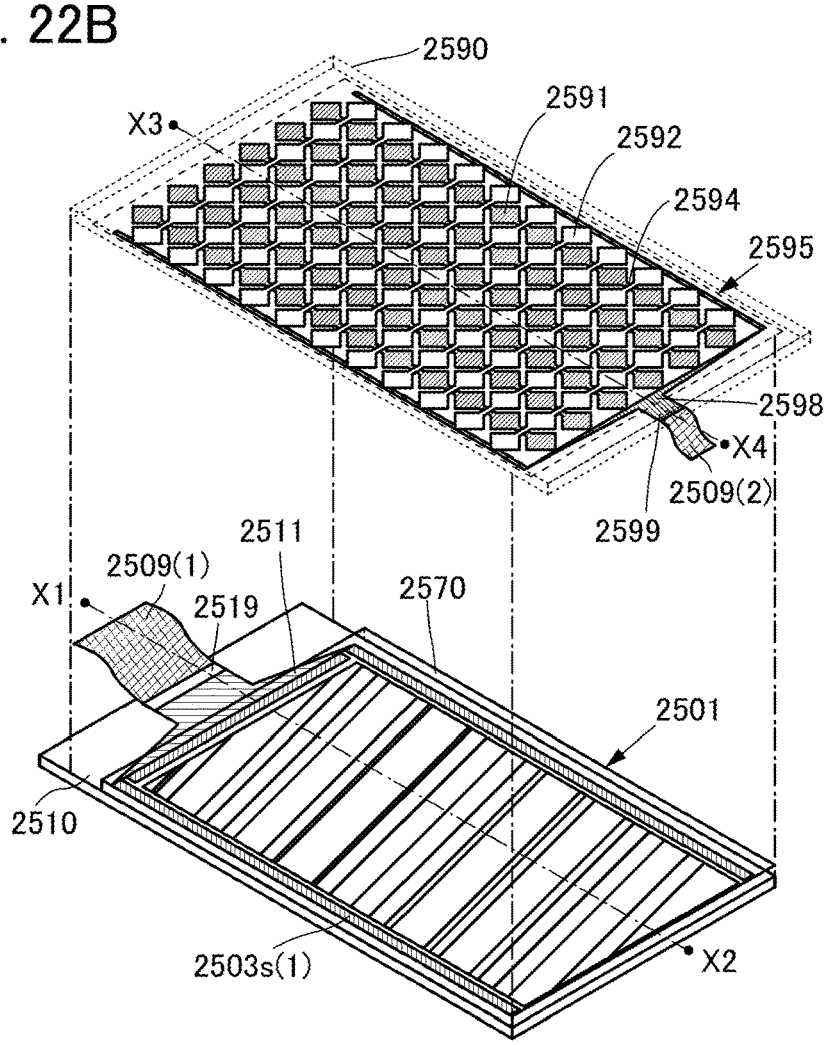

FIGS. 22A and 22B are perspective views of the touch panel 2000. Note that FIGS. 22A and 22B illustrate only main components of the touch panel 2000 for simplicity.

The touch panel 2000 includes a display device 2501 and a touch sensor 2595 (see FIG. 22B). Furthermore, the touch panel 2000 includes a substrate 2510, a substrate 2570, and a substrate 2590. Note that the substrate 2510, the substrate 2570, and the substrate 2590 each have flexibility. Note that one or all of the substrates 2510, 2570, and 2590 may be inflexible.

The display device 2501 includes a plurality of pixels over the substrate 2510 and a plurality of wirings 2511 through which signals are supplied to the pixels. The plurality of wirings 2511 are led to a peripheral portion of the substrate 2510, and part of the plurality of wirings 2511 forms a terminal 2519. The terminal 2519 is electrically connected to an FPC 2509(1). The plurality of wirings 2511 can supply signals from a signal line driver circuit 2503s(1) to the plurality of pixels.

The substrate 2590 includes the touch sensor 2595 and a plurality of wirings 2598 electrically connected to the touch sensor 2595. The plurality of wirings 2598 are led to a peripheral portion of the substrate 2590, and parts of the plurality of wirings 2598 form a terminal. The terminal is electrically connected to an FPC 2509(2). Note that in FIG. 22B, electrodes, wirings, and the like of the touch sensor 2595 provided on the back side of the substrate 2590 (the side facing the substrate 2510) are indicated by solid lines for clarity.

As the touch sensor 2595, a capacitive touch sensor can be used, for example. Examples of the capacitive touch sensor are a surface capacitive touch sensor and a projected capacitive touch sensor.

Examples of the projected capacitive touch sensor are a self-capacitive touch sensor and a mutual capacitive touch sensor, which differ mainly in the driving method. The use of a mutual capacitive touch sensor is preferable because multiple points can be sensed simultaneously.

Note that the touch sensor 2595 illustrated in FIG. 22B is an example of using a projected capacitive touch sensor.

Note that a variety of sensors that can sense proximity or touch of a sensing target such as a finger can be used as the touch sensor 2595.

The projected capacitive touch sensor 2595 includes electrodes 2591 and electrodes 2592. The electrodes 2591 are electrically connected to any of the plurality of wirings 2598, and the electrodes 2592 are electrically connected to any of the other wirings 2598.

The electrodes 2592 each have a shape of a plurality of quadrangles arranged in one direction with one corner of a quadrangle connected to one corner of another quadrangle as illustrated in FIGS. 22A and 22B.

The electrodes 2591 each have a quadrangular shape and are arranged in a direction intersecting with the direction in which the electrodes 2592 extend.

A wiring 2594 electrically connects two electrodes 2591 between which the electrode 2592 is positioned. The intersecting area of the electrode 2592 and the wiring 2594 is preferably as small as possible. Such a structure allows a reduction in the area of a region where the electrodes are not provided, reducing unevenness in transmittance. As a result, unevenness in the luminance of light from the touch sensor 2595 can be reduced.

Note that the shapes of the electrodes 2591 and the electrodes 2592 are not limited to the above-mentioned shapes and can be any of a variety of shapes. For example, a structure may be employed in which the plurality of electrodes 2591 are arranged so that gaps between the electrodes 2591 are reduced as much as possible, and the electrodes 2592 are spaced apart from the electrodes 2591 with an insulating layer interposed therebetween to have regions not overlapping with the electrodes 2591. In that case, between two adjacent electrodes 2592, a dummy electrode which is electrically insulated from these electrodes is preferably provided, whereby the area of a region having a different transmittance can be reduced.

<Description of Display Device>

Figure 23A:
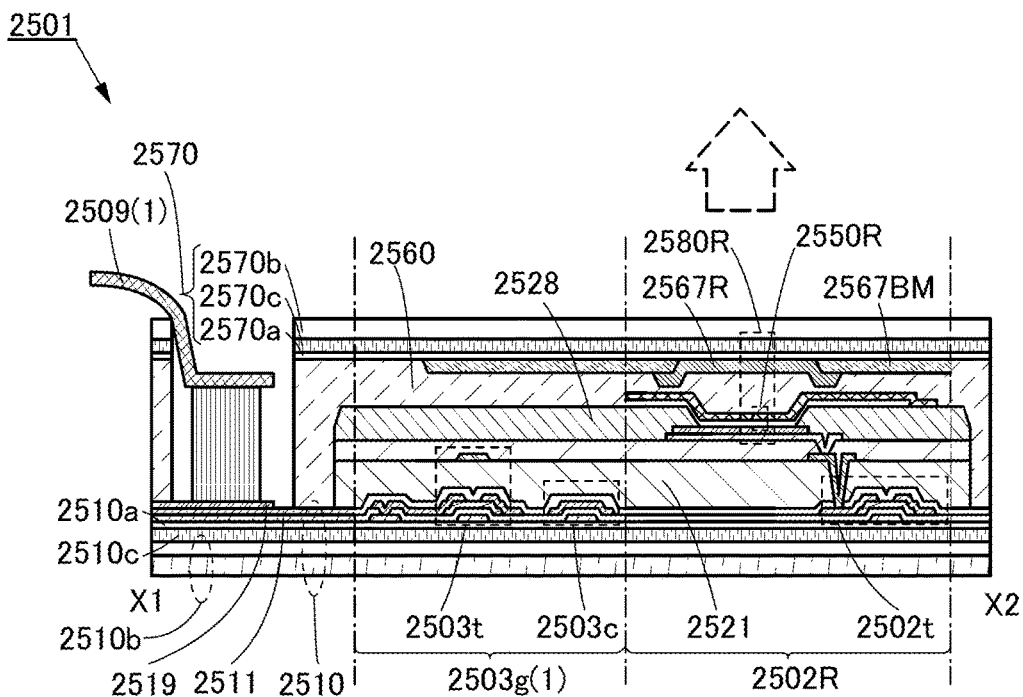
FIGS. 23A to 23C are cross-sectional views of examples of a display device and a touch sensor of one embodiment of the present invention.

Next, the display device 2501 will be described in detail with reference to FIG. 23A. FIG. 23A corresponds to a cross-sectional view taken along dashed-dotted line X1-X2 in FIG. 22B.

The display device 2501 includes a plurality of pixels arranged in a matrix. Each of the pixels includes a display element and a pixel circuit for driving the display element.

In the following description, an example of using a light-emitting element that emits white light as a display element will be described; however, the display element is not limited to such an element. For example, light-emitting elements that emit light of different colors may be included so that the light of different colors can be emitted from adjacent pixels.

For the substrate 2510 and the substrate 2570, for example, a flexible material with a vapor permeability lower than or equal to $1\times10^{-5}$ g·m$^{-2}$·day$^{-1}$, preferably lower than or equal to $1\times10^{-6}$ g·m$^{-2}$·day$^{-1}$ can be favorably used. Note that materials whose thermal expansion coefficients are substantially equal to each other are preferably used for the substrate 2510 and the substrate 2570 respectively. For example, the coefficient of linear expansion of the materials are preferably lower than or equal to $1\times10^{-3}$/K, further preferably lower than or equal to $5\times10^{-5}$/K, and still further preferably lower than or equal to $1\times10^{-5}$/K.

Note that the substrate 2510 is a stacked body including an insulating layer 2510a for preventing impurity diffusion into the light-emitting element, a flexible substrate 2510b, and an adhesive layer 2510c for attaching the insulating layer 2510a and the flexible substrate 2510b to each other. The substrate 2570 is a stacked body including an insulating layer 2570a for preventing impurity diffusion into the light-emitting element, a flexible substrate 2570b, and an adhesive layer 2570c for attaching the insulating layer 2570a and the flexible substrate 2570b to each other.

For the adhesive layer 2510c and the adhesive layer 2570c, for example, polyester, polyolefin, polyamide (e.g., nylon, aramid), polyimide, polycarbonate, or an acrylic resin, polyurethane, or an epoxy resin can be used. Alternatively, a material that includes a resin having a siloxane bond such as silicone can be used.

A sealing layer 2560 is provided between the substrate 2510 and the substrate 2570. A sealing layer 2560 preferably has a higher refractive index than the air. In the case where light is extracted to the sealing layer 2560 side as illustrated in FIG. 23A, the sealing layer 2560 can also serve as an optical adhesive layer.

A sealant may be formed in the peripheral portion of the sealing layer 2560. With use of the sealant, a light-emitting element 2550R can be provided in a region surrounded by the substrate 2510, the substrate 2570, the sealing layer 2560, and the sealant. Note that an inert gas (such as nitrogen or argon) may be used instead of the sealing layer 2560. A drying agent may be provided in the inert gas so as to adsorb moisture or the like. A resin such as an acrylic resin or an epoxy resin may be used. For example, an epoxy-based resin or a glass frit is preferably used as the sealant. As a material used for the sealant, a material which is impermeable to moisture or oxygen is preferably used.

The display device 2501 includes a pixel 2502R. The pixel 2502R includes a light-emitting module 2580R.

The pixel 2502R includes a light-emitting element 2550R and a transistor 2502t that can supply electric power to the light-emitting element 2550R. Note that the transistor 2502t functions as part of the pixel circuit. The light-emitting module 2580R includes the light-emitting element 2550R and a coloring layer 2567R.

The light-emitting element 2550R includes a lower electrode, an upper electrode, and an EL layer between the lower electrode and the upper electrode. As the light-emitting element 2550R, any of the light-emitting elements described in Embodiments 1 to 3 can be used, for example.

A microcavity structure may be employed between the lower electrode and the upper electrode so as to increase the intensity of light having a specific wavelength.

In the case where the sealing layer 2560 is provided on the light extraction side, the sealing layer 2560 is in contact with the light-emitting element 2550R and the coloring layer 2567R.

The coloring layer 2567R overlaps with the light-emitting element 2550R. Accordingly, part of light emitted from the light-emitting element 2550R passes through the coloring layer 2567R and is emitted to the outside of the light-emitting module 2580R as indicated by an arrow.

The display device 2501 includes a light-blocking layer 2567BM on the light extraction side. The light-blocking layer 2567BM is provided so as to surround the coloring layer 2567R.

The coloring layer 2567R is a coloring layer having a function of transmitting light in a particular wavelength region. For example, a color filter for transmitting light in a red wavelength region, a color filter for transmitting light in a green wavelength region, a color filter for transmitting light in a blue wavelength region, a color filter for transmitting light in a yellow wavelength region, or the like can be used. Each color filter can be formed with any of various materials by a printing method, an inkjet method, an etching method using a photolithography technique, or the like.

An insulating layer 2521 is provided in the display device 2501. The insulating layer 2521 covers the transistor 2502t. With the insulating layer 2521, unevenness caused by the pixel circuit is reduced. The insulating layer 2521 may serve also as a layer for preventing diffusion of impurities. This can prevent a reduction in the reliability of the transistor 2502t or the like due to diffusion of impurities.

The light-emitting element 2550R is formed above the insulating layer 2521. A partition 2528 is provided so as to cover end portions of the lower electrode in the light-emitting element 2550R. Note that a spacer for controlling the distance between the substrate 2510 and the substrate 2570 may be provided over the partition 2528.

A scan line driver circuit 2503g(1) includes a transistor 2503t and a capacitor 2503c. Note that the driver circuit can be formed in the same process and over the same substrate as those of the pixel circuits.

Over the substrate 2510, the wirings 2511 through which a signal can be supplied are provided. Over the wirings 2511, the terminal 2519 is provided. The FPC 2509(1) is electrically connected to the terminal 2519. The FPC 2509(1) has a function of supplying a video signal, a clock signal, a start signal, a reset signal, or the like. Note that a printed wiring board (PWB) may be attached to the FPC 2509(1).

Figure 23B:
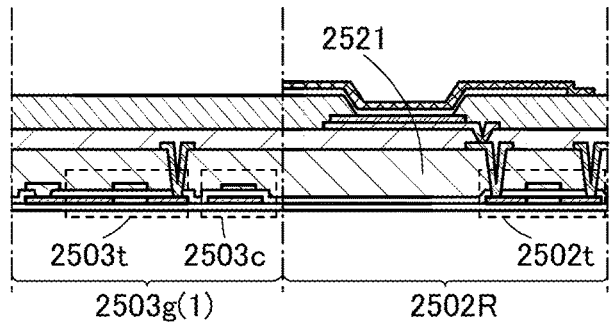

In the display device 2501, transistors with any of a variety of structures can be used. FIG. 23A illustrates an example of using bottom-gate transistors; however, the present invention is not limited to this example, and top-gate transistors may be used in the display device 2501 as illustrated in FIG. 23B.

In addition, there is no particular limitation on the polarity of the transistor 2502t and the transistor 2503t. For these transistors, n-channel and p-channel transistors may be used, or either n-channel transistors or p-channel transistors may be used, for example. Furthermore, there is no particular limitation on the crystallinity of a semiconductor film used for the transistors 2502t and 2503t. For example, an amorphous semiconductor film or a crystalline semiconductor film can be used. Examples of semiconductor materials include Group 14 semiconductors (e.g., a semiconductor including silicon), compound semiconductors (including oxide semiconductors), organic semiconductors, and the like. An oxide semiconductor that has an energy gap of 2 eV or more, preferably 2.5 eV or more, further preferably 3 eV or more is preferably used for one of the transistors 2502t and 2503t or both, so that the off-state current of the transistors can be reduced. Examples of the oxide semiconductors include an In—Ga oxide, an In-M-Zn oxide (M represents Al, Ga, Y, Zr, La, Ce, Sn, Hf, or Nd), and the like.

<Description of Touch Sensor>

Figure 23C:
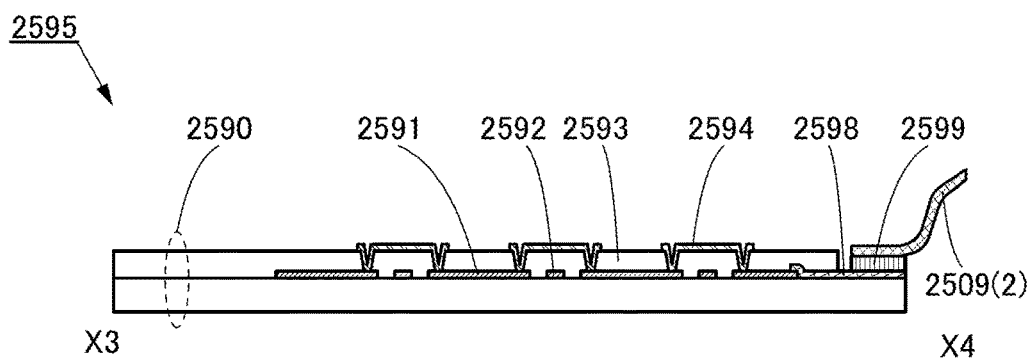

Next, the touch sensor 2595 will be described in detail with reference to FIG. 23C. FIG. 23C corresponds to a cross-sectional view taken along dashed-dotted line X3-X4 in FIG. 22B.

The touch sensor 2595 includes the electrodes 2591 and the electrodes 2592 provided in a staggered arrangement on the substrate 2590, an insulating layer 2593 covering the electrodes 2591 and the electrodes 2592, and the wiring 2594 that electrically connects the adjacent electrodes 2591 to each other.

The electrodes 2591 and the electrodes 2592 are formed using a light-transmitting conductive material. As a light-transmitting conductive material, a conductive oxide such as indium oxide, indium tin oxide, indium zinc oxide, zinc oxide, or zinc oxide to which gallium is added can be used. Note that a film including graphene can be used as well. The film including graphene can be formed, for example, by reducing a film containing graphene oxide. As a reducing method, a method with application of heat or the like can be employed.

The electrodes 2591 and the electrodes 2592 may be formed by, for example, depositing a light-transmitting conductive material on the substrate 2590 by a sputtering method and then removing an unnecessary portion by any of various pattern forming techniques such as photolithography.

Examples of a material for the insulating layer 2593 are a resin such as an acrylic resin or an epoxy resin, a resin having a siloxane bond such as silicon, and an inorganic insulating material such as silicon oxide, silicon oxynitride, or aluminum oxide.

Openings reaching the electrodes 2591 are formed in the insulating layer 2593, and the wiring 2594 electrically connects the adjacent electrodes 2591. A light-transmitting conductive material can be favorably used for the wiring 2594 because the aperture ratio of the touch panel can be increased. Moreover, a material having higher conductivity than the electrodes 2591 and 2592 can be favorably used for the wiring 2594 because electric resistance can be reduced.

One electrode 2592 extends in one direction, and a plurality of electrodes 2592 are provided in the form of stripes. The wiring 2594 intersects with the electrode 2592.

Adjacent electrodes 2591 are provided with one electrode 2592 provided therebetween. The wiring 2594 electrically connects the adjacent electrodes 2591.

Note that the plurality of electrodes 2591 are not necessarily arranged in the direction orthogonal to one electrode 2592 and may be arranged to intersect with one electrode 2592 at an angle of more than 0 degrees and less than 90 degrees.

One wiring 2598 is electrically connected to any of the electrodes 2591 and 2592. Part of the wiring 2598 functions as a terminal. For the wiring 2598, a metal material such as aluminum, gold, platinum, silver, nickel, titanium, tungsten, chromium, molybdenum, iron, cobalt, copper, or palladium or an alloy material containing any of these metal materials can be used.

Note that an insulating layer that covers the insulating layer 2593 and the wiring 2594 may be provided to protect the touch sensor 2595.

A connection layer 2599 electrically connects the wiring 2598 to the FPC 2509(2).

As the connection layer 2599, any of various anisotropic conductive films (ACF), anisotropic conductive pastes (ACP), or the like can be used.

<Description 2 of Touch Panel>

Figure 24A:
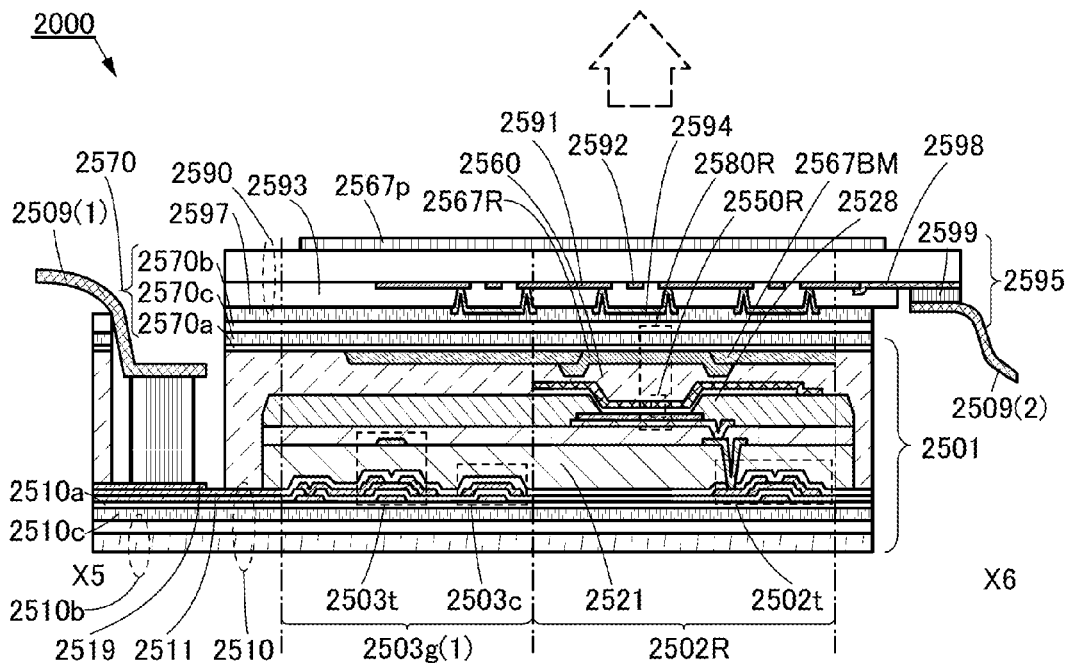
FIGS. 24A and 24B are cross-sectional views each illustrating an example of a touch panel of one embodiment of the present invention.

Next, the touch panel 2000 will be described in detail with reference to FIG. 24A. FIG. 24A corresponds to a cross-sectional view taken along dashed-dotted line X5-X6 in FIG. 22A.

In the touch panel 2000 illustrated in FIG. 24A, the display device 2501 described with reference to FIG. 23A and the touch sensor 2595 described with reference to FIG. 23C are attached to each other.

The touch panel 2000 illustrated in FIG. 24A includes an adhesive layer 2597 and an anti-reflective layer 2567p in addition to the components described with reference to FIGS. 23A and 23C.

The adhesive layer 2597 is provided in contact with the wiring 2594. Note that the adhesive layer 2597 attaches the substrate 2590 to the substrate 2570 so that the touch sensor 2595 overlaps with the display device 2501. The adhesive layer 2597 preferably has a light-transmitting property. A heat curable resin or an ultraviolet curable resin can be used for the adhesive layer 2597. For example, an acrylic resin, a urethane-based resin, an epoxy-based resin, or a siloxane-based resin can be used.

The anti-reflective layer 2567p is positioned in a region overlapping with pixels. As the anti-reflective layer 2567p, a circular polarizing plate can be used, for example.

Next, a touch panel having a structure different from that illustrated in FIG. 24A will be described with reference to FIG. 24B.

Figure 24B:
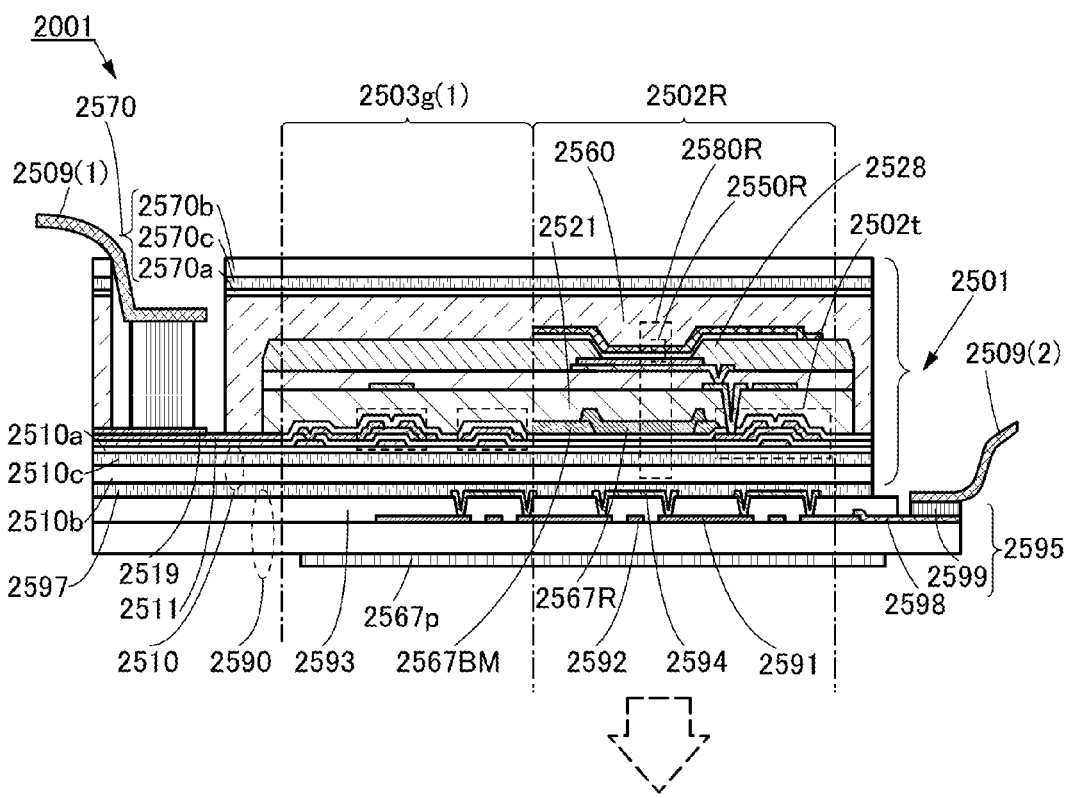

FIG. 24B is a cross-sectional view of a touch panel 2001. The touch panel 2001 illustrated in FIG. 24B differs from the touch panel 2000 illustrated in FIG. 24A in the position of the touch sensor 2595 relative to the display device 2501. Different structures will be described in detail below, and the above description of the touch panel 2000 can be referred to for the other similar structures.

The coloring layer 2567R overlaps with the light-emitting element 2550R. The light-emitting element 2550R illustrated in FIG. 24B emits light to the side where the transistor 2502t is provided. Accordingly, part of light emitted from the light-emitting element 2550R passes through the coloring layer 2567R and is emitted to the outside of the light-emitting module 2580R as indicated by an arrow in FIG. 24B.

The touch sensor 2595 is provided on the substrate 2510 side of the display device 2501.

The adhesive layer 2597 is provided between the substrate 2510 and the substrate 2590 and attaches the touch sensor 2595 to the display device 2501.

As illustrated in FIG. 24A or 24B, light may be emitted from the light-emitting element through one or both of the substrate 2510 and the substrate 2570.

<Method for Driving Touch Panel>

Next, an example of a method for driving a touch panel will be described with reference to FIGS. 25A and 25B.

Figure 25A:
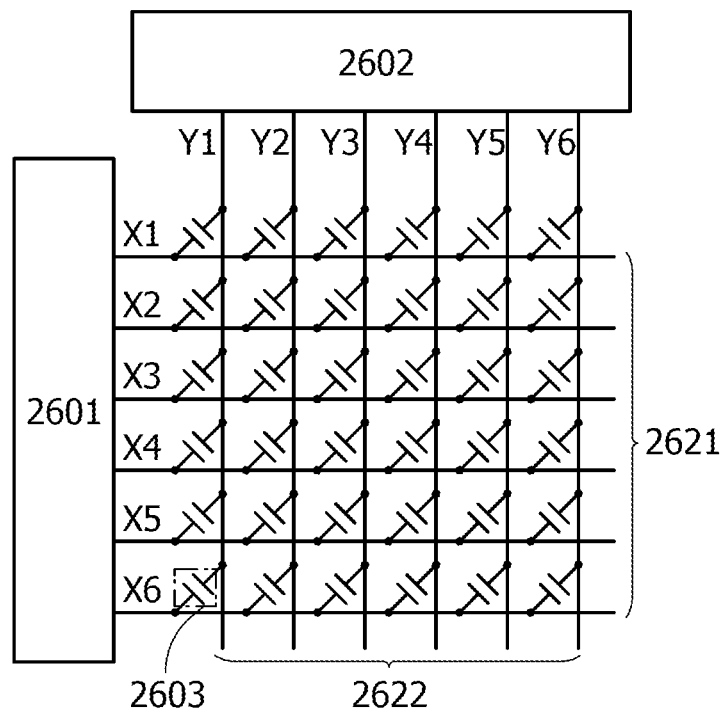
FIGS. 25A and 25B are a block diagram and a timing chart of a touch sensor of one embodiment of the present invention.

FIG. 25A is a block diagram illustrating the structure of a mutual capacitive touch sensor. FIG. 25A illustrates a pulse voltage output circuit 2601 and a current sensing circuit 2602. Note that in FIG. 25A, six wirings X1 to X6 represent the electrodes 2621 to which a pulse voltage is applied, and six wirings Y1 to Y6 represent the electrodes 2622 that detect changes in current. FIG. 25A also illustrates capacitors 2603 that are each formed in a region where the electrodes 2621 and 2622 overlap with each other. Note that functional replacement between the electrodes 2621 and 2622 is possible.

The pulse voltage output circuit 2601 is a circuit for sequentially applying a pulse voltage to the wirings X1 to X6. By application of a pulse voltage to the wirings X1 to X6, an electric field is generated between the electrodes 2621 and 2622 of the capacitor 2603. When the electric field between the electrodes is shielded, for example, a change occurs in the capacitor 2603 (mutual capacitance). The approach or contact of a sensing target can be sensed by utilizing this change.

The current sensing circuit 2602 is a circuit for detecting changes in current flowing through the wirings Y1 to Y6 that are caused by the change in mutual capacitance in the capacitor 2603. No change in current value is sensed in the wirings Y1 to Y6 when there is no approach or contact of a sensing target, whereas a decrease in current value is sensed when mutual capacitance is decreased owing to the approach or contact of a sensing target. Note that an integrator circuit or the like is used for sensing of current.

Figure 25B:
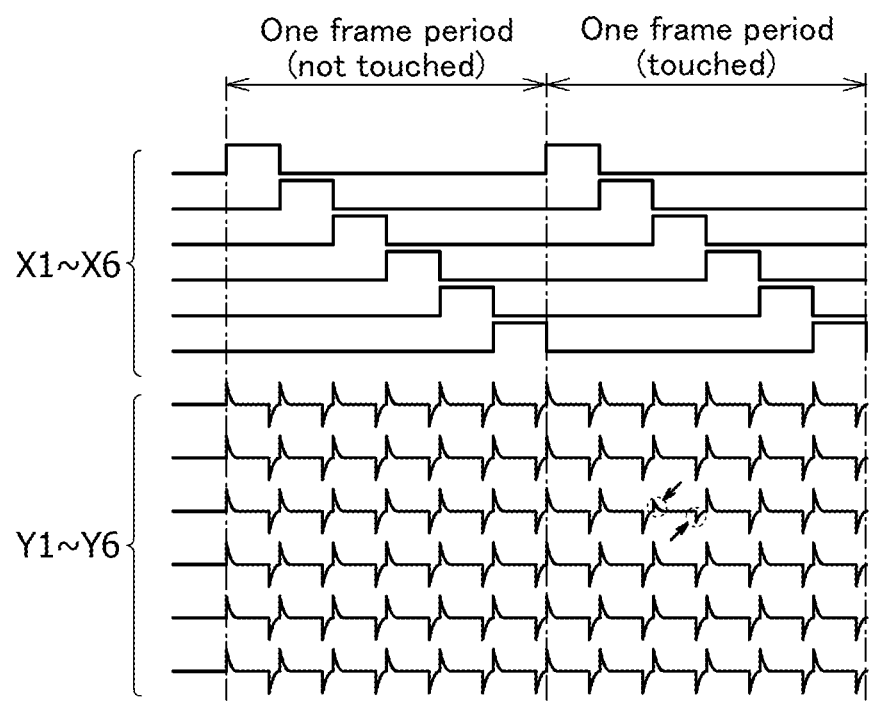

FIG. 25B is a timing chart showing input and output waveforms in the mutual capacitive touch sensor illustrated in FIG. 25A. In FIG. 25B, sensing of a sensing target is performed in all the rows and columns in one frame period. FIG. 25B shows a period when a sensing target is not sensed (not touched) and a period when a sensing target is sensed (touched). In FIG. 25B, sensed current values of the wirings Y1 to Y6 are shown as the waveforms of voltage values.

A pulse voltage is sequentially applied to the wirings X1 to X6, and the waveforms of the wirings Y1 to Y6 change in accordance with the pulse voltage. When there is no approach or contact of a sensing target, the waveforms of the wirings Y1 to Y6 change uniformly in accordance with changes in the voltages of the wirings X1 to X6. The current value is decreased at the point of approach or contact of a sensing target and accordingly the waveform of the voltage value changes.

By sensing a change in mutual capacitance in this manner, the approach or contact of a sensing target can be sensed.

<Description of Sensor Circuit>

Figure 26:
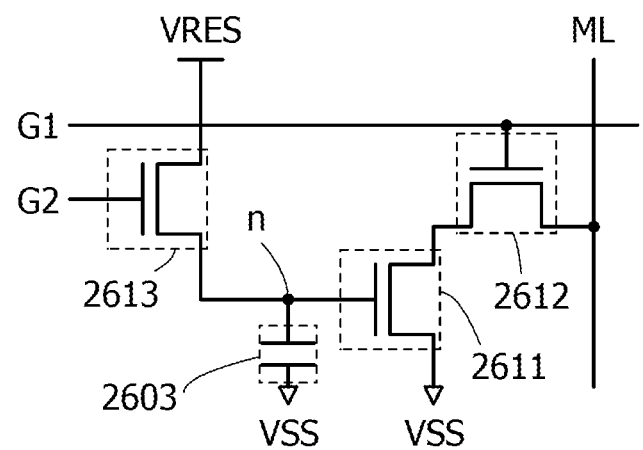
FIG. 26 is a circuit diagram of a touch sensor of one embodiment of the present invention.

Although FIG. 25A illustrates a passive matrix type touch sensor in which only the capacitor 2603 is provided at the intersection of wirings as a touch sensor, an active matrix type touch sensor including a transistor and a capacitor may be used. FIG. 26 illustrates an example of a sensor circuit included in an active matrix type touch sensor.

The sensor circuit in FIG. 26 includes the capacitor 2603 and transistors 2611, 2612, and 2613.

A signal G2 is input to a gate of the transistor 2613. A voltage VRES is applied to one of a source and a drain of the transistor 2613, and one electrode of the capacitor 2603 and a gate of the transistor 2611 are electrically connected to the other of the source and the drain of the transistor 2613. One of a source and a drain of the transistor 2611 is electrically connected to one of a source and a drain of the transistor 2612, and a voltage VSS is applied to the other of the source and the drain of the transistor 2611. The signal G1 is input to a gate of the transistor 2612, and a wiring ML is electrically connected to the other of the source and the drain of the transistor 2612. The voltage VSS is applied to the other electrode of the capacitor 2603.

Next, the operation of the sensor circuit in FIG. 26 will be described. First, a potential for turning on the transistor 2613 is supplied as the signal G2, and a potential with respect to the voltage VRES is thus applied to the node n connected to the gate of the transistor 2611. Then, a potential for turning off the transistor 2613 is applied as the signal G2, whereby the potential of the node n is maintained.

Then, mutual capacitance of the capacitor 2603 changes owing to the approach or contact of a sensing target such as a finger, and accordingly the potential of the node n is changed from VRES.

In reading operation, a potential for turning on the transistor 2612 is supplied as the signal G1. A current flowing through the transistor 2611, that is, a current flowing through the wiring ML is changed in accordance with the potential of the node n. By sensing this current, the approach or contact of a sensing target can be sensed.

In each of the transistors 2611, 2612, and 2613, an oxide semiconductor layer is preferably used as a semiconductor layer in which a channel region is formed. In particular, such a transistor is preferably used as the transistor 2613 so that the potential of the node n can be held for a long time and the frequency of operation of resupplying VRES to the node n (refresh operation) can be reduced.

The structure described in this embodiment can be used in appropriate combination with the structure described in any of the other embodiments.

Embodiment 7

In this embodiment, a display device including the light-emitting element of one embodiment of the present invention and a reflective liquid crystal element, which can display images in both a transmissive mode and a reflective mode, will be described with reference to FIGS. 27A and 27B, FIG. 28, FIG. 29, and FIGS. 30A, 30B1, and 30B2.

Figure 27A:
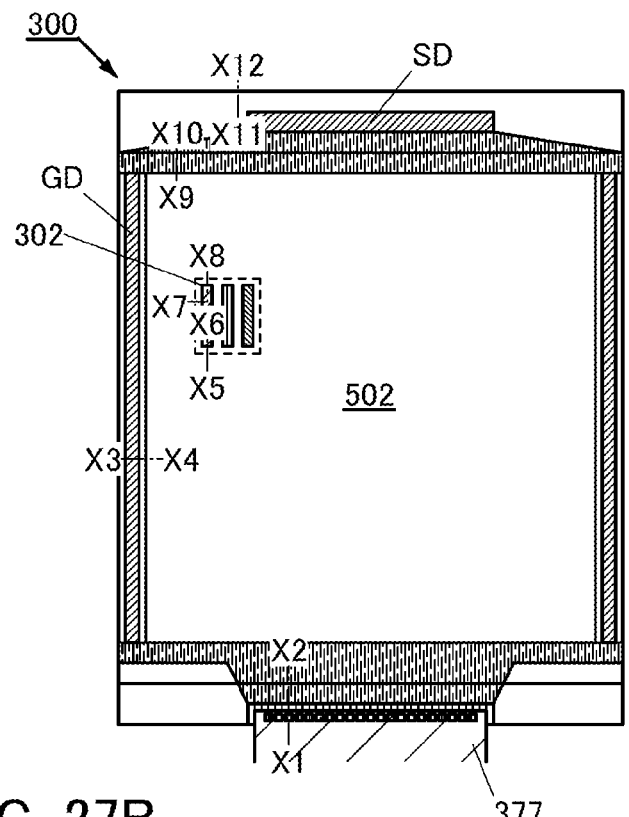
FIGS. 27A and 27B illustrate a structure of a display device of one embodiment of the present invention.
Figure 27B:
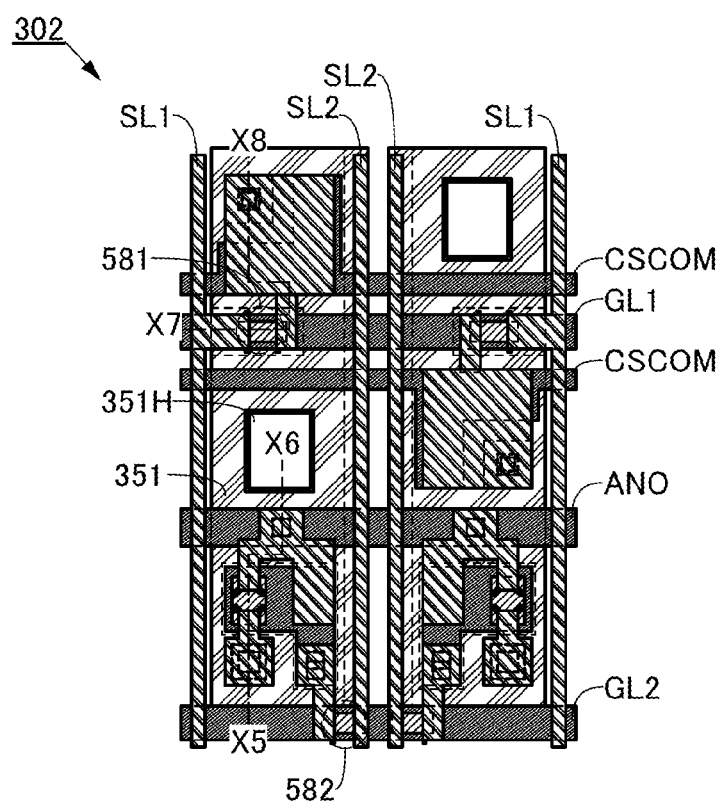

FIG. 27A is a bottom view illustrating the structure of a display device 300 of one embodiment of the present invention. FIG. 27B is a bottom view illustrating part of FIG. 27A. Note that in FIG. 27B, some components are not illustrated in order to avoid complexity of the drawing.

Figure 28:
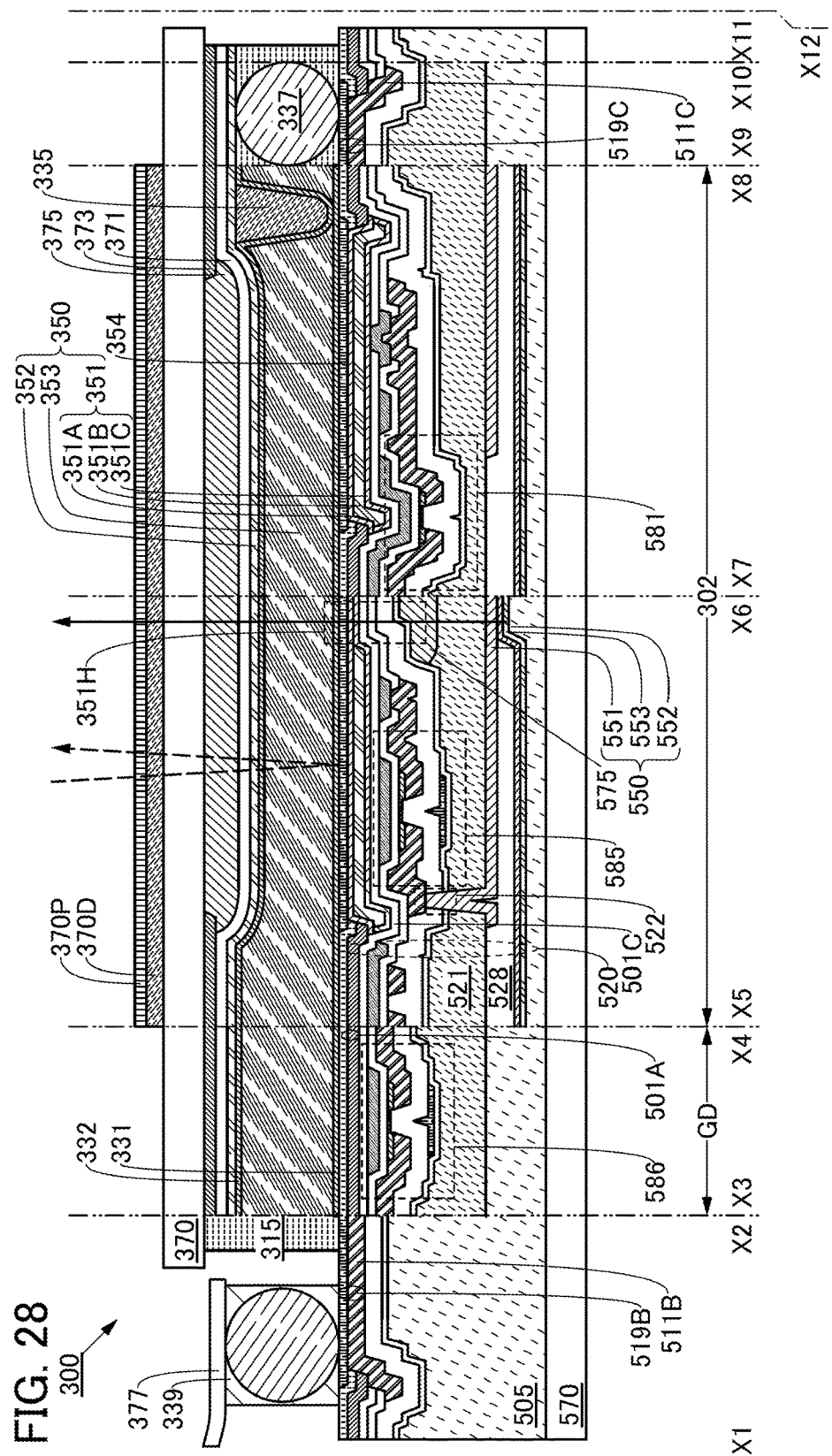
FIG. 28 is a cross-sectional view illustrating a structure of a display device of one embodiment of the present invention.

FIG. 28 is a cross-sectional view illustrating the structure of the display device 300 of one embodiment of the present invention. FIG. 28 is a cross-sectional view taken along dashed-dotted lines X1-X2, X3-X4, X5-X6, X7-X8, X9-X10, and X11-X12 in FIG. 27A.

Figure 29:
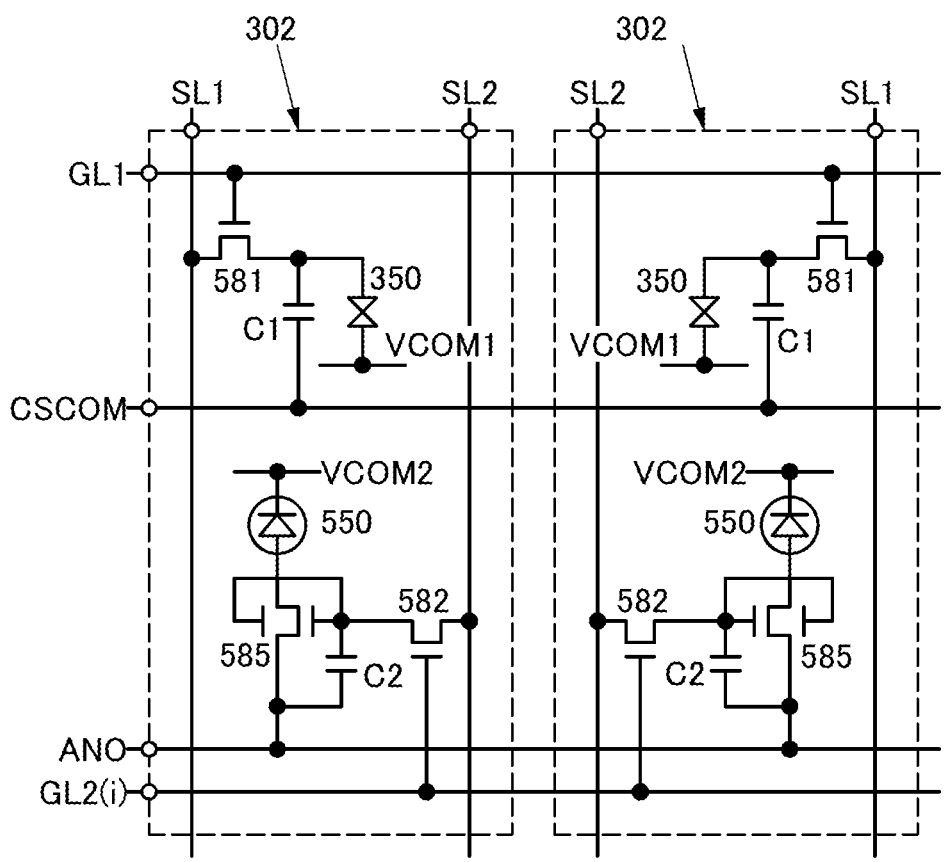
FIG. 29 shows a circuit of pixels of a display device of one embodiment of the present invention.

FIG. 29 illustrates a circuit of a pixel 302 included in the display device 300 of one embodiment of the present invention.

<Structure Example of Display Device>

As illustrated in FIG. 27A, the display device 300 of one embodiment of the present invention includes a pixel portion 502, and a driver circuit GD and a driver circuit SD placed outside the pixel portion 502. The pixel portion 502 includes the pixel 302.

The pixel 302 includes a liquid crystal element 350 and a light-emitting element 550. In addition, the pixel 302 includes a transistor 581. Moreover, the pixel 302 includes a transistor 585 and a transistor 586 (see FIG. 28).

The liquid crystal element 350 and the light-emitting element 550 perform display in the same direction. For example, a dashed line arrow in FIG. 28 denotes the direction in which the liquid crystal element 350 performs display by controlling the intensity of external light reflection. A solid line arrow in FIG. 28 denotes the direction in which the light-emitting element 550 performs display.

The liquid crystal element 350 thus includes a reflective film 351B having a function of reflecting incident light and a liquid crystal layer 353 containing a material having a function of adjusting the intensity of the reflected light. The liquid crystal element 350 has a function of reflecting incident light and a function of adjusting the intensity of the reflected light.

A reflective liquid crystal element is preferably used as the liquid crystal element 350. Specifically, the liquid crystal element 350 preferably includes a liquid crystal layer 353, an electrode 351, and an electrode 352. The electrode 351 preferably includes the reflective film 351B having a function of reflecting light. In addition, the liquid crystal layer 353 contains a liquid crystal material. Note that the electrode 352 is provided so that an electric field for controlling the alignment of the liquid crystal material is generated between the electrode 352 and the electrode 351. In addition, the liquid crystal layer 353 preferably has a function of adjusting the intensity of light which enters the liquid crystal element 350 and is reflected by the reflective film 351B.

The electrode 351 is electrically connected to the transistor 581. It is preferable that the electrode 351 have a structure in which a conductive film 351A and a conductive film 351C are provided so as to interpose the reflective film 351B therebetween. Interposing the reflective film 351B between the conductive films 351A and 351C suppresses diffusion of an element contained in the reflective film 351B into another layer. Moreover, it is possible to suppress contamination of the reflective film 351B due to impurities entering from the outside.

It is preferable that the conductive films 351A and 351C each have a function of transmitting light. Light incident on the liquid crystal element 350 from the outside can be efficiently reflected by the reflective film 351B owing to the function of transmitting light of the conductive film 351A. Moreover, light emitted from the light-emitting element 550 as will be shown later can be efficiently extracted to the outside owing to the function of transmitting light of the conductive film 351C.

In addition, the display device 300 includes an alignment film 331 and an alignment film 332. The liquid crystal layer 353 is sandwiched between the alignment films 331 and 332.

The display device 300 includes a coloring layer 375, a light-blocking layer 373, an insulating film 371, a functional film 370D, and a functional film 370P in a region overlapping with the pixel 302.

The coloring layer 375 has a region overlapping with the liquid crystal element 350. The light-blocking layer 373 has an opening in a region overlapping with the liquid crystal element 350. With the coloring layer 375, light incident on the liquid crystal element 350 from the outside enters the reflective film 351B through the coloring layer 375 and light reflected by the reflective film 351B is extracted to the outside through the coloring layer 375. Accordingly, light incident on the liquid crystal element 350 from the outside and reflected can be extracted to the outside with a predetermined color.

The insulating film 371 is provided between the coloring layer 375 and the liquid crystal layer 353 or between the light-blocking layer 373 and the liquid crystal layer 353. Owing to this, impurity diffusion from the light-blocking layer 373, the coloring layer 375, or the like to the liquid crystal layer 353 can be suppressed. The insulating film 371 may be provided to eliminate unevenness due to the thickness of the coloring layer 375.

The functional films 370D and 370P each include a region overlapping with the liquid crystal element 350. A substrate 370 is interposed between the functional film 370D and the liquid crystal element 350. As the functional films 370D and 370P, a film having a function of displaying clearer images of the liquid crystal element 350 and the light-emitting element 550, a film having a function of protecting the surface of the display device 300, or the like can be used. Note that either the functional film 370D or 370P may be used.

The display device 300 includes the substrate 370, a substrate 570, and a functional layer 520.

The substrate 370 has a region overlapping with the substrate 570. The functional layer 520 is provided between the substrates 570 and 370.

The functional layer 520 includes the transistor included in the pixel 302, the light-emitting element 550, an insulating film 521, and an insulating film 528.

The insulating film 521 is provided between the transistor included in the pixel 302 and the light-emitting element 550. The insulating film 521 is preferably formed so that steps due to components overlapping with the insulating film 521 can be covered to form a flat surface.

As the structure of the light-emitting element 550, any of the structures of the light-emitting element of one embodiment of the present invention, which is shown in Embodiments 1 to 3, is preferably used.

The light-emitting element 550 includes an electrode 551, an electrode 552, and a light-emitting layer 553. The electrode 552 has a region overlapping with the electrode 551. The light-emitting layer 553 is provided between the electrodes 551 and 552. The electrode 551 is electrically connected to the transistor 585 included in the pixel 302 in a connection portion 522.

In the case where the light-emitting element 550 has a bottom-emission structure, the electrode 552 preferably has a function of reflecting light. Therefore, it is preferable that the electrode 552 include a reflective film having a function of reflecting light. The electrode 551 preferably has a function of transmitting light.

In addition, the insulating film 528 has a region sandwiched between the electrodes 551 and 552. The insulating film 528 has an insulating property and thus can avoid a short circuit between the electrodes 551 and 552. In order to avoid a short circuit, an end portion of the electrode 551 preferably has a region in contact with the insulating film 528. In addition, the insulating film 528 has an opening in a region overlapping with the light-emitting element 550. In the opening, the light-emitting element 550 emits light.

The light-emitting layer 553 preferably contains an organic material or an inorganic material as a light-emitting material. Specifically, a fluorescent organic light-emitting material or a phosphorescent organic light-emitting material can be used. In addition, an inorganic light-emitting material such as quantum dots can be used.

The reflective film 351B of the liquid crystal element 350 includes an opening 351H. The opening 351H has a region overlapping with the conductive films 351A and 351C each having a function of transmitting light. The light-emitting element 550 has a function of emitting light toward the opening 351H. In other words, the liquid crystal element 350 has a function of performing display in a region overlapping with the reflective film 351B, and the light-emitting element 550 has a function of performing display in a region overlapping with the opening 351H.

In addition, the liquid crystal element has a function of performing display in a region overlapping with the reflective film 351B, and the light-emitting element has a function of performing display in a region overlapping with the opening 351H; therefore, the light-emitting element 550 has a function of performing display in a region surrounded by the display region of the liquid crystal element 350 (see FIG. 27B).

With the above-described structure in which a reflective liquid crystal element and a light-emitting element are used as the liquid crystal element 350 and the light-emitting element 550, respectively, the display device can perform display using the reflective liquid crystal element 350 in a bright environment, whereas using light from the light-emitting element 550 in a dark environment. Thus, a convenient display device with high visibility and low power consumption both in bright and dark environments can be provided. In addition, the display device can perform display in a dim environment using both the reflective liquid crystal element (utilizing external light) and light from the light-emitting element. Thus, a convenient display device with high visibility and low power consumption can be provided.

In the display device of one embodiment of the present invention, the coloring layer 375, the functional film 370D, and the functional film 370P each functioning as an optical element (e.g., a coloring layer, a color conversion layer (e.g., quantum dot), a polarizing plate, and an anti-reflective film) are provided in a region overlapping with the light-emitting element 550. Therefore, the color purity of light emitted from the light-emitting element 550 can be improved and thus the color purity of the display device 300 can be improved. Alternatively, the contrast ratio of the display device 300 can be enhanced. For example, a polarizing plate, a retardation plate, a diffusing film, an anti-reflective film, a condensing film, or the like can be used as the functional films 370D and 370P. Alternatively, a polarizing plate containing a dichromatic pigment can be used. Alternatively, an antistatic film preventing the attachment of a foreign substance, a water repellent film suppressing the attachment of stain, a hard coat film suppressing generation of a scratch in use, or the like can be used as the functional films 370D and 370P.

Furthermore, the coloring layer 575 may be provided in a region overlapping the opening 351H sandwiched between the liquid crystal element 350 and the light-emitting element 550. With such a structure, light emitted from the light-emitting element 550 is extracted to the outside through the coloring layers 575 and 375; therefore, the color purity of the light emitted from the light-emitting element 550 can be improved and the intensity of light emitted from the light-emitting element 550 can be increased.

A material that transmits light of a predetermined color can be used for the coloring layers 375 and 575. Thus, the coloring layers 375 and 575 can be used as, for example, a color filter. For example, the coloring layers 375 and 575 can be formed using a material transmitting light of blue, green, red, yellow, or white.

A touch panel may be provided in the display device 300 illustrated in FIG. 28. As the touch panel, a capacitive touch panel (a surface capacitive touch panel or a projected capacitive touch panel) can be preferably used.

<Arrangement Example of Pixel and Wiring>

The driver circuit GD is electrically connected to scan lines GL1 and GL2. The driver circuit GD includes a transistor 586, for example. Specifically, a transistor including a semiconductor film which can be formed through the same process as the transistor included in the pixel 302 (e.g., the transistor 581) can be used as the transistor 586 (see FIG. 28).

The driver circuit SD is electrically connected to signal lines SL1 and SL2. The driver circuit SD is electrically connected to a terminal which can be formed in the same process as the terminal 519B or 519C with a conductive material, for example.

The pixel 302 is electrically connected to a signal line SL1 (see FIG. 29). Note that it is preferable that one of a source electrode and a drain electrode of the transistor 581 be electrically connected to the signal line SL1 (see FIGS. 28 and 29).

Figure 30A:
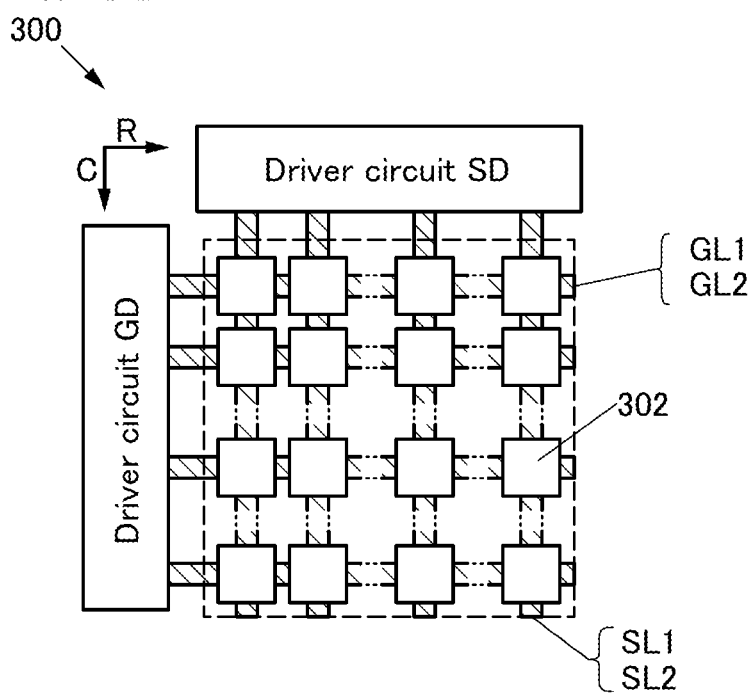
Figures 1, 30B:
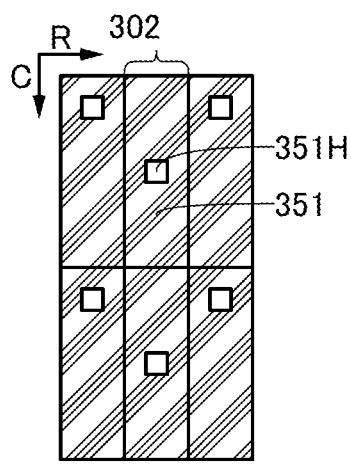
Figures 2, 30B:
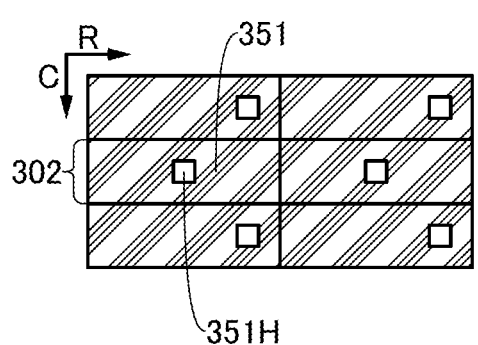

FIG. 30A is a block diagram illustrating arrangement of pixel circuits, wirings, and the like which can be used for the display device 300 of one embodiment of the present invention. FIGS. 30B1 and 30B2 are schematic views illustrating arrangement of the openings 351H which can be included in the display device 300 of one embodiment of the present invention.

The display device 300 of one embodiment of the present invention includes a plurality of pixels 302. Each pixel 302 includes the liquid crystal element 350, the light-emitting element 550, the transistor 581, the transistor 585, and the like. The pixels 302 are provided in a row direction (a direction indicated by an arrow R in FIG. 30A) and in a column direction ((a direction indicated by an arrow C in FIG. 30A) that intersects the row direction.

The group of pixels 302 arranged in the row direction are electrically connected to the scan line GL1. The group of pixels 302 arranged in the column direction are electrically connected to the signal line SL1.

For example, the pixel adjacent to the pixel 302 in the row direction (the direction indicated by the arrow R in FIG. 30B1) includes an opening that does not align with the opening 351H in the pixel 302. In addition, for example, the pixel adjacent to the pixel 302 in the column direction (the direction indicated by an arrow C in FIG. 30B2) includes an opening that does not align with the opening 351H in the pixel 302.

The opening 351H can have a polygonal shape (e.g., a quadrangular shape or a cross-like shape), an elliptical shape, a circular shape, or the like. The opening 351H may have a stripe shape, a slit-like shape, or a checkered pattern. The opening 351H may be moved to the side of an adjacent pixel. Preferably, the opening 351H is provided to the side of another pixel for emitting light of the same color. With this structure, a phenomenon in which light emitted from the light-emitting element 550 enters a coloring film of the adjacent pixel (i.e., cross talk), can be suppressed.

As described above, the display device 300 of one embodiment of the present invention includes the pixel 302; the pixel 302 includes the liquid crystal element 350 and the light-emitting element 550; the electrode 351 included in the liquid crystal element 350 is electrically connected to the transistor 581 included in the pixel 302; the electrode 551 included in the light-emitting element 550 is electrically connected to the transistor 585 included in the pixel 302; the light-emitting element 550 has a function of emitting light through the opening 351H; and the liquid crystal element 350 has a function of reflecting light entering the display device 300.

Thus, the liquid crystal element 350 and the light-emitting element 550 can be driven using transistors that can be formed through the same process, for example.

<Components of Display Device>

The pixel 302 is electrically connected to the signal line SL1, a signal line SL2, the scan line GL1, a scan line GL2, a wiring CSCOM, and a wiring ANO (see FIG. 29).

In the case where the voltage of a signal supplied to the signal line SL2 is different from the voltage of a signal supplied to the signal line SL1 of an adjacent pixel, the signal line SL1 of the adjacent pixel is positioned apart from the signal line SL2. Specifically, the signal line SL2 is positioned adjacent to the signal line SL2.

The pixel 302 includes the transistor 581, a capacitor C1, a transistor 582, the transistor 585, and a capacitor C2.

For example, a transistor including a gate electrode electrically connected to the scan line GL1 and a first electrode (one of a source electrode and a drain electrode) electrically connected to the signal line SL1 can be used as the transistor 581.

The capacitor C1 includes a first electrode electrically connected to a second electrode (the electrode corresponds to the other of the source electrode and the drain electrode of the transistor 581) and a second electrode electrically connected to the wiring CSCOM.

For example, a transistor including a gate electrode electrically connected to the scan line GL2 and a first electrode (one of a source electrode and a drain electrode) electrically connected to the signal line SL2 can be used as the transistor 582.

The transistor 585 includes a gate electrode electrically connected to a second electrode (the electrode corresponds to the other of the source electrode and the drain electrode of the transistor 582) and a first electrode (one of a source electrode and a drain electrode) electrically connected to the wiring ANO.

A transistor in which a semiconductor film is sandwiched between a conductive film and a gate electrode can be used as the transistor 585. For example, a conductive film electrically connected to the wiring capable of supplying a potential equal to that supplied to the first electrode (the one of the source electrode and the drain electrode) of the transistor 585 can be used.

The capacitor C2 includes a first electrode electrically connected to a second electrode of the transistor 582 (the electrode corresponds to the other of the source electrode and the drain electrode) and a second electrode electrically connected to the first electrode (the one of the source electrode and the drain electrode) of the transistor 585.

Note that a first electrode of the liquid crystal element 350 is electrically connected to the second electrode (the other of the source electrode and the drain electrode) of the transistor 581, and a second electrode of the liquid crystal element 350 is electrically connected to a wiring VCOM1. This enables the liquid crystal element 350 to be driven.

In addition, a first electrode of the light-emitting element 550 is electrically connected to the second electrode (the other of the source electrode and the drain electrode) of the transistor 585, and a second electrode of the light-emitting element 550 is electrically connected to and a wiring VCOM2. This enables the light-emitting element 550 to be driven.

<<<Components of Pixel>>>

The pixel 302 includes the insulating film 501C and an intermediate film 354. In addition, the pixel 302 includes a transistor 581. In addition, the pixel 302 includes the transistor 585 and the transistor 586. The semiconductor film used for these transistors is preferably an oxide semiconductor.

The display device 300 includes a terminal 519B, and the terminal 519B includes the conductive film 511B and the intermediate film 354. In addition, the display device 300 includes a terminal 519C and a conductor 337, and the terminal 519C includes the conductive film 511C and the intermediate film 354 (see FIG. 28). For example, a material having a function of allowing hydrogen passage and supplying hydrogen can be used for the intermediate film 354. A conductive material can be used for the intermediate film 354. A light-transmitting material can be used for the intermediate film 354.

The insulating film 501C has a region sandwiched between an insulating film 501A and a conductive film 511B.

The conductive film 511B is electrically connected to the pixel 302. For example, when the electrode 351 or the first conductive film is used as the reflective film 351B, a surface functioning as a contact with the terminal 519B is oriented in the same direction as a surface of the electrode 351 facing light incident on the liquid crystal element 350.

A flexible printed board 377 can be electrically connected to the terminal 519B with the conductive material 339. Thus, power or signals can be supplied to the pixel 302 through the terminal 519B.

The conductive film 511C is electrically connected to the pixel 302. For example, when the electrode 351 or the first conductive film is used as the reflective film 351B, a surface functioning as a contact with the terminal 519C is oriented in the same direction as a surface of the electrode 351 facing light incident on the liquid crystal element 350.

The conductor 337 is sandwiched between the terminal 519C and the electrode 352 to electrically connect them. A conductive particle can be used as the conductor 337, for example.

The display device 300 includes a bonding layer 505, a sealant 315 and a structure body 335.

The bonding layer 505 is provided between the functional layer 520 and the substrate 570 to bond them together. For the bonding layer 505, a material that can be used for the sealant 315 can be used, for example.

The sealant 315 is provided between the functional layer 520 and the substrate 370 to bond them together.

The structure body 335 has a function of making a predetermined gap between the functional layer 520 and the substrate 570.

An organic material, an inorganic material, or a composite material of an organic material and an inorganic material can be used for the structure body 335. Accordingly, components between which the structure body 335 or the like is interposed can have a predetermined gap. Specifically, polyester, polyolefin, polyamide, polyimide, polycarbonate, polysiloxane, an acrylic resin, or the like, or a composite material of a plurality of kinds of resins selected from these can be used. Alternatively, a photosensitive material may be used.

<<Components of Liquid Crystal Element>>

Next, a structure example of the liquid crystal element that forms the display device of one embodiment of the present invention is described.

The liquid crystal element 350 has a function of controlling transmission or reflection of light. For example, a combined structure of a polarizing plate and a liquid crystal element or a MEMS shutter display element can be used. The use of a reflective display element can reduce power consumption of a display device. Specifically, a reflective liquid crystal display element is preferably used as the liquid crystal element 350.

Specifically, a liquid crystal element that can be driven by any of the following driving methods can be used: an in-plane switching (IPS) mode, a twisted nematic (TN) mode, a fringe field switching (FFS) mode, an axially symmetric aligned micro-cell (ASM) mode, an optically compensated birefringence (OCB) mode, a ferroelectric liquid crystal (FLC) mode, an antiferroelectric liquid crystal (AFLC) mode, and the like.

In addition, a liquid crystal element that can be driven by, for example, a vertical alignment (VA) mode such as a multi-domain vertical alignment (MVA) mode, a patterned vertical alignment (PVA) mode, an electrically controlled birefringence (ECB) mode, a continuous pinwheel alignment (CPA) mode, or an advanced super view (ASV) mode can be used.

Other examples of the driving method of the liquid crystal element 350 include a polymer dispersed liquid crystal (PDLC) mode, a polymer network liquid crystal (PNLC) mode, and a guest-host mode. Note that one embodiment of the present invention is not limited thereto, and various liquid crystal elements and driving methods can be used.

A liquid crystal material or the like which can be used for a liquid crystal element is used for the liquid crystal element 350. For example, thermotropic liquid crystal, low-molecular liquid crystal, high-molecular liquid crystal, polymer dispersed liquid crystal, ferroelectric liquid crystal, or antiferroelectric liquid crystal can be used. Alternatively, a liquid crystal material which exhibits a cholesteric phase, a smectic phase, a cubic phase, a chiral nematic phase, an isotropic phase, or the like can be used. Alternatively, a liquid crystal material which exhibits a blue phase can be used.

Alternatively, liquid crystal exhibiting a blue phase for which an alignment film is not involved may be used. A blue phase is one of liquid crystal phases, which is generated just before a cholesteric phase changes into an isotropic phase while temperature of cholesteric liquid crystal is increased. Since the blue phase is only generated within a narrow range of temperatures, a liquid crystal composition containing a chiral material at 5 wt % or more is used for the liquid crystal layer in order to improve the temperature range. The liquid crystal composition that includes the liquid crystal exhibiting a blue phase and a chiral material has a short response time of 1 msec or less, and has optical isotropy, which makes the alignment process unnecessary and the viewing angle dependence small. An alignment film does not need to be provided and rubbing treatment is thus not necessary; accordingly, electrostatic discharge damage caused by the rubbing treatment can be prevented and defects and damage of the liquid crystal display device in the manufacturing process can be reduced. Thus, productivity of the liquid crystal display device can be increased.

Moreover, it is possible to use a method called domain multiplication or multi-domain design, in which a pixel is divided into some regions (subpixels) and molecules are aligned in different directions in their respective regions.

<<Components of Transistor>>

For example, a bottom-gate transistor, a top-gate transistor, or the like can be used as the transistor 581, the transistor 582, the transistor 585, the transistor 586, or the like.

For example, a semiconductor containing an element belonging to Group 14 can be used for a semiconductor film of the transistor. Specifically, a semiconductor containing silicon can be used for the semiconductor film of the transistor. For example, single crystal silicon, polysilicon, microcrystalline silicon, or amorphous silicon can be used for the semiconductor film of the transistor.

For example, a transistor whose semiconductor film includes an oxide semiconductor can be used for the transistor 581, the transistor 582, the transistor 585, the transistor 586, or the like. Specifically, an oxide semiconductor containing indium or an oxide semiconductor containing indium, gallium, and zinc can be used for a semiconductor film.

The transistor including an oxide semiconductor is used for the transistor 581, the transistor 582, the transistor 585, the transistor 586, or the like, whereby a pixel circuit can hold an image signal for a longer time than a pixel circuit including a transistor that uses amorphous silicon for a semiconductor film. Specifically, the selection signal can be supplied at a frequency of lower than 30 Hz, preferably lower than 1 Hz, further preferably lower than once per minute while flickering is suppressed. Consequently, eye-strain on a user of the information processing device can be reduced, and power consumption for driving can be reduced.

The structure and method described in this embodiment can be implemented by being combined as appropriate with structures and methods described in the other embodiments and the examples.

Embodiment 8

In this embodiment, a display module and electronic devices including a light-emitting element of one embodiment of the present invention will be described with reference to FIGS. 31A to 31G, FIGS. 32A to 32E, FIGS. 33A to 33E, FIGS. 34A to 34D, and FIGS. 35A and 35B.

<Description of Electronic Device>

FIGS. 31A to 31G illustrate electronic devices. These electronic devices can include a housing 9000, a display portion 9001, a speaker 9003, operation keys 9005 (including a power switch or an operation switch), a connection terminal 9006, a sensor 9007 (a sensor having a function of measuring or sensing force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 9008, and the like. In addition, the sensor 9007 may have a function of measuring biological information like a pulse sensor and a finger print sensor.

The electronic devices illustrated in FIGS. 31A to 31G can have a variety of functions, for example, a function of displaying a variety of data (a still image, a moving image, a text image, and the like) on the display portion, a touch sensor function, a function of displaying a calendar, date, time, and the like, a function of controlling a process with a variety of software (programs), a wireless communication function, a function of being connected to a variety of computer networks with a wireless communication function, a function of transmitting and receiving a variety of data with a wireless communication function, a function of reading a program or data stored in a memory medium and displaying the program or data on the display portion, and the like. Note that functions that can be provided for the electronic devices illustrated in FIGS. 31A to 31G are not limited to those described above, and the electronic devices can have a variety of functions. Although not illustrated in FIGS. 31A to 31G, the electronic devices may include a plurality of display portions. The electronic devices may have a camera or the like and a function of taking a still image, a function of taking a moving image, a function of storing the taken image in a memory medium (an external memory medium or a memory medium incorporated in the camera), a function of displaying the taken image on the display portion, or the like.

The electronic devices illustrated in FIGS. 31A to 31G are described in detail below.

Figure 31A:
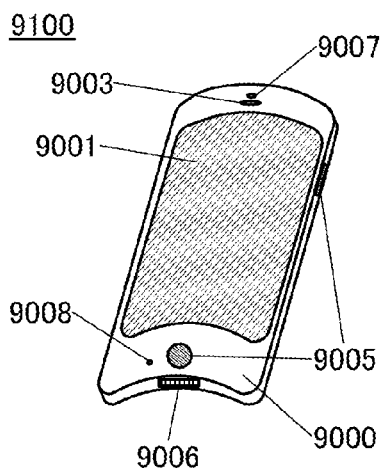
FIGS. 31A to 31G illustrate electronic devices of one embodiment of the present invention.

FIG. 31A is a perspective view of a portable information terminal 9100. The display portion 9001 of the portable information terminal 9100 is flexible. Therefore, the display portion 9001 can be incorporated along a bent surface of a bent housing 9000. In addition, the display portion 9001 includes a touch sensor, and operation can be performed by touching the screen with a finger, a stylus, or the like. For example, when an icon displayed on the display portion 9001 is touched, an application can be started.

Figure 31B:
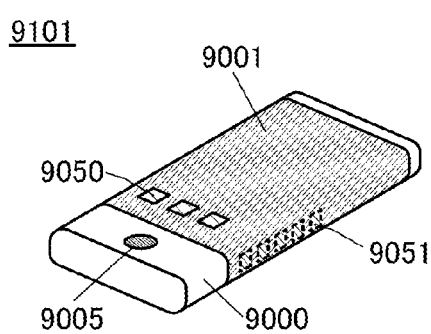

FIG. 31B is a perspective view of a portable information terminal 9101. The portable information terminal 9101 functions as, for example, one or more of a telephone set, a notebook, and an information browsing system. Specifically, the portable information terminal can be used as a smartphone. Note that the speaker 9003, the connection terminal 9006, the sensor 9007, and the like, which are not illustrated in the drawing, can be positioned in the portable information terminal 9101 as in the portable information terminal 9100 illustrated in FIG. 31A. The portable information terminal 9101 can display characters and image information on its plurality of surfaces. For example, three operation buttons 9050 (also referred to as operation icons, or simply, icons) can be displayed on one surface of the display portion 9001. Furthermore, information 9051 indicated by dashed rectangles can be displayed on another surface of the display portion 9001. Examples of the information 9051 include display indicating reception of an incoming email, social networking service (SNS) message, call, and the like; the title and sender of an email and SNS message; the date; the time; remaining battery; and display indicating the strength of a received signal such as a radio wave. Instead of the information 9051, the operation buttons 9050 or the like may be displayed on the position where the information 9051 is displayed.

As a material of the housing 9000, for example, an alloy, a plastic, or a ceramic can be used. As a plastic, a reinforced plastic can also be used. A carbon fiber reinforced plastic (CFRP), which is a kind of reinforced plastic, has advantages of lightweight and corrosion-free. Other examples of reinforced plastics include one including glass fiber and one including aramid fiber. As the alloy, an aluminum alloy and a magnesium alloy can be given. The alloy includes aluminum alloy and magnesium alloy. In particular, amorphous alloy (also referred to as metal glass) containing zirconium, copper, nickel, and titanium is superior in terms of high elastic strength. This amorphous alloy includes a glass transition region at room temperature, which is also referred to as a bulk-solidifying amorphous alloy and substantially has an amorphous atomic structure. By a solidification casting method, an alloy material is molded in a mold of at least part of the housing and coagulated so that the part of the housing is formed using a bulk-solidifying amorphous alloy. The amorphous alloy may include beryllium, silicon, niobium, boron, gallium, molybdenum, tungsten, manganese, iron, cobalt, yttrium, vanadium, phosphorus, carbon, or the like in addition to zirconium, copper, nickel, and titanium. The amorphous alloy may be formed by a vacuum evaporation method, a sputtering method, an electroplating method, an electroless plating method, or the like instead of the solidification casting method. The amorphous alloy may include a microcrystal or a nanocrystal as long as a state without a long-range order (a periodic structure) is maintained as a whole. Note that the term alloy refer to both a complete solid solution alloy which has a single solid phase structure and a partial solution that has two or more phases. The housing 9000 using the amorphous alloy can have high elastic strength. Even if the portable information terminal 9101 is dropped and the impact causes temporary deformation, the use of the amorphous alloy in the housing 9000 allows a return to the original shape; thus, the impact resistance of the portable information terminal 9101 can be improved.

Figure 31C:
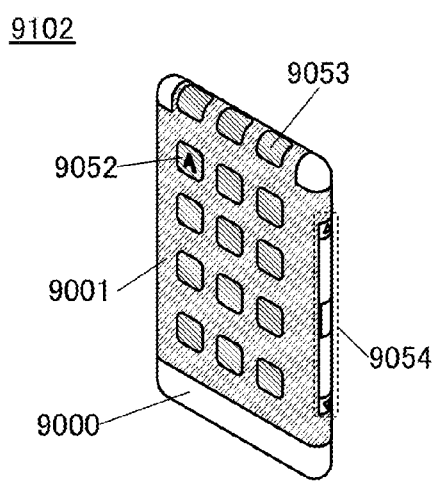

FIG. 31C is a perspective view of a portable information terminal 9102. The portable information terminal 9102 has a function of displaying information on three or more surfaces of the display portion 9001. Here, information 9052, information 9053, and information 9054 are displayed on different surfaces. For example, a user of the portable information terminal 9102 can see the display (here, the information 9053) with the portable information terminal 9102 put in a breast pocket of his/her clothes. Specifically, a caller's phone number, name, or the like of an incoming call is displayed in a position that can be seen from above the portable information terminal 9102. Thus, the user can see the display without taking out the portable information terminal 9102 from the pocket and decide whether to answer the call.

Figure 31D:
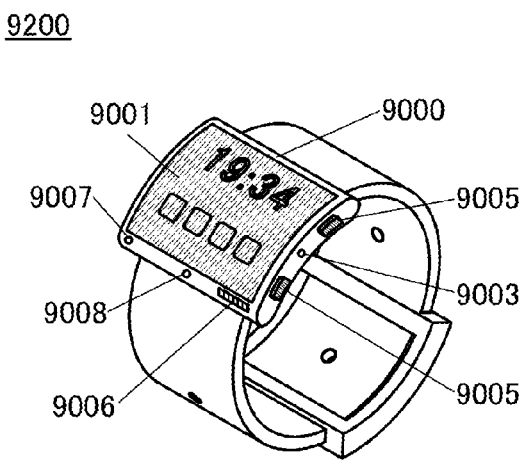

FIG. 31D is a perspective view of a watch-type portable information terminal 9200. The portable information terminal 9200 is capable of executing a variety of applications such as mobile phone calls, e-mailing, viewing and editing texts, music reproduction, Internet communication, and computer games. The display surface of the display portion 9001 is bent, and images can be displayed on the bent display surface. The portable information terminal 9200 can employ near field communication that is a communication method based on an existing communication standard. In that case, for example, mutual communication between the portable information terminal and a headset capable of wireless communication can be performed, and thus hands-free calling is possible. The portable information terminal 9200 includes the connection terminal 9006, and data can be directly transmitted to and received from another information terminal via a connector. Power charging through the connection terminal 9006 is possible. Note that the charging operation may be performed by wireless power feeding without using the connection terminal 9006.

Figure 31E:
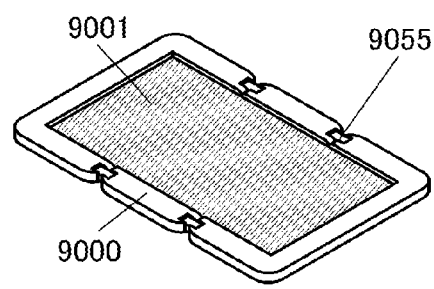
Figure 31F:
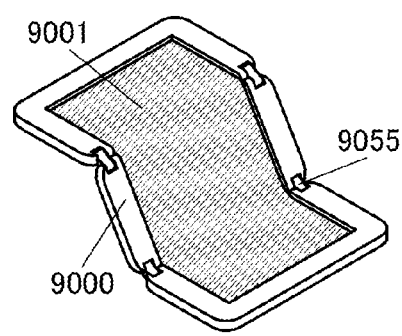
Figure 31G:
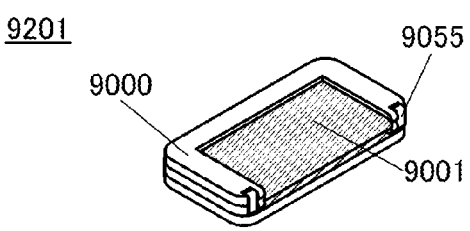

FIGS. 31E, 31F, and 31G are perspective views of a foldable portable information terminal 9201. FIG. 31E is a perspective view illustrating the portable information terminal 9201 which is opened. FIG. 31F is a perspective view illustrating the portable information terminal 9201 which is being opened or being folded. FIG. 31G is a perspective view illustrating the portable information terminal 9201 which is folded. When the portable information terminal 9201 is opened, a seamless large display region is highly browsable. The display portion 9001 of the portable information terminal 9201 is supported by three housings 9000 joined together by hinges 9055. By folding the portable information terminal 9201 at a connection portion between two housings 9000 with the hinges 9055, the portable information terminal 9201 can be reversibly changed in shape from an opened state to a folded state. For example, the portable information terminal 9201 can be bent with a radius of curvature greater than or equal to 1 mm and less than or equal to 150 mm.

Examples of electronic devices are a television set (also referred to as a television or a television receiver), a monitor of a computer or the like, a camera such as a digital camera or a digital video camera, a digital photo frame, a mobile phone handset (also referred to as a mobile phone or a mobile phone device), a goggle-type display (head mounted display), a portable game machine, a portable information terminal, an audio reproducing device, and a large-sized game machine such as a pachinko machine.

Furthermore, the electronic device of one embodiment of the present invention may include a secondary battery. It is preferable that the secondary battery be capable of being charged by non-contact power transmission.

Examples of the secondary battery include a lithium ion secondary battery such as a lithium polymer battery using a gel electrolyte (lithium ion polymer battery), a lithium-ion battery, a nickel-hydride battery, a nickel-cadmium battery, an organic radical battery, a lead-acid battery, an air secondary battery, a nickel-zinc battery, and a silver-zinc battery.

The electronic device of one embodiment of the present invention may include an antenna. When a signal is received by the antenna, the electronic device can display an image, data, or the like on a display portion. When the electronic device includes a secondary battery, the antenna may be used for non-contact power transmission.

Figure 32A:
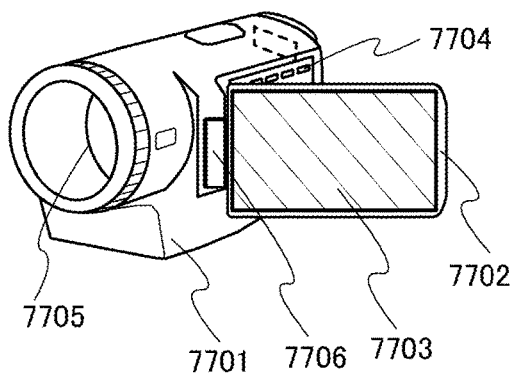
FIGS. 32A to 32E illustrate electronic devices of one embodiment of the present invention.

FIG. 32A illustrates a video camera including a housing 7701, a housing 7702, a display portion 7703, operation keys 7704, a lens 7705, a joint 7706, and the like. The operation keys 7704 and the lens 7705 are provided for the housing 7701, and the display portion 7703 is provided for the housing 7702. The housing 7701 and the housing 7702 are connected to each other with the joint 7706, and the angle between the housing 7701 and the housing 7702 can be changed with the joint 7706. Images displayed on the display portion 7703 may be switched in accordance with the angle at the joint 7706 between the housing 7701 and the housing 7702.

Figure 32B:
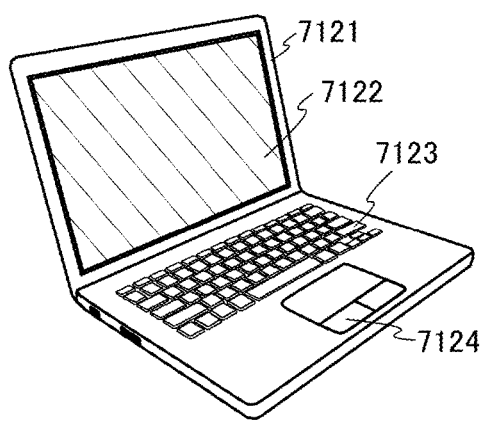

FIG. 32B illustrates a notebook personal computer including a housing 7121, a display portion 7122, a keyboard 7123, a pointing device 7124, and the like. Note that the display portion 7122 is small- or medium-sized but can perform 8$k$ display because it has greatly high pixel density and high resolution; therefore, a significantly clear image can be obtained.

Figure 32C:
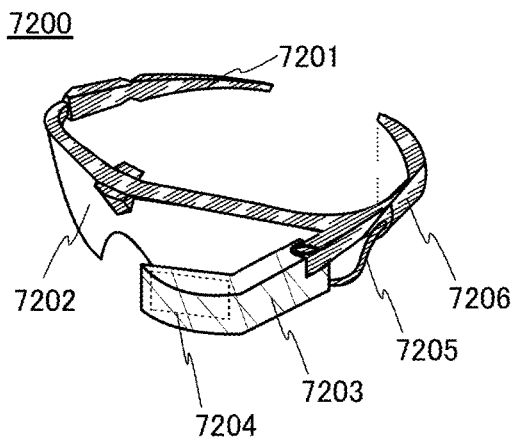

FIG. 32C is an external view of a head-mounted display 7200.

The head-mounted display 7200 includes a mounting portion 7201, a lens 7202, a main body 7203, a display portion 7204, a cable 7205, and the like. The mounting portion 7201 includes a battery 7206.

Power is supplied from the battery 7206 to the main body 7203 through the cable 7205. The main body 7203 includes a wireless receiver or the like to receive video data, such as image data, and display it on the display portion 7204. The movement of the eyeball and the eyelid of a user is captured by a camera in the main body 7203 and then coordinates of the points the user looks at are calculated using the captured data to utilize the eye point of the user as an input means.

The mounting portion 7201 may include a plurality of electrodes so as to be in contact with the user. The main body 7203 may be configured to sense current flowing through the electrodes with the movement of the user's eyeball to recognize the direction of his or her eyes. The main body 7203 may be configured to sense current flowing through the electrodes to monitor the user's pulse. The mounting portion 7201 may include sensors, such as a temperature sensor, a pressure sensor, or an acceleration sensor, so that the user's biological information can be displayed on the display portion 7204. The main body 7203 may be configured to sense the movement of the user's head or the like to move an image displayed on the display portion 7204 in synchronization with the movement of the user's head or the like.

Figure 32D:
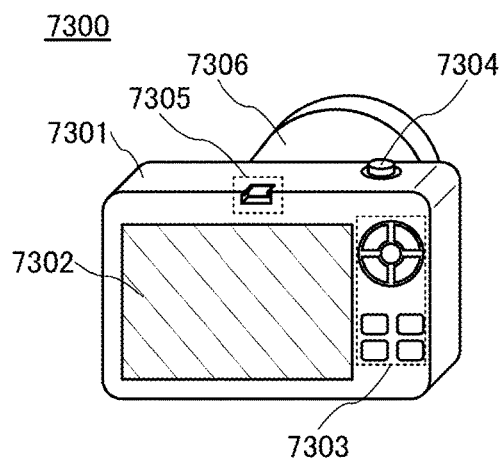

FIG. 32D is an external view of a camera 7300. The camera 7300 includes a housing 7301, a display portion 7302, an operation button 7303, a shutter button 7304, a connection portion 7305, and the like. A lens 7306 can be put on the camera 7300.

The connection portion 7305 includes an electrode to connect with a finder 7400, which is described below, a stroboscope, or the like.

Although the lens 7306 of the camera 7300 here is detachable from the housing 7301 for replacement, the lens 7306 may be included in the housing 7301.

Images can be taken at the touch of the shutter button 7304. In addition, images can be taken by operation of the display portion 7302 including a touch sensor.

In the display portion 7302, the display device of one embodiment of the present invention or a touch sensor can be used.

Figure 32E:
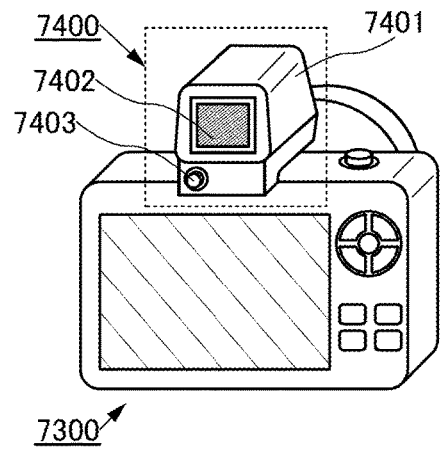

FIG. 32E illustrates the camera 7300 with the finder 7400 connected.

The finder 7400 includes a housing 7401, a display portion 7402, a button 7403, and the like.

The housing 7401 includes a connection portion for engagement with the connection portion 7305 of the camera 7300 so that the finder 7400 can be connected to the camera 7300. The connection portion includes an electrode, and an image or the like received from the camera 7300 through the electrode can be displayed on the display portion 7402.

The button 7403 functions as a power supply button. With the button 7403, on/off of display on the display portion 7402 can be switched.

Although the camera 7300 and the finder 7400 are separate and detachable electronic devices in FIGS. 32D and 32E, the housing 7301 of the camera 7300 may include a finder having a display device of one embodiment of the present invention or a touch sensor.

FIGS. 33A to 33E are external views of a head-mounted display 7500 and a head-mounted display 7510.

The head-mounted display 7500 includes a housing 7501, two display portions 7502, an operation button 7503, and a fixing band 7504.

The head-mounted display 7500 has the functions of the above-described head-mounted display 7200 and further includes two display portions.

With the two display portions 7502, the user can see one display portion with one eye and the other display portion with the other eye. Thus, a high-resolution image can be displayed even when a three-dimensional display using parallax or the like is performed. The display portion 7502 is curved around an arc with the user's eye as an approximate center. Thus, distances between the user's eye and display surfaces of the display portion become equal; thus, the user can see a more natural image. Even when the luminance or chromaticity of light from the display portion is changed depending on the angle at which the user see it, since the user's eye is positioned in a normal direction of the display surface of the display portion, the influence of the change can be substantially ignorable and thus a more realistic image can be displayed.

The operation button 7503 serves as a power button or the like. A button other than the operation button 7503 may be included.

The head-mounted display 7510 includes the housing 7501, the display portion 7502, the fixing bands 7504, and the pair of lenses 7505.

The user can view display on the display portion 7502 through the lenses 7505. It is favorable that the display portion 7502 be curved. The curved display portion 7502 gives the user a high realistic sensation.

Figure 33A:
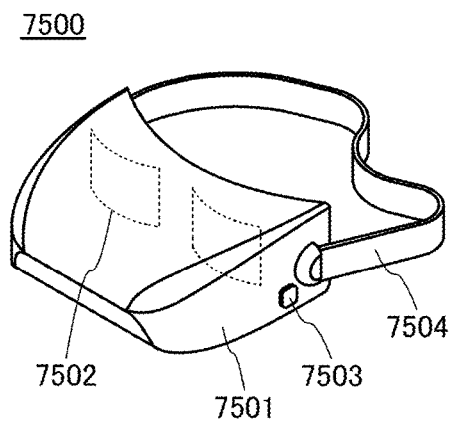
FIGS. 33A to 33E illustrate an electronic device of one embodiment of the present invention.
Figure 33B:
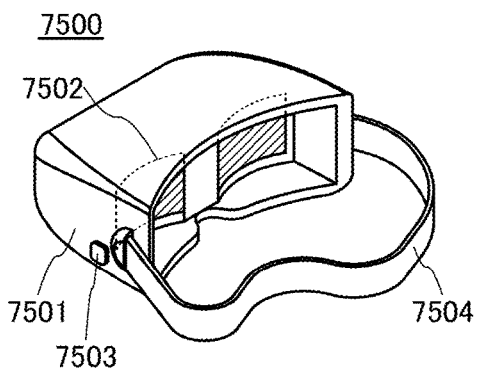
Figure 33C:
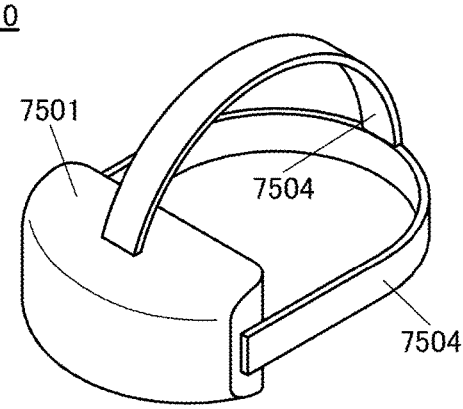
Figure 33D:
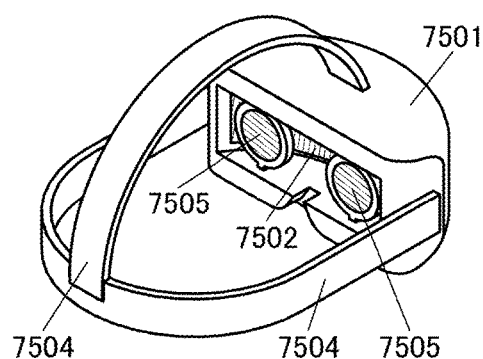
Figure 33E:
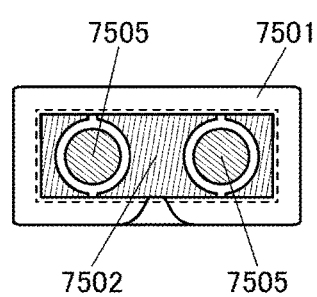

The display device of one embodiment of the present invention can be used in the display portion 7502. The display device of one embodiment of the present invention can have a high resolution; thus, even when an image is magnified using the lenses 7505 as illustrated in FIG. 33E, the user does not perceive pixels, and thus a more realistic image can be displayed.

Figure 34A:
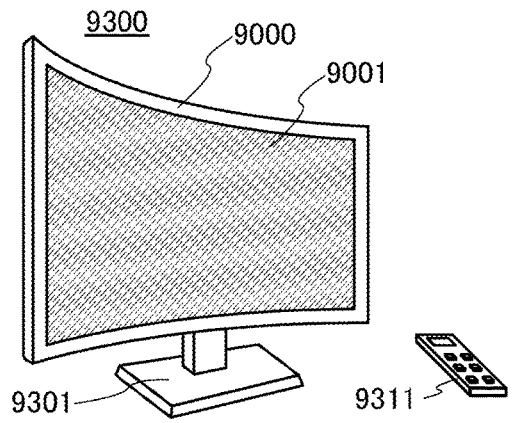
FIGS. 34A to 34D illustrate electronic devices of one embodiment of the present invention.

FIG. 34A illustrates an example of a television set. In the television set 9300, the display portion 9001 is incorporated into the housing 9000. Here, the housing 9000 is supported by a stand 9301.

The television set 9300 illustrated in FIG. 34A can be operated with an operation switch of the housing 9000 or a separate remote controller 9311. The display portion 9001 may include a touch sensor. The television set 9300 can be operated by touching the display portion 9001 with a finger or the like. The remote controller 9311 may be provided with a display portion for displaying data output from the remote controller 9311. With operation keys or a touch panel of the remote controller 9311, channels or volume can be controlled and images displayed on the display portion 9001 can be controlled.

The television set 9300 is provided with a receiver, a modem, or the like. With the use of the receiver, general television broadcasting can be received. Moreover, when the television device is connected to a communication network with or without wires via the modem, one-way (from a sender to a receiver) or two-way (between a sender and a receiver or between receivers) information communication can be performed.

The electronic device or the lighting device of one embodiment of the present invention has flexibility and therefore can be incorporated along a curved inside/outside wall surface of a house or a building or a curved interior/exterior surface of a car.

Figure 34B:
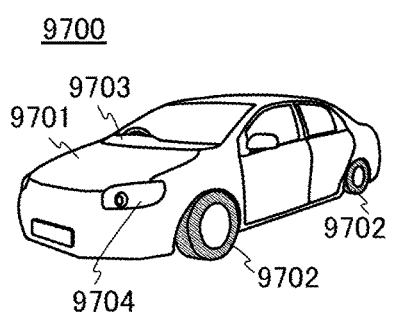
Figure 34C:
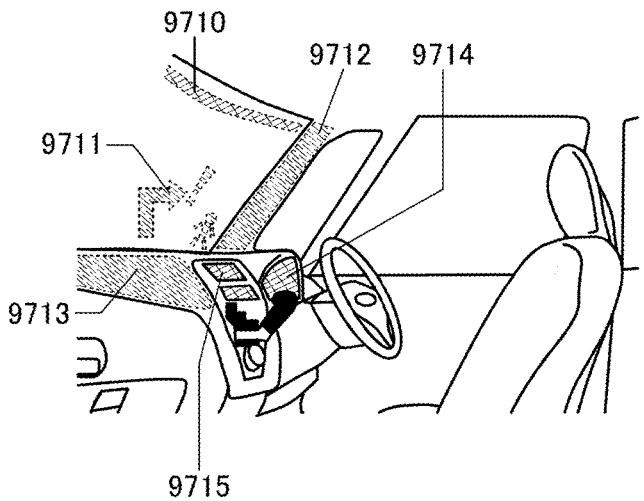

FIG. 34B is an external view of an automobile 9700. FIG. 34C illustrates a driver's seat of the automobile 9700. The automobile 9700 includes a car body 9701, wheels 9702, a dashboard 9703, lights 9704, and the like. The display device, the light-emitting device, or the like of one embodiment of the present invention can be used in a display portion or the like of the automobile 9700. For example, the display device, the light-emitting device, or the like of one embodiment of the present invention can be used in display portions 9710 to 9715 illustrated in FIG. 34C.

The display portion 9710 and the display portion 9711 are display devices provided in an automobile windshield. The display device, the light-emitting device, or the like of one embodiment of the present invention can be a see-through display device, through which the opposite side can be seen, using a light-transmitting conductive material for its electrodes and wirings. Such a see-through display portion 9710 or 9711 does not hinder driver's vision during driving the automobile 9700. Thus, the display device, the light-emitting device, or the like of one embodiment of the present invention can be provided in the windshield of the automobile 9700. Note that in the case where a transistor or the like for driving the display device, the light-emitting device, or the like is provided, a transistor having a light-transmitting property, such as an organic transistor using an organic semiconductor material or a transistor using an oxide semiconductor, is preferably used.

The display portion 9712 is a display device provided on a pillar portion. For example, the display portion 9712 can compensate for the view hindered by the pillar portion by showing an image taken by an imaging unit provided on the car body. The display portion 9713 is a display device provided on the dashboard. For example, the display portion 9713 can compensate for the view hindered by the dashboard portion by showing an image taken by an imaging unit provided on the car body. That is, showing an image taken by an imaging unit provided on the outside of the car body leads to elimination of blind areas and enhancement of safety. In addition, showing an image so as to compensate for the area which a driver cannot see makes it possible for the driver to confirm safety easily and comfortably.

Figure 34D:
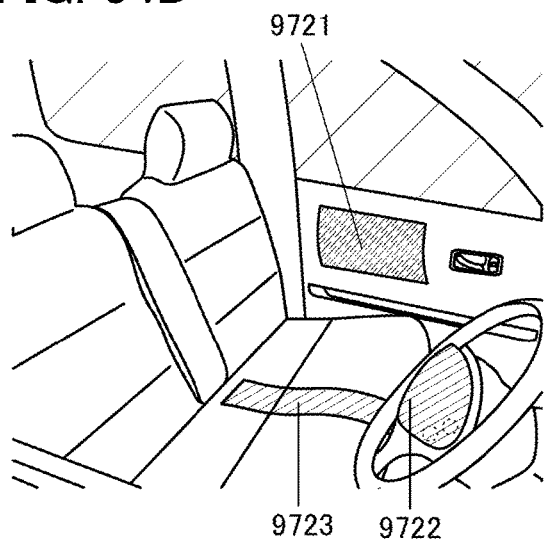

FIG. 34D illustrates the inside of a car in which a bench seat is used as a driver seat and a front passenger seat. A display portion 9721 is a display device provided in a door portion. For example, the display portion 9721 can compensate for the view hindered by the door portion by showing an image taken by an imaging unit provided on the car body. A display portion 9722 is a display device provided in a steering wheel. A display portion 9723 is a display device provided in the middle of a seating face of the bench seat. Note that the display device can be used as a seat heater by providing the display device on the seating face or backrest and by using heat generation of the display device as a heat source.

The display portion 9714, the display portion 9715, and the display portion 9722 can display a variety of kinds of information such as navigation data, a speedometer, a tachometer, a mileage, a fuel meter, a gearshift indicator, and air-condition setting. The content, layout, or the like of the display on the display portions can be changed freely by a user as appropriate. The information listed above can also be displayed on the display portions 9710 to 9713, 9721, and 9723. The display portions 9710 to 9715 and 9721 to 9723 can also be used as lighting devices. The display portions 9710 to 9715 and 9721 to 9723 can also be used as heating devices.

Figure 35A:
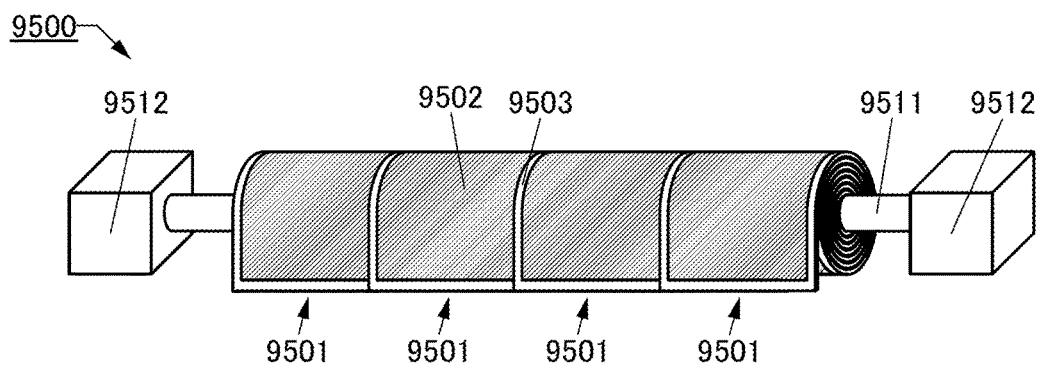
FIGS. 35A and 35B are perspective views illustrating a display device of one embodiment of the present invention.
Figure 35B:
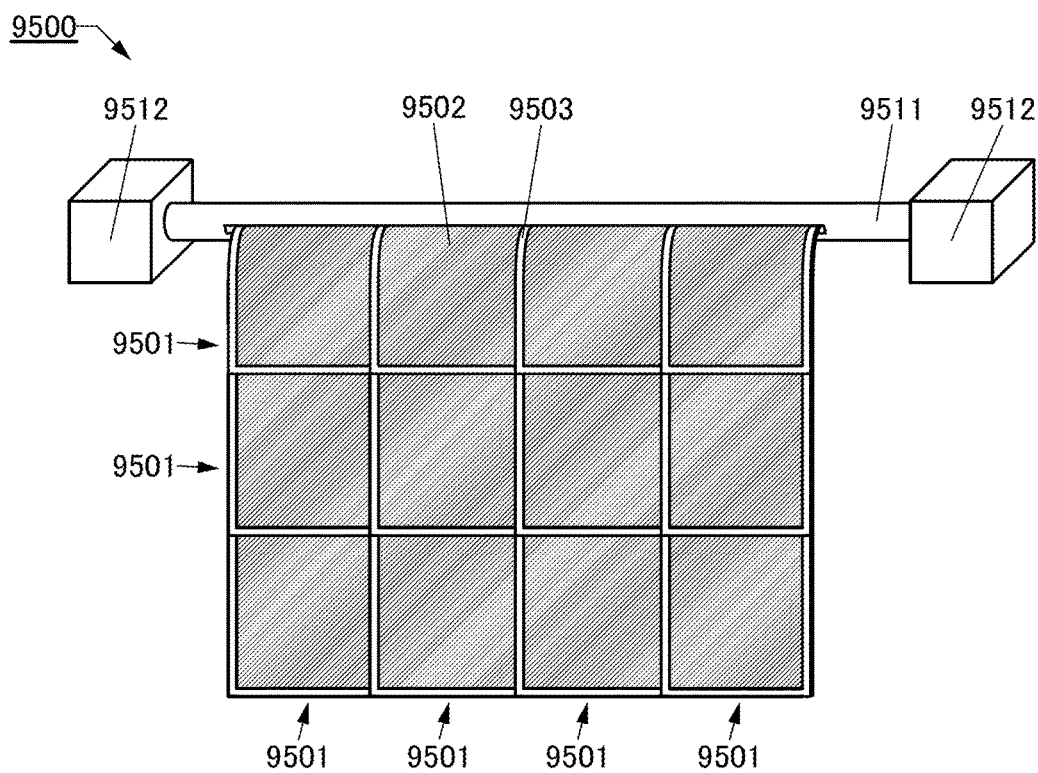

A display device 9500 illustrated in FIGS. 35A and 35B includes a plurality of display panels 9501, a hinge 9511, and a bearing 9512. The plurality of display panels 9501 each include a display region 9502 and a light-transmitting region 9503.

Each of the plurality of display panels 9501 is flexible. Two adjacent display panels 9501 are provided so as to partly overlap with each other. For example, the light-transmitting regions 9503 of the two adjacent display panels 9501 can be overlapped each other. A display device having a large screen can be obtained with the plurality of display panels 9501. The display device is highly versatile because the display panels 9501 can be wound depending on its use.

Moreover, although the display regions 9502 of the adjacent display panels 9501 are separated from each other in FIGS. 35A and 35B, without limitation to this structure, the display regions 9502 of the adjacent display panels 9501 may overlap with each other without any space so that a continuous display region 9502 is obtained, for example.

The electronic devices described in this embodiment each include the display portion for displaying some sort of data. Note that the light-emitting element of one embodiment of the present invention can also be used for an electronic device which does not have a display portion. The structure in which the display portion of the electronic device described in this embodiment is flexible and display can be performed on the bent display surface or the structure in which the display portion of the electronic device is foldable is described as an example; however, the structure is not limited thereto and a structure in which the display portion of the electronic device is not flexible and display is performed on a plane portion may be employed.

The structure described in this embodiment can be used in appropriate combination with the structure described in any of the other embodiments.

Embodiment 9

In this embodiment, a light-emitting device including the light-emitting element of one embodiment of the present invention is described with reference to FIGS. 36A to 36C and FIGS. 37A to 37D.

Figure 36A:
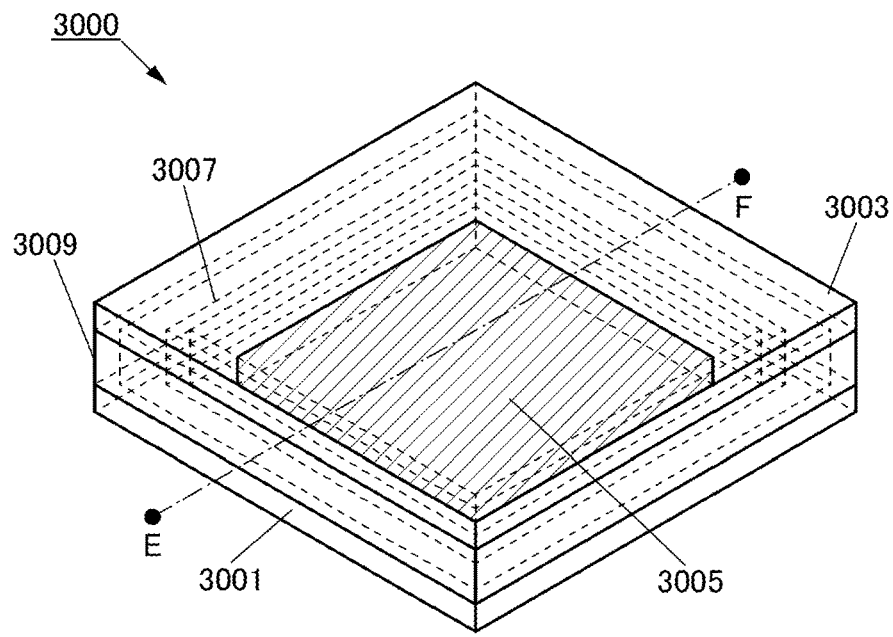
FIGS. 36A to 36C are a perspective view and cross-sectional views illustrating a light-emitting device of one embodiment of the present invention.
Figure 36B:
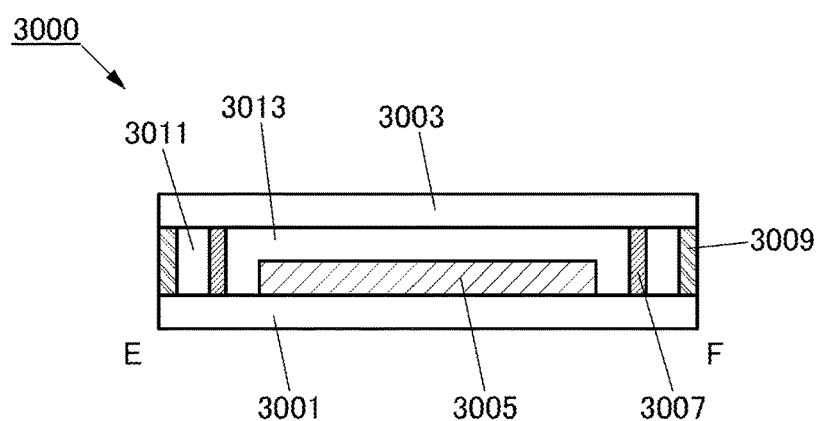

FIG. 36A is a perspective view of a light-emitting device 3000 shown in this embodiment, and FIG. 36B is a cross-sectional view along dashed-dotted line E-F in FIG. 36A. Note that in FIG. 36A, some components are illustrated by broken lines in order to avoid complexity of the drawing.

The light-emitting device 3000 illustrated in FIGS. 36A and 36B includes a substrate 3001, a light-emitting element 3005 over the substrate 3001, a first sealing region 3007 provided around the light-emitting element 3005, and a second sealing region 3009 provided around the first sealing region 3007.

Light is emitted from the light-emitting element 3005 through one or both of the substrate 3001 and a substrate 3003. In FIGS. 36A and 36B, a structure in which light is emitted from the light-emitting element 3005 to the lower side (the substrate 3001 side) is illustrated.

As illustrated in FIGS. 36A and 36B, the light-emitting device 3000 has a double sealing structure in which the light-emitting element 3005 is surrounded by the first sealing region 3007 and the second sealing region 3009. With the double sealing structure, entry of impurities (e.g., water, oxygen, and the like) from the outside into the light-emitting element 3005 can be favorably suppressed. Note that it is not necessary to provide both the first sealing region 3007 and the second sealing region 3009. For example, only the first sealing region 3007 may be provided.

Note that in FIG. 36B, the first sealing region 3007 and the second sealing region 3009 are each provided in contact with the substrate 3001 and the substrate 3003. However, without limitation to such a structure, for example, one or both of the first sealing region 3007 and the second sealing region 3009 may be provided in contact with an insulating film or a conductive film provided on the substrate 3001. Alternatively, one or both of the first sealing region 3007 and the second sealing region 3009 may be provided in contact with an insulating film or a conductive film provided on the substrate 3003.

The substrate 3001 and the substrate 3003 can have structures similar to those of the substrate 200 and the substrate 220 described in the above embodiment, respectively. The light-emitting element 3005 can have a structure similar to that of any of the light-emitting elements described in the above embodiments.

For the first sealing region 3007, a material containing glass (e.g., a glass frit, a glass ribbon, and the like) can be used. For the second sealing region 3009, a material containing a resin can be used. With use of the material containing glass for the first sealing region 3007, productivity and a sealing property can be improved. Moreover, with use of the material containing a resin for the second sealing region 3009, impact resistance and heat resistance can be improved. However, the materials used for the first sealing region 3007 and the second sealing region 3009 are not limited to such, and the first sealing region 3007 may be formed using the material containing a resin and the second sealing region 3009 may be formed using the material containing glass.

The glass frit may contain, for example, magnesium oxide, calcium oxide, strontium oxide, barium oxide, cesium oxide, sodium oxide, potassium oxide, boron oxide, vanadium oxide, zinc oxide, tellurium oxide, aluminum oxide, silicon dioxide, lead oxide, tin oxide, phosphorus oxide, ruthenium oxide, rhodium oxide, iron oxide, copper oxide, manganese dioxide, molybdenum oxide, niobium oxide, titanium oxide, tungsten oxide, bismuth oxide, zirconium oxide, lithium oxide, antimony oxide, lead borate glass, tin phosphate glass, vanadate glass, or borosilicate glass. The glass frit preferably contains at least one kind of transition metal to absorb infrared light.

As the above glass frits, for example, a frit paste is applied to a substrate and is subjected to heat treatment, laser light irradiation, or the like. The frit paste contains the glass frit and a resin (also referred to as a binder) diluted by an organic solvent. Note that an absorber which absorbs light having the wavelength of laser light may be added to the glass frit. For example, an Nd:YAG laser or a semiconductor laser is preferably used as the laser. The shape of laser light may be circular or quadrangular.

As the above material containing a resin, for example, polyester, polyolefin, polyamide (e.g., nylon, aramid), polyimide, polycarbonate, or an acrylic resin, polyurethane, or an epoxy resin can be used. Alternatively, a material that includes a resin having a siloxane bond such as silicone can be used.

Note that in the case where the material containing glass is used for one or both of the first sealing region 3007 and the second sealing region 3009, the material containing glass preferably has a thermal expansion coefficient close to that of the substrate 3001. With the above structure, generation of a crack in the material containing glass or the substrate 3001 due to thermal stress can be suppressed.

For example, the following advantageous effect can be obtained in the case where the material containing glass is used for the first sealing region 3007 and the material containing a resin is used for the second sealing region 3009.

The second sealing region 3009 is provided closer to an outer portion of the light-emitting device 3000 than the first sealing region 3007 is. In the light-emitting device 3000, distortion due to external force or the like increases toward the outer portion. Thus, the outer portion of the light-emitting device 3000 where a larger amount of distortion is generated, that is, the second sealing region 3009 is sealed using the material containing a resin and the first sealing region 3007 provided on an inner side of the second sealing region 3009 is sealed using the material containing glass, whereby the light-emitting device 3000 is less likely to be damaged even when distortion due to external force or the like is generated.

Furthermore, as illustrated in FIG. 36B, a first region 3011 corresponds to the region surrounded by the substrate 3001, the substrate 3003, the first sealing region 3007, and the second sealing region 3009. A second region 3013 corresponds to the region surrounded by the substrate 3001, the substrate 3003, the light-emitting element 3005, and the first sealing region 3007.

The first region 3011 and the second region 3013 are preferably filled with, for example, an inert gas such as a rare gas or a nitrogen gas. Alternatively, the first region 3011 and the second region 3013 are preferably filled with a resin such as an acrylic resin or an epoxy resin. Note that for the first region 3011 and the second region 3013, a reduced pressure state is preferred to an atmospheric pressure state.

Figure 36C:
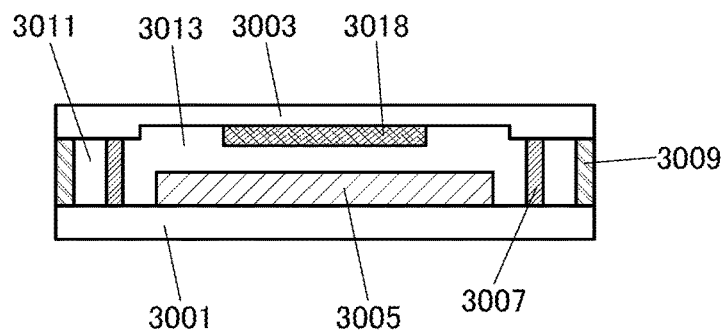

FIG. 36C illustrates a modification example of the structure in FIG. 36B. FIG. 36C is a cross-sectional view illustrating the modification example of the light-emitting device 3000.

FIG. 36C illustrates a structure in which a desiccant 3018 is provided in a recessed portion provided in part of the substrate 3003. The other components are the same as those of the structure illustrated in FIG. 36B.

As the desiccant 3018, a substance which adsorbs moisture and the like by chemical adsorption or a substance which adsorbs moisture and the like by physical adsorption can be used. Examples of the substance that can be used as the desiccant 3018 include alkali metal oxides, alkaline earth metal oxide (e.g., calcium oxide, barium oxide, and the like), sulfate, metal halides, perchlorate, zeolite, silica gel, and the like.

Next, modification examples of the light-emitting device 3000 which is illustrated in FIG. 36B are described with reference to FIGS. 37A to 37D. Note that FIGS. 37A to 37D are cross-sectional views illustrating the modification examples of the light-emitting device 3000 illustrated in FIG. 36B.

In each of the light-emitting devices illustrated in FIGS. 37A to 37D, the second sealing region 3009 is not provided but only the first sealing region 3007 is provided. Moreover, in each of the light-emitting devices illustrated in FIGS. 37A to 37D, a region 3014 is provided instead of the second region 3013 illustrated in FIG. 36B.

For the region 3014, for example, polyester, polyolefin, polyamide (e.g., nylon, aramid), polyimide, polycarbonate, or an acrylic resin, polyurethane, or an epoxy resin can be used. Alternatively, a material that includes a resin having a siloxane bond such as silicone can be used.

When the above-described material is used for the region 3014, what is called a solid-sealing light-emitting device can be obtained.

Figure 37A:
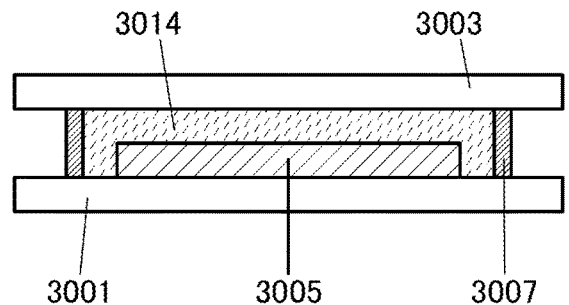
FIGS. 37A to 37D are cross-sectional views each illustrating a light-emitting device of one embodiment of the present invention.
Figure 37B:
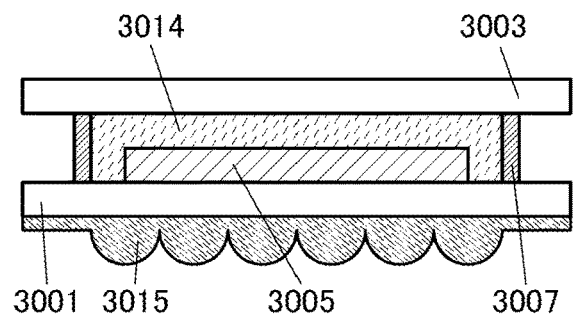

In the light-emitting device illustrated in FIG. 37B, a substrate 3015 is provided on the substrate 3001 side of the light-emitting device illustrated in FIG. 37A.

The substrate 3015 has unevenness as illustrated in FIG. 37B. With a structure in which the substrate 3015 having unevenness is provided on the side through which light emitted from the light-emitting element 3005 is extracted, the efficiency of extraction of light from the light-emitting element 3005 can be improved. Note that instead of the structure having unevenness and illustrated in FIG. 37B, a substrate having a function as a diffusion plate may be provided.

Figure 37C:
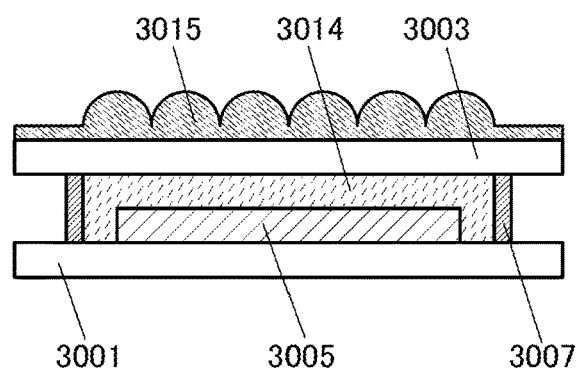

In the light-emitting device illustrated in FIG. 37C, light is extracted through the substrate 3003 side, unlike in the light-emitting device illustrated in FIG. 37A, in which light is extracted through the substrate 3001 side.

The light-emitting device illustrated in FIG. 37C includes the substrate 3015 on the substrate 3003 side. The other components are the same as those of the light-emitting device illustrated in FIG. 37B.

Figure 37D:
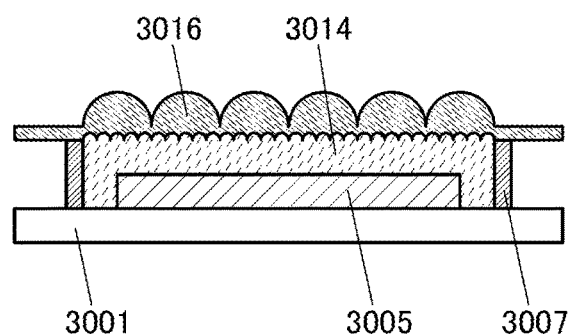

In the light-emitting device illustrated in FIG. 37D, the substrate 3003 and the substrate 3015 included in the light-emitting device illustrated in FIG. 37C are not provided but a substrate 3016 is provided.

The substrate 3016 includes first unevenness positioned closer to the light-emitting element 3005 and second unevenness positioned farther from the light-emitting element 3005. With the structure illustrated in FIG. 37D, the efficiency of extraction of light from the light-emitting element 3005 can be further improved.

Thus, the use of the structure described in this embodiment can provide a light-emitting device in which deterioration of a light-emitting element due to impurities such as moisture and oxygen is suppressed. Alternatively, with the structure described in this embodiment, a light-emitting device having high light extraction efficiency can be obtained.

Note that the structure described in this embodiment can be combined as appropriate with any of the structures described in the other embodiments.

Embodiment 10

In this embodiment, examples in which the light-emitting element of one embodiment of the present invention is used for various lighting devices and electronic devices are described with reference to FIGS. 38A to 38C and FIG. 39.

An electronic device or a lighting device that has a light-emitting region with a curved surface can be obtained with use of the light-emitting element of one embodiment of the present invention which is manufactured over a substrate having flexibility.

Furthermore, a light-emitting device to which one embodiment of the present invention is applied can also be used for lighting for motor vehicles, examples of which are lighting for a dashboard, a windshield, a ceiling, and the like.

Figure 38A:
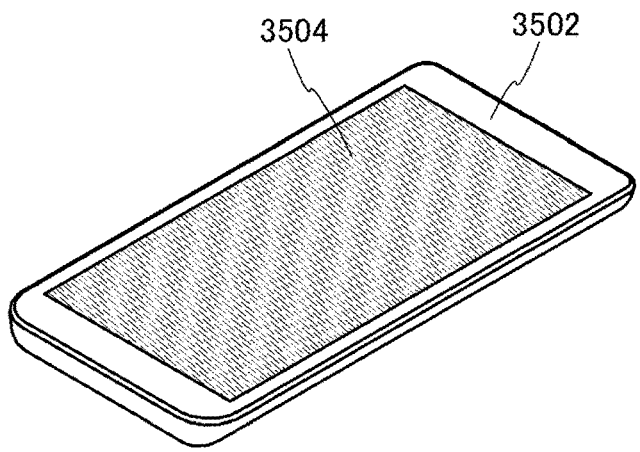
FIGS. 38A and 38B illustrate a lighting device of one embodiment of the present invention.
Figure 38B:
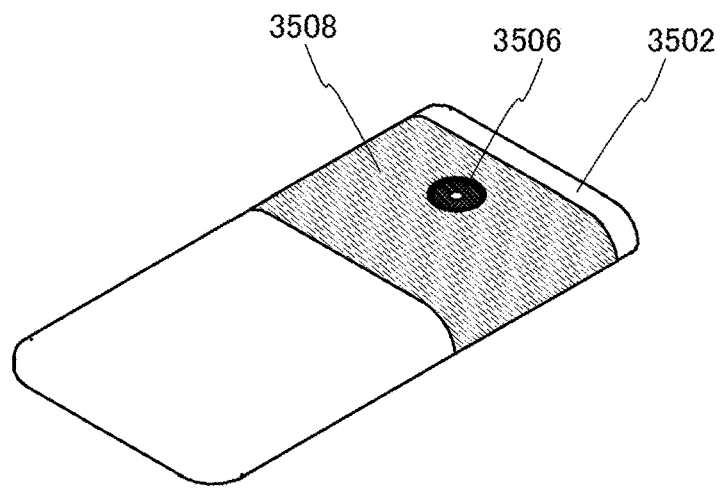

FIG. 38A is a perspective view illustrating one surface of a multifunction terminal 3500, and FIG. 38B is a perspective view illustrating the other surface of the multifunction terminal 3500. In a housing 3502 of the multifunction terminal 3500, a display portion 3504, a camera 3506, lighting 3508, and the like are incorporated. The light-emitting device of one embodiment of the present invention can be used for the lighting 3508.

The lighting 3508 that includes the light-emitting device of one embodiment of the present invention functions as a planar light source. Thus, unlike a point light source typified by an LED, the lighting 3508 can provide light emission with low directivity. When the lighting 3508 and the camera 3506 are used in combination, for example, imaging can be performed by the camera 3506 with the lighting 3508 lighting or flashing. Because the lighting 3508 functions as a planar light source, a photograph as if taken under natural light can be taken.

Note that the multifunction terminal 3500 illustrated in FIGS. 38A and 38B can have a variety of functions as in the electronic devices illustrated in FIGS. 31A to 31G.

The housing 3502 can include a speaker, a sensor (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), a microphone, and the like. When a detection device including a sensor for detecting inclination, such as a gyroscope sensor or an acceleration sensor, is provided inside the multifunction terminal 3500, display on the screen of the display portion 3504 can be automatically switched by determining the orientation of the multifunction terminal 3500 (whether the multifunction terminal is placed horizontally or vertically for a landscape mode or a portrait mode).

The display portion 3504 may function as an image sensor. For example, an image of a palm print, a fingerprint, or the like is taken when the display portion 3504 is touched with the palm or the finger, whereby personal authentication can be performed. Furthermore, by providing a backlight or a sensing light source which emits near-infrared light in the display portion 3504, an image of a finger vein, a palm vein, or the like can be taken. Note that the light-emitting device of one embodiment of the present invention may be used for the display portion 3504.

Figure 38C:
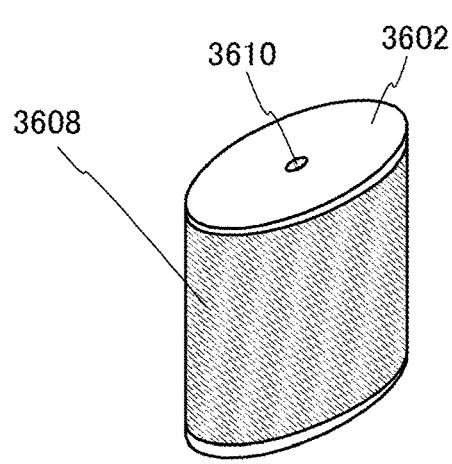
FIG. 38C illustrates an electronic device of one embodiment of the present invention.

FIG. 38C is a perspective view of a security light 3600. The security light 3600 includes lighting 3608 on the outside of the housing 3602, and a speaker 3610 and the like are incorporated in the housing 3602. The light-emitting device of one embodiment of the present invention can be used for the lighting 3608.

The security light 3600 emits light when the lighting 3608 is gripped or held, for example. An electronic circuit that can control the manner of light emission from the security light 3600 may be provided in the housing 3602. The electronic circuit may be a circuit that enables light emission once or intermittently a plurality of times or may be a circuit that can adjust the amount of emitted light by controlling the current value for light emission. A circuit with which a loud audible alarm is output from the speaker 3610 at the same time as light emission from the lighting 3608 may be incorporated.

The security light 3600 can emit light in various directions; therefore, it is possible to intimidate a thug or the like with light, or light and sound. Moreover, the security light 3600 may include a camera such as a digital still camera to have a photography function.

Figure 39:
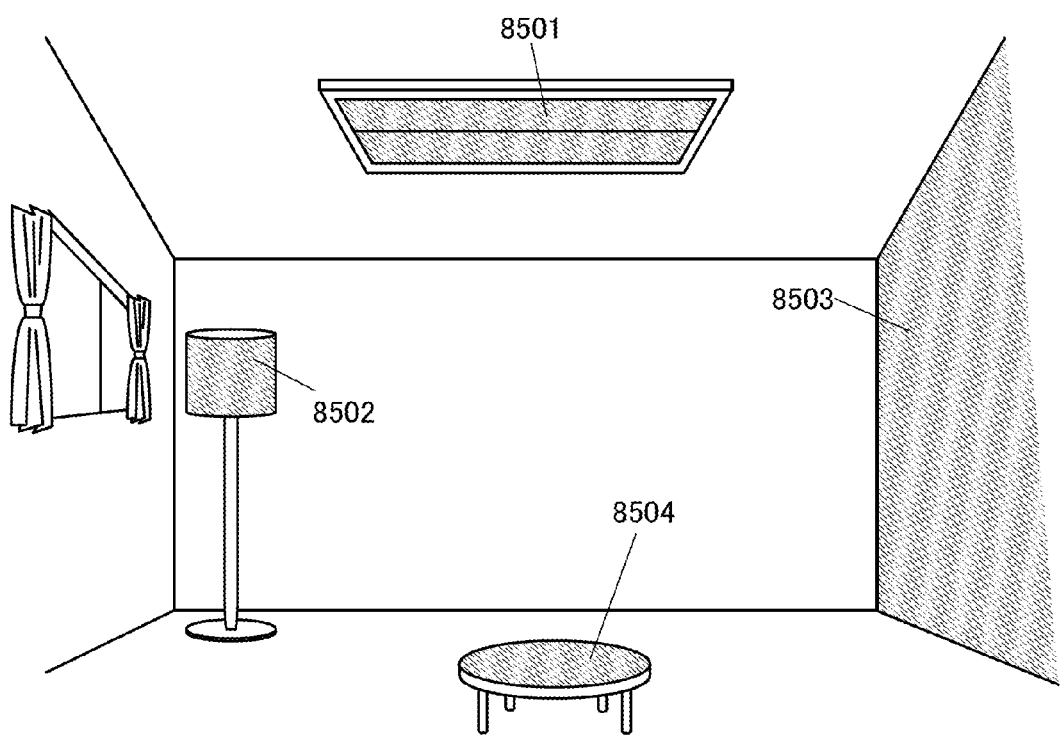
FIG. 39 illustrates lighting devices of embodiments of the present invention.

FIG. 39 illustrates an example in which the light-emitting element is used for an indoor lighting device 8501. Since the light-emitting element can have a larger area, a lighting device having a large area can also be formed. In addition, a lighting device 8502 in which a light-emitting region has a curved surface can also be formed with use of a housing with a curved surface. A light-emitting element described in this embodiment is in the form of a thin film, which allows the housing to be designed more freely. Therefore, the lighting device can be elaborately designed in a variety of ways. Furthermore, a wall of the room may be provided with a large-sized lighting device 8503. Touch sensors may be provided in the lighting devices 8501, 8502, and 8503 to control the power on/off of the lighting devices.

Moreover, when the light-emitting element is used on the surface side of a table, a lighting device 8504 which has a function as a table can be obtained. When the light-emitting element is used as part of other furniture, a lighting device which has a function as the furniture can be obtained.

As described above, lighting devices and electronic devices can be obtained by application of the light-emitting device of one embodiment of the present invention. Note that the light-emitting device can be used for electronic devices in a variety of fields without being limited to the lighting devices and the electronic devices described in this embodiment.

The structure described in this embodiment can be combined with any of the structures described in the other embodiments as appropriate.

Example 1

Figure 40A:
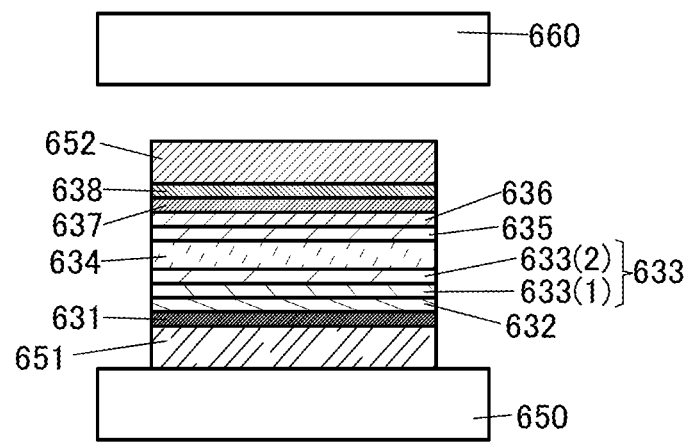
FIGS. 40A and 40B are schematic cross-sectional views each illustrating a light-emitting element in Examples.

In this example, examples of fabricating light-emitting elements of embodiments of the present invention are described. FIG. 40A is a schematic cross-sectional view of the light-emitting element fabricated in this example, and Tables 1 and 2 show details of the element structures. In addition, structures and abbreviations of compounds used here are given below.

[Chemical Formula 1]

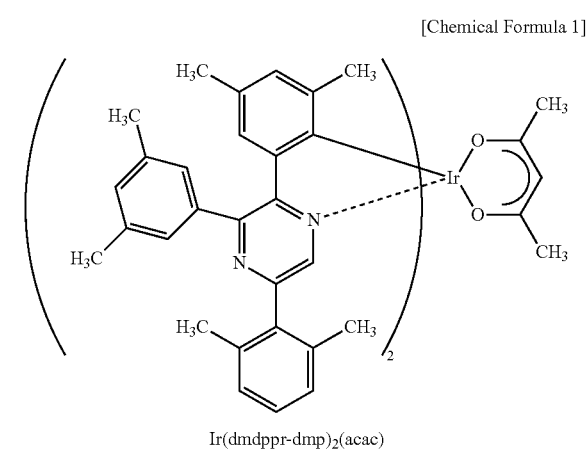

Ir(dmdppr-dmp)₂(acac)

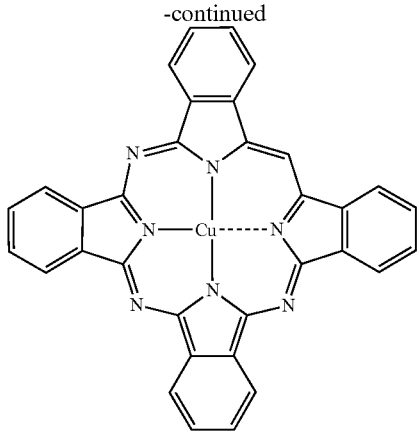

CuPc

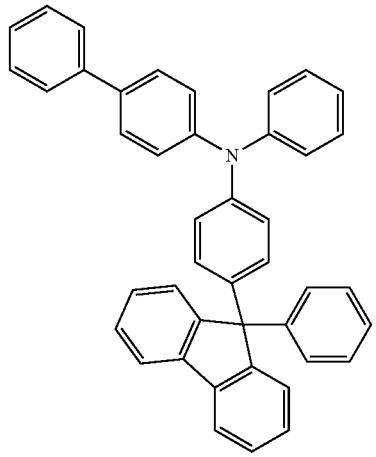

BPAFLP

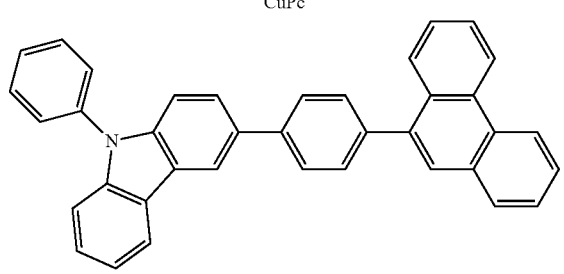

PCPPn

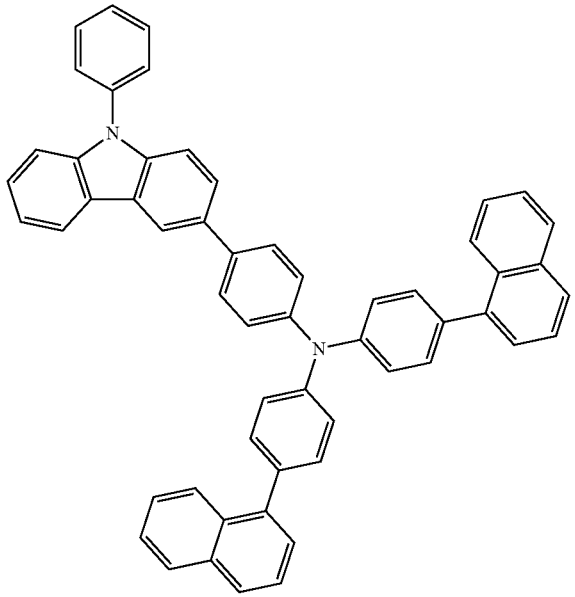

PCBNBB

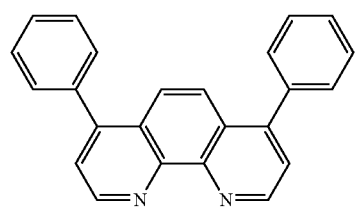

BPhen

2mDBTBPDBq-II

TABLE 1

| | Layer | Reference numeral | Thickness (nm) | Material | Weight ratio *1) |
|---|---|---|---|---|---|
| Light-emitting element 1 | Electrode | 652(2) | 200 | Al | — |
| | | 652(1) | 15 | Ag:Mg | 0.5:0.05 |
| | Buffer layer | 638 | 1 | LiF | — |
| | Buffer layer | 637 | 10 | BPhen | — |
| | Hole-injection layer | 636 | 30 | PCPPn:MoO$_3$ | 1:0.5 |
| | Hole-transport layer | 635 | 20 | BPAFLP | — |
| | Light-emitting layer | 634 | 30 | 2mDBTBPDBq-II:PCBNBB:Ir(dmdppr-dmp)$_2$(acac) | 0.8:0.2:0.06 |
| | Electron-transport layer | 633(2) | 20 | 2mDBTBPDBq-II | — |
| | | 633(1) | 10 | BPhen | — |

TABLE 1-continued

|  | Layer | Reference numeral | Thickness (nm) | Material | Weight ratio *1) |
|---|---|---|---|---|---|
|  | Electron-injection layer | 632 | 0.15 | $Li_2O$ | — |
|  | Buffer layer | 631(2) | 5 | BPhen | — |
|  |  | 631(1) | 2 | CuPc | — |
|  | Electrode | 651 | 110 | ITSO | — |
| Light-emitting element 2 | Electrode | 652(2) | 200 | Al | — |
|  |  | 652(1) | 15 | Ag:Mg | 0.5:0.05 |
|  | Buffer layer | 637 | 10 | BPhen | — |
|  | Hole-injection layer | 636 | 30 | $PCPPn:MoO_3$ | 1:0.5 |
|  | Hole-transport layer | 635 | 20 | BPAFLP | — |
|  | Light-emitting layer | 634 | 30 | 2mDBTBPDBq-II:PCBNBB:Ir(dmdppr-dmp)$_2$(acac) | 0.8:0.2:0.06 |
|  | Electron-transport layer | 633(2) | 20 | 2mDBTBPDBq-II | — |
|  |  | 633(1) | 10 | BPhen | — |
|  | Electron-injection layer | 632 | 0.15 | $Li_2O$ | — |
|  | Buffer layer | 631(2) | 5 | BPhen | — |
|  |  | 631(1) | 2 | CuPc | — |
|  | Electrode | 651 | 110 | ITSO | — |
| Light-emitting element 3 | Electrode | 652(2) | 200 | Al | — |
|  |  | 652(1) | 15 | Ag:Mg | 0.5:0.05 |
|  | Buffer layer | 638 | 1 | LiF | — |
|  | Hole-injection layer | 636 | 30 | $PCPPn:MoO_3$ | 1:0.5 |
|  | Hole-transport layer | 635 | 20 | BPAFLP | — |
|  | Light-emitting layer | 634 | 30 | 2mDBTBPDBq-II:PCBNBB:Ir(dmdppr-dmp)$_2$(acac) | 0.8:0.2:0.06 |
|  | Electron-transport layer | 633(2) | 20 | 2mDBTBPDBq-II | — |
|  |  | 633(1) | 10 | BPhen | — |
|  | Electron-injection layer | 632 | 0.15 | $Li_2O$ | — |
|  | Buffer layer | 631(2) | 5 | BPhen | — |
|  |  | 631(1) | 2 | CuPc | — |
|  | Electrode | 651 | 110 | ITSO | — |

*1) The ratio of only Ag:Mg is represented by the volume ratio.

TABLE 2

|  | Layer | Reference numeral | Thickness (nm) | Material | Weight ratio *1) |
|---|---|---|---|---|---|
| Light-emitting element 4 | Electrode | 652(2) | 200 | Al | — |
|  |  | 652(1) | 15 | Ag:Mg | 0.5:0.05 |
|  | Hole-injection layer | 636 | 30 | $PCPPn:MoO_3$ | 1:0.5 |
|  | Hole-transport layer | 635 | 20 | BPAFLP | — |
|  | Light-emitting layer | 634 | 30 | 2mDBTBPDBq-II:PCBNBB:Ir(dmdppr-dmp)$_2$(acac) | 0.8:0.2:0.06 |
|  | Electron-transport layer | 633(2) | 20 | 2mDBTBPDBq-II | — |
|  |  | 633(1) | 10 | BPhen | — |
|  | Electron-injection layer | 632 | 0.15 | $Li_2O$ | — |
|  | Buffer layer | 631(2) | 5 | BPhen | — |
|  |  | 631(1) | 2 | CuPc | — |
|  | Electrode | 651 | 110 | ITSO | — |
| Light-emitting element 5 | Electrode | 652(2) | 200 | Al | — |
|  |  | 652(1) | 15 | Ag:Mg | 0.5:0.05 |
|  | Buffer layer | 638 | 0.15 | $Li_2O$ | — |
|  | Buffer layer | 637(2) | 5 | BPhen | — |
|  |  | 637(1) | 2 | CuPc | — |
|  | Hole-injection layer | 636 | 30 | $PCPPn:MoO_3$ | 1:0.5 |
|  | Hole-transport layer | 635 | 20 | BPAFLP | — |
|  | Light-emitting layer | 634 | 30 | 2mDBTBPDBq-II:PCBNBB:Ir(dmdppr-dmp)$_2$(acac) | 0.8:0.2:0.06 |
|  | Electron-transport layer | 633(2) | 20 | 2mDBTBPDBq-II | — |
|  |  | 633(1) | 10 | BPhen | — |
|  | Electron-injection layer | 632 | 0.15 | $Li_2O$ | — |
|  | Buffer layer | 631(2) | 5 | BPhen | — |
|  |  | 631(1) | 2 | CuPc | — |
|  | Electrode | 651 | 110 | ITSO | — |
| Light-emitting element 6 | Electrode | 652(2) | 200 | Al | — |
|  |  | 652(1) | 15 | Ag:Mg | 0.5:0.05 |
|  | Buffer layer | 639 | 10 | BPhen | — |
|  | Buffer layer | 638 | 0.15 | $Li_2O$ | — |
|  | Buffer layer | 637(2) | 5 | BPhen | — |
|  |  | 637(1) | 2 | CuPc | — |
|  | Hole-injection layer | 636 | 30 | $PCPPn:MoO_3$ | 1:0.5 |
|  | Hole-transport layer | 635 | 20 | BPAFLP | — |
|  | Light-emitting layer | 634 | 30 | 2mDBTBPDBq-II:PCBNBB:Ir(dmdppr-dmp)$_2$(acac) | 0.8:0.2:0.06 |
|  | Electron-transport layer | 633(2) | 20 | 2mDBTBPDBq-II | — |
|  |  | 633(1) | 10 | BPhen | — |

TABLE 2-continued

| Layer | Reference numeral | Thickness (nm) | Material | Weight ratio *1) |
|---|---|---|---|---|
| Electron-injection layer | 632 | 0.15 | $Li_2O$ | — |
| Buffer layer | 631(2) | 5 | BPhen | — |
|  | 631(1) | 2 | CuPc | — |
| Electrode | 651 | 110 | ITSO | — |

*1) The ratio of only Ag:Mg is represented by the volume ratio.

<Fabrication of Light-Emitting Element>
<<Fabrication of Light-Emitting Element 1>>

A film of ITSO was formed to a thickness of 110 nm over a substrate 650, so that an electrode 651 was formed. The electrode area of the electrode 651 was set to 4 mm² (2 mm×2 mm).

Next, as a buffer layer 631, copper phthalocyanine (abbreviation: CuPc) was deposited by evaporation to a thickness of 2 nm and bathophenanthroline (abbreviation: BPhen) was sequentially deposited by evaporation to a thickness of 5 nm over the electrode 651.

Then, as an electron-injection layer 632, lithium oxide ($Li_2O$) was deposited by evaporation to a thickness of 0.15 nm.

Next, as an electron-transport layer 633, BPhen was deposited by evaporation to a thickness of 10 nm and 2-[3'-(dibenzothiophen-4-yl)biphenyl-3-yl]dibenzo[f,h]quinoxaline (abbreviation: 2mDBTBPDBq-II) was deposited by evaporation to a thickness of 20 nm.

Next, as a light-emitting layer 634, 2mDBTBPDBq-II, 4,4'-di(1-naphthyl)-4''-(9-phenyl-9H-carbazol-3-yl)triphenylamine (abbreviation: PCBNBB), and bis{4,6-dimethyl-2-[5-(2,6-dimethylphenyl)-3-(3,5-dimethylphenyl)-2-pyrazinyl-κN]phenyl-κC}(2,4-pentanedionato-$K^2O,O'$) iridium(III) (abbreviation: Ir(dmdppr-dmp)$_2$(acac)) were deposited by co-evaporation to a thickness of 30 nm such that the weight ratio of 2mDBTBPDBq-II to PCBNBB and Ir(dmdppr-dmp)$_2$(acac) was 0.8 to 0.2 and 0.06.

Then, as a hole-transport layer 635, 4-phenyl-4'-(9-phenylfluoren-9-yl)triphenylamine (abbreviation: BPAFLP) was deposited by evaporation to a thickness of 20 nm.

Then, as a hole-injection layer 636, 3-[4-(9-phenanthryl)-phenyl]-9-phenyl-9H-carbazole (abbreviation: PCPPn) and molybdenum oxide ($MoO_3$) were deposited by co-evaporation to a thickness of 30 nm such that the weight ratio of PCPPn to $MoO_3$ was 1 to 0.5.

Next, BPhen was deposited by evaporation to a thickness of 10 nm as a buffer layer 637, and lithium fluoride (LiF) was deposited by evaporation to a thickness of 1 nm as a buffer layer 638.

Then, a 15-nm-thick alloy film of silver (Ag) and magnesium (Mg) and a 200-nm-thick aluminum (Al) film were sequentially formed, so that an electrode 652 was obtained. The alloy film of Ag and Mg was deposited by evaporation in a volume ratio of Ag:Mg=1:0.1.

Next, in a glove box containing a nitrogen atmosphere, a light-emitting element 1 was sealed by fixing a substrate 660 to the substrate 650 over which an organic material was deposited using a sealant for an organic EL device. Specifically, after the sealant was applied to surround the organic materials over the substrate 650 and the substrate 660 was bonded to the substrate 650, the sealant was irradiated with ultraviolet light having a wavelength of 365 nm at 6 J/cm² and heat treatment was performed at 80° C. for 1 hour. Through the process, the light-emitting element 1 was obtained.

<<Fabrication of Light-Emitting Elements 2 to 6>>

Light-emitting elements 2 to 6 were fabricated through the same steps as those for the light-emitting element 1 except for the steps of forming the buffer layer 637 and the buffer layer 638.

In the light-emitting element 2, BPhen was deposited by evaporation to a thickness of 10 nm as the buffer layer 637. Note that in the light-emitting element 2, the buffer layer 638 was not formed, and the electrode 652 was formed over the buffer layer 637.

In the light-emitting element 3, the buffer layer 637 was not formed, and lithium fluoride (LiF) was deposited by evaporation to a thickness of 1 nm as the buffer layer 638 over the hole-injection layer 636.

In the light-emitting element 4, neither the buffer layer 637 nor the buffer layer 638 was formed, and the electrode 652 was formed over the hole-injection layer 636.

In the light-emitting element 5, the buffer layer 637 was formed by depositing CuPC to a thickness of 2 nm and sequentially depositing BPhen to a thickness of 5 nm by evaporation. Then, the buffer layer 638 was formed by depositing $Li_2O$ to a thickness of 0.15 nm by evaporation over the buffer layer 637.

In the light-emitting element 6, the buffer layer 637 was formed by depositing CuPC to a thickness of 2 nm and sequentially depositing BPhen to a thickness of 5 nm by evaporation. Over the buffer layer 637, the buffer layer 638 was formed by depositing $Li_2O$ to a thickness of 0.15 nm by evaporation. Furthermore, over the buffer layer 638, a buffer layer 639 was formed by depositing BPhen to a thickness of 10 nm by evaporation.

<Characteristics of Light-Emitting Element>

Figure 41:
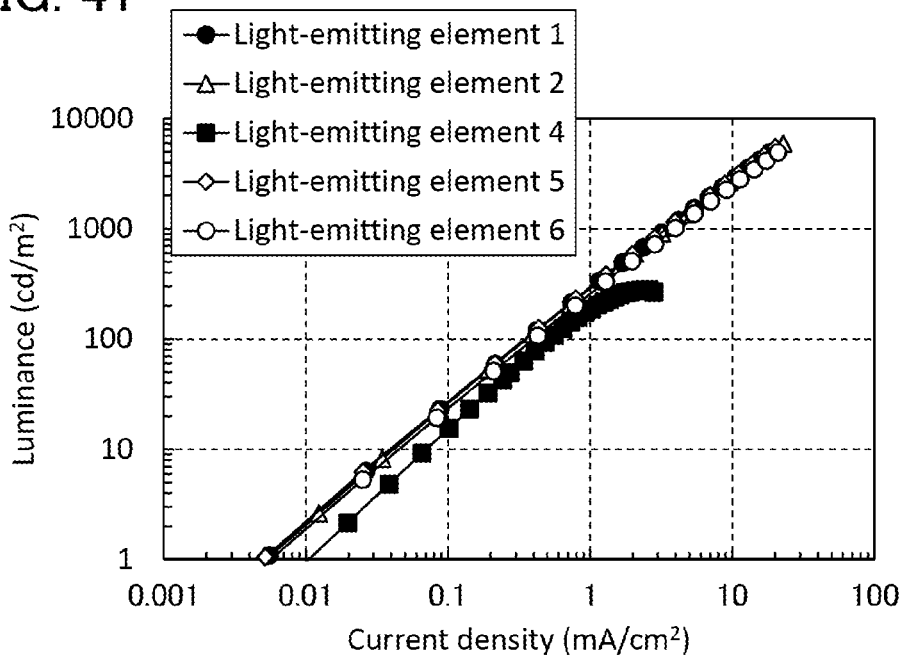
FIG. 41 is a graph showing luminance-current density characteristics of a light-emitting element in Example 1.
Figure 42:
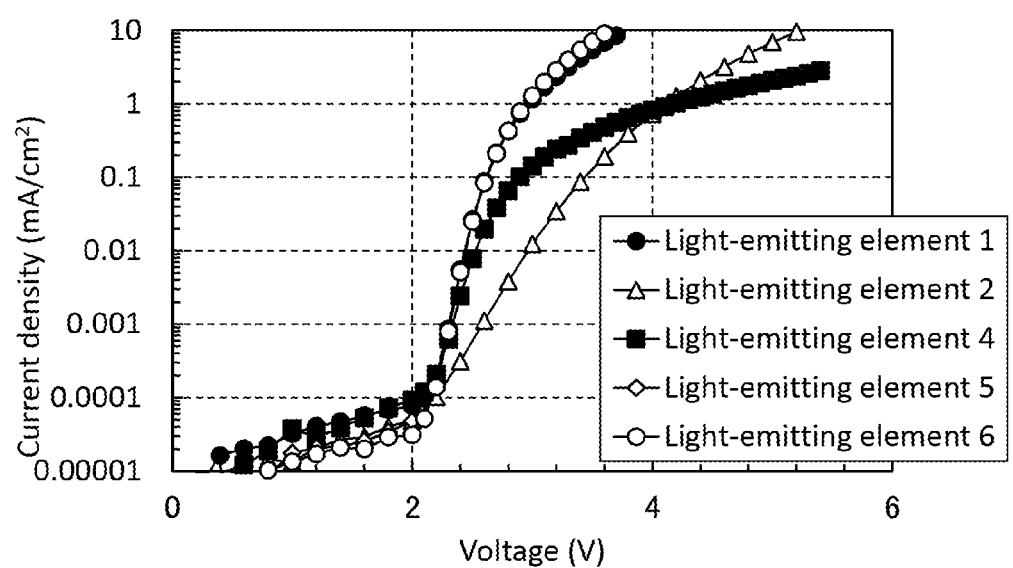
FIG. 42 is a graph showing current density-voltage characteristics of light-emitting elements in Example 1.
Figure 43:
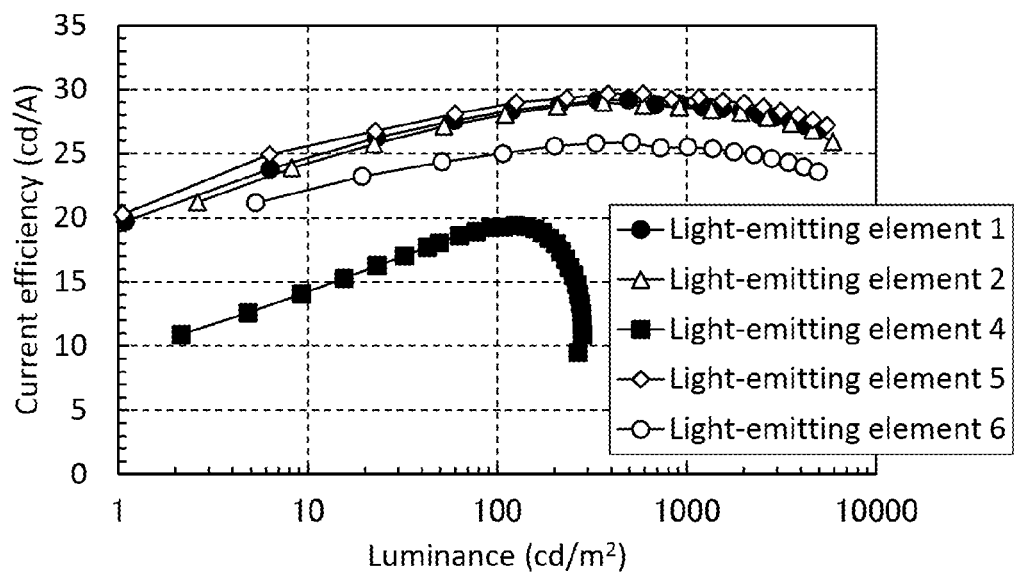
FIG. 43 is a graph showing current efficiency-luminance characteristics of light-emitting elements in Example 1.

FIG. 41 shows luminance-current density characteristics of fabricated the light-emitting elements 1 to 6. FIG. 42 shows current density-voltage characteristics thereof. FIG. 43 shows current efficiency-luminance characteristics thereof. The measurements of the light-emitting elements were performed at room temperature (in an atmosphere kept at 23° C.).

Figure 44:
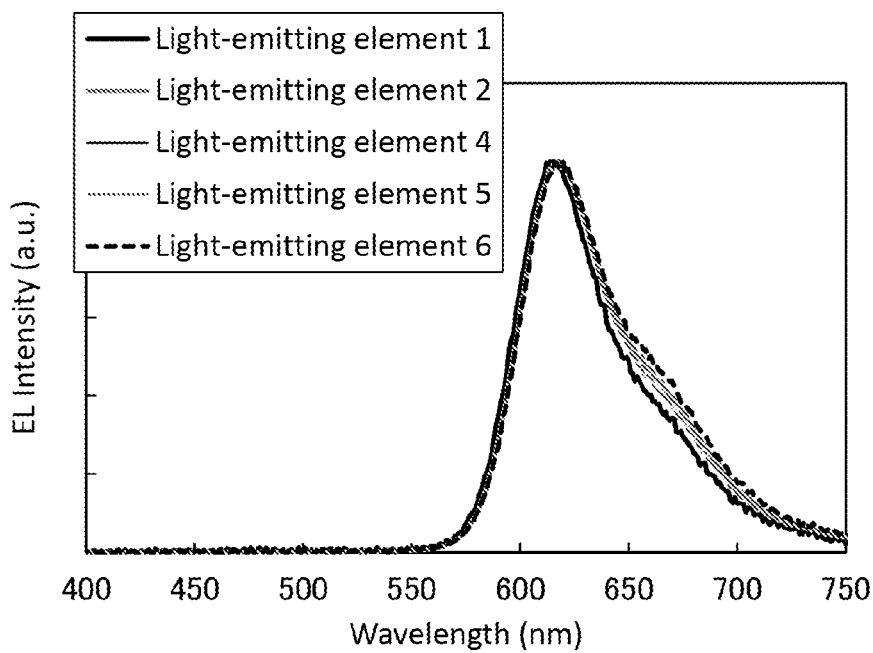
FIG. 44 is a graph showing electroluminescence spectra of light-emitting elements in Example 1.

FIG. 44 shows electroluminescence spectra (EL spectra) when a current at a current density of 2.5 mA/cm² was supplied to the light-emitting elements 1 to 6. Note that in FIG. 44, the vertical axis represents the emission intensity (EL intensity) normalized by the maximum values of the electroluminescence spectra.

Table 3 shows element characteristics of the light-emitting elements 1 to 6 at around 1000 cd/m².

TABLE 3

|  | Voltage (V) | Current density (mA/cm$^2$) | CIE chromaticity (x, y) | Luminance (cd/m$^2$) | Current efficiency (cd/A) | Power consumption (lmW) |
|---|---|---|---|---|---|---|
| Light-emitting element 1 | 3.3 | 3.18 | (0.668, 0.332) | 920 | 28.9 | 27.5 |
| Light-emitting element 2 | 4.6 | 3.20 | (0.668, 0.332) | 910 | 28.6 | 19.5 |
| Light-emitting element 3 | — | — | — | — | — | — |
| Light-emitting element 4 | 5.3 | 2.59 | (0.660, 0.337) | 280 | 10.9 | 6.45 |
| Light-emitting element 5 | 3.3 | 3.95 | (0.666, 0.334) | 1160 | 29.4 | 28.0 |
| Light-emitting element 6 | 3.3 | 3.97 | (0.669, 0.331) | 1010 | 25.5 | 24.3 |

As shown in FIG. 44, red light whose electroluminescence spectrum has a peak at a wavelength of around 618 nm was obtained from each of the light-emitting elements 1, 2, 4, 5, and 6. Note that light emission with a luminance exceeding 1 cd/m$^2$ was not obtained from the light-emitting element 3.

As shown in FIG. 42 and Table 3, when 3.3 V is applied, light emission with a luminance of about 1000 cd/m$^2$ is obtained from the light-emitting elements 1, 5, and 6; the driving voltage of each of the light-emitting elements 1, 5, and 6 is low. In contrast, the driving voltage of each of the light-emitting elements 2 and 4 is high. In other words, the light-emitting element including the buffer layer 637 and the buffer layer 638 can be driven at a low voltage.

As shown in FIG. 43 and Table 3, high current efficiency is obtained from each of the light-emitting elements 1, 5, and 6. In contrast, the light-emitting element 4 has low current efficiency and a low maximum luminance (280 cd/m$^2$). Thus, each of the light-emitting elements 1, 5, and 6 has high power efficiency. In other words, the light-emitting element including the buffer layer 637 and the buffer layer 638 has low power consumption.

Even a light-emitting element including the buffer layer 639 like the light-emitting element 6 has a low driving voltage and high current efficiency. Note that a value of current efficiency of the light-emitting element 6 is slightly lower than those of the light-emitting elements 1 and 5. This is because the light-emitting element 6 includes the buffer layer 639 and accordingly a distance between the pair of electrodes (the electrode 651 and the electrode 652) of the light-emitting element 6 is larger than those of the other light-emitting elements (the light-emitting elements 1, 2, 3, 4, and 5); that is, an optical length between the pair of electrodes is different from those of the other light-emitting elements.

According to one embodiment of the present invention, a light-emitting element with a low driving voltage can be provided. Moreover, a light-emitting element with low power consumption can be provided.

The structures described in this example can be used in an appropriate combination with any of the other embodiments and example.

Example 2

Figure 40B:
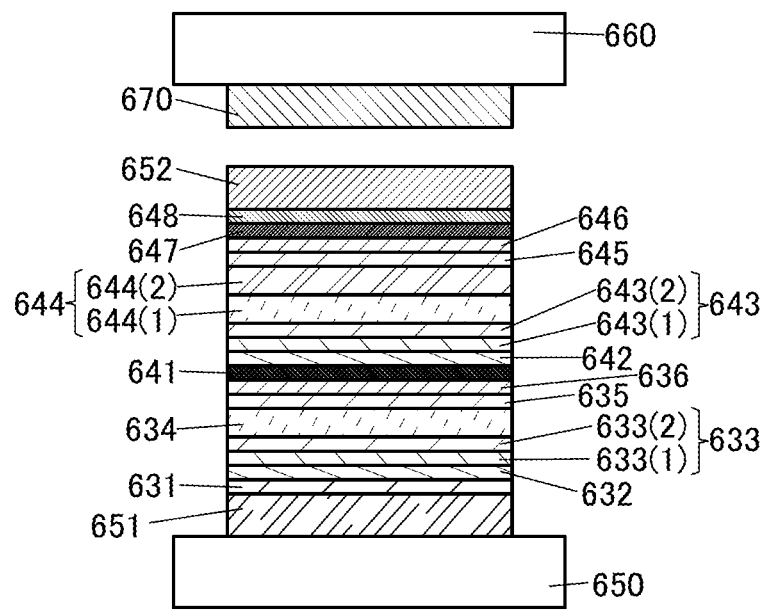

In this example, examples of fabricating tandem light-emitting elements of embodiments of the present invention are described. FIG. 40B is a schematic cross-sectional view of the light-emitting element fabricated in this example, and Tables 3 and 4 show details of the element structures. In addition, structures and abbreviations of compounds used here are given below. Note that Example 1 can be referred to for other compounds.

[Chemical Formula 2]

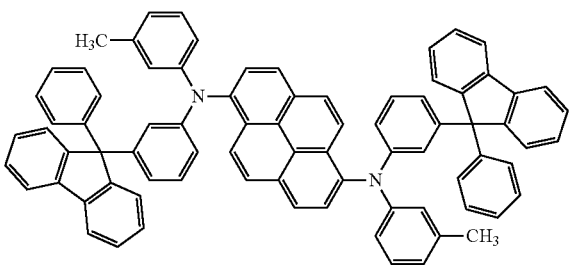

1,6mMemFLPAPrn

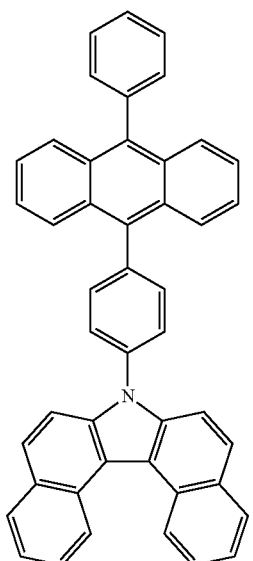

cgDBCzPA

-continued

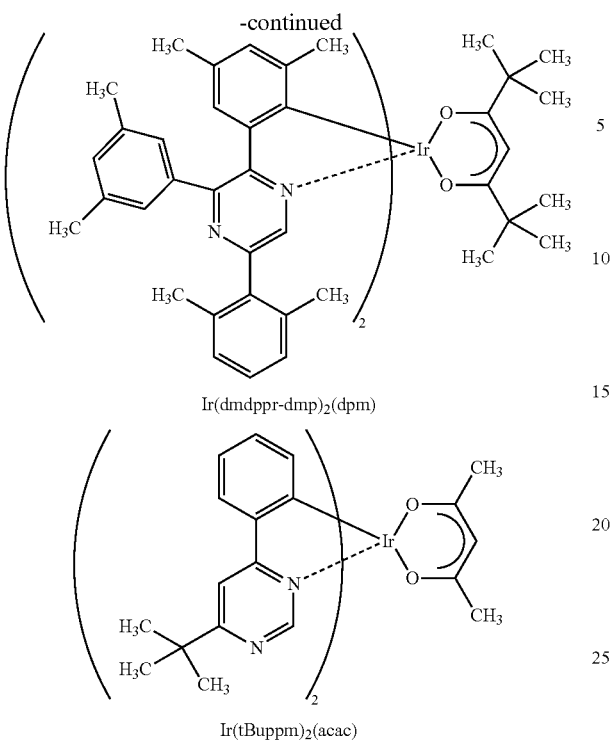

Ir(dmdppr-dmp)$_2$(dpm)

Ir(tBuppm)$_2$(acac)

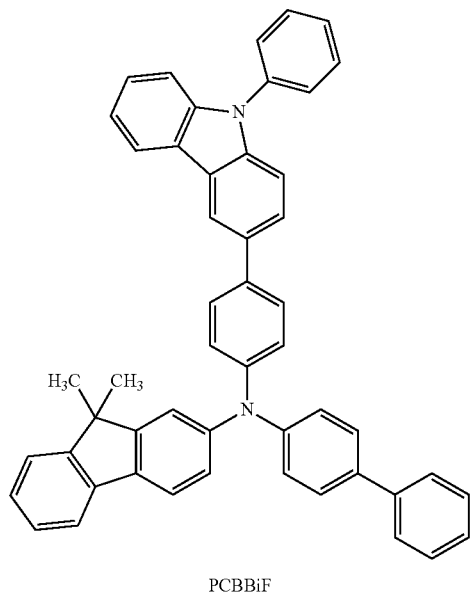

PCBBiF

TABLE 4

| | Layer | Reference numeral | Thickness (nm) | Material | Weight ratio *1) |
|---|---|---|---|---|---|
| Light-emitting element 7 | Optical element | 670 | — | CF(Red) | — |
| | Electrode | 652(2) | 70 | ITO | — |
| | | 652(1) | 15 | Ag:Mg | 1:0.1 |
| | Buffer layer | 648 | 1 | LiF | — |
| | Buffer layer | 647 | 10 | BPhen | — |
| | Hole-injection layer | 646 | 25 | PCPPn:MoO$_3$ | 1:0.5 |
| | Hole-transport layer | 645 | 20 | BPAFLP | — |
| | Light-emitting layer | 644(2) | 20 | 2mDBTBPDBq-II:PCBBiF:Ir(tBuppm)$_2$(acac) | 0.7:0.3:0.06 |
| | | 644(1) | 20 | 2mDBTBPDBq-II:Ir(dmdppr-dmp)$_2$(dpm) | 1:0.06 |
| | Electron-transport layer | 643(2) | 20 | 2mDBTBPDBq-II | — |
| | | 643(1) | 10 | BPhen | — |
| | Buffer layer | 642 | 0.15 | Li$_2$O | — |
| | Buffer layer | 641(2) | 5 | BPhen | — |
| | | 641(1) | 2 | CuPc | — |
| | Charge-generation layer | 636 | 10 | PCPPn:MoO$_3$ | 1:0.5 |
| | Hole-transport layer | 635 | 15 | PCPPn | — |
| | Light-emitting layer | 634 | 25 | cgDBCzPA:1,6mMemFLPAPrn | 1:0.05 |
| | Electron-transport layer | 633(2) | 10 | cgDBCzPA | — |
| | | 633(1) | 10 | BPhen | — |
| | Electron-injection layer | 632 | 0.15 | Li$_2$O | — |
| | Buffer layer | 631(3) | 5 | BPhen | — |
| | | 631(2) | 2 | CuPc | — |
| | | 631(1) | 25 | PCPPn:MoO$_3$ | 1:0.5 |
| | Electrode | 651(3) | 45 | ITSO | — |
| | | 651(2) | 6 | Ti | — |
| | | 651(1) | 200 | Al—Ni—La | — |
| Light-emitting element 8 | Optical element | 670 | — | CF(Green) | — |
| | Electrode | 652(2) | 70 | ITO | — |
| | | 652(1) | 15 | Ag:Mg | 1:0.1 |
| | Buffer layer | 648 | 1 | LiF | — |
| | Buffer layer | 647 | 10 | BPhen | — |
| | Hole-injection layer | 646 | 25 | PCPPn:MoO$_3$ | 1:0.5 |
| | Hole-transport layer | 645 | 20 | BPAFLP | — |
| | Light-emitting layer | 644(2) | 20 | 2mDBTBPDBq-II:PCBBiF:Ir(tBuppm)$_2$(acac) | 0.7:0.3:0.06 |
| | | 644(1) | 20 | 2mDBTBPDBq-II:Ir(dmdppr-dmp)$_2$(dpm) | 1:0.06 |
| | Electron-transport layer | 643(2) | 20 | 2mDBTBPDBq-II | — |
| | | 643(1) | 10 | BPhen | — |
| | Buffer layer | 642 | 0.15 | Li$_2$O | — |
| | Buffer layer | 641(2) | 5 | BPhen | — |
| | | 641(1) | 2 | CuPc | — |

TABLE 4-continued

| Layer | | Reference numeral | Thickness (nm) | Material | Weight ratio *1) |
|---|---|---|---|---|---|
| | Charge-generation layer | 636 | 10 | PCPPn:MoO$_3$ | 1:0.5 |
| | Hole-transport layer | 635 | 15 | PCPPn | — |
| | Light-emitting layer | 634 | 25 | cgDBCzPA:1,6mMemFLPAPrn | 1:0.05 |
| | Electron-transport layer | 633(2) | 10 | cgDBCzPA | — |
| | | 633(1) | 10 | BPhen | — |
| | Electron-injection layer | 632 | 0.15 | Li$_2$O | — |
| | Buffer layer | 631(3) | 5 | BPhen | — |
| | | 631(2) | 2 | CuPc | — |
| | | 631(1) | 20 | PCPPn:MoO$_3$ | 1:0.5 |
| | Electrode | 651(3) | 10 | ITSO | — |
| | | 651(2) | 6 | Ti | — |
| | | 651(1) | 200 | Al—Ni—La | — |

*1) The ratio of only Ag:Mg is represented by the volume ratio.

TABLE 5

| Layer | | Reference numeral | Thickness (nm) | Material | Weight ratio *1) |
|---|---|---|---|---|---|
| Light-emitting element 9 | Optical element | 670 | — | CF(Blue) | — |
| | Electrode | 652(2) | 70 | ITO | — |
| | | 652(1) | 15 | Ag:Mg | 1:0.1 |
| | Buffer layer | 648 | 1 | LiF | — |
| | Buffer layer | 647 | 10 | BPhen | — |
| | Hole-injection layer | 646 | 25 | PCPPn:MoO$_3$ | 1:0.5 |
| | Hole-transport layer | 645 | 20 | BPAFLP | — |
| | Light-emitting layer | 644(2) | 20 | 2mDBTBPDBq-II:PCBBiF:Ir(tBuppm)$_2$(acac) | 0.7:0.3:0.06 |
| | | 644(1) | 20 | 2mDBTBPDBq-II:Ir(dmdppr-dmp)$_2$(dpm) | 1:0.06 |
| | Electron-transport layer | 643(2) | 20 | 2mDBTBPDBq-II | — |
| | | 643(1) | 10 | BPhen | — |
| | Buffer layer | 642 | 0.15 | Li$_2$O | — |
| | Buffer layer | 641(2) | 5 | BPhen | — |
| | | 641(1) | 2 | CuPc | — |
| | Charge-generation layer | 636 | 10 | PCPPn:MoO$_3$ | 1:0.5 |
| | Hole-transport layer | 635 | 15 | PCPPn | — |
| | Light-emitting layer | 634 | 25 | cgDBCzPA:1,6mMemFLPAPrn | 1:0.05 |
| | Electron-transport layer | 633(2) | 10 | cgDBCzPA | — |
| | | 633(1) | 10 | BPhen | — |
| | Electron-injection layer | 632 | 0.15 | Li$_2$O | — |
| | Buffer layer | 631(3) | 5 | BPhen | — |
| | | 631(2) | 2 | CuPc | — |
| | | 631(1) | 15 | PCPPn:MoO$_3$ | 1:0.5 |
| | Electrode | 651(3) | 75 | ITSO | — |
| | | 651(2) | 6 | Ti | — |
| | | 651(1) | 200 | Al—Ni—La | — |

*1) The ratio of only Ag:Mg is represented by the volume ratio.

<Fabrication of Light-Emitting Element>
<<Fabrication of Light-Emitting Element 7>>

An alloy film of aluminum, nickel, and lanthanum (Al—Ni—La film) was formed to a thickness of 200 nm over the substrate 650. Next, a titanium (Ti) film was formed to a thickness of 6 nm over the Al—Ni—La film and oxidized by baking at 300° C. for 1 hour, so that a titanium oxide film was formed. Then, an ITSO film was formed to a thickness of 45 nm. Through the above steps, the electrode 651 was formed. The electrode area of the electrode 651 was set to 4 mm$^2$ (2 mm×2 mm).

Next, over the electrode 651, a buffer layer 631(1) was formed by depositing PCPPn and MoO$_3$ to a thickness of 25 nm by co-evaporation such that the weight ratio of PCPPn to MoO$_3$ was 1 to 0.5. Then, a buffer layer 631(2) was formed by depositing CuPc to a thickness of 2 nm and BPhen to a thickness of 5 nm subsequently by evaporation.

Next, as the electron-injection layer 632, lithium oxide (Li$_2$O) was deposited by evaporation to a thickness of 0.15 nm.

Next, as the electron-transport layer 633, BPhen was deposited by evaporation to a thickness of 10 nm and 7-[4-(10-phenyl-9-anthryl)phenyl]-7H-dibenzo[c,g]carbazole (abbreviation: cgDBCzPA) was subsequently deposited by evaporation to a thickness of 10 nm.

Next, as the light-emitting layer 634, cgDBCzPA and N,N'-bis(3-methylphenyl)-N,N'-bis[3-(9-phenyl-9H-fluoren-9-yl)phenyl]pyrene-1,6-diamine (abbreviation: 1,6mMemFLPAPm) were deposited by co-evaporation to a thickness of 25 nm such that the weight ratio of cgDBCzPA to 1,6mMemFLPAPrn was 1:0.05.

Next, as the hole-transport layer 635, PCPPn was deposited by evaporation to a thickness of 15 nm.

Next, as the hole-injection layer 636 serving as a charge-generation layer, PCPPn and MoO$_3$ were deposited by co-evaporation to a thickness of 10 nm such that the weight ratio of PCPPn to MoO$_3$ was 1 to 0.5.

Next, as a buffer layer 641, CuPc was deposited by evaporation to a thickness of 2 nm and BPhen was sequentially deposited by evaporation to a thickness of 5 nm.

Next, as an electron-injection layer 642, Li$_2$O was deposited by evaporation to a thickness of 0.15 nm.

Next, as an electron-transport layer 643, BPhen was deposited by evaporation to a thickness of 10 nm and 2mDBTBPDBq-II was sequentially deposited by evaporation to a thickness of 20 nm.

Next, a light-emitting layer 644 was formed in the following manner: 2mDBTBPDBq-II and bis{2-[5-(2,6-dimethylphenyl)-3-(3,5-dimethylphenyl)-2-pyrazinyl-κN]-4,6-dimethylphenyl-κC}(2,2,6,6-tetramethyl-3,5-heptanedionato-$K^2O,O'$) iridium(III) (abbreviation: Ir(dmdppr-dmp)$_2$(dpm)) were deposited by co-evaporation to a thickness of 20 nm such that the weight ratio of 2mDBTBPDBq-II to Ir(dmdppr-dmp)$_2$(dpm) was 1 to 0.06; and 2mDBTBPDBq-II, N-(1,1'-biphenyl-4-yl)-N-[4-(9-phenyl-9H-carbazol-3-yl)phenyl]-9,9-dimethyl-9H-fluor en-2-amine (abbreviation: PCBBiF), and (acetylacetonato)bis(6-tert-butyl-4-phenylpyrimidinato)iridium(III) (abbreviation: Ir(tBuppm)$_2$(acac)) were deposited by co-evaporation to a thickness of 20 nm such that the weight ratio of 2mDBTBPDBq-II to PCBBiF and Ir(tBuppm)$_2$(acac) was 0.7 to 0.3 and 0.06.

Next, as a hole-transport layer 645, BPAFLP was deposited by evaporation to a thickness of 20 nm.

Next, as a hole-injection layer 646, PCPPn and MoO$_3$ were deposited by co-evaporation to a thickness of 25 nm such that the weight ratio of PCPPn to MoO$_3$ was 1 to 0.5.

As a buffer layer 647, BPhen was deposited by evaporation to a thickness of 10 nm. Then, as a buffer layer 648, lithium fluoride (LiF) was deposited by evaporation to a thickness of 1 nm.

Next, as the electrode 652, a 15-nm-thick alloy film of silver (Ag) and magnesium (Mg) and a 70-nm-thick ITO film were sequentially formed. The alloy film of Ag and Mg was deposited by evaporation in a volume ratio of Ag:Mg=1:0.1.

As an optical element 670 with which a light-emitting element 7 overlaps, a red color filter (CF red) was formed to a thickness of 2.1 μm over a substrate 660.

Next, in a glove box containing a nitrogen atmosphere, the light-emitting element 7 was sealed by fixing the substrate 660 provided with the optical element 670 to the substrate 650 over which the organic material was deposited using a sealant for an organic EL material. Specifically, after the sealant was applied to surround the organic materials over the substrate 650 and the substrate 660 was bonded to the substrate 650, the sealant was irradiated with ultraviolet light having a wavelength of 365 nm at 6 J/cm$^2$ and heat treatment was performed at 80° C. for 1 hour. Through the above steps, the light-emitting element 7 was obtained.

<<Fabrication of Light-Emitting Elements 8 and 9>>

The light-emitting elements 8 and 9 were fabricated through the same steps as those for the light-emitting element 7 described above except for the steps of forming the electrode 651, the buffer layer 631, and the optical element 670.

In the electrode 651 of the light-emitting element 8, an ITSO film was formed to a thickness of 10 nm over the 200-nm-thick Al—Ni—La film and the 6-nm-thick titanium oxide film.

Next, over the electrode 651, the buffer layer 631(1) was formed by depositing PCPPn and MoO$_3$ to a thickness of 20 nm by co-evaporation such that the weight ratio of PCPPn to MoO$_3$ was 1 to 0.5.

As the optical element 670 with which the light-emitting element 8 overlaps, a green color filter (CF Green) was formed to a thickness of 1.2 μm over the substrate 660.

As the electrode 651 of the light-emitting element 9, an ITSO film was formed to a thickness of 75 nm over the 200-nm-thick Al—Ni—La film and the 6-nm-thick titanium oxide film.

Next, over the electrode 651, the buffer layer 631(1) was formed by depositing PCPPn and MoO$_3$ to a thickness of 15 nm by co-evaporation such that the weight ratio of PCPPn to MoO$_3$ was 1 to 0.5.

As the optical element 670 with which the light-emitting element 9 overlaps, a blue color filter (CF Blue) was formed to a thickness of 0.8 μm over the substrate 660.

<Characteristics of Light-Emitting Element>

Figure 45:
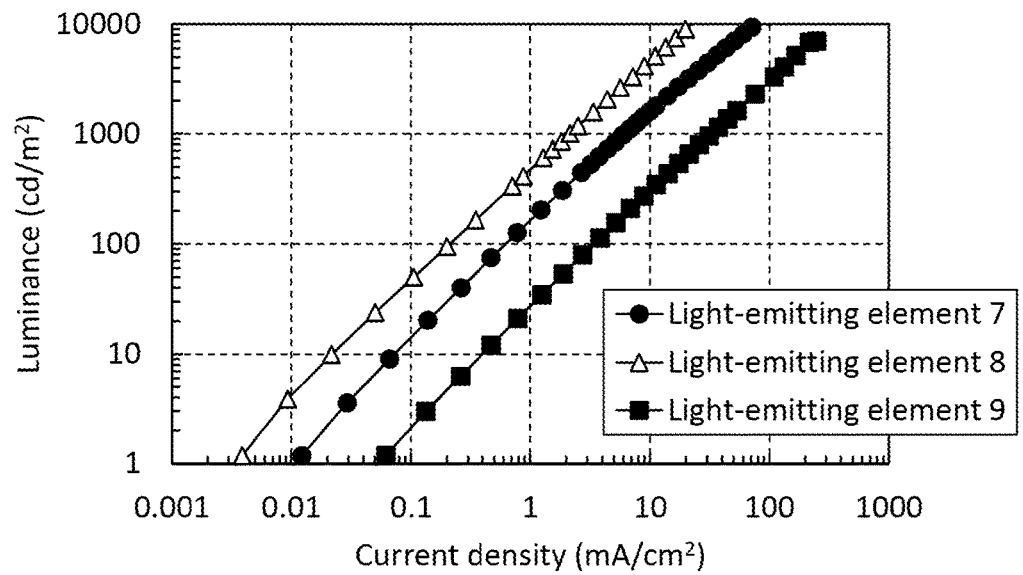
FIG. 45 is a graph showing luminance-current density characteristics of light-emitting elements in Example 2.
Figure 46:
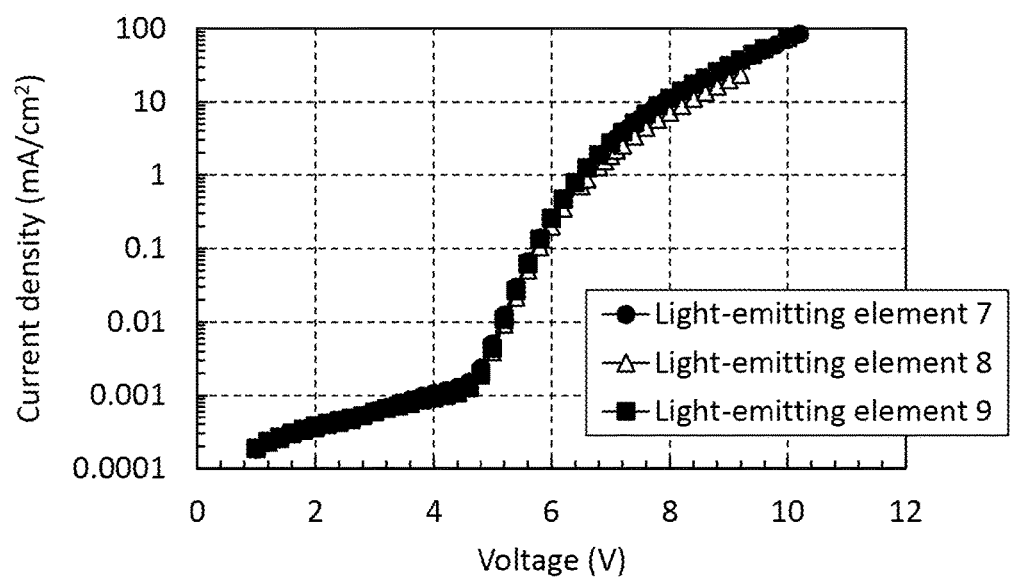
FIG. 46 is a graph showing current density-voltage characteristics of light-emitting elements in Example 2.
Figure 47:
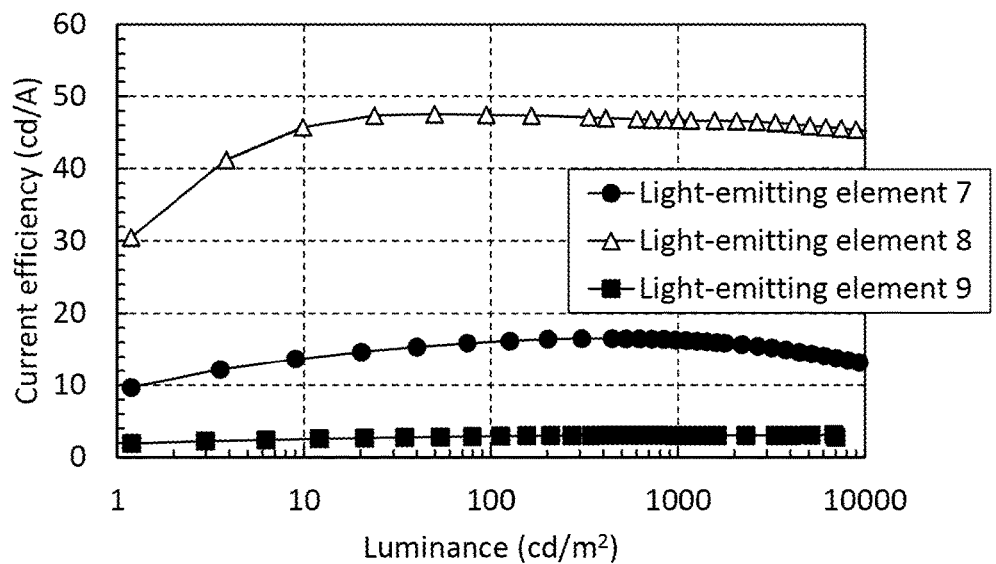
FIG. 47 is a graph showing current efficiency-luminance characteristics of light-emitting elements in Example 2.

FIG. 45 shows luminance-current density characteristics of the fabricated light-emitting elements 7 to 9. FIG. 46 shows current density-voltage characteristics thereof. FIG. 47 shows current efficiency-luminance characteristics thereof. The measurements of the light-emitting elements were performed at room temperature (in an atmosphere kept at 23° C.).

Figure 48:
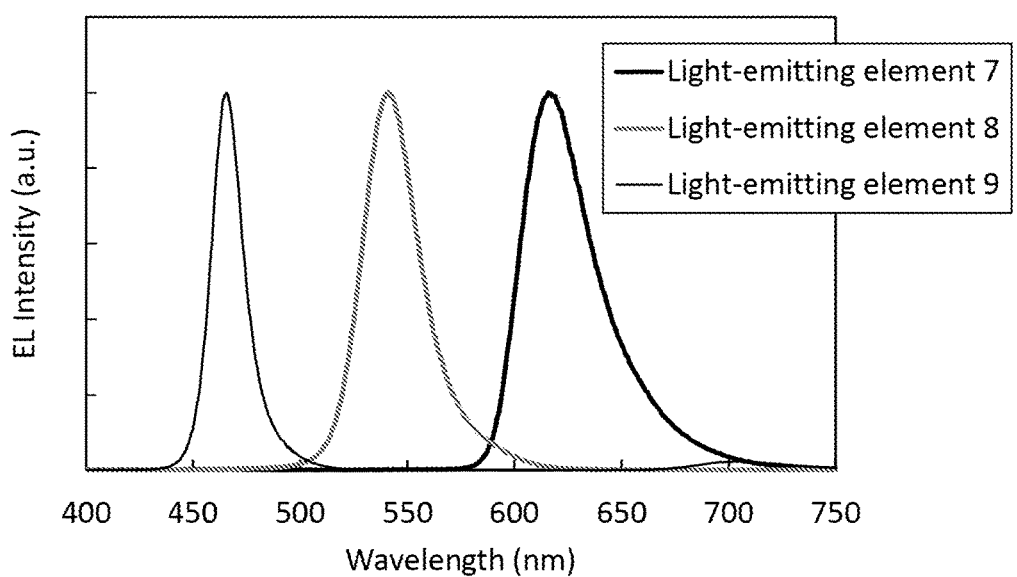
FIG. 48 is a graph showing electroluminescence spectra of light-emitting elements in Example 2.

FIG. 48 shows electroluminescence spectra (EL spectra) of the light-emitting elements 7 to 9 when a current with a current density of 2.5 mA/cm$^2$ was supplied to the light-emitting elements. Note that in FIG. 48, the vertical axis represents the emission intensity (EL intensity) normalized by the maximum values of the electroluminescence spectra.

Table 6 shows element characteristics of the light-emitting elements 7 to 9 at around 1000 cd/m$^2$.

TABLE 6

| | Voltage (V) | Current density (mA/cm$^2$) | CIE chromaticity (x, y) | Luminance (cd/m$^2$) | Current efficiency (cd/A) |
|---|---|---|---|---|---|
| Light-emitting element 7 | 7.5 | 5.93 | (0.676, 0.322) | 970 | 16 |
| Light-emitting element 8 | 7.1 | 2.15 | (0.271, 0.715) | 1010 | 47 |
| Light-emitting element 9 | 9.0 | 31.2 | (0.140, 0.053) | 950 | 3.1 |

As shown in FIG. 48, the light-emitting element 7 has a peak wavelength of the electroluminescence spectrum of 616 nm and emits red light, the light-emitting element 8 has a peak wavelength of 541 nm and emits green light, and the light-emitting element 9 has a peak wavelength of 466 nm and emits blue light. In addition, in the light-emitting elements 7, 8, and 9, the full widths at half maximum of the electroluminescence spectra are 40 nm, 31 nm, and 17 nm, respectively. Each light-emitting element enabled light to be emitted with high color purity. This is because each of the light-emitting elements 7 to 9 has a microcavity structure between the pair of electrodes (the electrode 651 and the electrode 652).

As shown in FIG. 46 and Table 6, the driving voltages of the light-emitting elements 7, 8, and 9 are low, considering that they are tandem light-emitting elements. In other words, the light-emitting element with a structure of one embodiment of the present invention can be driven at a low voltage.

As shown in FIG. 47 and Table 6, the light-emitting elements 7, 8, and 9 have high current efficiency as the light-emitting elements emitting red, green, and blue light. In other words, the light-emitting element with a structure of one embodiment of the present invention has low power consumption.

Next, power consumption of a display device in which the fabricated light-emitting elements 7, 8, and 9 were used was estimated.

In this example, the power consumption of the display device was estimated on the assumption that the display region of the display device had an aspect ratio of 16:9, a diagonal of 4.3 inches, and an area of 50.97 cm$^2$ and that the aperture ratio was 35%. Moreover, the characteristics of the light-emitting elements and the display device with the above specifications were evaluated in the case where the entire surface of the display region displayed white (chromaticity coordinates (x,y)=(0.313,0.329)) with a color temperature of 6500 K at 300 cd/m$^2$.

As a result, white color (chromaticity coordinates (x,y)= (0.313,0.329)) with a color temperature of 6500 K was able to be displayed at 300 cd/m$^2$ on the entire display region in the display device having the above specifications when luminance of the light-emitting element 7 was 617 cd/m$^2$, luminance of the light-emitting element 8 was 1771 cd/m$^2$, and luminance of the light-emitting element 9 was 183 cd/m$^2$. At this time, power consumption of the display device was able to be estimated to be 601 mW.

The region where the color gamut according to the National Television System Committee (NTSC) can be displayed in the display device was estimated to be 114% at an area ratio (NTSC ratio) of the CIE 1976 chromaticity coordinates, which indicates that the display device has high color reproducibility.

According to one embodiment of the present invention, a light-emitting element with a low driving voltage can be provided. A light-emitting element with low power consumption can be provided. A light-emitting element having high color purity can be provided. A light-emitting element having high color reproducibility can be provided.

The structures described in this example can be used in an appropriate combination with any of the other embodiments and example.

This application is based on Japanese Patent Application serial no. 2016-032007 filed with Japan Patent Office on Feb. 23, 2016, the entire contents of which are hereby incorporated by reference.

What is claimed is:

1. A light-emitting element comprising:
a cathode;
an anode;
a light-emitting layer;
a first layer;
a second layer; and
a third layer,
wherein the first layer is provided between the cathode and the light-emitting layer,
wherein the second layer is provided between the light-emitting layer and the third layer and comprises a region in contact with the third layer,
wherein the third layer is provided between the second layer and the anode and comprises a region in contact with the anode,
wherein the first layer comprises an alkali metal or an alkaline earth metal,
wherein the third layer comprises an alkali metal or an alkaline earth metal, and
wherein the second layer comprises a material having a function of transporting an electron.

2. A light-emitting element comprising:
a cathode;
a first layer over the cathode;
a light-emitting layer over the first layer;
a second layer over the light-emitting layer;
a third layer comprising a region over and in contact with the second layer; and
an anode comprising a region over and in contact with the third layer,
wherein the first layer comprises an alkali metal or an alkaline earth metal,
wherein the third layer comprises an alkali metal or an alkaline earth metal, and
wherein the second layer comprises a material having a function of transporting an electron.

3. A light-emitting element comprising:
a cathode;
an anode;
a light-emitting layer;
a first layer;
a second layer;
a third layer; and
a fourth layer,
wherein the first layer is provided between the cathode and the light-emitting layer,
wherein the second layer is provided between the light-emitting layer and the third layer and comprises a region in contact with the third layer,
wherein the third layer is provided between the second layer and the fourth layer and comprises a region in contact with the fourth layer,
wherein the fourth layer is provided between the third layer and the anode and comprises a region in contact with the anode,
wherein the first layer comprises an alkali metal or an alkaline earth metal,
wherein the third layer comprises an alkali metal or an alkaline earth metal,
wherein the second layer comprises a material having a function of transporting an electron, and
wherein the fourth layer comprises a material having a function of transporting an electron.

4. A light-emitting element comprising:
a cathode;
a first layer over the cathode;
a light-emitting layer over the first layer;
a second layer over the light-emitting layer;
a third layer comprising a region over and in contact with the second layer;
a fourth layer comprising a region over and in contact with the third layer; and
an anode comprising a region over and in contact with the fourth layer,
wherein the first layer comprises an alkali metal or an alkaline earth metal,
wherein the third layer comprises an alkali metal or an alkaline earth metal,
wherein the second layer comprises a material having a function of transporting an electron, and
wherein the fourth layer comprises a material having a function of transporting an electron.

5. The light-emitting element according to claim 1, further comprising a fifth layer between the light-emitting layer and the second layer,
wherein the fifth layer comprises a region in contact with the second layer, and
wherein the fifth layer comprises an electron acceptor and a material having a function of transporting a hole.

6. The light-emitting element according to claim 5,
wherein the material having a function of transporting a hole comprises at least one of a π-electron rich heteroaromatic ring skeleton and an aromatic amine skeleton, and wherein the electron acceptor comprises a transition metal oxide.

7. The light-emitting element according to claim 1, further comprising a sixth layer between the cathode and the first layer,
   wherein the sixth layer comprises a region in contact with the first layer, and
   wherein the sixth layer comprises a material having a function of transporting an electron.

8. The light-emitting element according to claim 1, wherein the material having a function of transporting an electron comprises a π-electron deficient heteroaromatic ring skeleton.

9. The light-emitting element according to claim 1, wherein the material of having a function of transporting an electron comprises bathophenanthroline or tris(8-quinolinolato)aluminum.

10. The light-emitting element according to claim 1, wherein each of the first layer and the third layer comprises a region without a material comprising a π-electron deficient heteroaromatic ring skeleton.

11. The light-emitting element according to claim 1, wherein the alkali metal is lithium and the alkaline earth metal is calcium.

12. The light-emitting element according to claim 1, wherein the anode comprises silver.

13. The light-emitting element according to claim 1, wherein at least one of the cathode and the anode comprises a metal oxide comprising at least one of indium and zinc.

14. A display device comprising:
   the light-emitting element according to claim 1, and
   a transistor electrically connected to the cathode.

15. The display device according to claim 14, wherein the transistor is an n-channel transistor.

16. The display device according to claim 15,
   wherein the transistor comprises a semiconductor layer, and
   wherein the semiconductor layer comprises an oxide semiconductor.

17. The display device according to claim 16, wherein the oxide semiconductor comprises indium, gallium, and zinc.

18. An electronic device comprising:
   the display device according to claim 14, and
   at least one of a housing and a touch sensor.

19. A lighting apparatus comprising:
   the light-emitting element according to claim 1, and
   at least one of a housing and a touch sensor.

* * * * *